US011239430B2

(12) United States Patent
Xia

(10) Patent No.: US 11,239,430 B2
(45) Date of Patent: Feb. 1, 2022

(54) BORON AND NITROGEN CONTAINING HETEROCYCLIC COMPOUNDS

(71) Applicant: Beijing Summer Sprout Technology Co., Ltd., Beijing (CN)

(72) Inventor: Chuanjun Xia, Lawrenceville, NJ (US)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 421 days.

(21) Appl. No.: 16/239,933

(22) Filed: Jan. 4, 2019

(65) Prior Publication Data

US 2019/0214564 A1 Jul. 11, 2019

Related U.S. Application Data

(60) Provisional application No. 62/614,353, filed on Jan. 5, 2018.

(51) Int. Cl.
*H01L 51/00* (2006.01)
*C07F 5/02* (2006.01)
(Continued)

(52) U.S. Cl.
CPC ............ *H01L 51/008* (2013.01); *C07F 5/027* (2013.01); *C09K 11/06* (2013.01); *H01L 51/006* (2013.01); *H01L 51/0061* (2013.01); *H01L 51/0071* (2013.01); *H01L 51/0072* (2013.01); *H01L 51/5012* (2013.01); *H01L 51/5096* (2013.01); *C09K 2211/1018* (2013.01); *H01L 51/5048* (2013.01); *H01L 51/5056* (2013.01); *H01L 51/5072* (2013.01)

(58) Field of Classification Search
CPC ............... H01L 51/0071; H01L 51/006; H01L 51/0061; H01L 51/0058; H01L 51/008; C09K 2211/1014; C09K 2211/104; C09K 2211/1096; C09K 2211/1029; C07F 5/027
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 106467553 3/2017
CN 107417715 12/2017
(Continued)

OTHER PUBLICATIONS

Chinese Office Action issued in Chinese Application No. 201910009772.4, dated Jan. 18, 2021, and machine translation, 8 pages.
(Continued)

*Primary Examiner* — Alexander C Kollias
(74) *Attorney, Agent, or Firm* — Alston & Bird LLP

(57) ABSTRACT

Boron and nitrogen containing heterocyclic compounds are disclosed, which can be used as emitters, hosts, charge blocking materials, charge transporting materials, etc. in an electroluminescent device. These novel compounds can offer very narrow emissive spectrum, and obtain high saturated deep blue emission. Also disclosed are an organic light-emitting device and a formulation.

13 Claims, 2 Drawing Sheets

Figure 1:
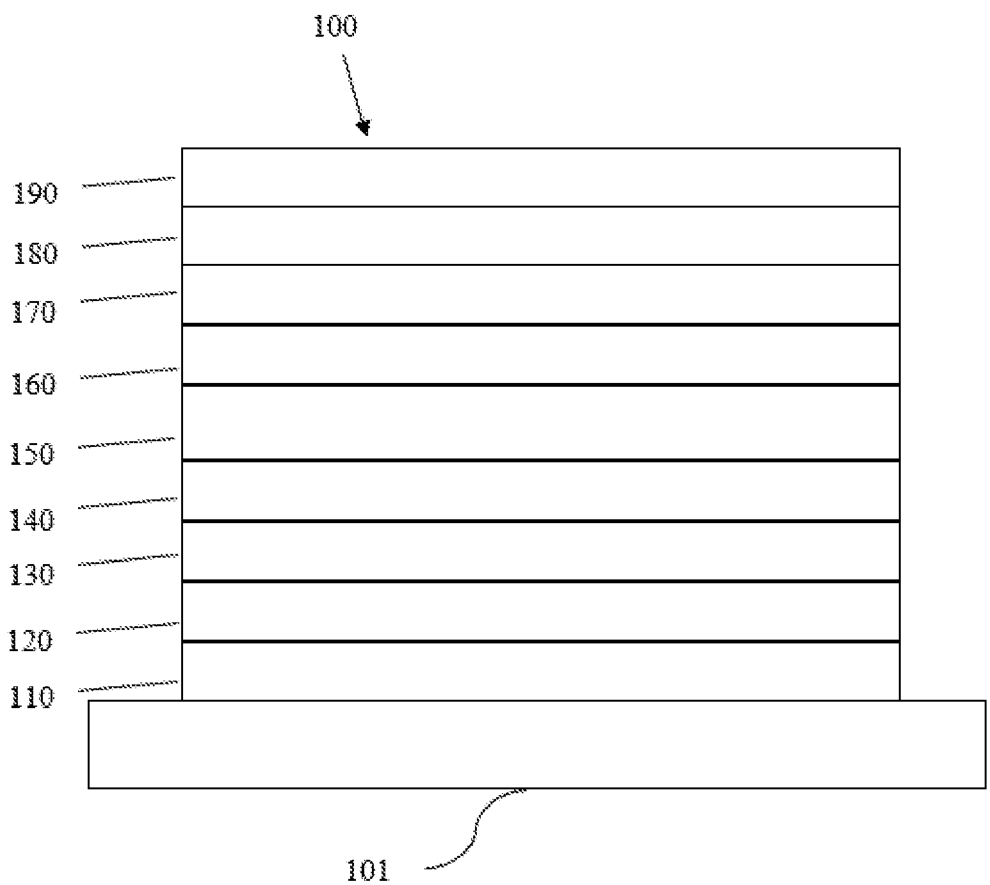

(51) Int. Cl.
*C09K 11/06* (2006.01)
*H01L 51/50* (2006.01)

(56) References Cited

U.S. PATENT DOCUMENTS

| | | | |
|---|---|---|---|
| 5,844,363 A | 12/1998 | Gu et al. | |
| 6,097,147 A | 8/2000 | Baldo et al. | |
| 6,303,238 B1 | 10/2001 | Thompson et al. | |
| 7,279,704 B2 | 10/2007 | Walters et al. | |
| 7,968,146 B2 | 6/2011 | Wagner et al. | |
| 9,073,948 B2 | 7/2015 | Kottas et al. | |
| 2002/0180925 A1* | 12/2002 | Tsuboyama | H01L 51/0052 349/172 |
| 2003/0230980 A1 | 12/2003 | Forrest et al. | |
| 2004/0174116 A1 | 9/2004 | Lu et al. | |
| 2012/0292576 A1 | 11/2012 | Parham et al. | |
| 2014/0058099 A1 | 3/2014 | Wakamiya et al. | |
| 2015/0236274 A1* | 8/2015 | Hatakeyama | H01L 51/0054 257/40 |
| 2015/0295186 A1 | 10/2015 | Parham et al. | |
| 2015/0349273 A1 | 12/2015 | Hung et al. | |
| 2016/0020396 A1 | 1/2016 | Lee | |
| 2016/0233444 A1* | 8/2016 | Hayer | C09K 11/025 |
| 2016/0293853 A1 | 10/2016 | Zeng et al. | |
| 2016/0359122 A1 | 12/2016 | Boudreault et al. | |
| 2016/0359125 A1 | 12/2016 | Li et al. | |
| 2017/0054083 A1 | 2/2017 | Lee | |
| 2017/0069849 A1 | 3/2017 | Lee | |
| 2018/0069182 A1* | 3/2018 | Hatakeyama | C07F 9/90 |
| 2018/0094000 A1* | 4/2018 | Hatakeyama | C09K 11/06 |
| 2019/0211038 A1 | 7/2019 | Xia | |

FOREIGN PATENT DOCUMENTS

| | | |
|---|---|---|
| CN | 107501311 | 12/2017 |
| CN | 108409761 | 8/2018 |
| JP | 2012-248663 A | 12/2012 |
| JP | 2013-147481 A | 8/2013 |

OTHER PUBLICATIONS

Chinese Search Report issued in Chinese Application No. 201910009772.4, dated Jan. 18, 2021, and machine translation, 3 pages.

Chinese Office Action issued in Chinese Application No. 201910009861.9, dated Jan. 18, 2021, and machine translation, 8 pages.

Chinese Search Report issued in Chinese Application No. 201910009861.9, dated Jan. 18, 2021, and machine translation, 3 pages.

C.W. Tang et al. "Organic electroluminescent diodes", Appl. Phys. Ltt. 51, 913 (1987); doi: 10.1063/1.98799.

Hiroki Uoyama et al. "Highli efficient organic light-emitting diodes from delayed fluorescence", doi:10.1038/nature11687, 234, Nature, vol. 492, Dec. 13, 2012.

Non-Final Rejection dated Apr. 14, 2021 for U.S. Appl. No. 16/239,814.

Final Rejection dated Aug. 6, 2021 for U.S. Appl. No. 16/239,814.

Machine translation of JP-2013147481, translation generated Sep. 2021, 66 pages. (Year: 2021).

Non-Final Rejection dated Oct. 4, 2021 for U.S. Appl. No. 16/239,814, 6 pages.

* cited by examiner

BORON AND NITROGEN CONTAINING HETEROCYCLIC COMPOUNDS

This application claims the benefit of U.S. Provisional Application No. 62/614,353, filed Jan. 5, 2018, the entire content of which is incorporated herein by reference.

1 FIELD OF THE INVENTION

The present invention relates to a compound for organic electronic devices, such as organic light emitting devices. More specifically, the present invention relates to heterocyclic compounds containing boron and nitrogen, an organic electroluminescent device and a formulation comprising the compounds.

2 BACKGROUND ART

An organic electronic device is preferably selected from the group consisting of organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This invention laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent emitters still suffer from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

At present phosphorescent blue OLED lifetime is short, and it is difficult to reach deep blue. Fluorescent blue OLED has longer lifetime than phosphorescent blue OLED, but the efficiency is low. There is a great need to improve the lifetime and efficiency of the blue OLED. Blue light emitting materials with thermal activated delayed fluorescence (TADF) have already been used to obtain high external quantum efficiency (EQE). However, most TADF light emitting materials show very broad emissive spectrum, making them undesirable for display applications. Novel TADF materials with very narrow emissive spectrum are therefore strongly needed.

3 SUMMARY OF THE INVENTION

The present invention aims to provide a new series of heterocyclic compounds containing boron and nitrogen to solve at least part of the above problems. The compounds can be used as emitters, hosts, charge blocking materials, charge transporting materials etc. in an organic electroluminescent device. Especially as light emitting materials, these novel compounds offer very narrow emissive spectrum, and obtain high saturated deep blue emission.

According to an embodiment of the present invention, a compound having Formula I is disclosed:

Formula I

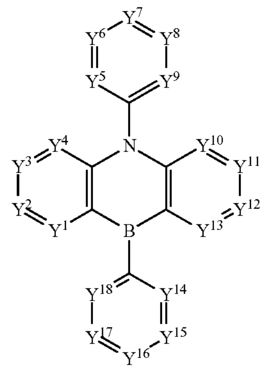

wherein $Y^1$-$Y^{18}$ are each independently selected from C, CR or N;

wherein R is each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

wherein $Y^4$ and $Y^5$ are carbon and connected by a C—C single bond, wherein at least two of the three groups consisting of $Y^1$ and $Y^{18}$, $Y^{13}$ and $Y^{14}$ and $Y^9$ and $Y^{10}$ are connected by Z, wherein Z is selected from $CR^{z1}R^{z2}$, $PR^z$, O, S or Se;

wherein $R^{z1}$, $R^{z2}$ and $R^z$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

and wherein the compound is not a fullerene type compound.

According to another embodiment, an organic light-emitting device is also disclosed, which comprises:

an anode, a cathode, and organic layer between the anode and the cathode, wherein the organic layer comprises a compound having Formula I:

Formula I

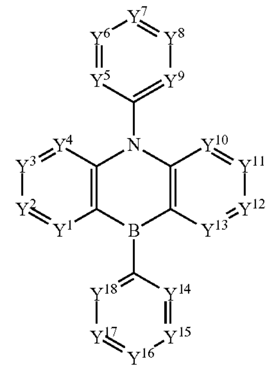

wherein $Y^1$-$Y^{18}$ are each independently selected from C, CR or N;

wherein R is each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;

wherein $Y^4$ and $Y^5$ are carbon and connected by a C—C single bond, wherein at least two of the three groups consisting of $Y^1$ and $Y^{18}$, $Y^{13}$ and $Y^{14}$ and $Y^9$ and $Y^{10}$ are connected via Z, wherein Z is selected from $CR^{z1}R^{z2}$, $PR^z$, O, S or Se;

wherein $R^{z1}$, $R^{z2}$ and $R^z$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

and wherein the compound is not a fullerene type compound.

According to yet another embodiment, a formulation comprising a compound having a structure of Formula I is also disclosed.

The novel heterocycles containing boron and nitrogen disclosed in the present invention can be used as emitters, hosts, charge blocking materials, charge transporting materials, etc. in an electroluminescent device. Especially as emitters, these novel compounds offer very narrow emissive spectrum, and obtain high saturated deep blue emission.

4 BRIEF DESCRIPTION OF THE DRAWINGS

FIG. 1 schematically shows an organic light emitting device that can incorporate the compound and formulation disclosed herein.

Figure 2:
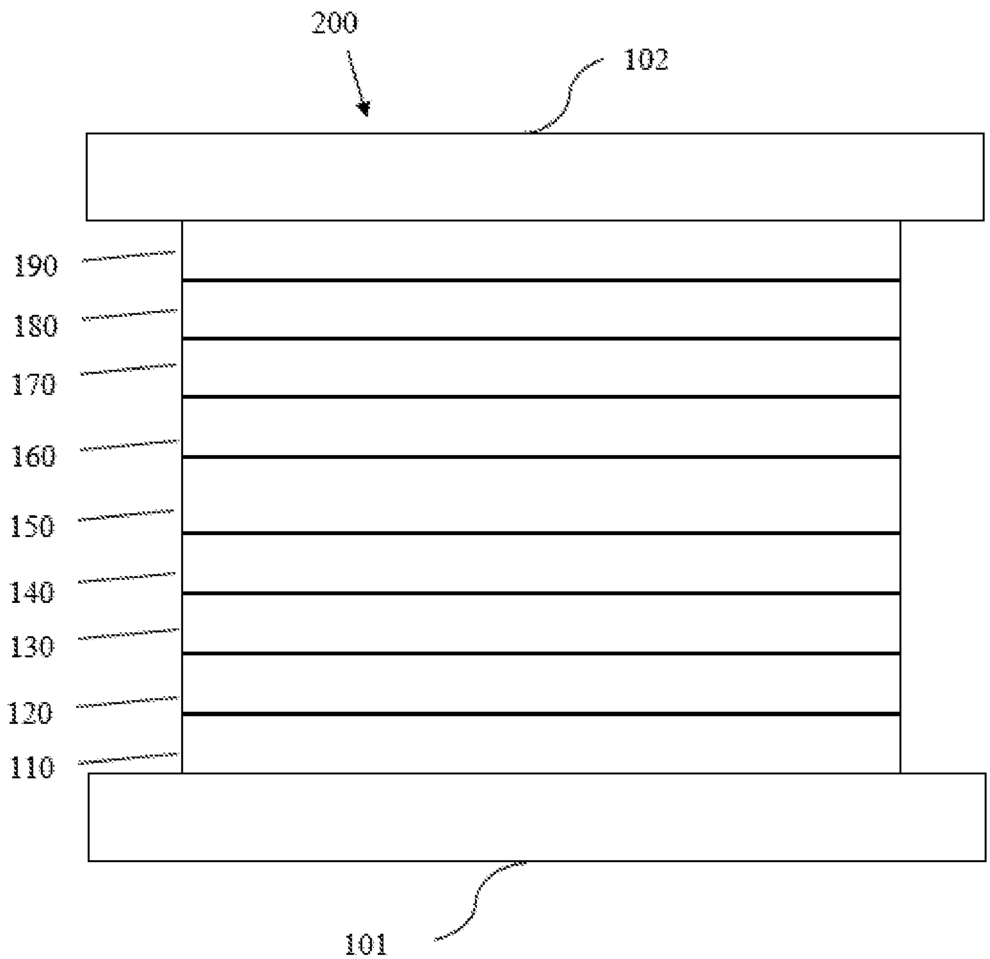

FIG. 2 schematically shows another organic light emitting device that can incorporate the compound and formulation disclosed herein.

5 DETAILED DESCRIPTION

OLEDs can be fabricated on various types of substrates such as glass, plastic, and metal foil. FIG. 1 schematically shows the organic light emitting device 100 without limitation. The figures are not necessarily drawn to scale. Some of the layer in the figure can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, which are incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The layered structure described above is provided by way of non-limiting example. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have a two layers of different emitting materials to achieve desired emission spectrum. Also for example, the hole transporting layer may comprise the first hole transporting layer and the second hole transporting layer.

In one embodiment, an OLED may be described as having an "organic layer" disposed between a cathode and an anode. This organic layer may comprise a single layer or multiple layers.

An OLED can be encapsulated by a barrier layer to protect it from harmful species from the environment such as moisture and oxygen. FIG. 2 schematically shows the organic light emitting device 200 without limitation. FIG. 2 differs from FIG. 1 in that the organic light emitting device 200 include a barrier layer 102, which is above the cathode 190. Any material that can provide the barrier function can be used as the barrier layer such as glass and organic-inorganic hybrid layers. The barrier layer should be placed directly or indirectly outside of the OLED device. Multi-layer thin film encapsulation was described in U.S. Pat. No. 7,968,146, which is herein incorporated by reference in its entirety.

Devices fabricated in accordance with embodiments of the invention can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as “ancillary” when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (ΔEs-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small ΔEs-T. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcyclohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing two to fifteen carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing two to fifteen carbon atoms. Additionally, the alkynyl group may be optionally substituted.

Aryl or aromatic group—as used herein contemplates noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein contemplates aromatic and non-aromatic cyclic groups. Heteroaromatic also means heteroaryl. Preferred non-aromatic heterocyclic groups are those containing 3 to 7 ring atoms which includes at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein contemplates noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, arylalkyl, alkoxy, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

According to an embodiment of the present invention, a compound having Formula I is disclosed:

Formula I

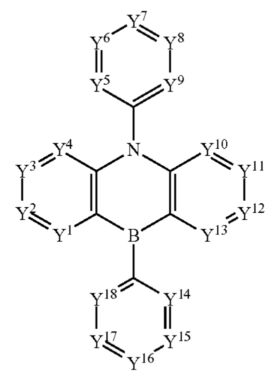

wherein $Y^1$-$Y^{18}$ are each independently selected from C, CR or N;

wherein R is each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

wherein $Y^4$ and $Y^5$ are carbon and connected by a C—C single bond, wherein at least one of the three groups consisting of $Y^1$ and $Y^{18}$, $Y^{13}$ and $Y^{14}$, and $Y^9$ and $Y^{10}$ are connected via Z, wherein Z is selected from $CR^{z1}R^{z2}$, $PR^z$, O, S or Se;

wherein $R^{z1}$, $R^{z2}$ and $R^z$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

and wherein the compound is not a fullerene type compound.

Fullerene is a class of compounds comprising carbon with a cage structure. The cage structure includes spherical cage, ellipsoidal cage, tubular, onion-like, and clusters containing any of the above four cage structures. The typical family members of fullerenes are $C_{20}$, $C_{24}$, $C_{26}$, $C_{28}$, $C_{32}$, $C_{50}$, $C_{60}$, $C_{70}$ . . . $C_{540}$ and so on. In the present invention, the fullerene type compound refers to a compound having a cage structure and comprising carbon and heteroatoms that partially replace carbon. Its structure is similar to fullerene, including spherical cage, ellipsoidal cage, tubular, onion-like, and clusters containing any of the above four cage structures. None of the compounds of multiple structures disclosed in the present invention are fullerene-type compounds, and the crucial point is that the compound molecules comprising the structure represented by any one of the formulas disclosed in the present invention do not form a spatially closed structure, for example, spherical cage, ellipsoidal cage, tubular, onion-like, and clusters containing any of the above four cage structures.

According to an embodiment of the present invention, wherein the compound has a structure of Formula II or Formula III:

Formula II

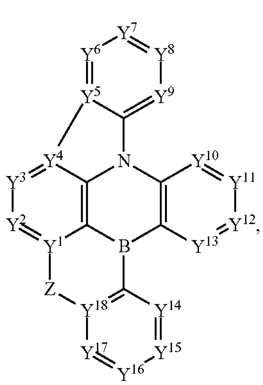

-continued

Formula III

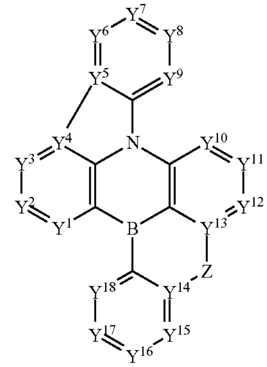

wherein $Y^1$-$Y^{18}$ are each independently selected from C, CR or N;

wherein $Y^4$ and $Y^5$ are carbon and connected by a C—C single bond, wherein Z is selected from $CR^{z1}R^{z2}$, $PR^z$, O, S or Se;

wherein R, $R^{z1}$, $R^{z2}$ and $R^z$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

and wherein the compound is not a fullerene type compound.

According to an embodiment of the present invention, wherein the compound has a structure of Formula IV:

Formula IV

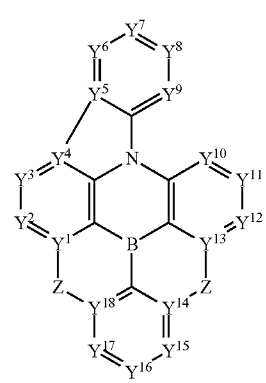

wherein $Y^1$-$Y^{18}$ are each independently selected from C, CR or N;

wherein $Y^4$ and $Y^5$ are carbon and connected by a C—C single bond, wherein Z is selected from $CR^{z1}R^{z2}$, $PR^z$, O, S or Se, two Z can be same or different;

wherein R, $R^{z1}$, $R^{z2}$ and $R^z$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

and wherein the compound is not a fullerene type compound.

According to an embodiment of the present invention, wherein the compound has a structure of Formula V or Formula VI:

Formula V

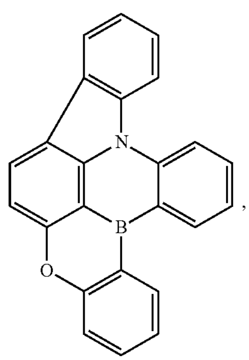

Formula VI

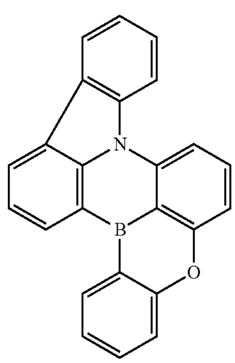

And, wherein in the structure of the Formula V or Formula VI, all the positions which can be substituted can optionally be substituted by any of the substituents consisting of deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

In this embodiment, in Formula V, for example, in the structure of the compound, all the positions which can be substituted are the positions marked with * as shown below. At all the positions which can be substituted, each independently can be optionally selected from, hydrogen (unsubstituted case), or any substituent of the groups described in the embodiments above (substituted case). Formula VI is same as Formula V.

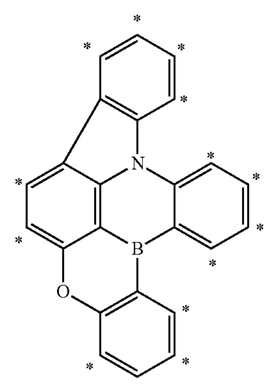

According to one embodiment of the present invention, wherein the compound is selected from the group consisting of:

Compound 1-1

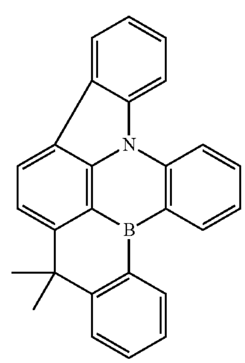

Compound 1-2
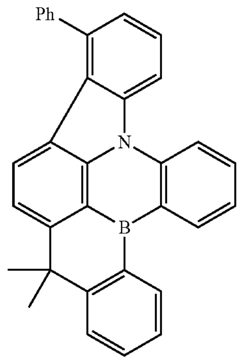
Compound 1-3
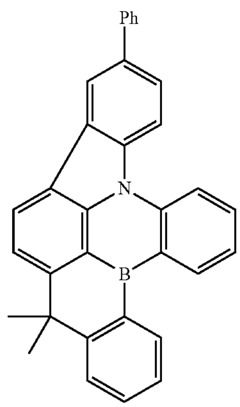
Compound 1-4
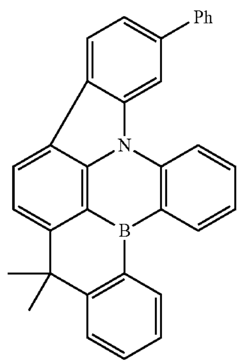
Compound 1-5
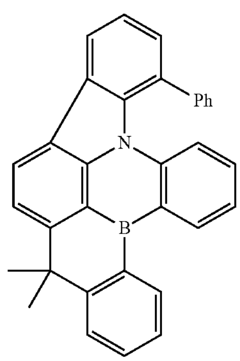
Compound 1-6
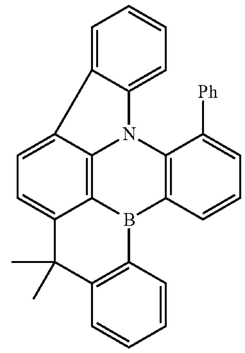
Compound 1-7
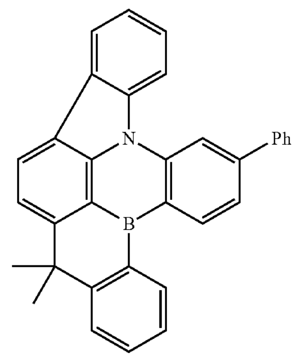
Compound 1-8
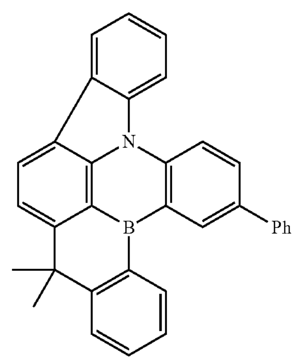
Compound 1-9
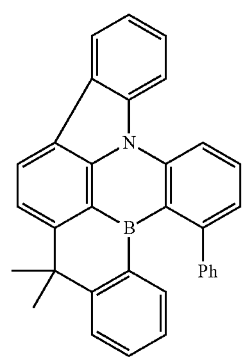

-continued
Compound 1-10
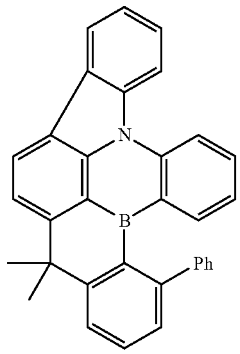
Compound 1-11
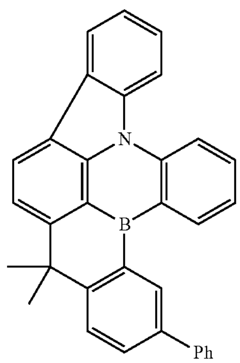
Compound 1-12
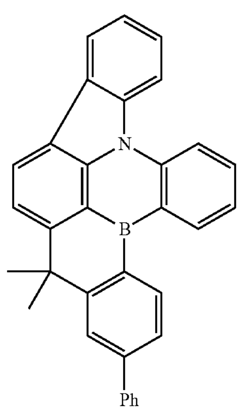
Compound 1-13
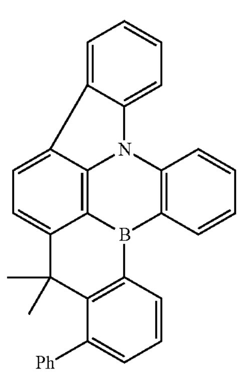
-continued
Compound 1-14
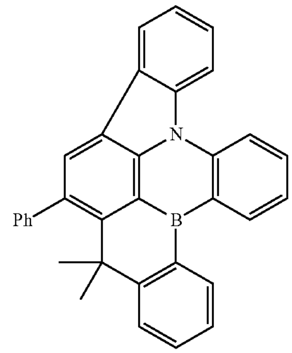
Compound 1-15
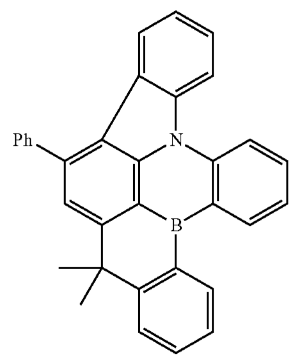
Compound 1-16
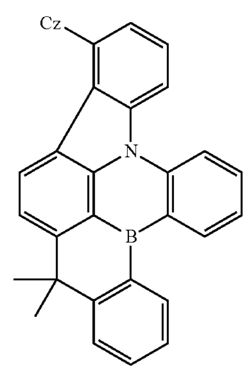
Compound 1-17
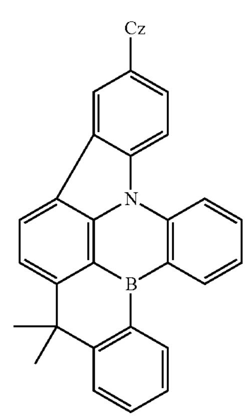

-continued
Compound 1-18
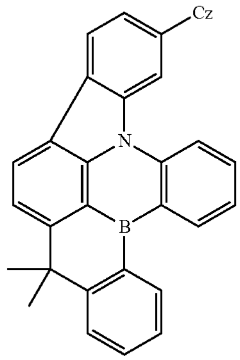
Compound 1-19
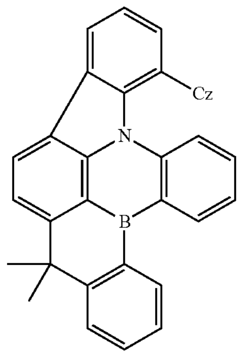
Compound 1-20
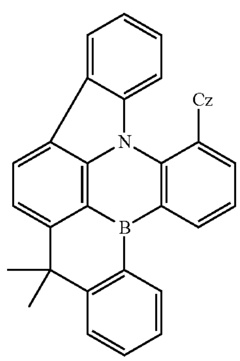
Compound 1-21
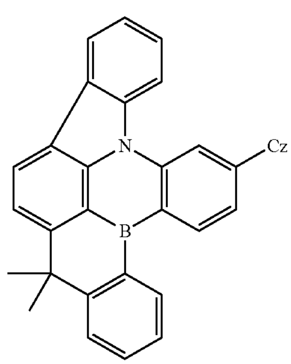
-continued
Compound 1-22
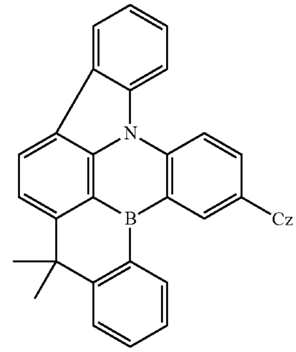
Compound 1-23
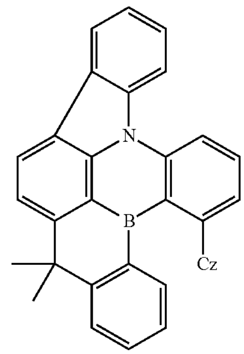
Compound 1-24
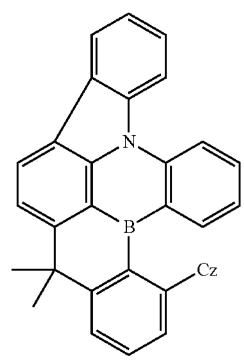
Compound 1-25
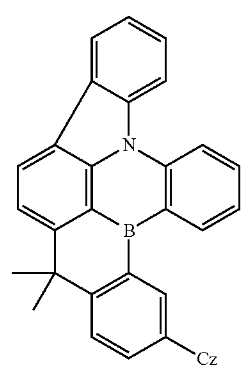

Compound 1-26
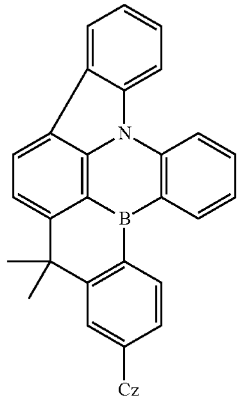
Compound 1-27
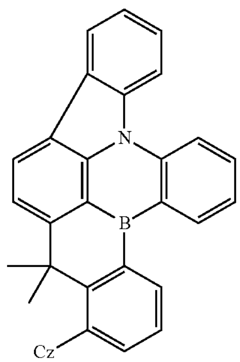
Compound 1-28
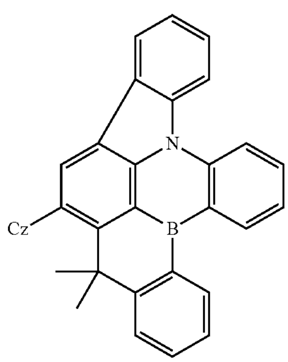
Compound 1-29
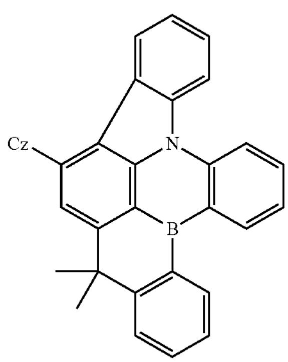
Compound 1-30
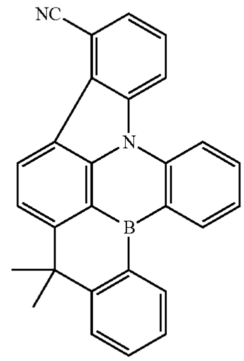
Compound 1-31
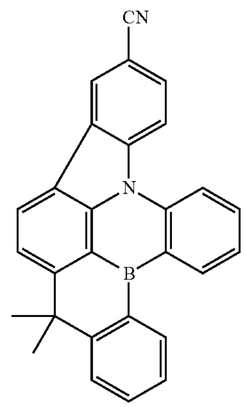
Compound 1-32
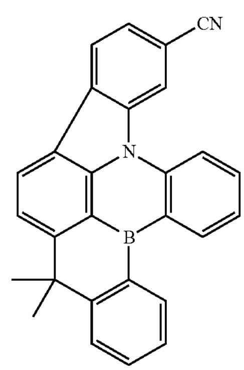
Compound 1-33
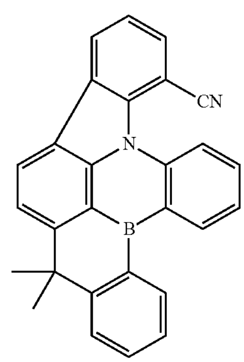

Compound 1-34
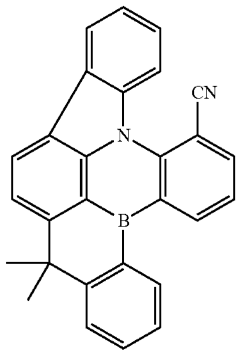
Compound 1-35
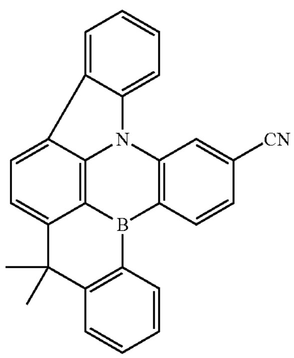
Compound 1-36
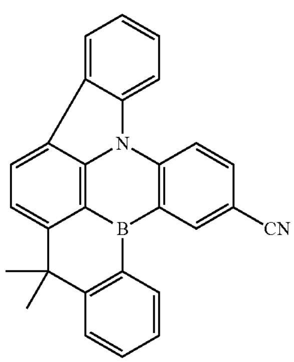
Compound 1-37
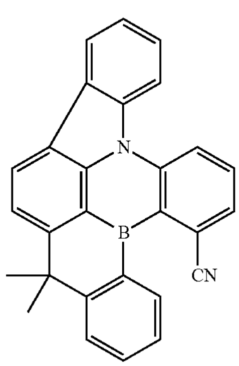
Compound 1-38
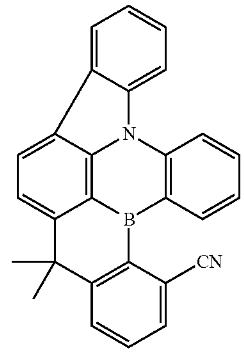
Compound 1-39
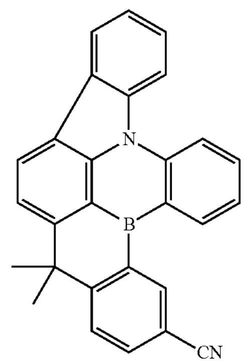
Compound 1-40
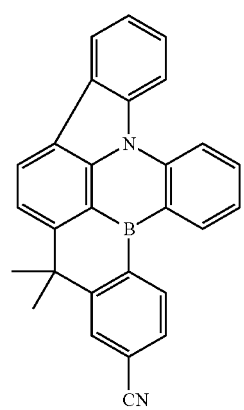
Compound 1-41
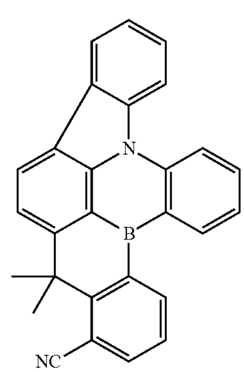

-continued
Compound 1-42
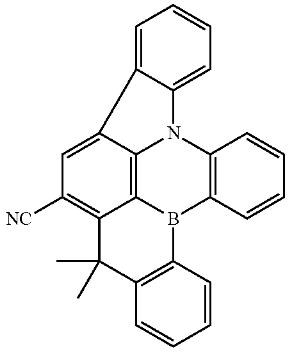
Compound 1-43
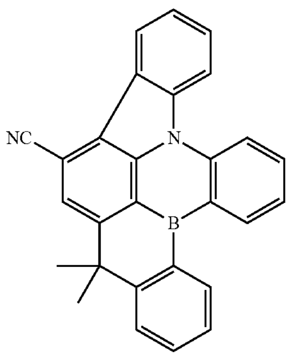
Compound 1-44
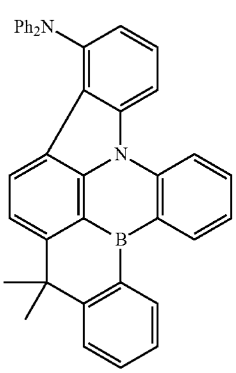
Compound 1-45
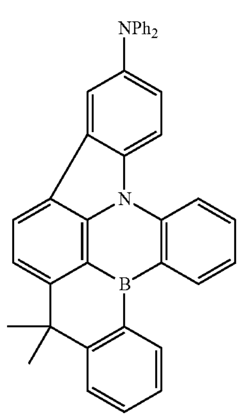
-continued
Compound 1-46
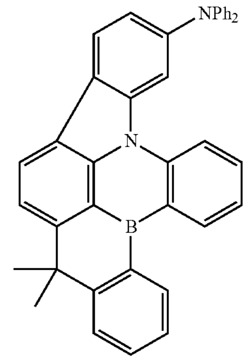
Compound 1-47
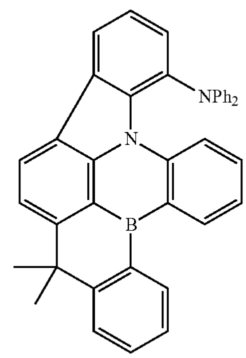
Compound 1-48
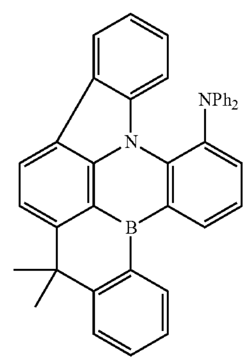
Compound 1-49
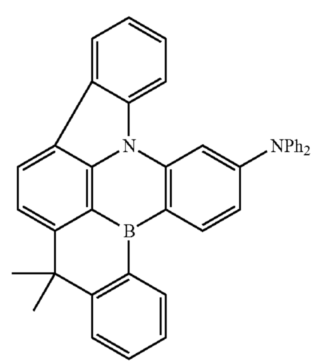

-continued
Compound 1-50
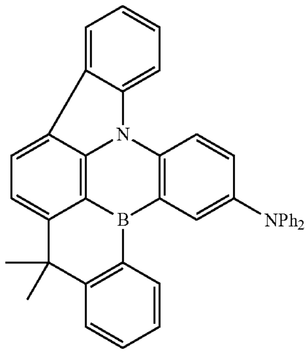
Compound 1-51
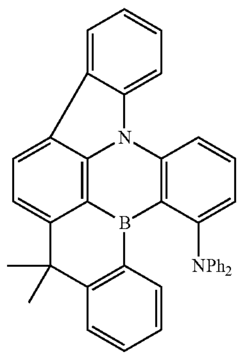
Compound 1-52
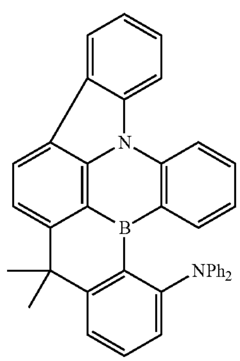
Compound 1-53
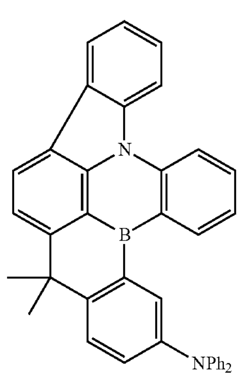
-continued
Compound 1-54
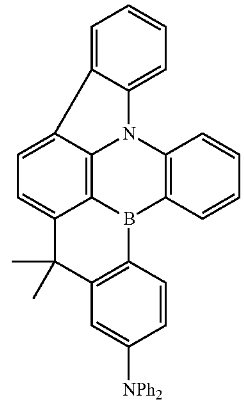
Compound 1-55
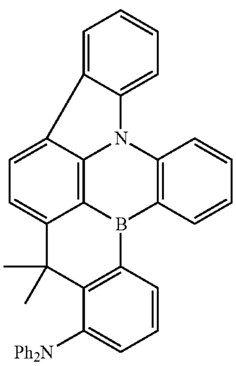
Compound 1-56
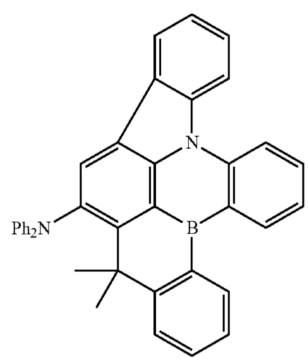
Compound 1-57
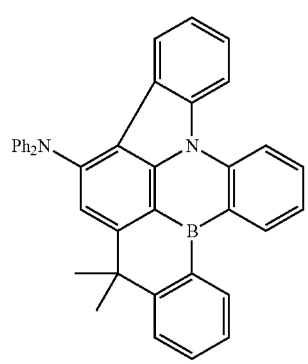

-continued
Compound 1-58
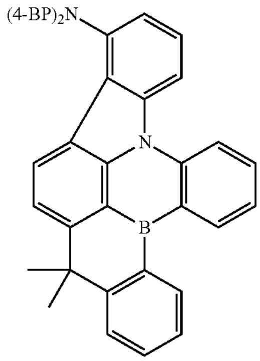
Compound 1-59
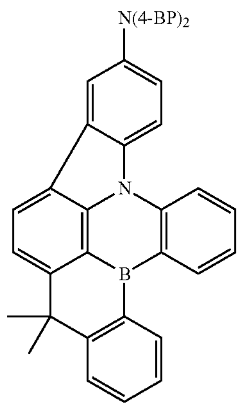
Compound 1-60
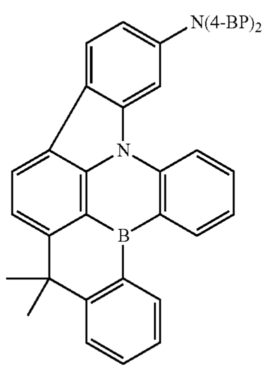
Compound 1-61
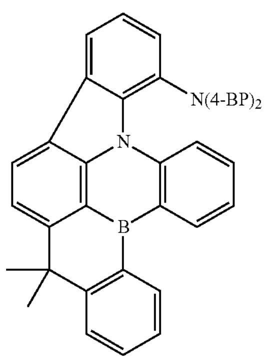
-continued
Compound 1-62
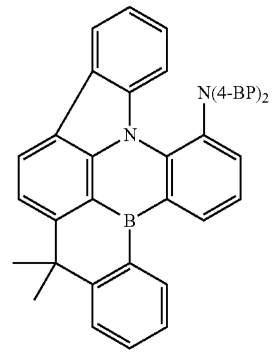
Compound 1-63
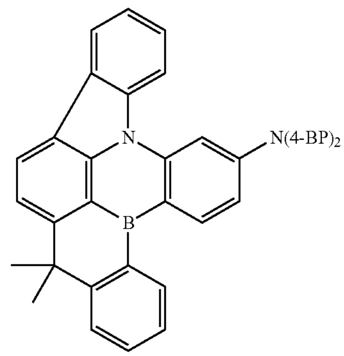
Compound 1-64
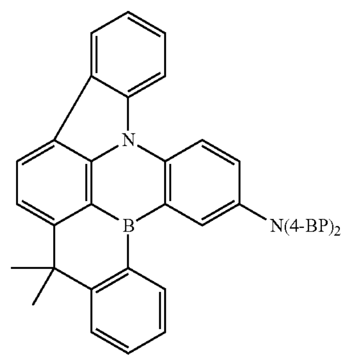
Compound 1-65
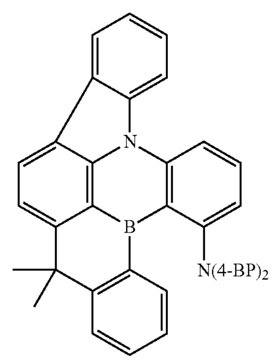

Compound 1-66
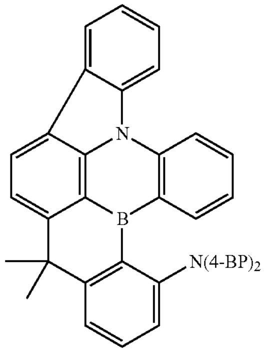
Compound 1-67
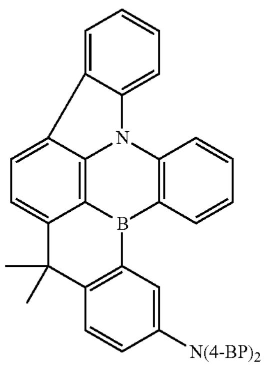
Compound 1-68
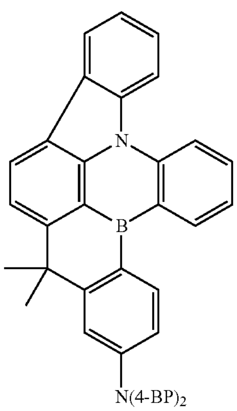
Compound 1-69
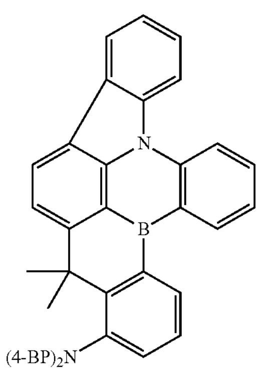
Compound 1-70
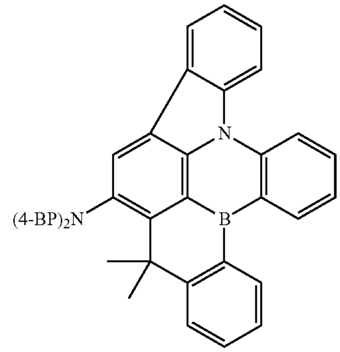
Compound 1-71
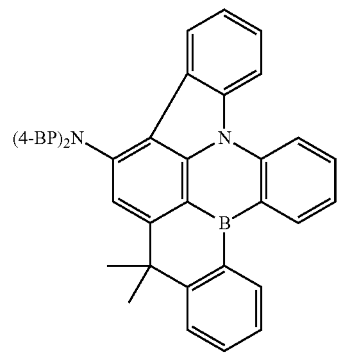
Compound 1-72
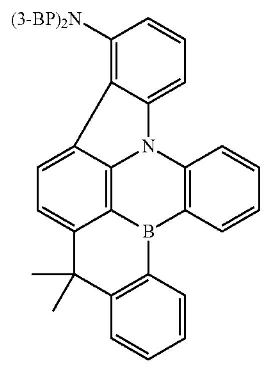
Compound 1-73
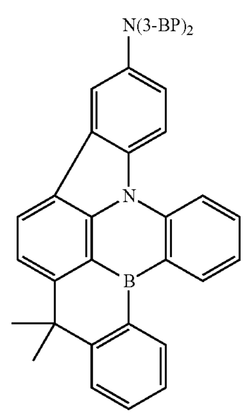

Compound 1-74
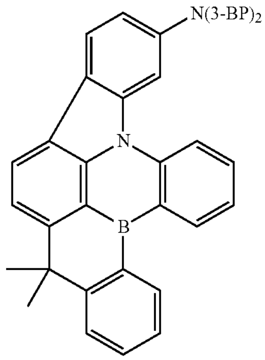
Compound 1-75
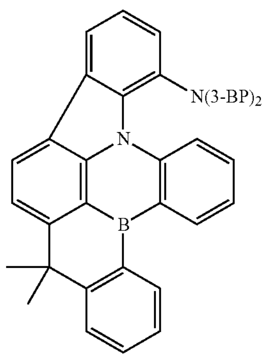
Compound 1-76
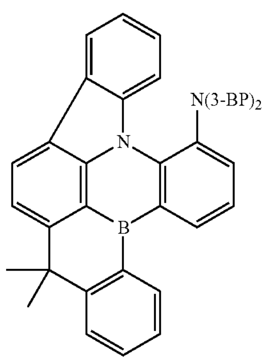
Compound 1-77
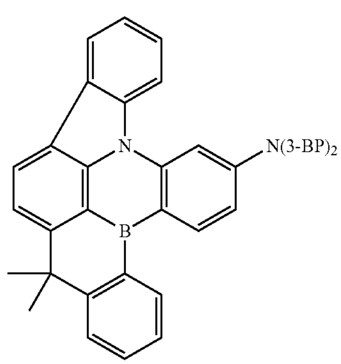
Compound 1-78
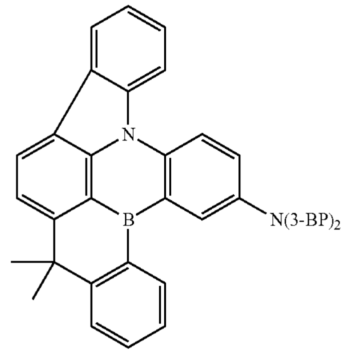
Compound 1-79
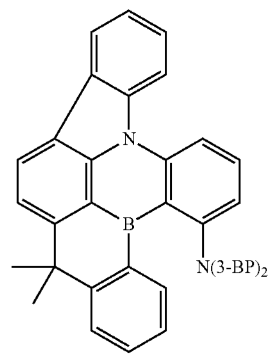
Compound 1-80
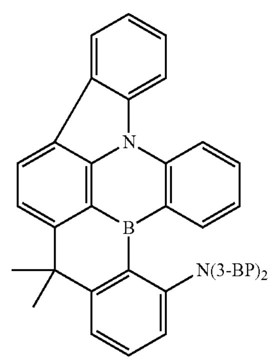
Compound 1-81
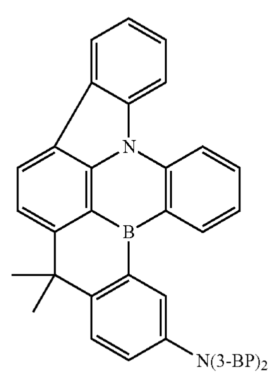

Compound 1-82
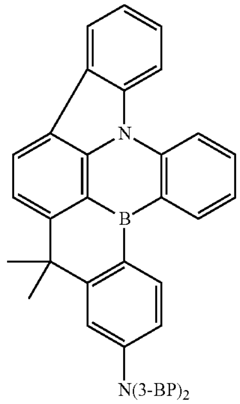
Compound 1-83
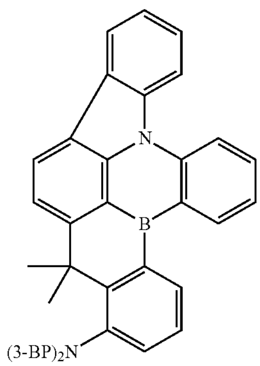
Compound 1-84
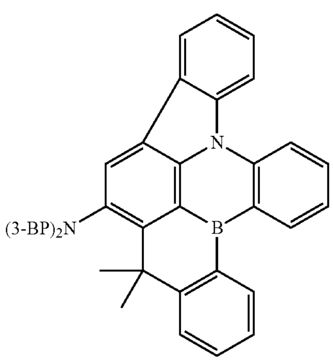
Compound 1-85
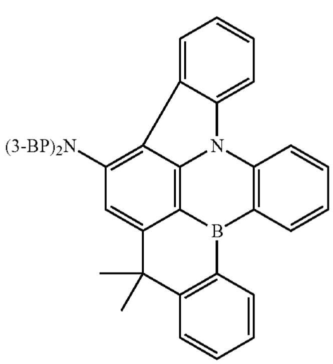
Compound 1-86
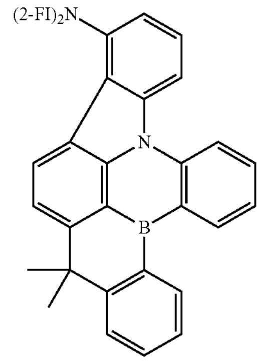
Compound 1-87
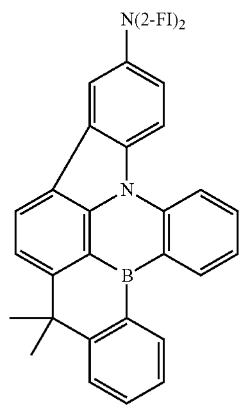
Compound 1-88
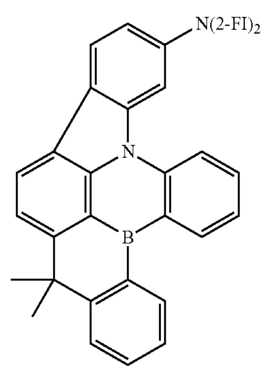
Compound 1-89
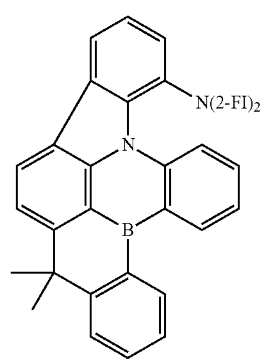

-continued
Compound 1-90
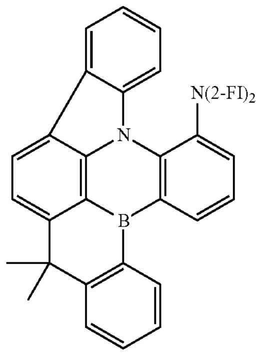
Compound 1-91
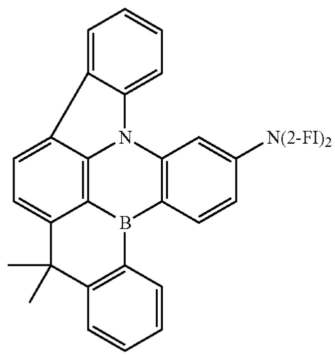
Compound 1-92
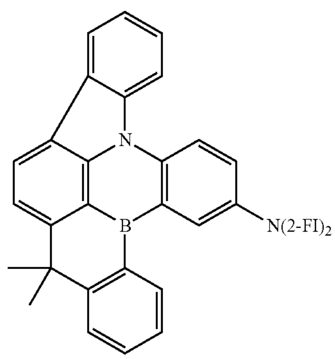
Compound 1-93
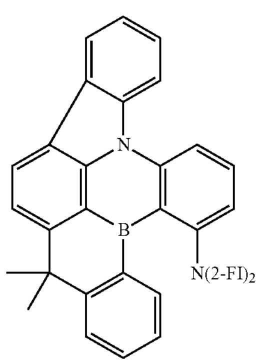
-continued
Compound 1-94
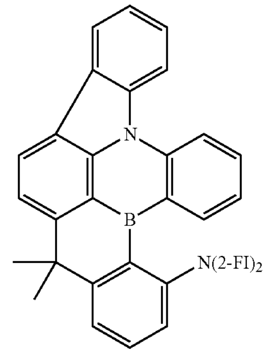
Compound 1-95
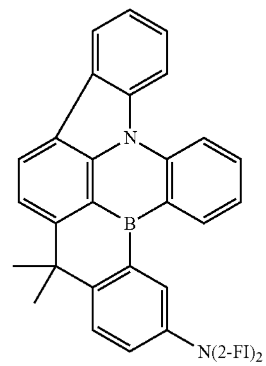
Compound 1-96
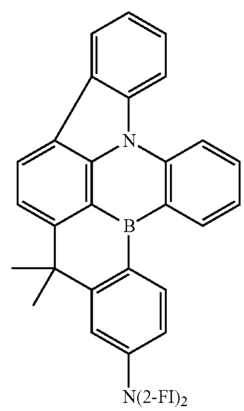
Compound 1-97
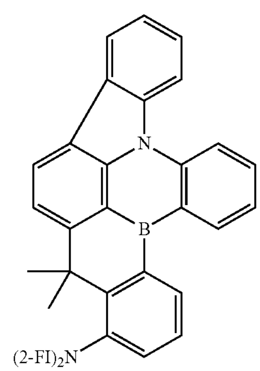

Compound 1-98
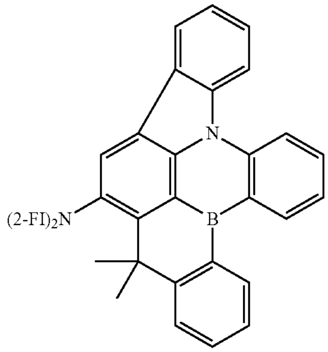
Compound 1-99
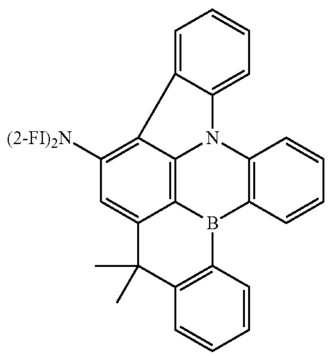
Compound 1-100
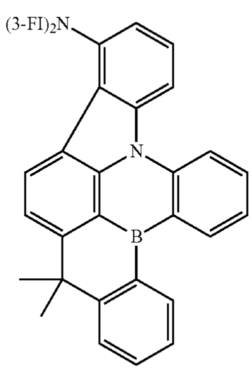
Compound 1-101
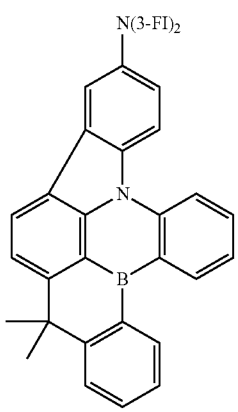
Compound 1-102
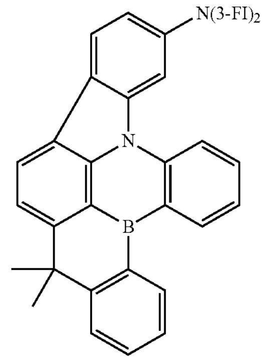
Compound 1-103
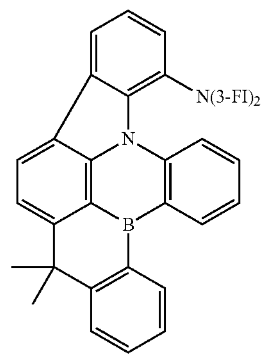
Compound 1-104
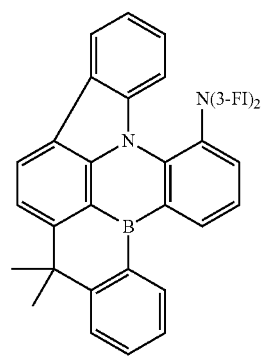
Compound 1-105
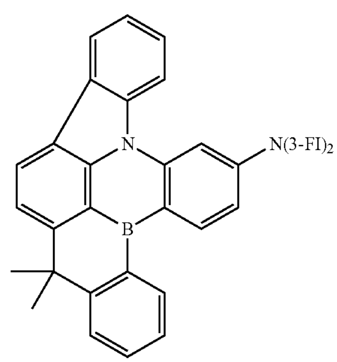

-continued
Compound 1-106
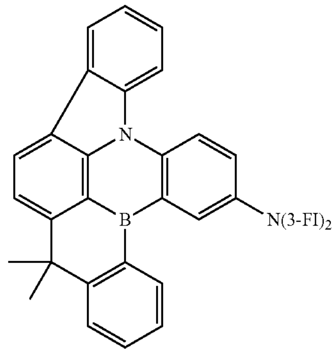
Compound 1-107
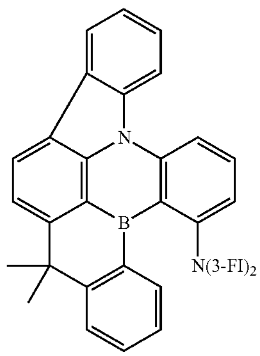
Compound 1-108
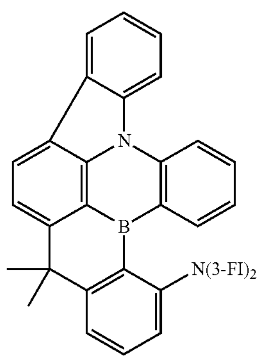
Compound 1-109
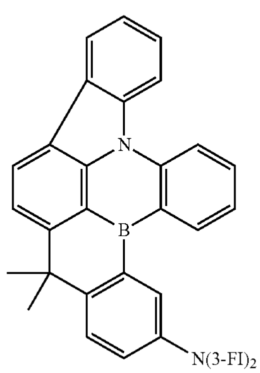
-continued
Compound 1-110
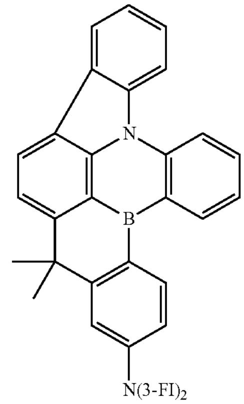
Compound 1-111
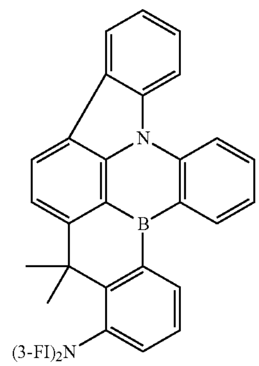
Compound 1-112
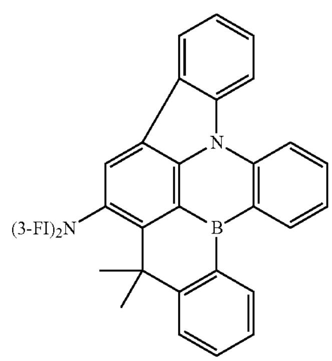
Compound 1-113
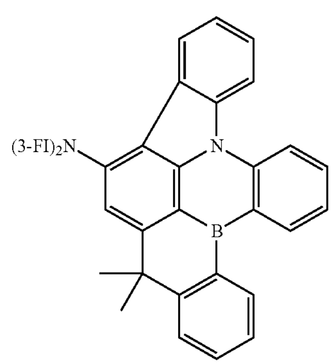

-continued
Compound 1-114
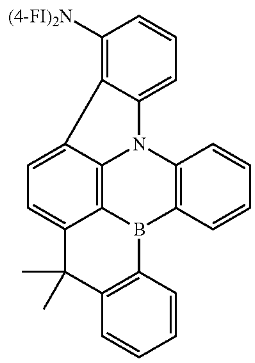
Compound 1-115
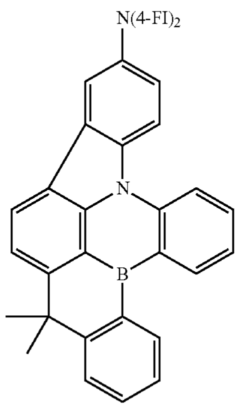
Compound 1-116
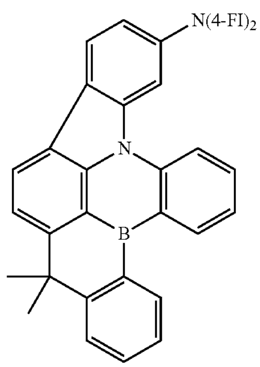
Compound 1-117
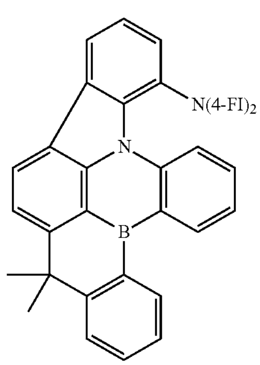
-continued
Compound 1-118
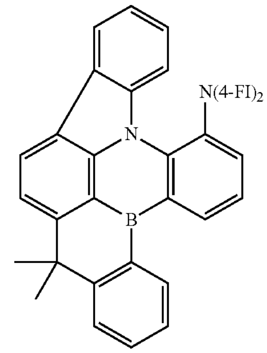
Compound 1-119
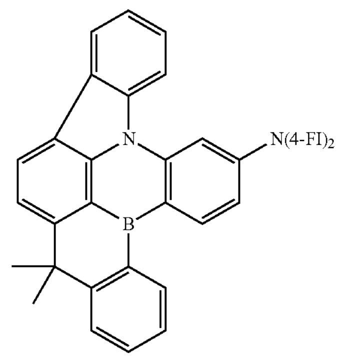
Compound 1-120
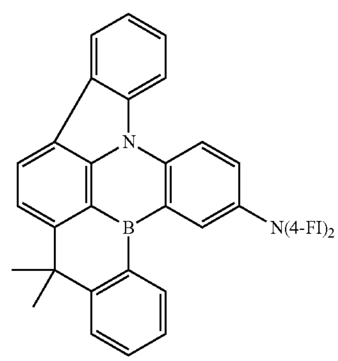
Compound 1-121
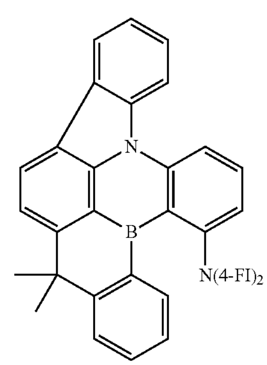

-continued
Compound 1-122
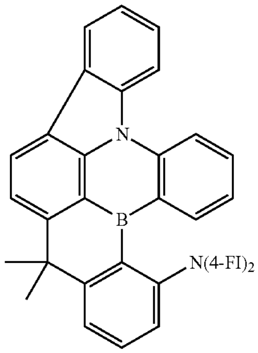
Compound 1-123
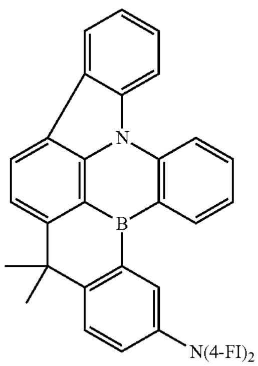
Compound 1-124
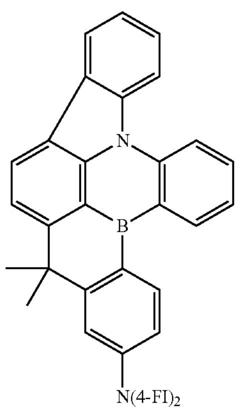
Compound 1-125
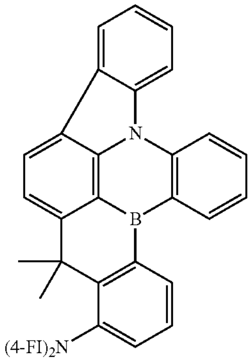
-continued
Compound 1-126
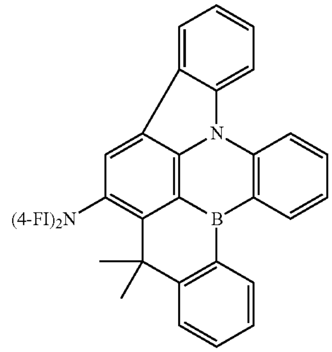
Compound 1-127
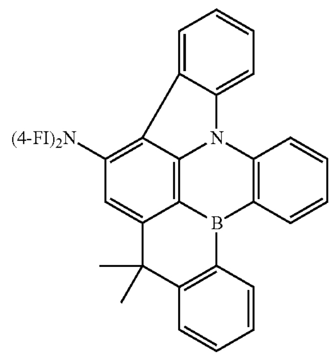
Compound 1-128
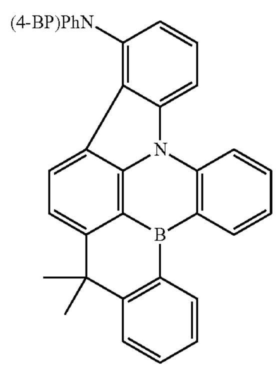
Compound 1-129
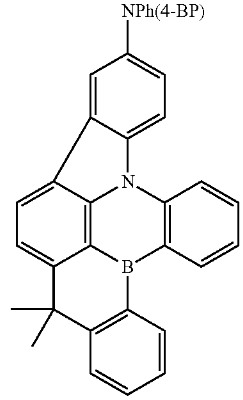

Compound 1-130
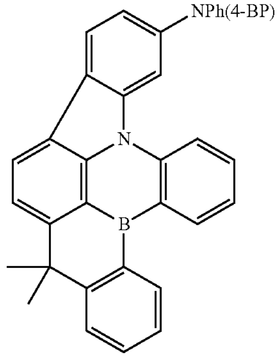
Compound 1-131
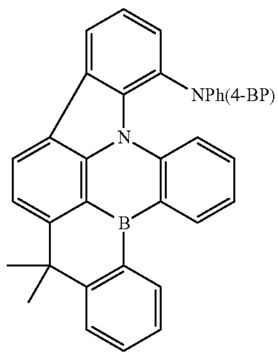
Compound 1-132
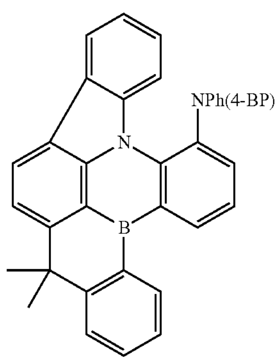
Compound 1-133
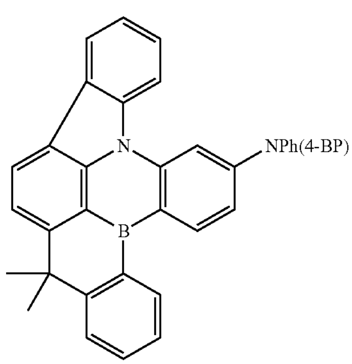
Compound 1-134
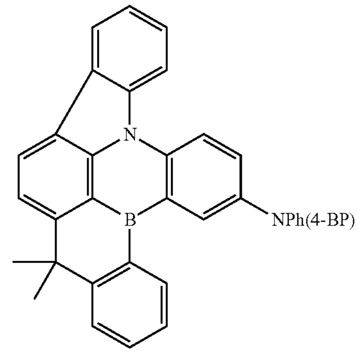
Compound 1-135
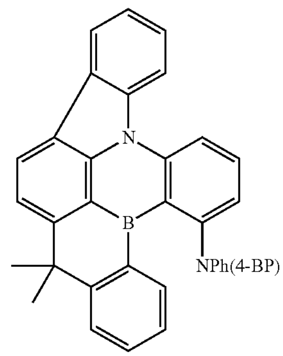
Compound 1-136
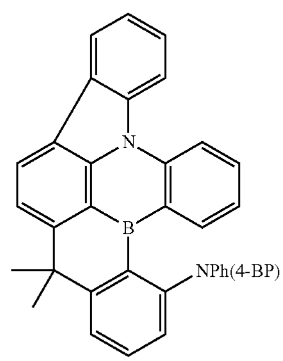
Compound 1-137
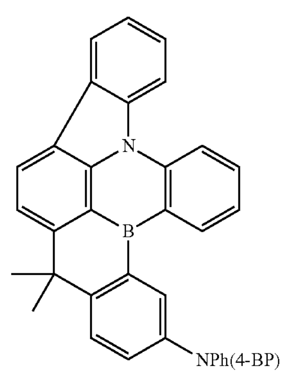

-continued
Compound 1-138
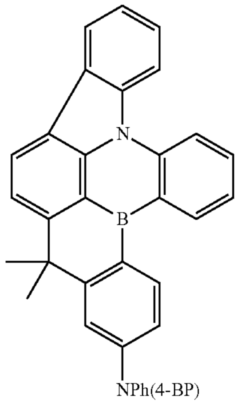
Compound 1-139
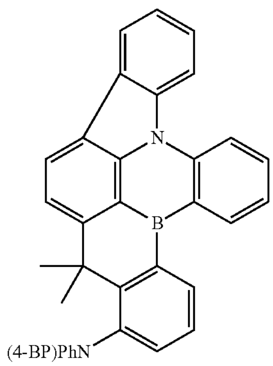
Compound 1-140
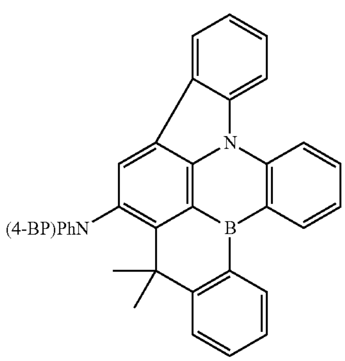
Compound 1-141
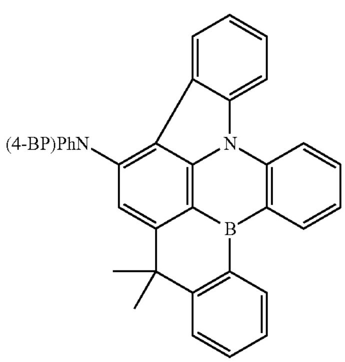
-continued
Compound 1-142
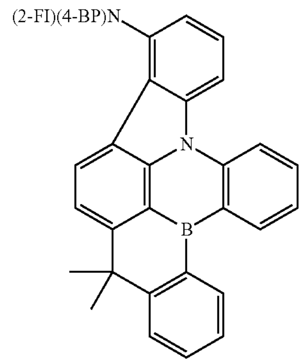
Compound 1-143
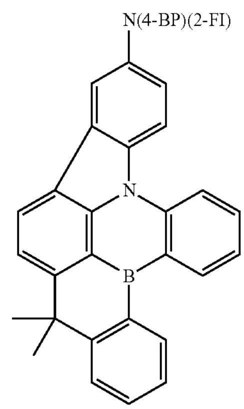
Compound 1-144
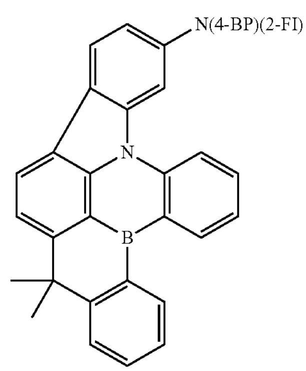
Compound 1-145
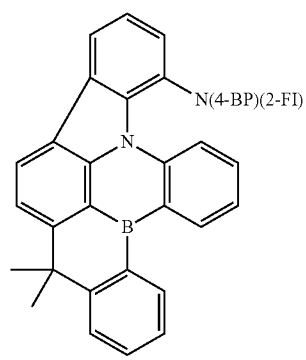

Compound 1-146
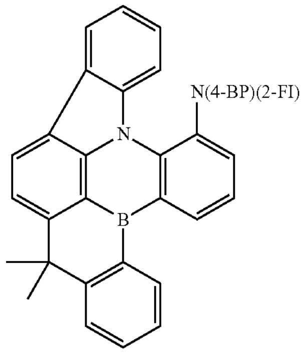
Compound 1-147
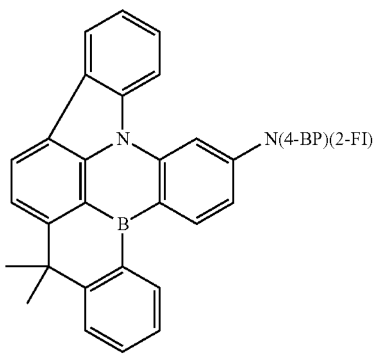
Compound 1-148
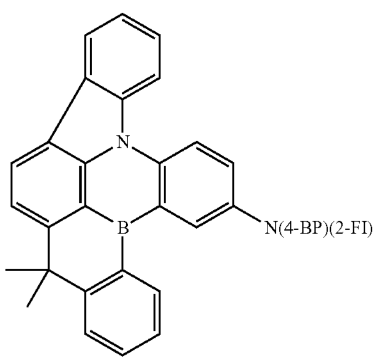
Compound 1-149
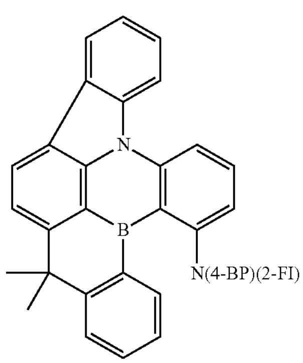
Compound 1-150
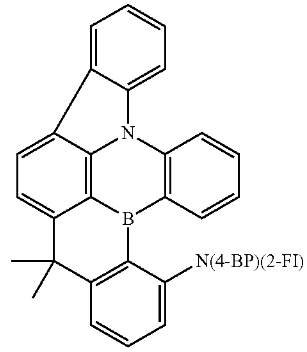
Compound 1-151
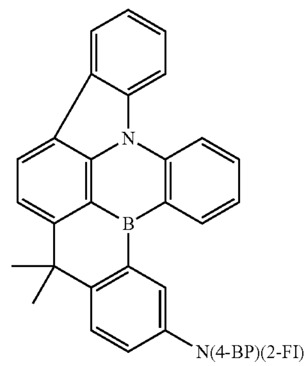
Compound 1-152
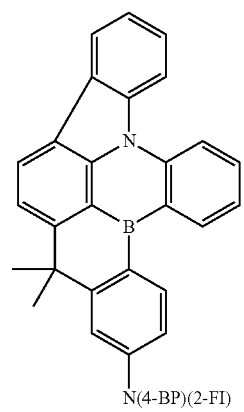
Compound 1-153
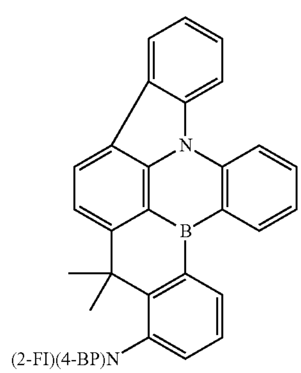

Compound 1-154
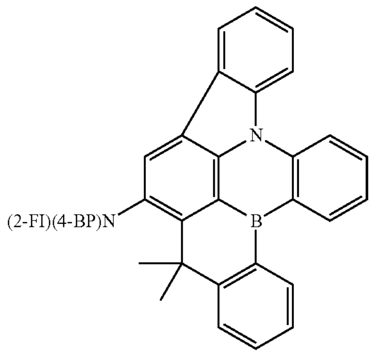
Compound 1-155
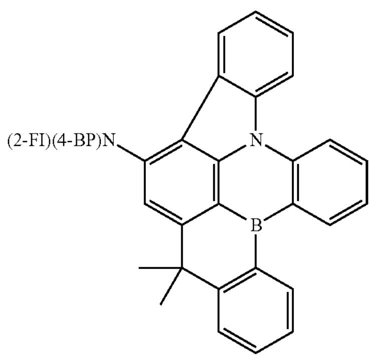
Compound 1-156
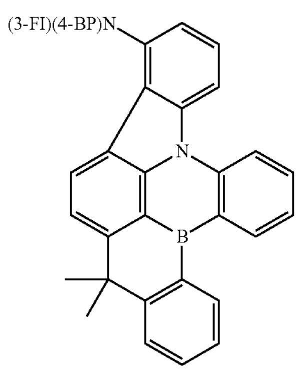
Compound 1-157
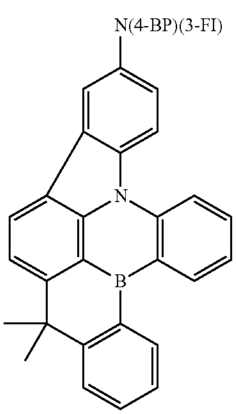
Compound 1-158
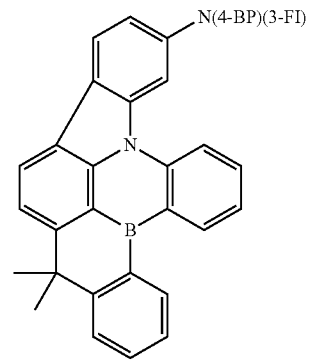
Compound 1-159
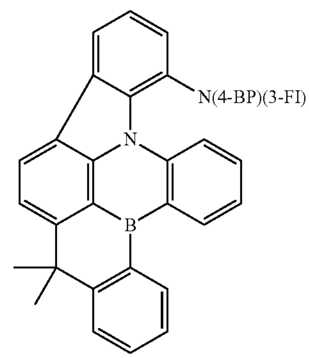
Compound 1-160
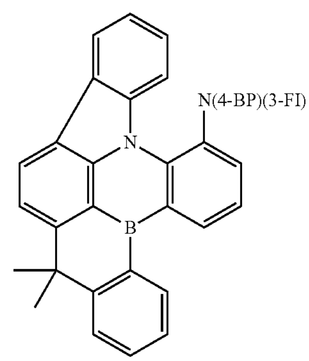
Compound 1-161
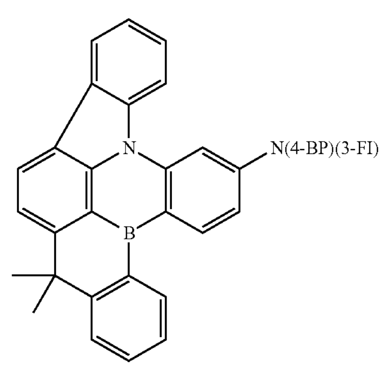

Compound 1-162
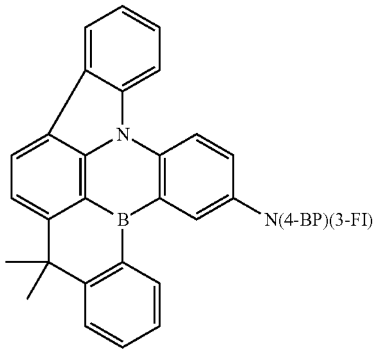
Compound 1-163
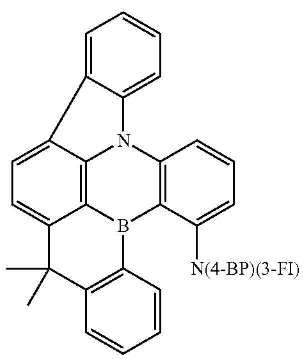
Compound 1-164
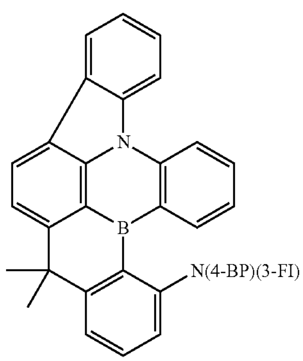
Compound 1-165
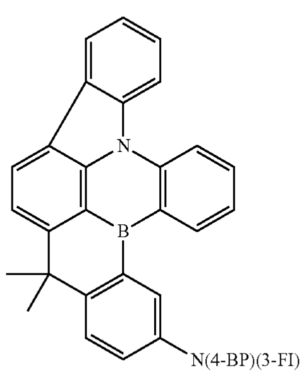
Compound 1-166
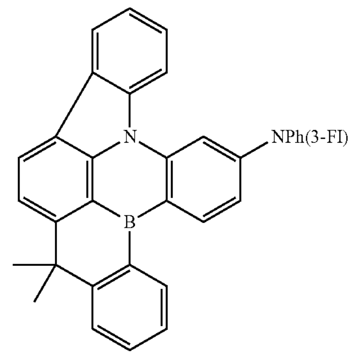
Compound 1-167
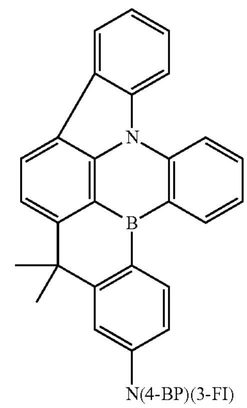
Compound 1-168
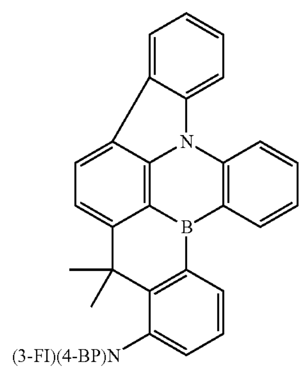
Compound 1-169
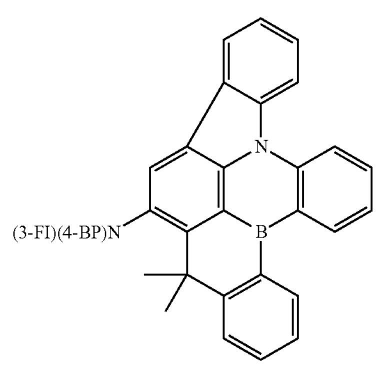

Compound 1-170
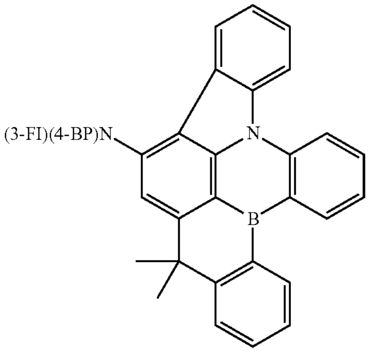
Compound 1-171
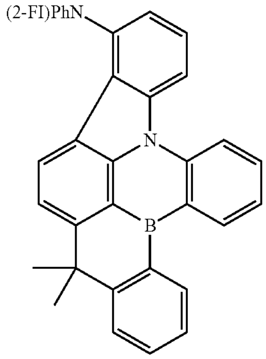
Compound 1-172
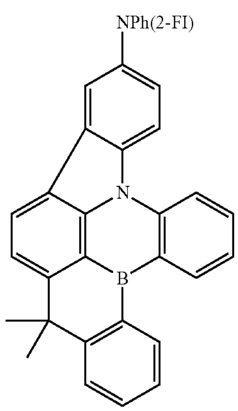
Compound 1-173
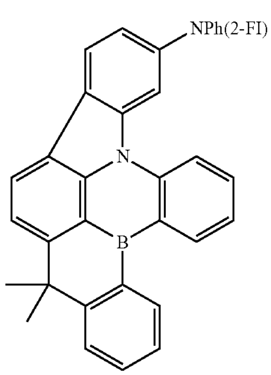
Compound 1-174
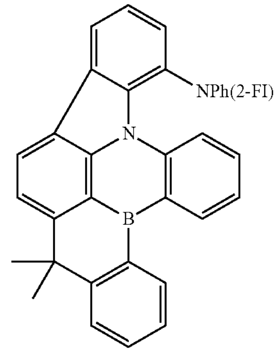
Compound 1-175
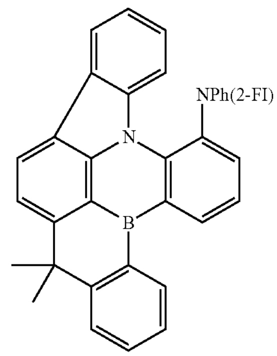
Compound 1-176
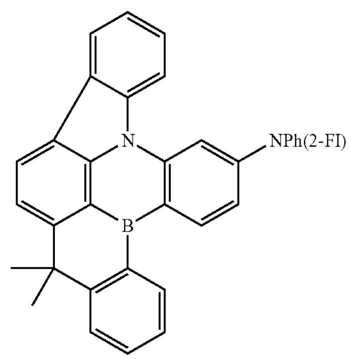
Compound 1-177
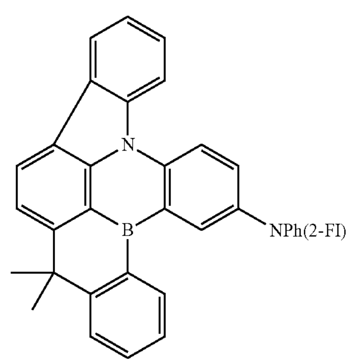

-continued
Compound 1-178
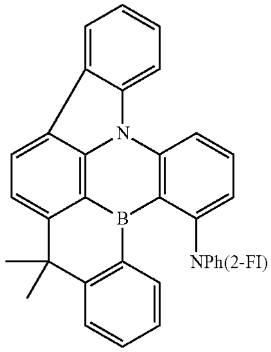
Compound 1-179
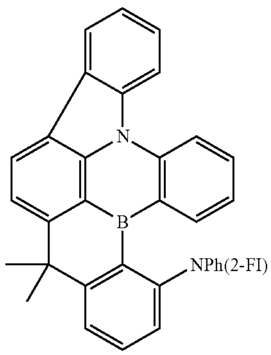
Compound 1-180
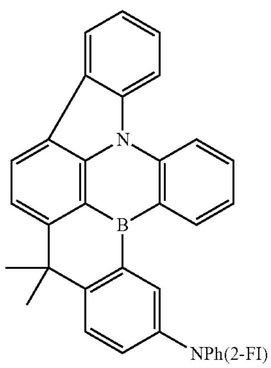
Compound 1-181
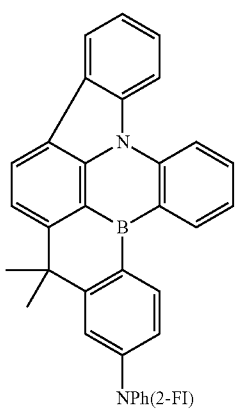
-continued
Compound 1-182
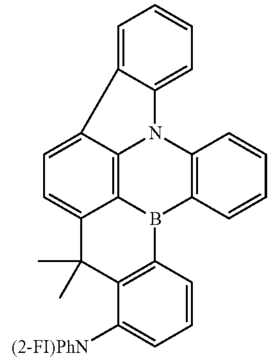
Compound 1-183
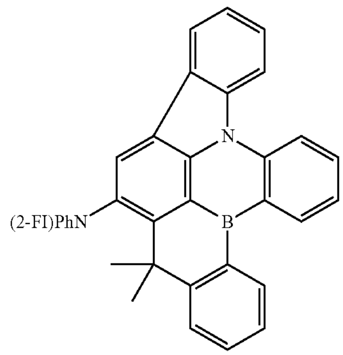
Compound 1-184
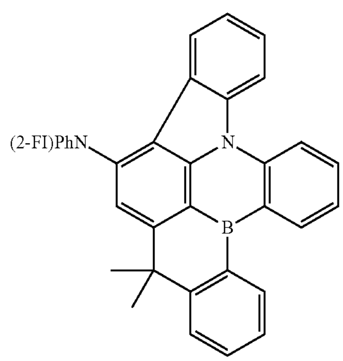
Compound 1-185
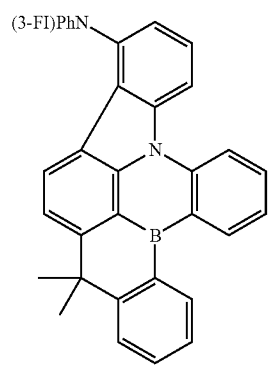

Compound 1-186
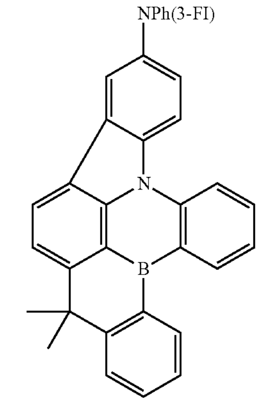
Compound 1-187
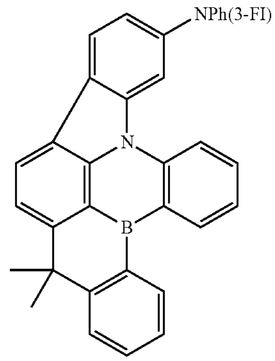
Compound 1-188
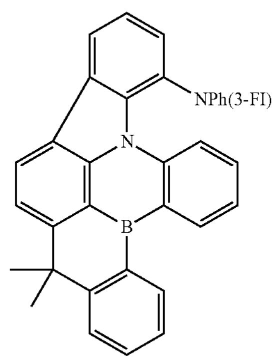
Compound 1-189
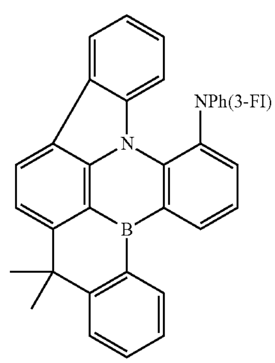
Compound 1-190
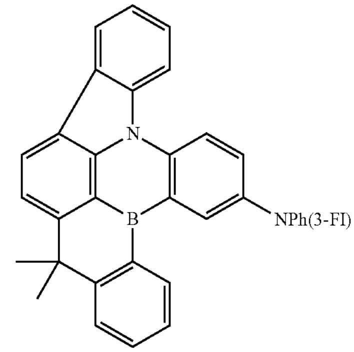
Compound 1-191
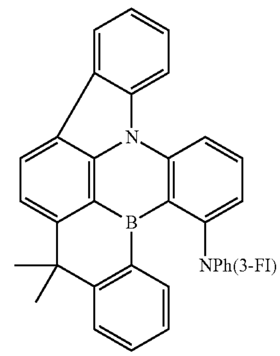
Compound 1-192
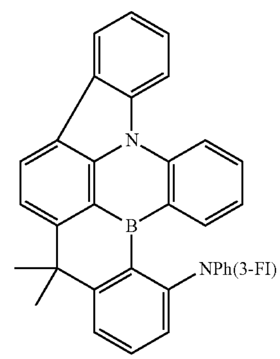
Compound 1-193
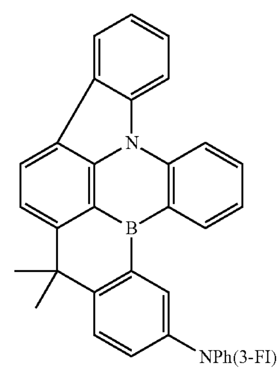

-continued
Compound 1-194
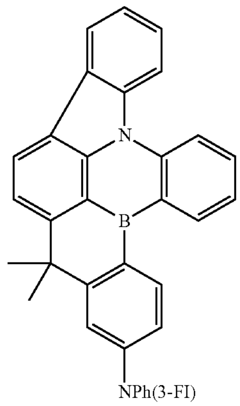
Compound 1-195
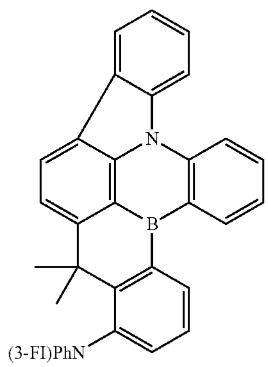
Compound 1-196
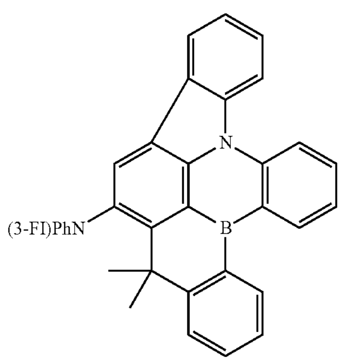
Compound 1-197
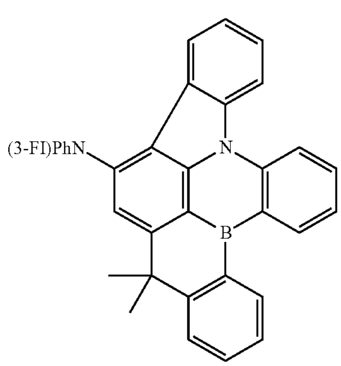
-continued
Compound 1-198
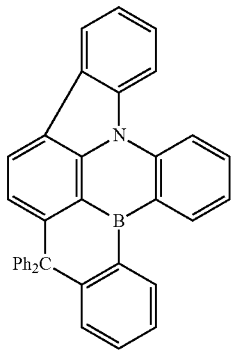
Compound 1-199
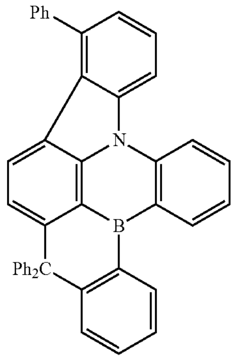
Compound 1-200
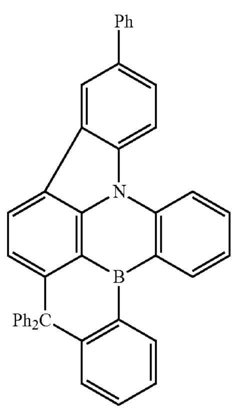
Compound 1-201
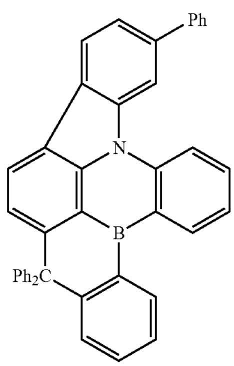

-continued
Compound 1-202
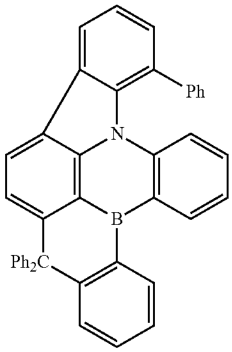
Compound 1-203
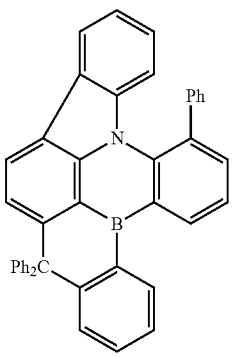
Compound 1-204
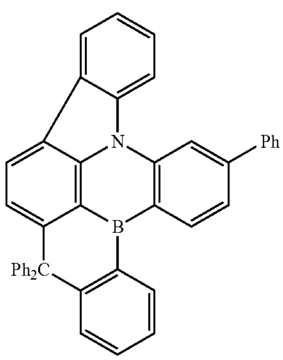
Compound 1-205
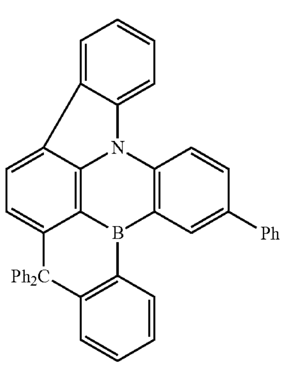
-continued
Compound 1-206
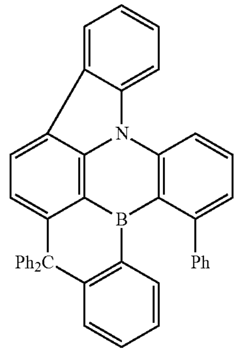
Compound 1-207
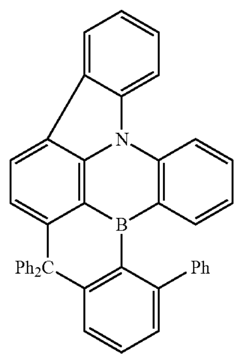
Compound 1-208
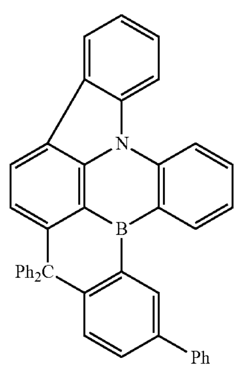
Compound 1-209
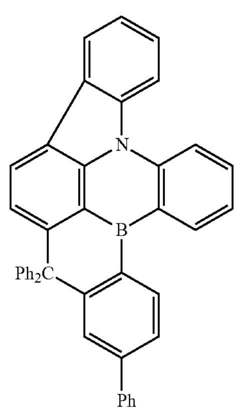

-continued
Compound 1-210
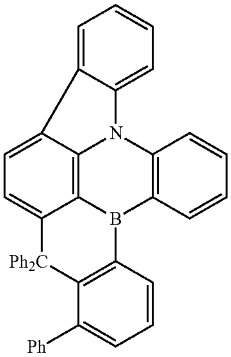
Compound 1-211
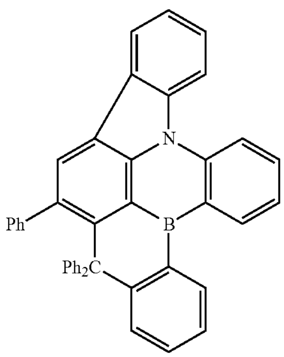
Compound 1-212
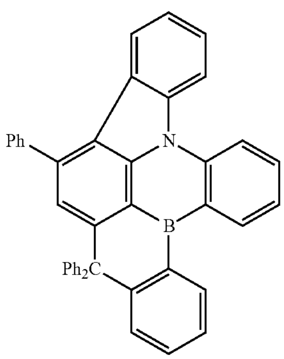
Compound 1-213
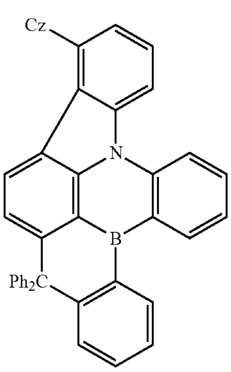
-continued
Compound 1-214
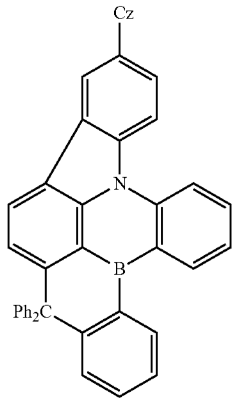
Compound 1-215
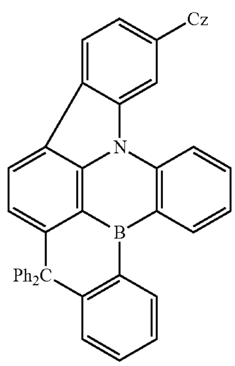
Compound 1-216
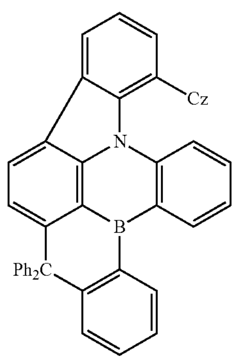
Compound 1-217
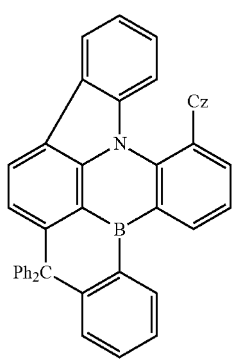

Compound 1-218
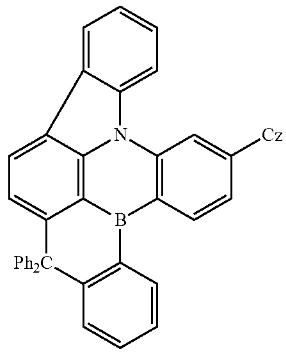
Compound 1-219
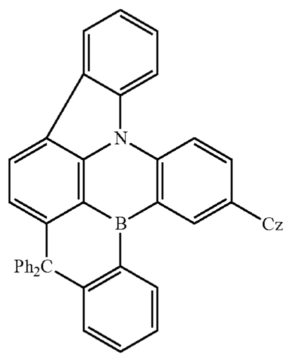
Compound 1-220
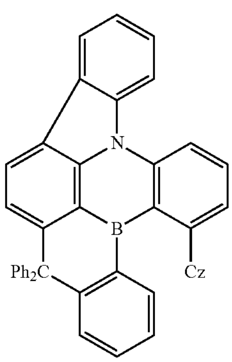
Compound 1-221
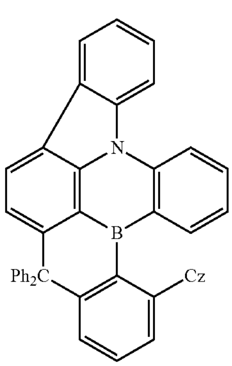
Compound 1-222
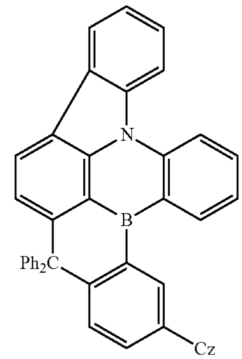
Compound 1-223
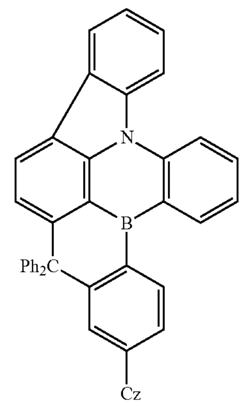
Compound 1-224
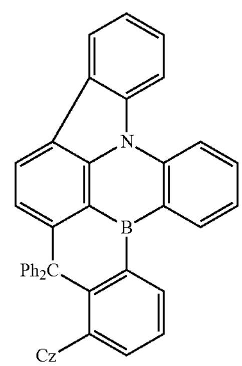
Compound 1-225
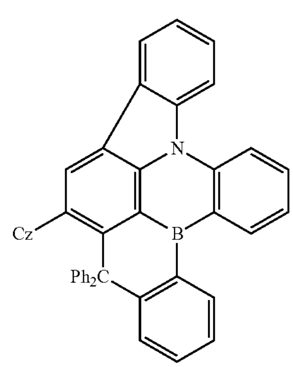

-continued
Compound 1-226
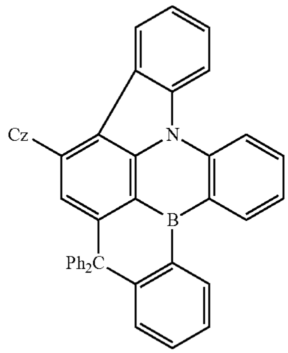
Compound 1-227
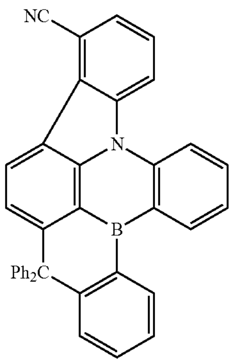
Compound 1-228
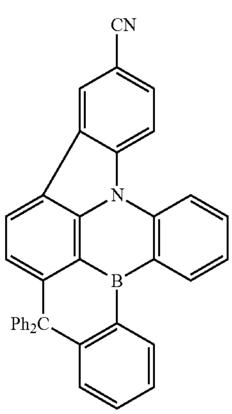
Compound 1-229
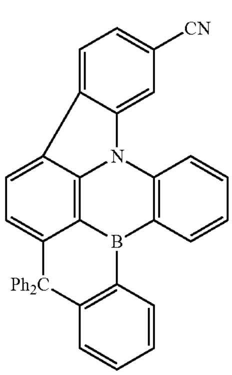
-continued
Compound 1-230
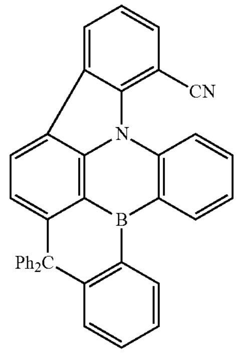
Compound 1-231
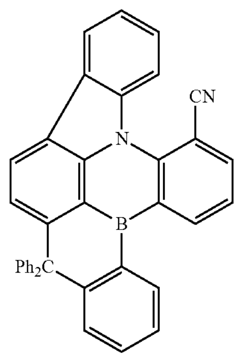
Compound 1-232
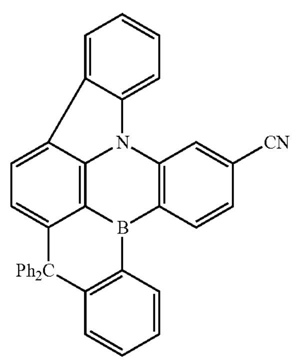
Compound 1-233
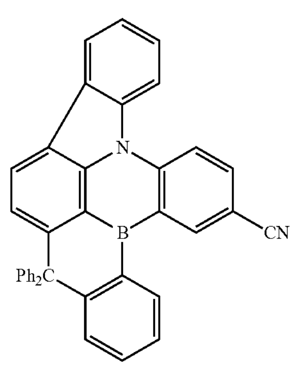

-continued
Compound 1-234
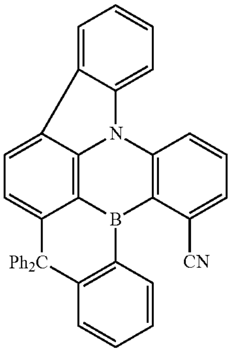
Compound 1-235
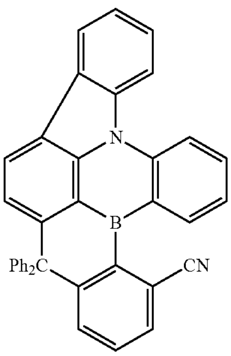
Compound 1-236
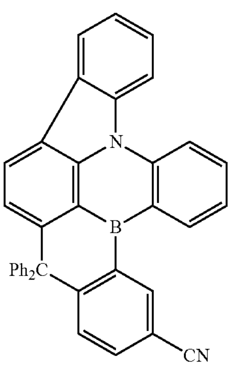
Compound 1-237
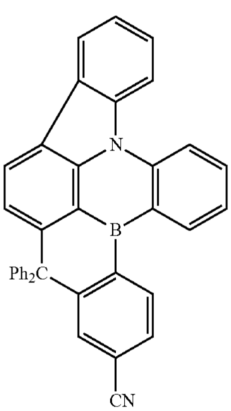
-continued
Compound 1-238
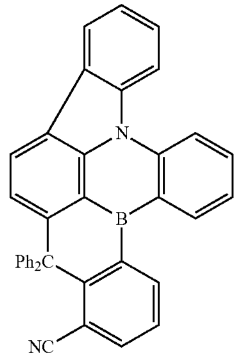
Compound 1-239
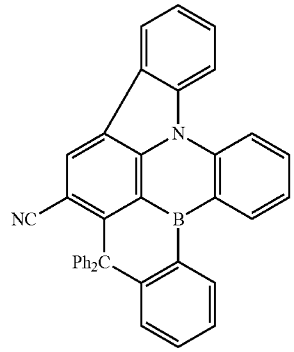
Compound 1-240
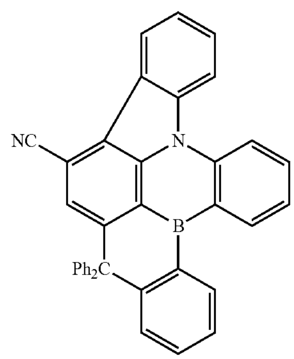
Compound 1-241
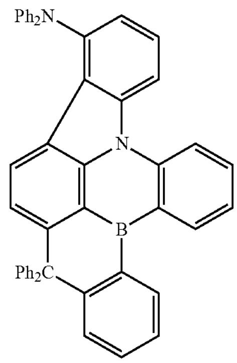

-continued
Compound 1-242
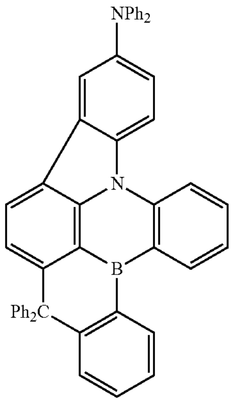
Compound 1-243
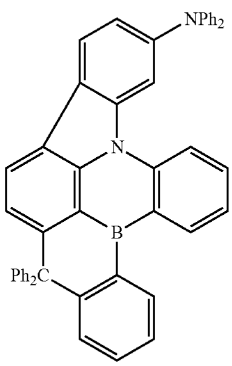
Compound 1-244
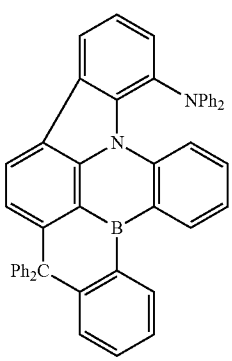
Compound 1-245
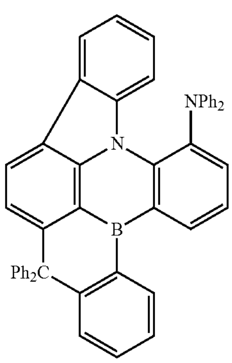
-continued
Compound 1-246
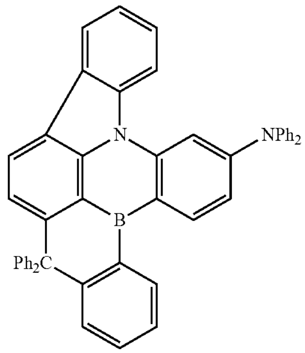
Compound 1-247
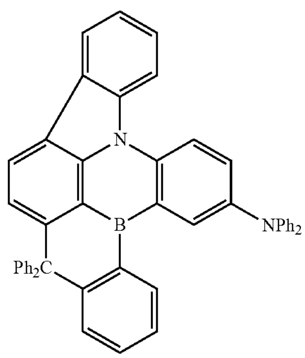
Compound 1-248
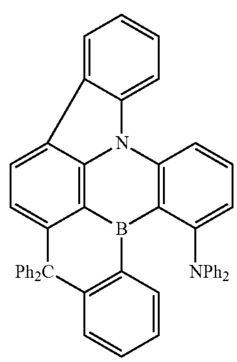
Compound 1-249
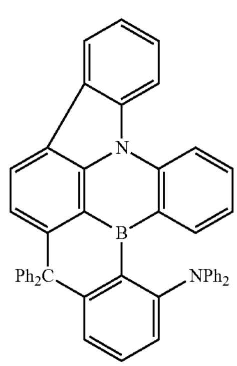

Compound 1-250
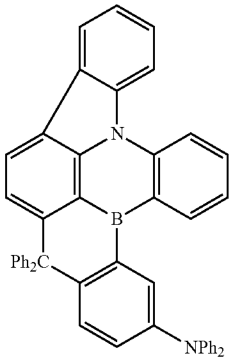
Compound 1-251
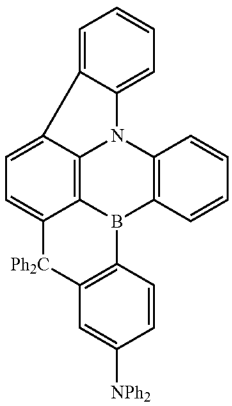
Compound 1-252
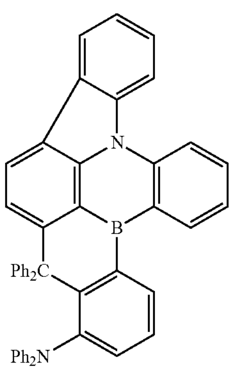
Compound 1-253
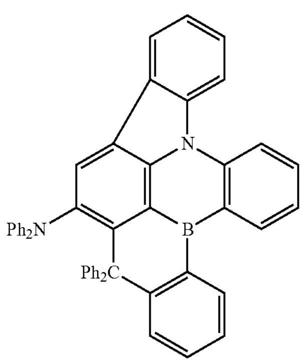
Compound 1-254
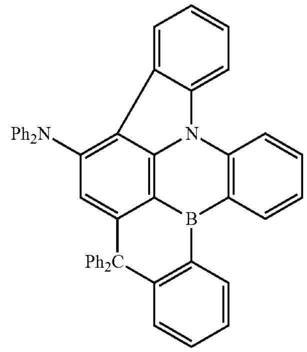
Compound 1-255
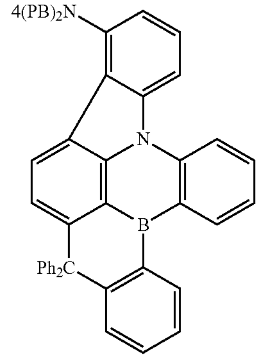
Compound 1-256
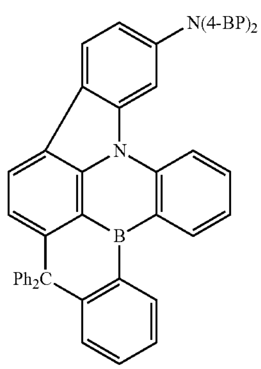
Compound 1-257
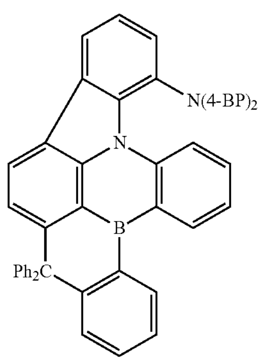

Compound 1-258
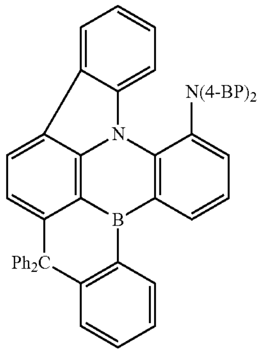
Compound 1-259
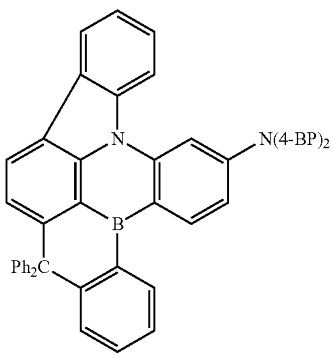
Compound 1-260
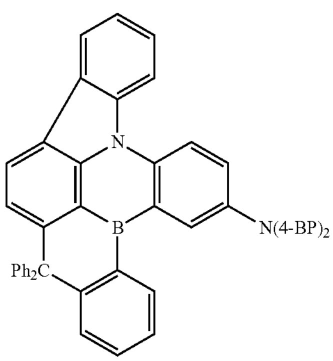
Compound 1-261
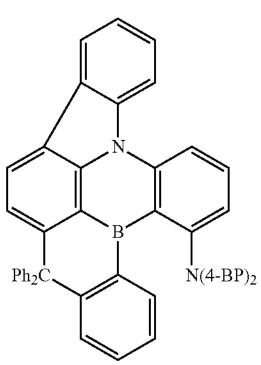
Compound 1-262
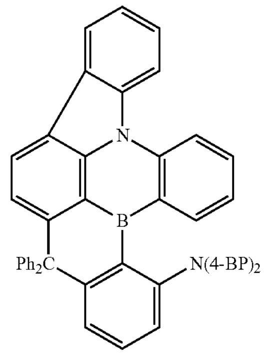
Compound 1-263
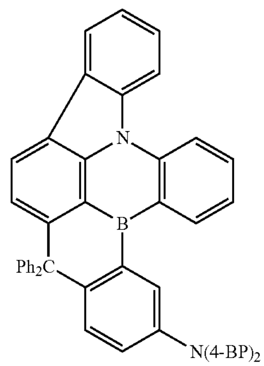
Compound 1-264
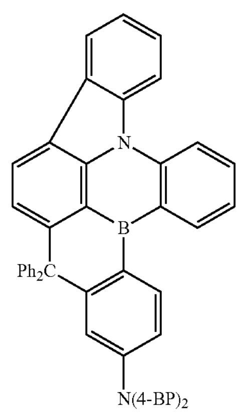
Compound 1-265
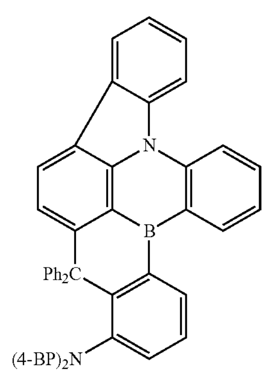

Compound 1-266
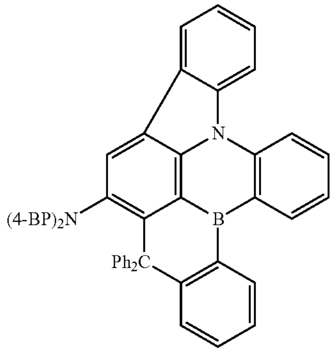
Compound 1-267
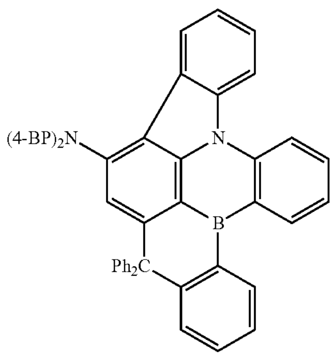
Compound 1-268
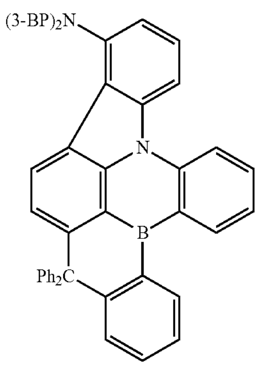
Compound 1-269
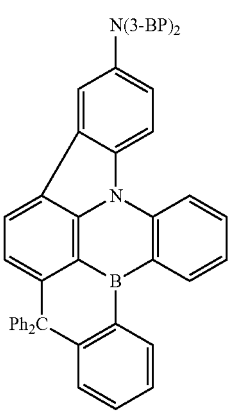
Compound 1-270
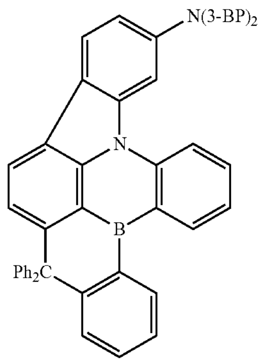
Compound 1-271
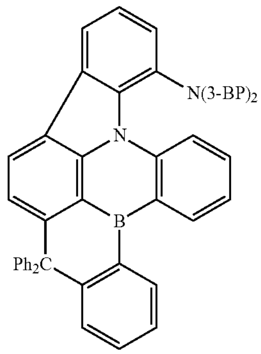
Compound 1-272
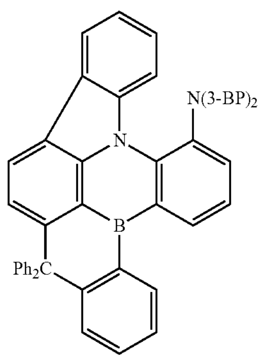
Compound 1-273
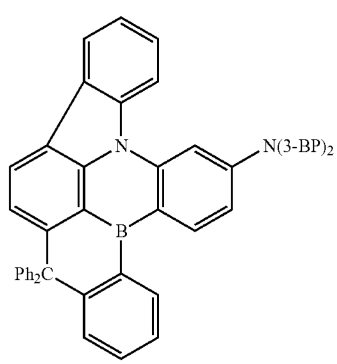

Compound 1-274
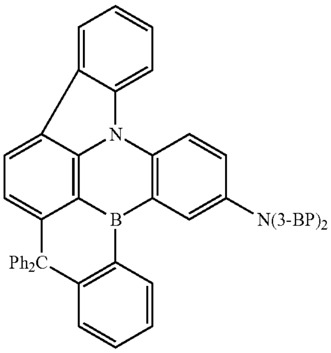
Compound 1-275
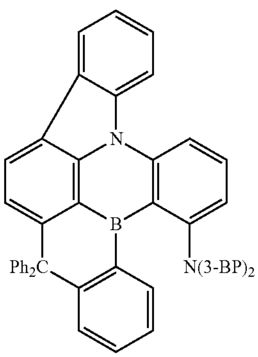
Compound 1-276
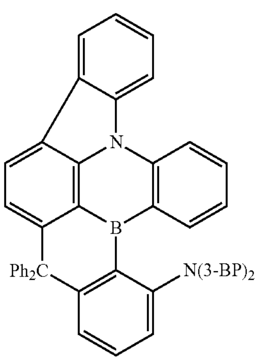
Compound 1-277
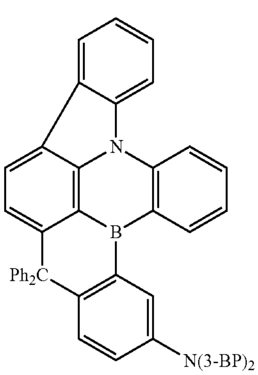
Compound 1-278
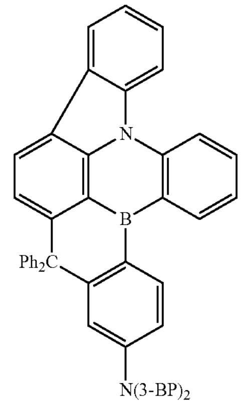
Compound 1-279
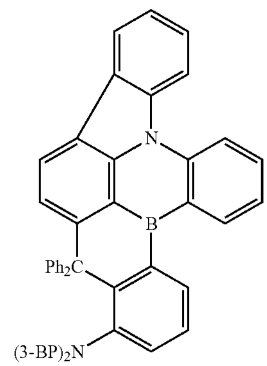
Compound 1-280
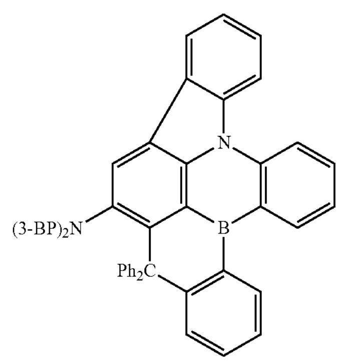
Compound 1-281
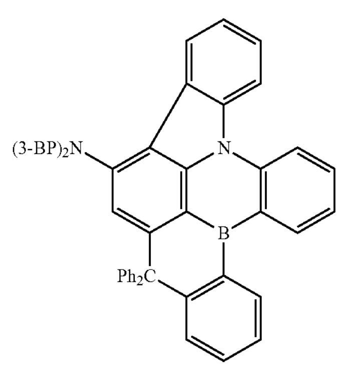

Compound 1-282
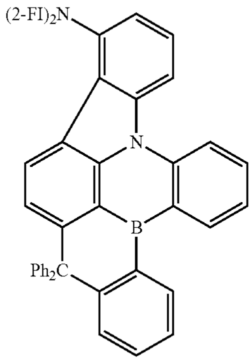
Compound 1-283
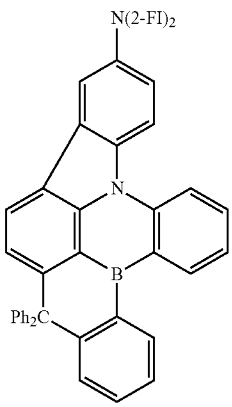
Compound 1-284
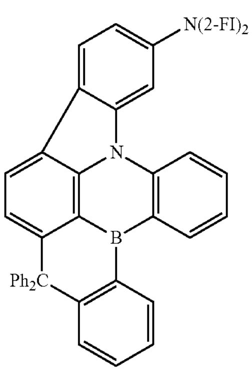
Compound 1-285
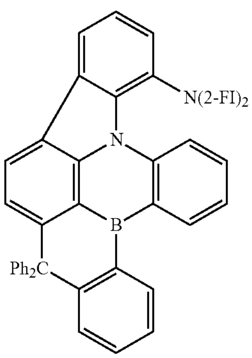
Compound 1-286
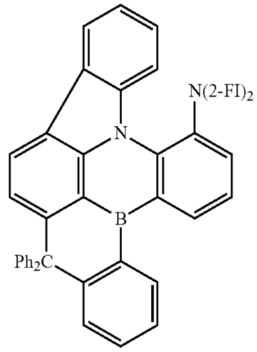
Compound 1-287
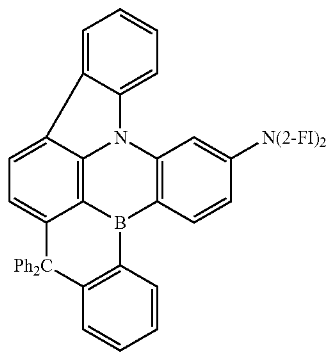
Compound 1-288
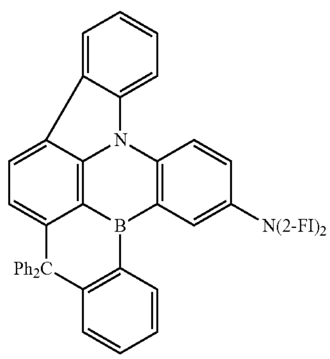
Compound 1-289
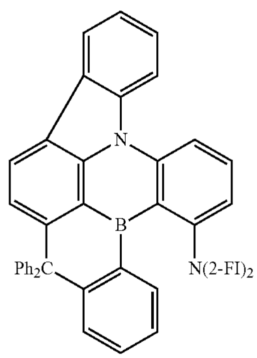

Compound 1-290
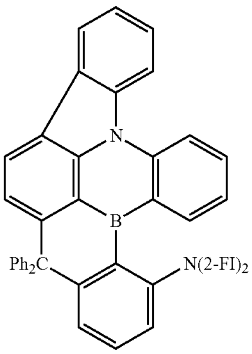
Compound 1-291
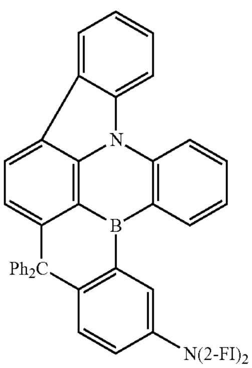
Compound 1-292
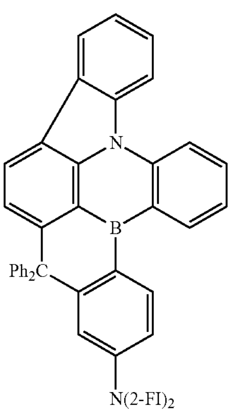
Compound 1-293
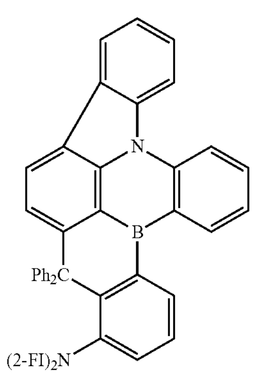
Compound 1-294
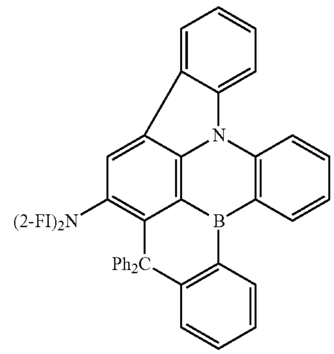
Compound 1-295
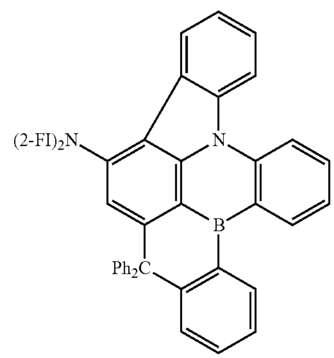
Compound 1-296
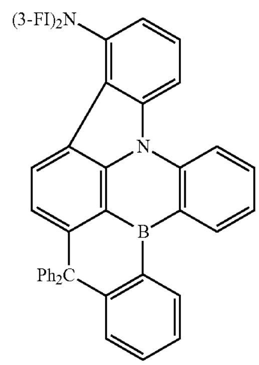
Compound 1-297
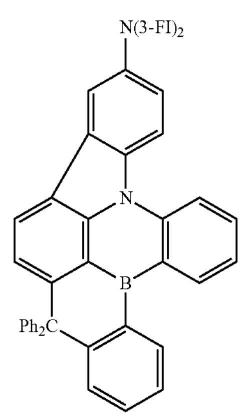

-continued
Compound 1-298
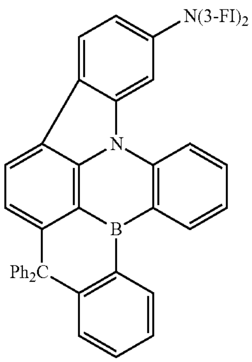
Compound 1-299
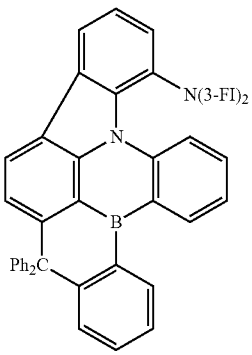
Compound 1-300
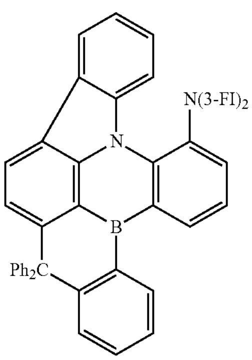
Compound 1-301
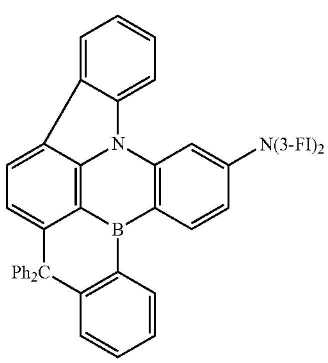
-continued
Compound 1-302
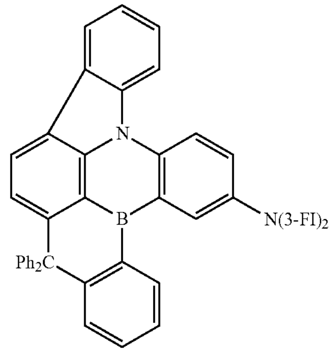
Compound 1-303
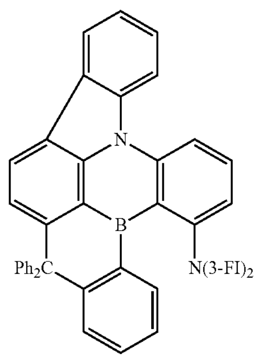
Compound 1-304
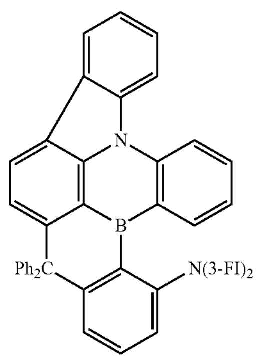
Compound 1-305
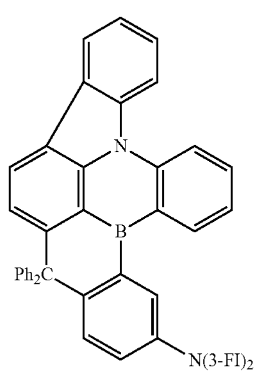

-continued
Compound 1-306
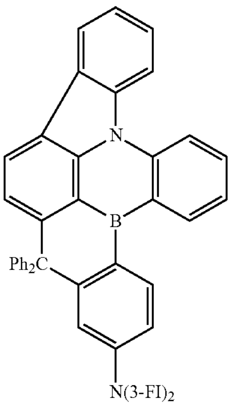
Compound 1-307
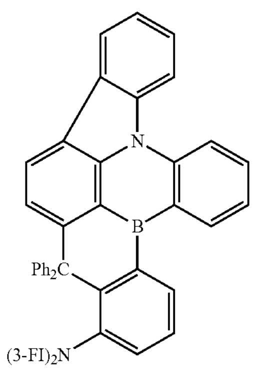
Compound 1-308
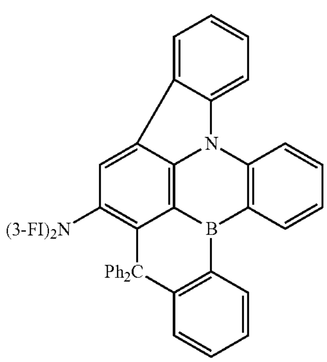
Compound 1-309
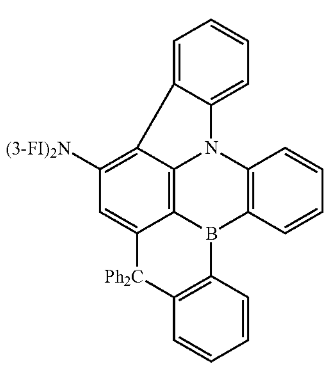
-continued
Compound 1-310
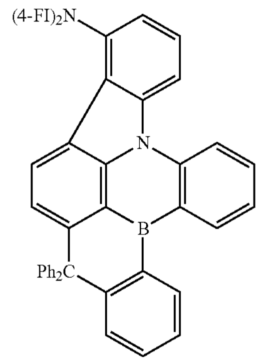
Compound 1-311
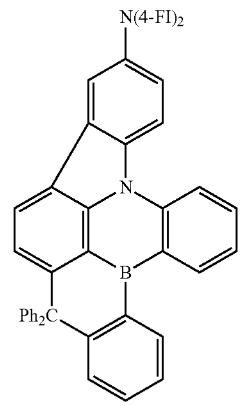
Compound 1-312
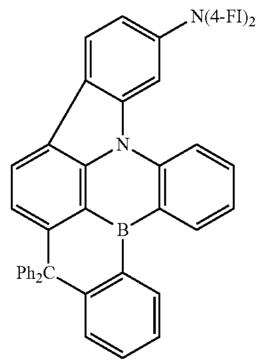
Compound 1-313
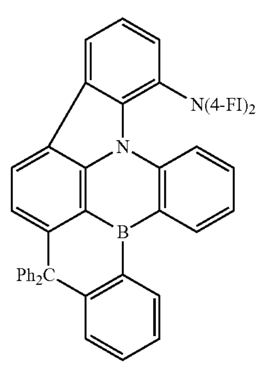

-continued
Compound 1-314
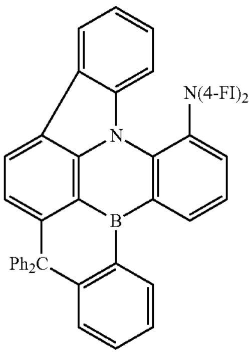
Compound 1-315
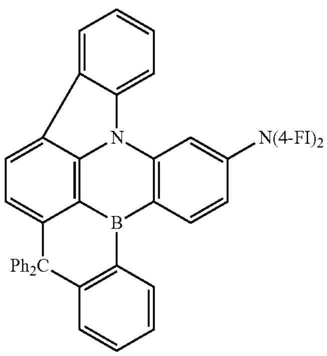
Compound 1-316
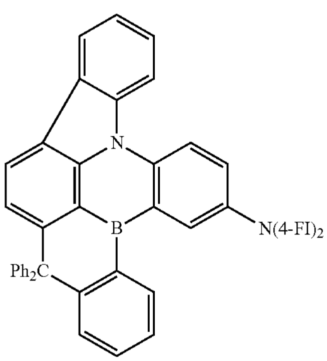
Compound 1-317
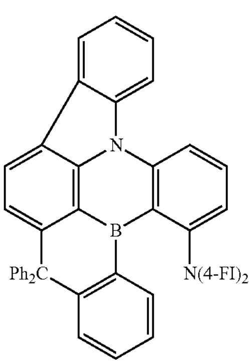
-continued
Compound 1-318
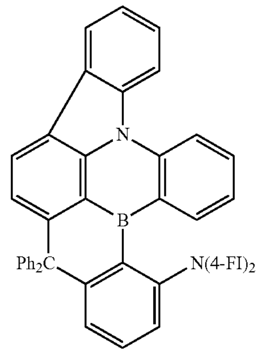
Compound 1-319
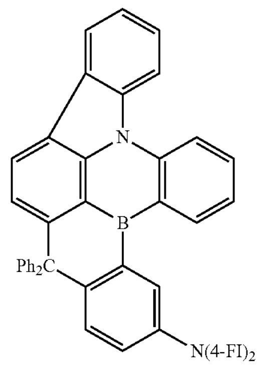
Compound 1-320
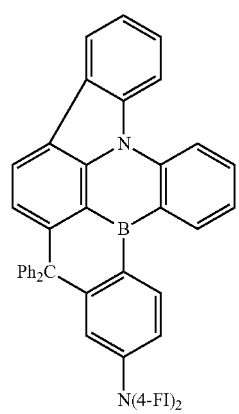
Compound 1-321
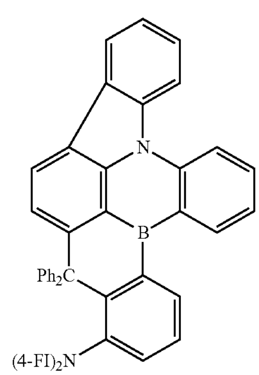

-continued
Compound 1-322
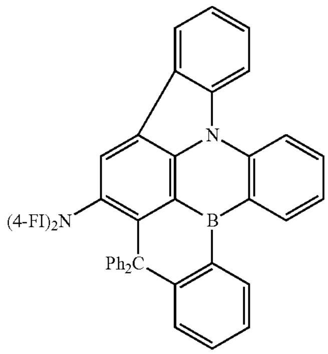
Compound 1-323
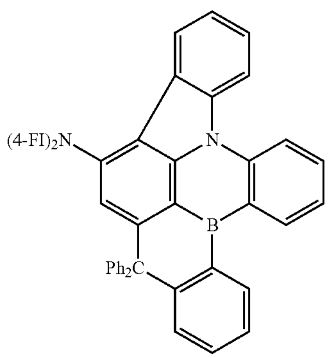
Compound 1-324
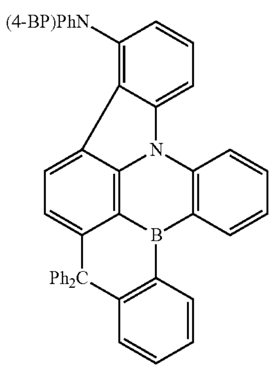
Compound 1-325
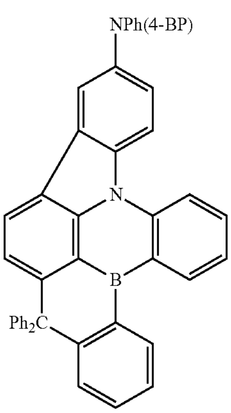
-continued
Compound 1-326
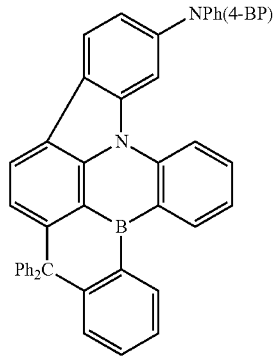
Compound 1-327
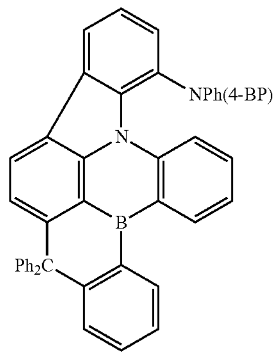
Compound 1-328
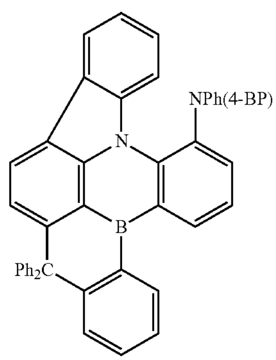
Compound 1-329
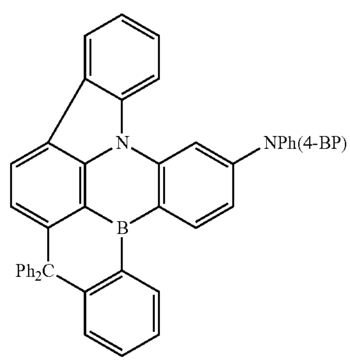

-continued
Compound 1-330
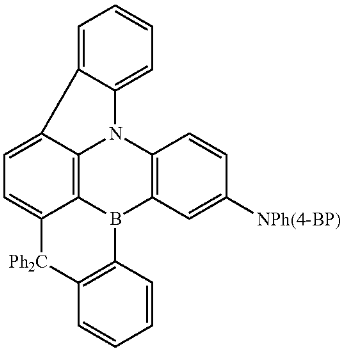
Compound 1-331
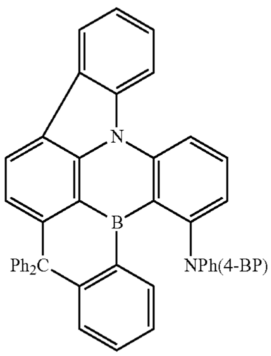
Compound 1-332
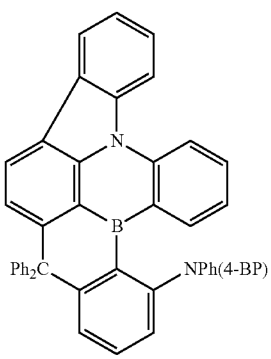
Compound 1-333
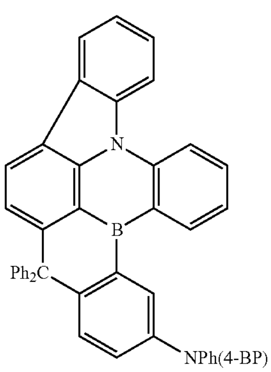
-continued
Compound 1-334
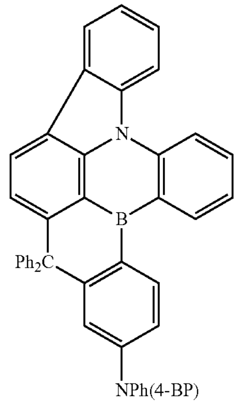
Compound 1-335
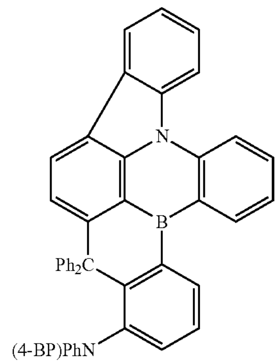
Compound 1-336
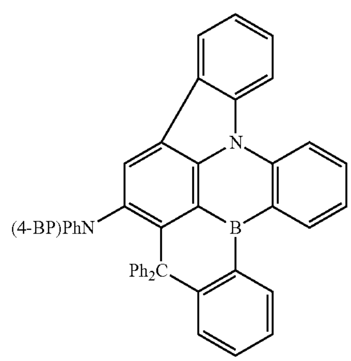
Compound 1-337
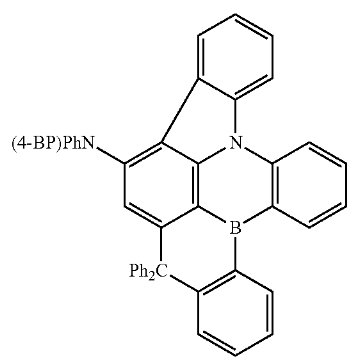

Compound 1-338
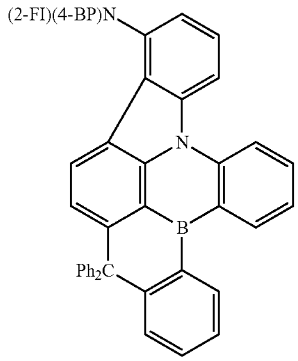
Compound 1-339
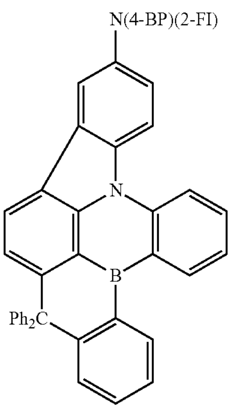
Compound 1-340
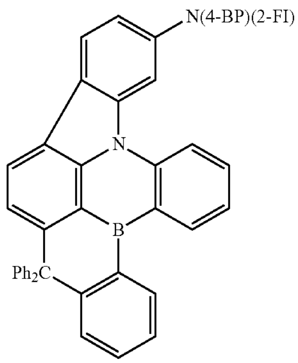
Compound 1-341
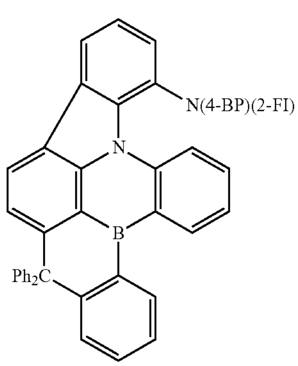
Compound 1-342
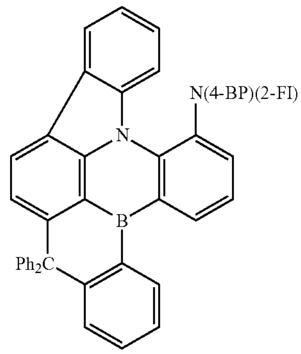
Compound 1-343
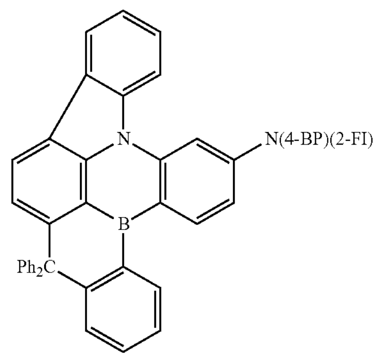
Compound 1-344
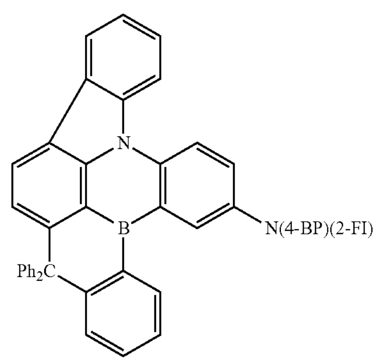
Compound 1-345
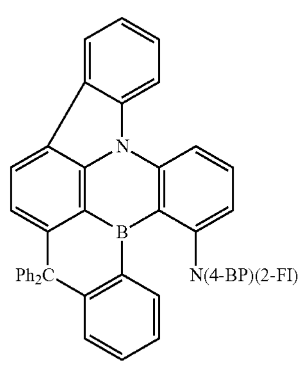

-continued
Compound 1-346
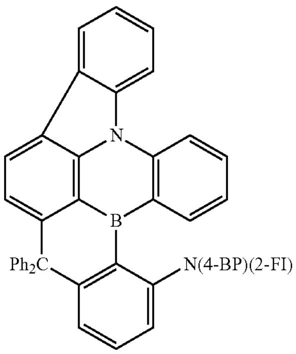
Compound 1-347
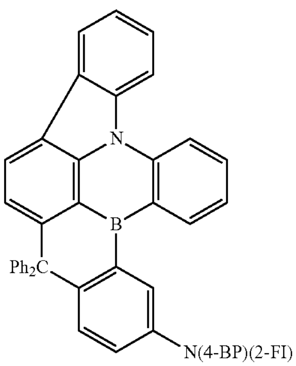
Compound 1-348
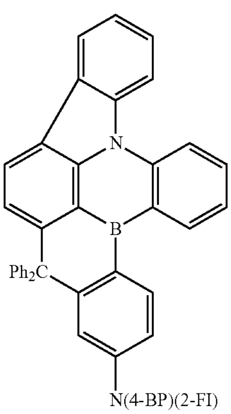
Compound 1-349
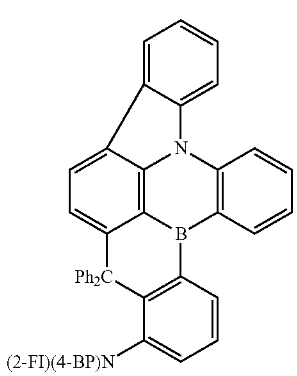
-continued
Compound 1-350
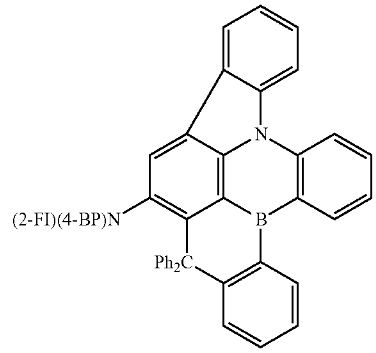
Compound 1-351
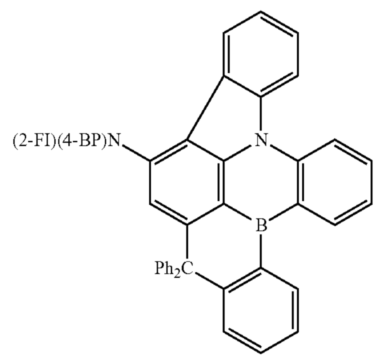
Compound 1-352
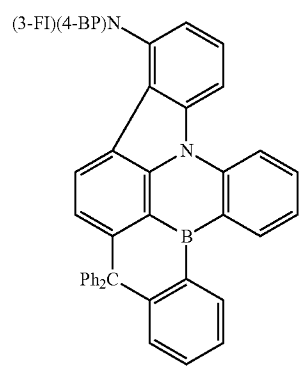
Compound 1-353
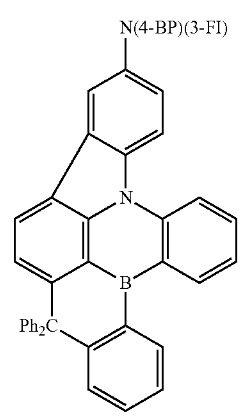

-continued
Compound 1-354
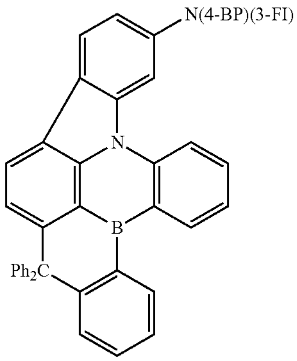
Compound 1-355
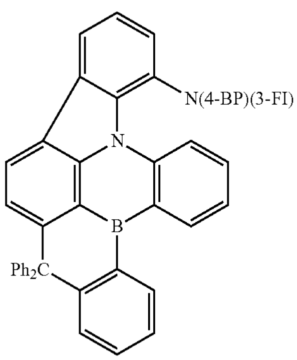
Compound 1-356
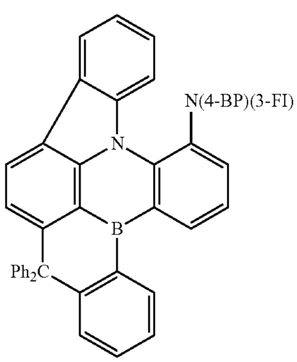
Compound 1-357
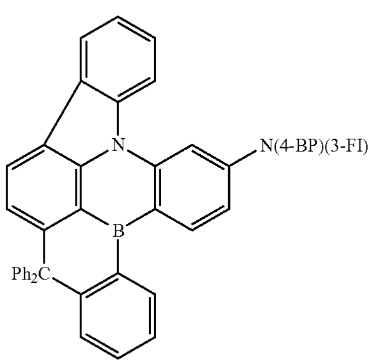
-continued
Compound 1-358
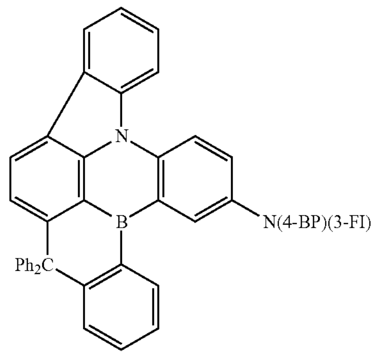
Compound 1-359
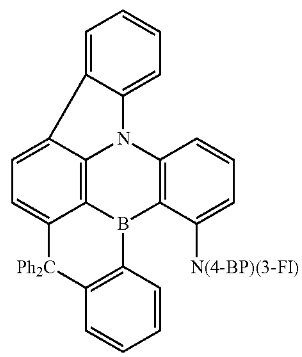
Compound 1-360
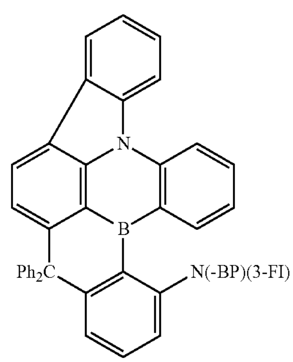
Compound 1-361
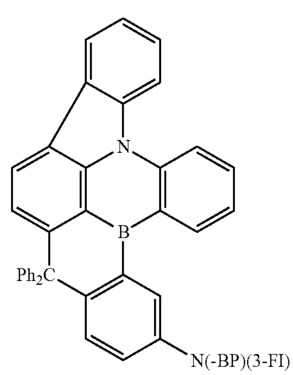

Compound 1-362
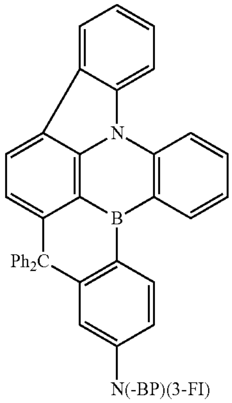
Compound 1-363
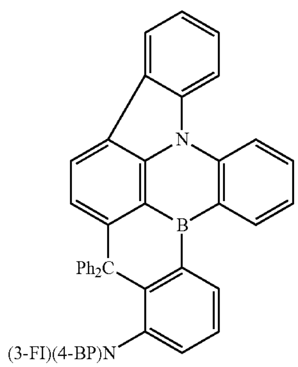
Compound 1-364
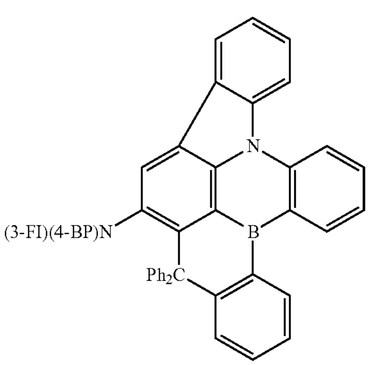
Compound 1-365
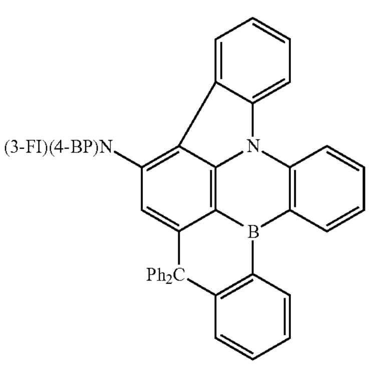
Compound 1-366
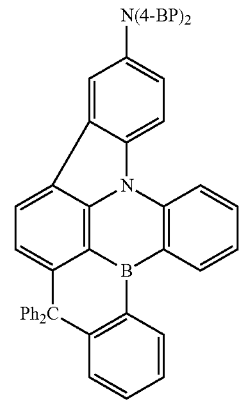
Compound 1-367
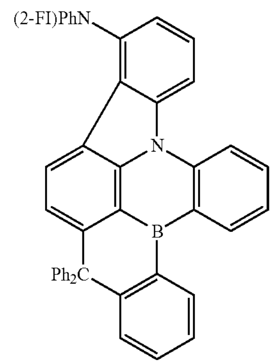
Compound 1-368
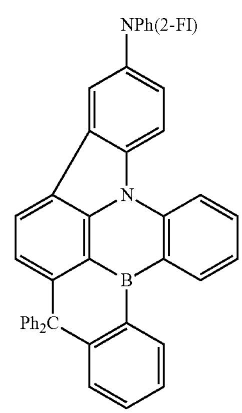
Compound 1-369
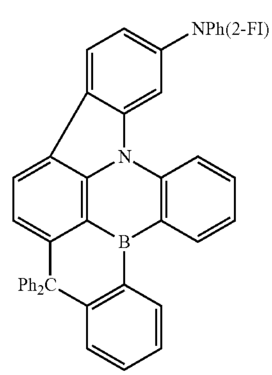

Compound 1-370
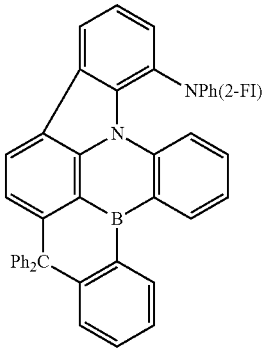
Compound 1-371
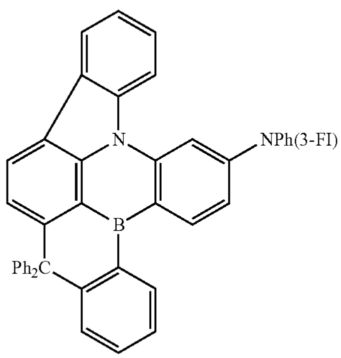
Compound 1-372
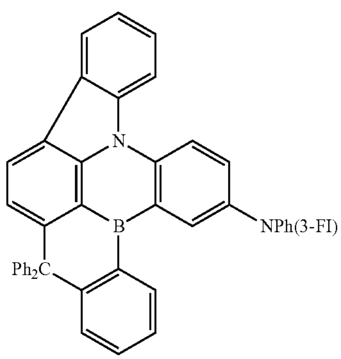
Compound 1-373
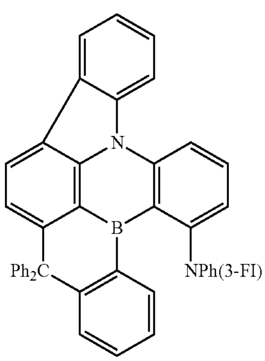
Compound 1-374
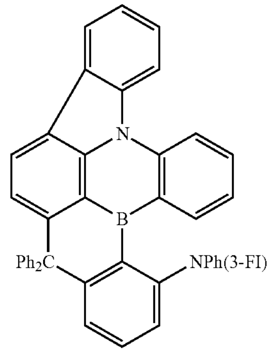
Compound 1-375
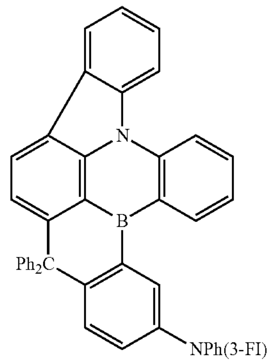
Compound 1-376
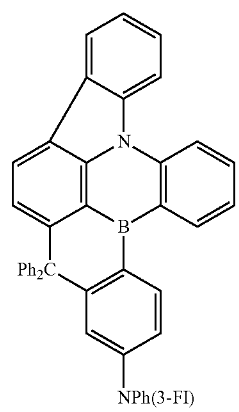
Compound 1-377
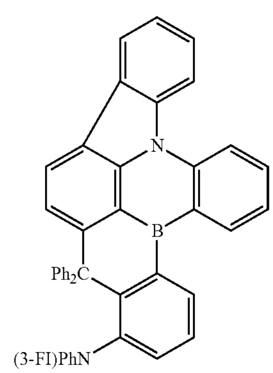

-continued
Compound 1-378
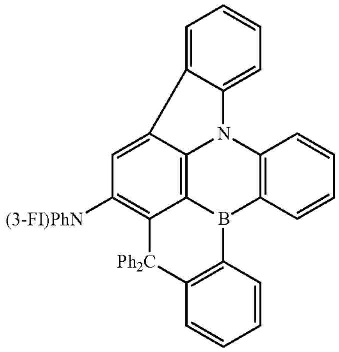
Compound 1-379
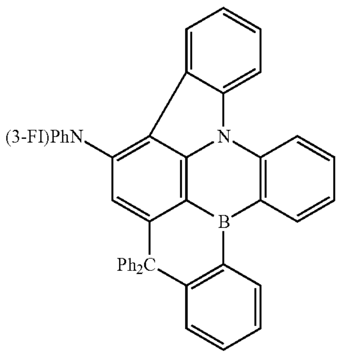
Compound 1-380
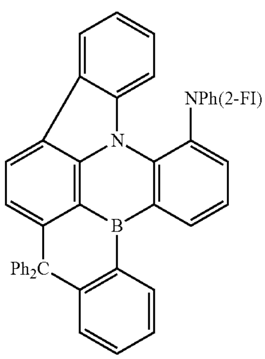
Compound 1-381
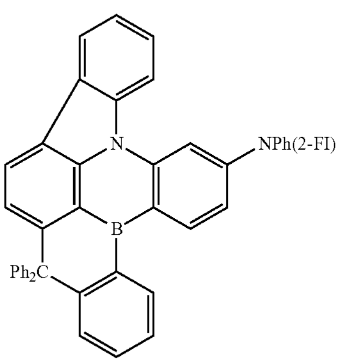
-continued
Compound 1-382
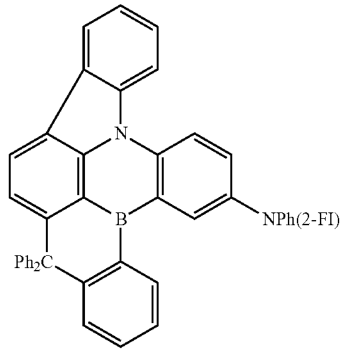
Compound 1-383
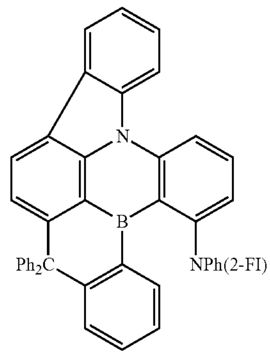
Compound 1-384
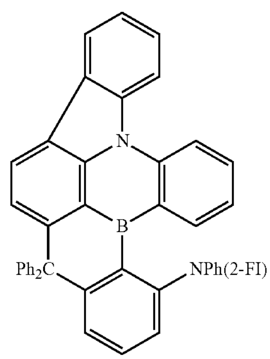
Compound 1-385
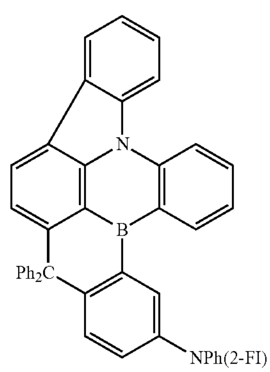

-continued
Compound 1-386
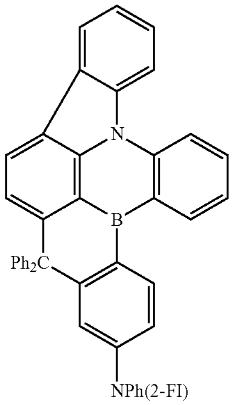
Compound 1-387
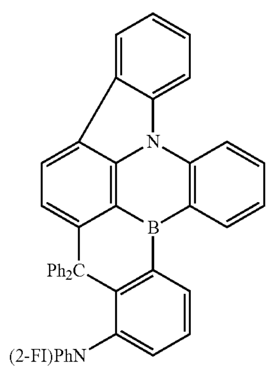
Compound 1-388
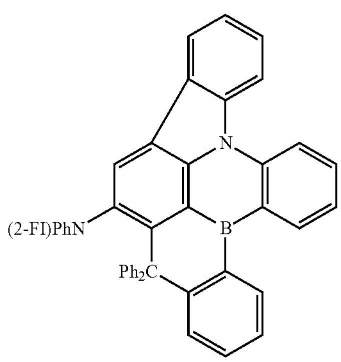
Compound 1-389
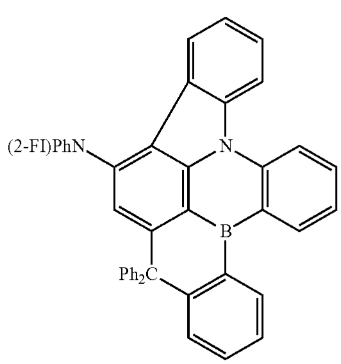
-continued
Compound 1-390
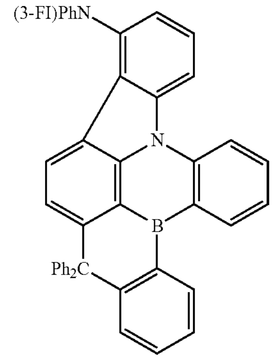
Compound 1-391
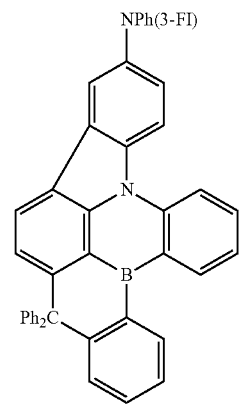
Compound 1-392
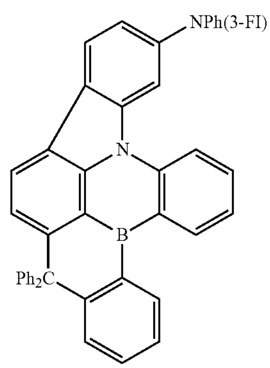
Compound 1-393
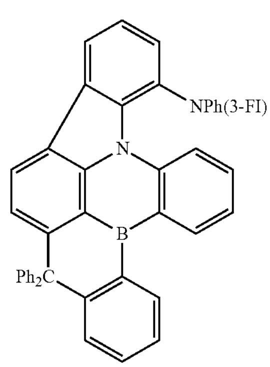

-continued
Compound 1-394
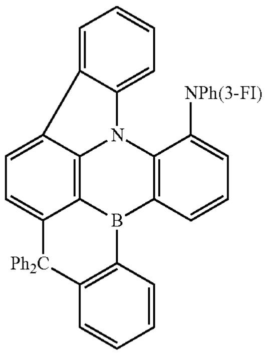
Compound 1-395
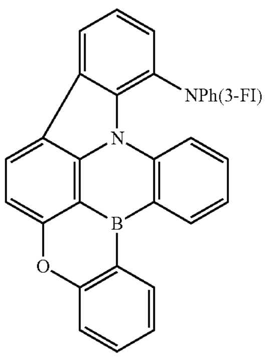
Compound 1-396
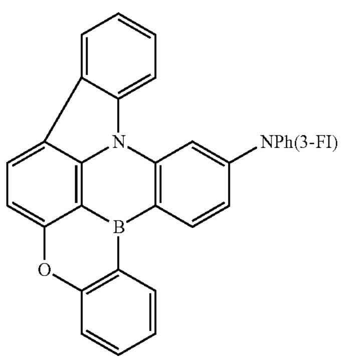
Compound 1-397
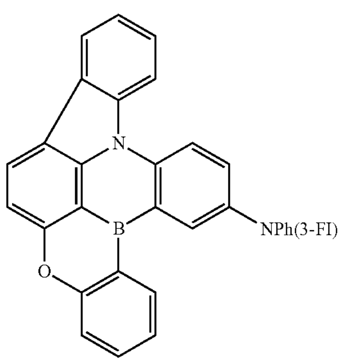
-continued
Compound 1-398
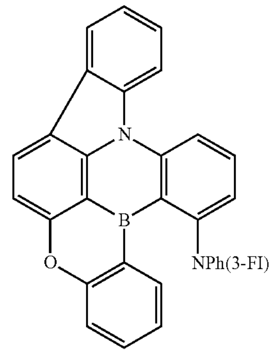
Compound 1-399
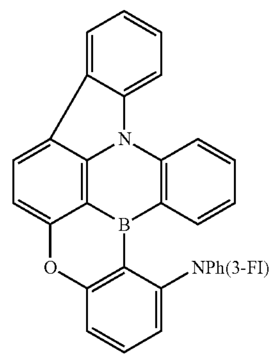
Compound 1-400
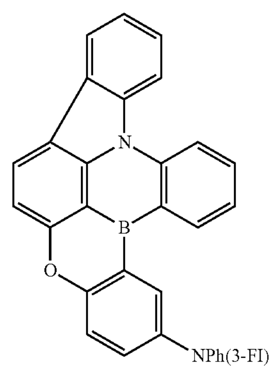
Compound 1-401
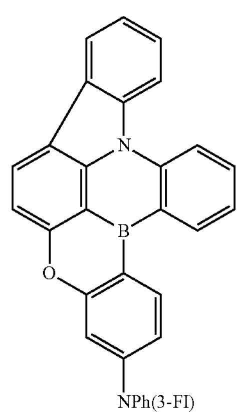

Compound 1-402
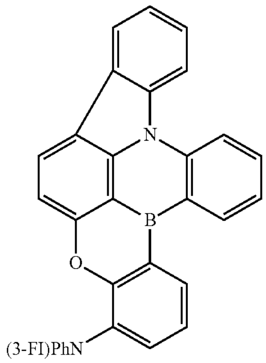
Compound 1-403
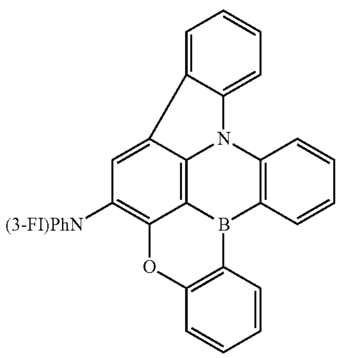
Compound 1-404
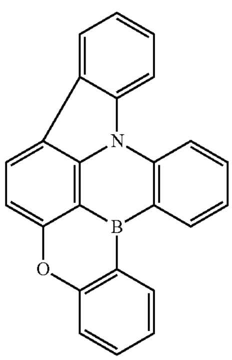
Compound 1-405
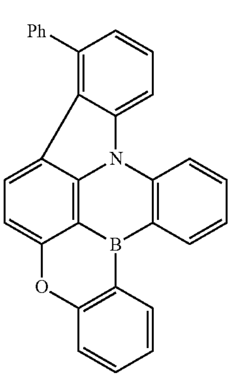
Compound 1-406
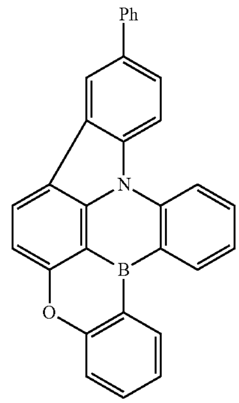
Compound 1-407
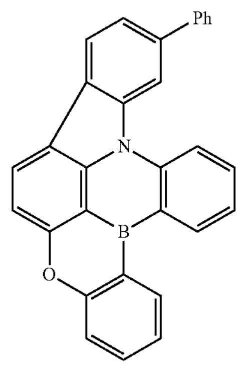
Compound 1-408
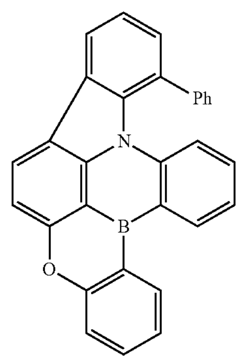
Compound 1-409
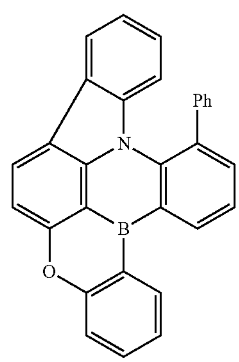

-continued
Compound 1-410
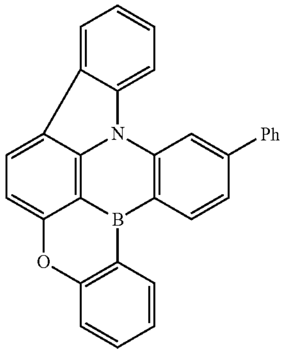
Compound 1-411
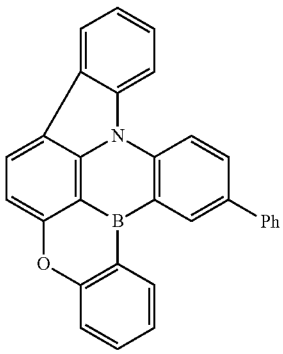
Compound 1-412
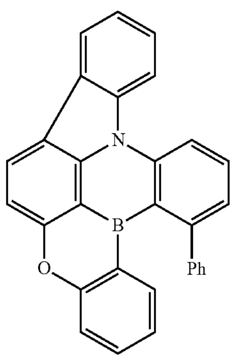
Compuond 1-413
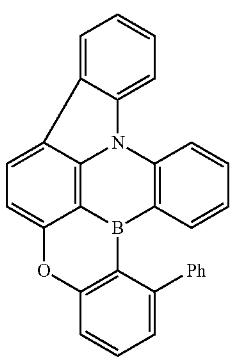
-continued
Compound 1-414
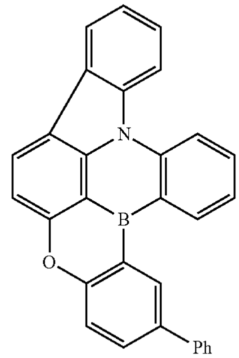
Compound 1-415
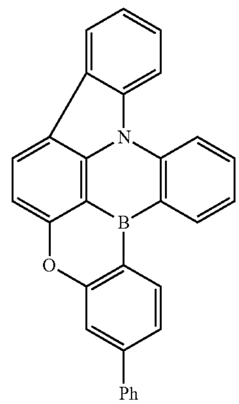
Compound 1-416
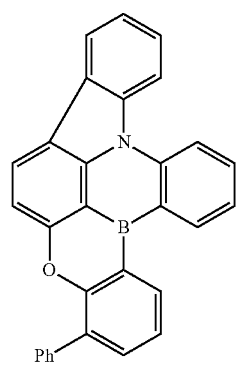
Compound 1-417
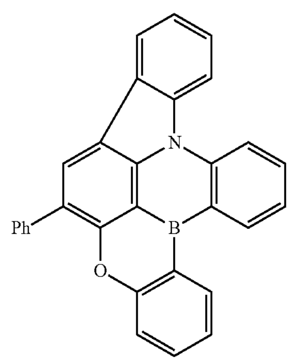

Compound 1-418
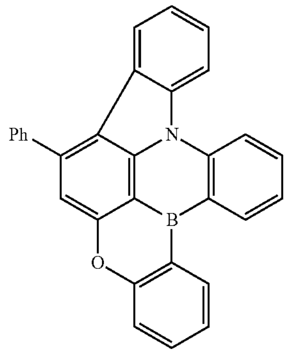
Compound 1-419
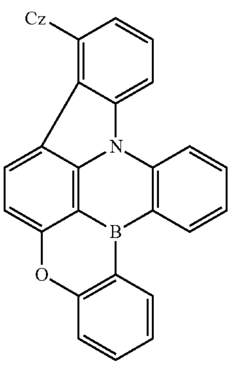
Compound 1-420
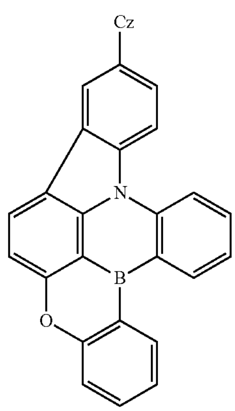
Compound 1-421
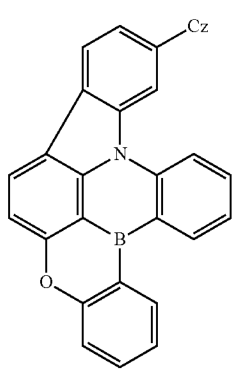
Compound 1-422
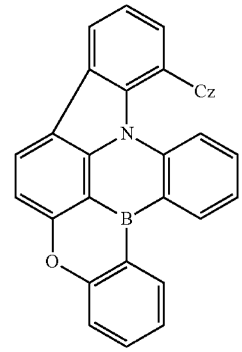
Compound 1-423
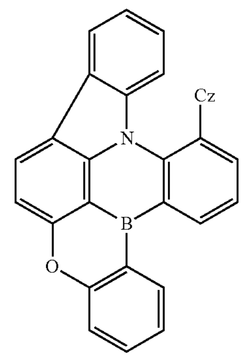
Compound 1-424
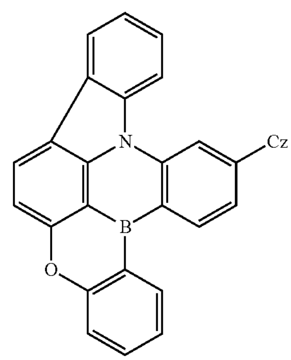
Compound 1-425
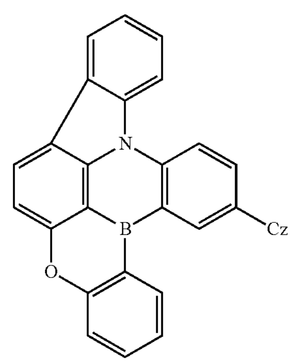

Compound 1-426
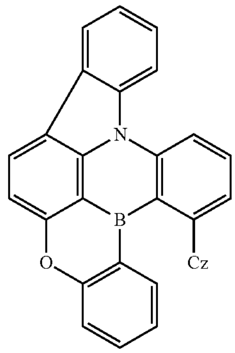
Compound 1-427
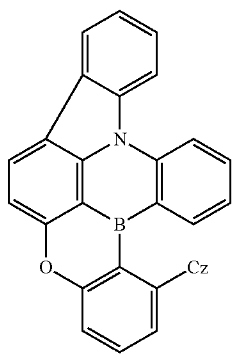
Compound 1-428
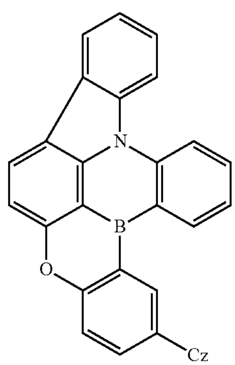
Compound 1-429
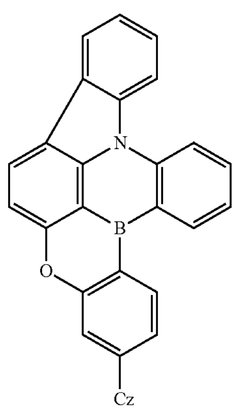
Compouind 1-430
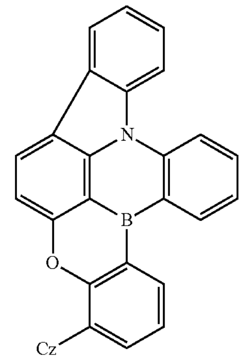
Compound 1-431
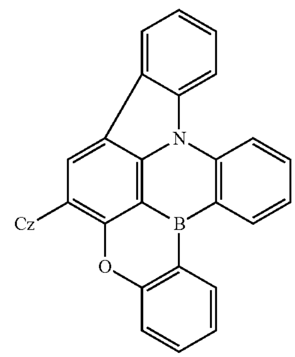
Compound 1-432
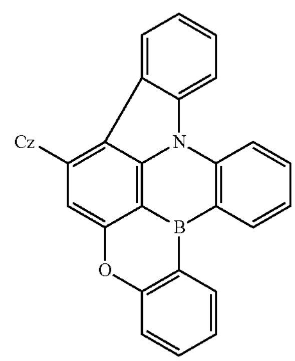
Compound 1-433
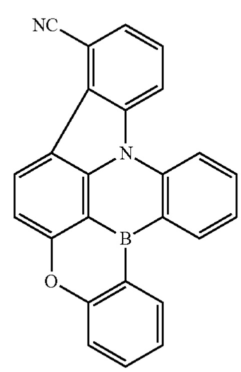

-continued
Compound 1-434
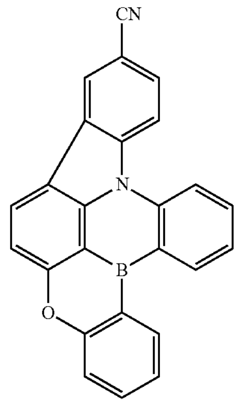
Compound 1-435
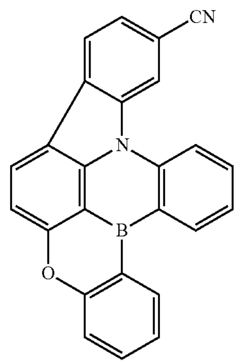
Compound 1-436
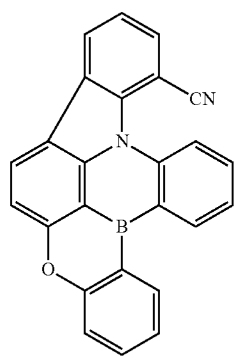
Compound 1-437
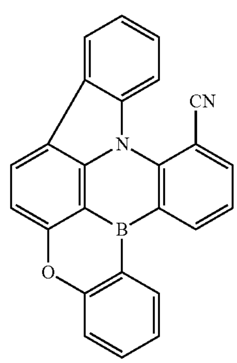
-continued
Compound 1-438
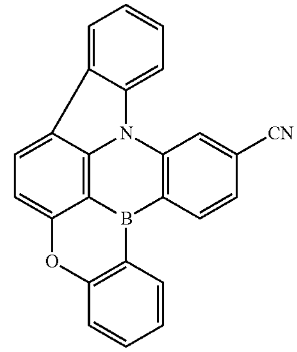
Compound 1-439
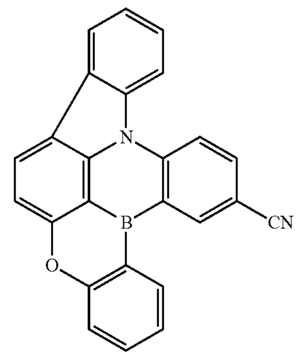
Compound 1-440
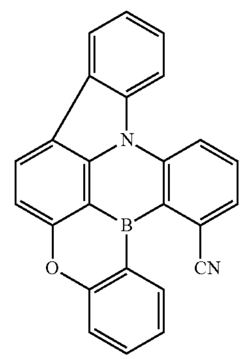
Compound 1-441
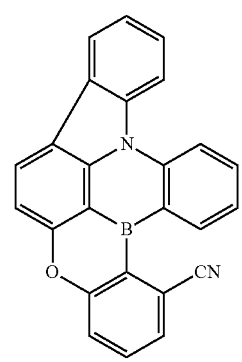

-continued
Compound 1-442
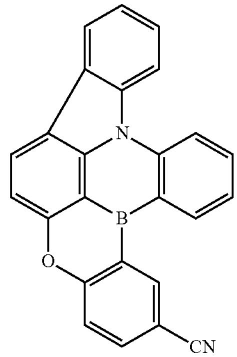
Compound 1-443
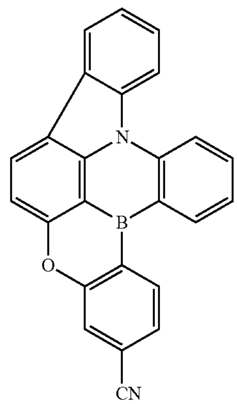
Compound 1-444
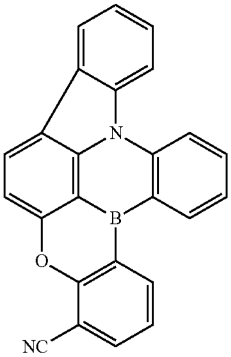
Compound 1-445
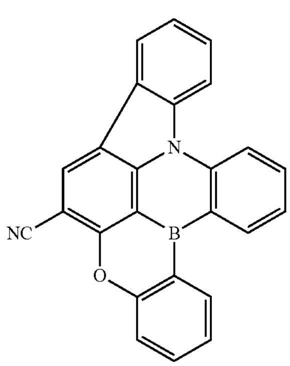
-continued
Compound 1-446
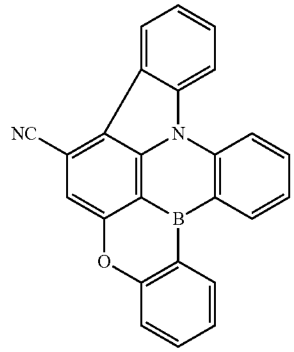
Compound 1-447
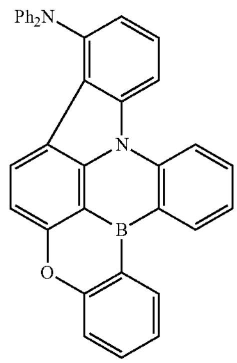
Compound 1-448
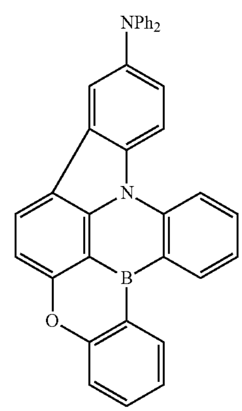
Compound 1-449
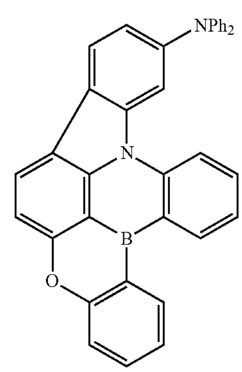

-continued
Compound 1-450
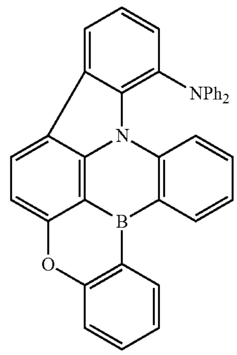
Compound 1-451
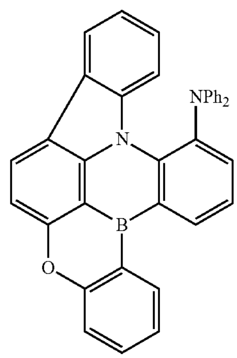
Compound 1-452
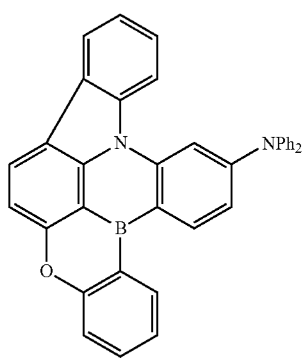
Compound 1-453
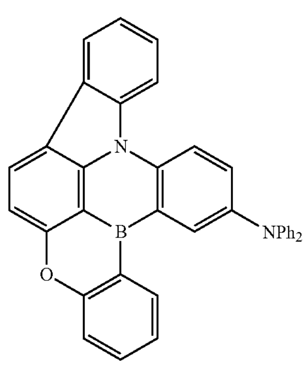
-continued
Compound 1-454
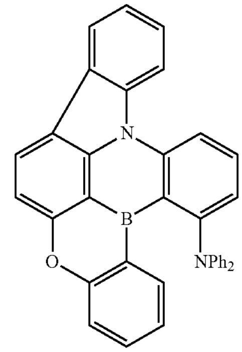
Compound 1-455
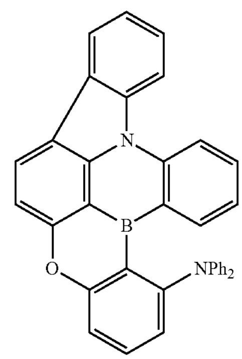
Compound 1-456
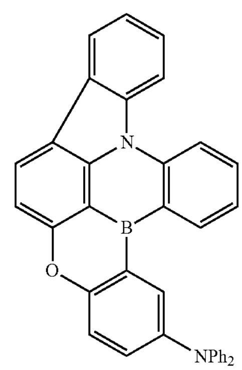
Compound 1-457
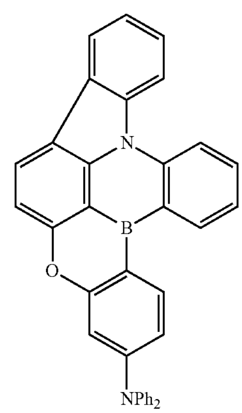

-continued
Compound 1-458
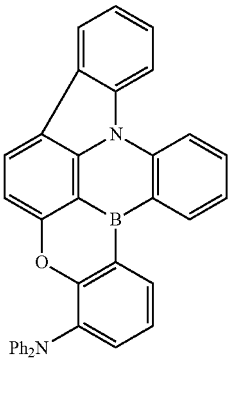
Compound 1-459
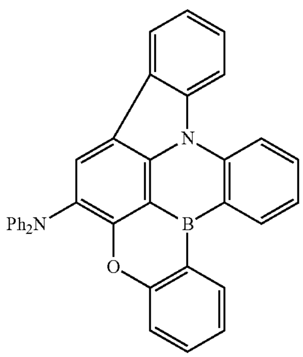
Compound 1-460
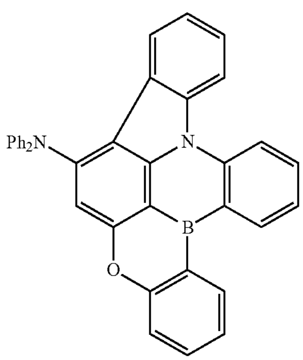
Compound 1-461
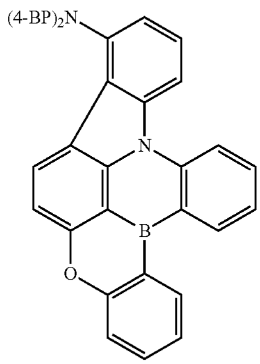
-continued
Compound 1-462
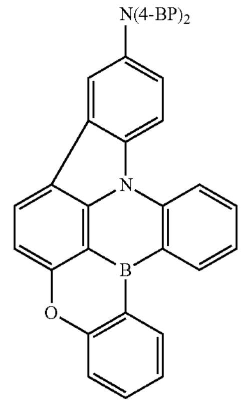
Compound 1-463
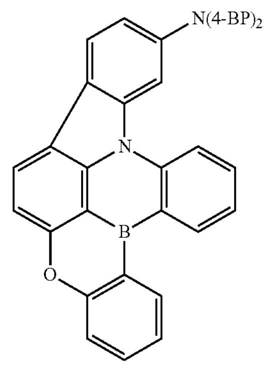
Compound 1-464
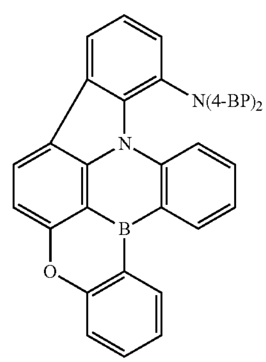
Compound 1-465
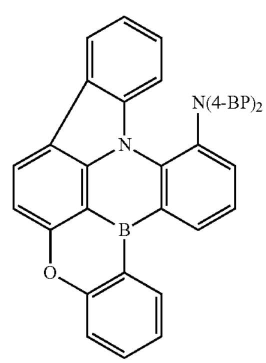

-continued
Compound 1-466
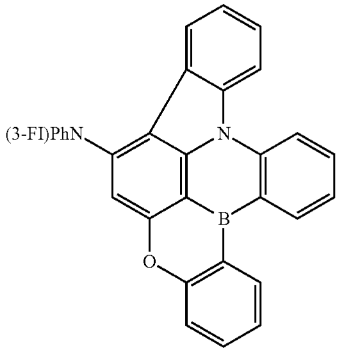
Compound 1-467
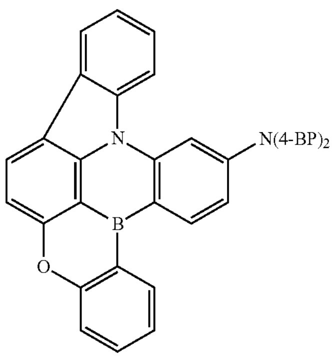
Compound 1-468
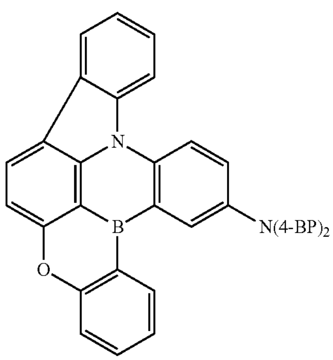
Compound 1-469
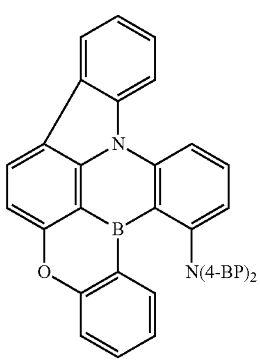
-continued
Compound 1-470
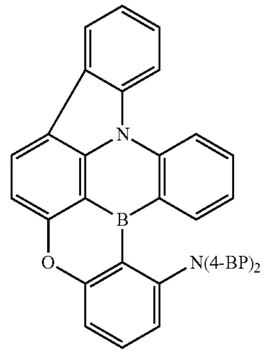
Compound 1-471
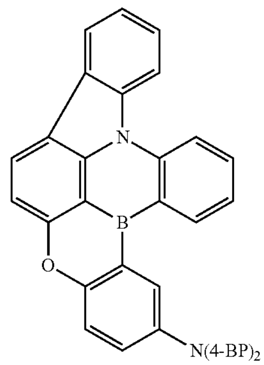
Compound 1-472
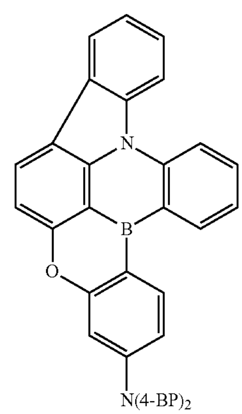
Compound 1-473
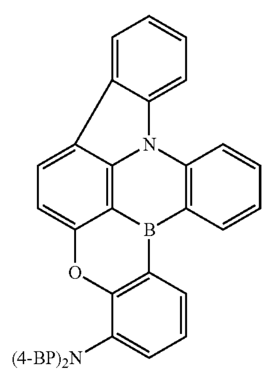

-continued
Compound 1-474
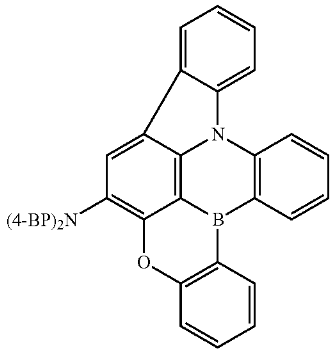
Compound 1-475
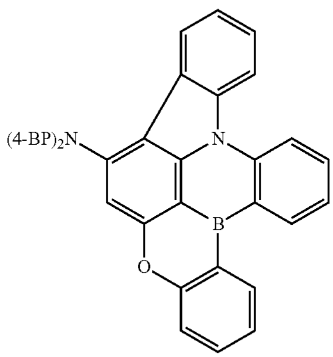
Compound 1-476
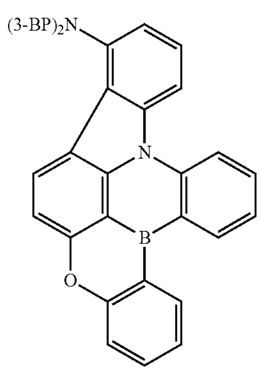
Compound 1-477
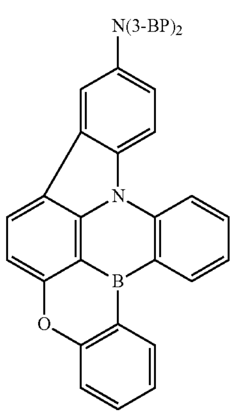
-continued
Compound 1-478
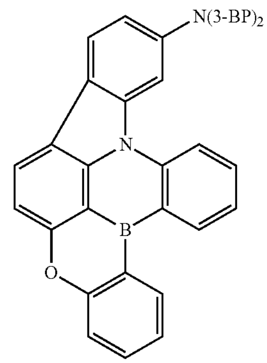
Compound 1-479
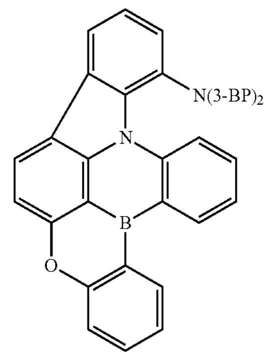
Compound 1-480
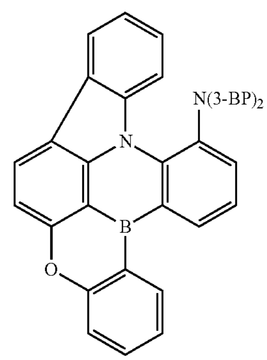
Compound 1-481
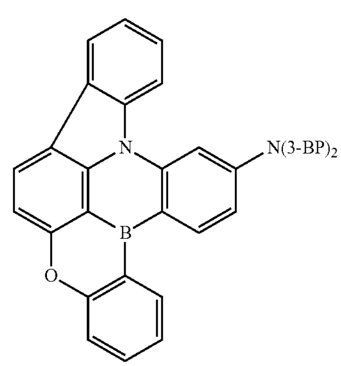

-continued
Compound 1-482
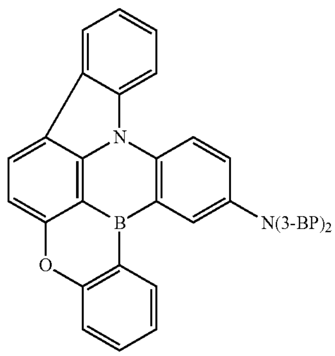
Compound 1-483
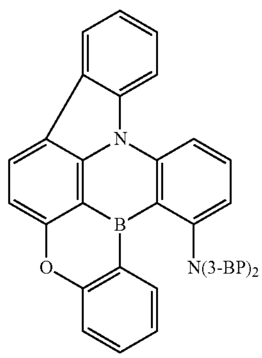
Compound 1-484
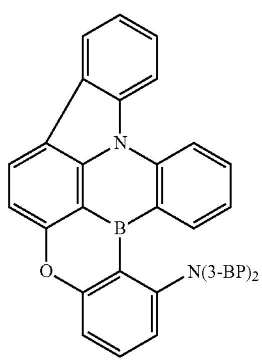
Compound 1-485
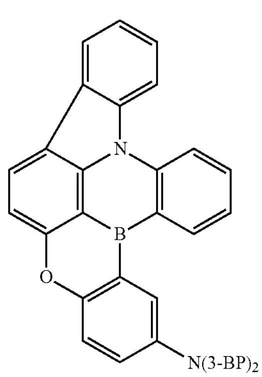
-continued
Compound 1-486
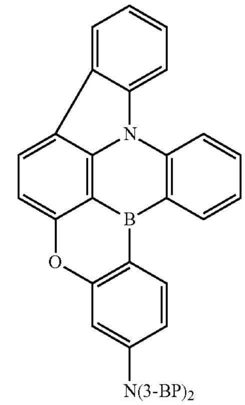
Compound 1-487
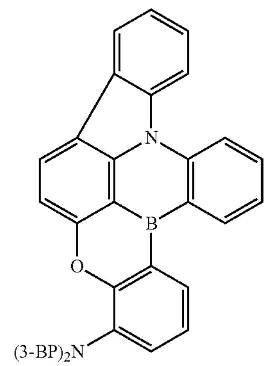
Compound 1-488
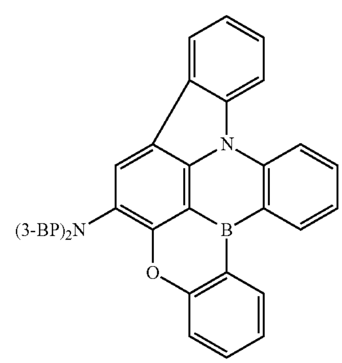
Compound 1-489
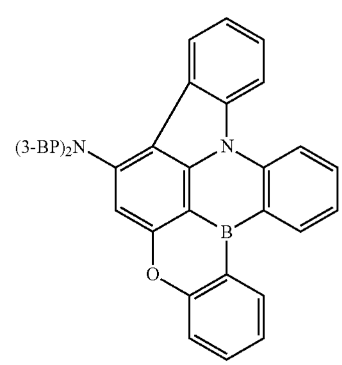

-continued
Compound 1-490
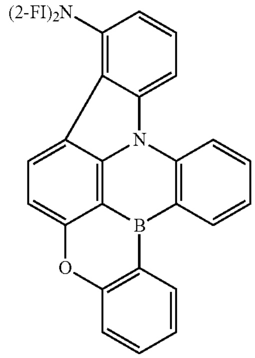
Compound 1-491
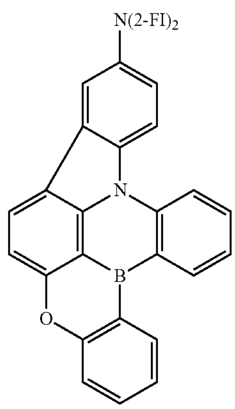
Compound 1-492
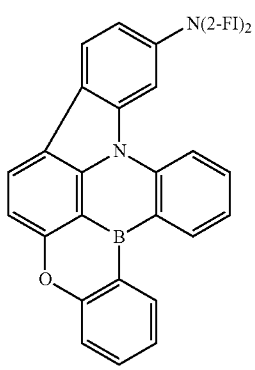
Compound 1-493
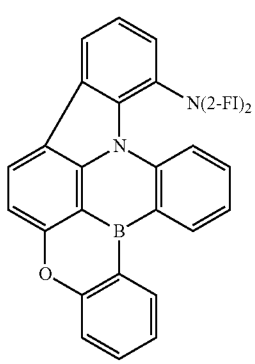
-continued
Compound 1-494
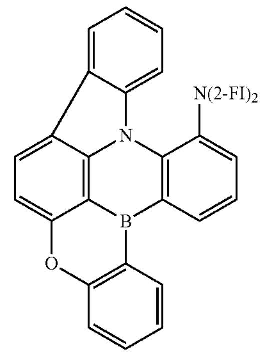
Compound 1-495
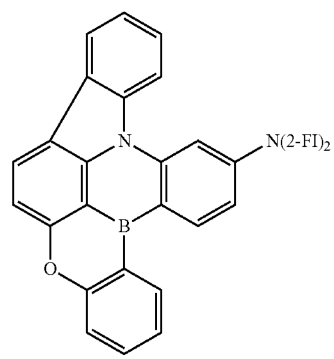
Compound 1-496
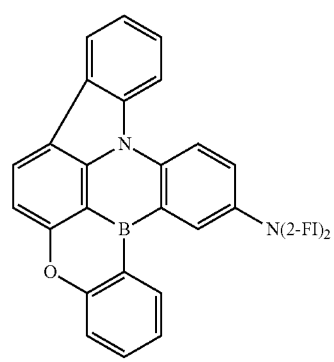
Compound 1-497
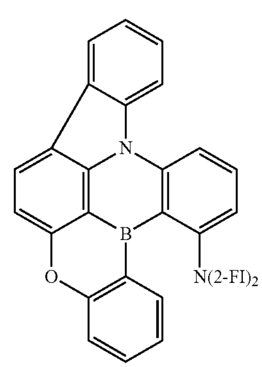

-continued
Compound 1-498
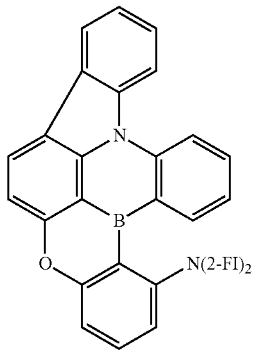
Compound 1-499
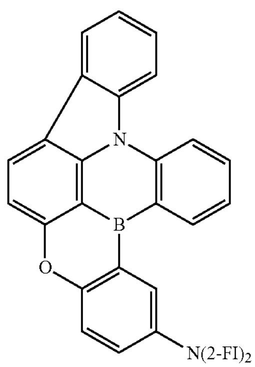
Compound 1-500
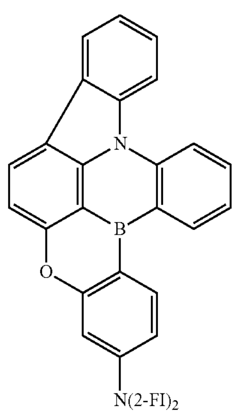
Compound 1-501
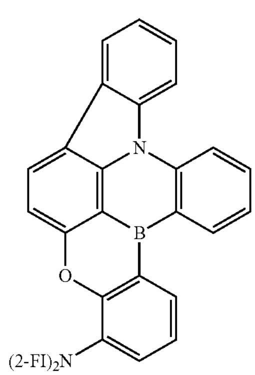
-continued
Compound 1-502
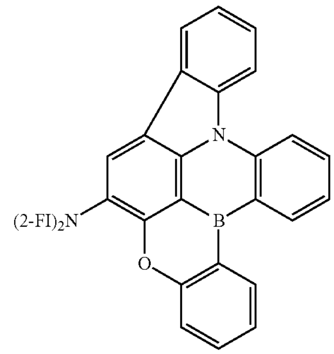
Compound 1-503
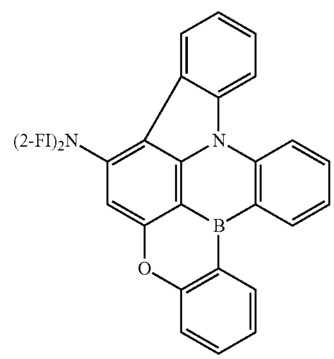
Compound 1-504
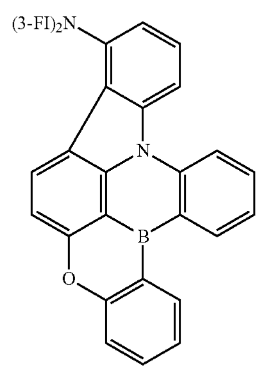
Compound 1-505
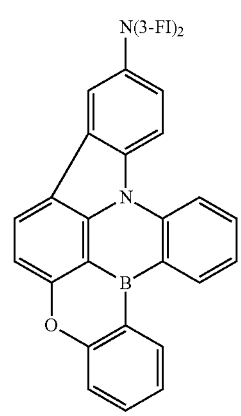

-continued
Compound 1-506
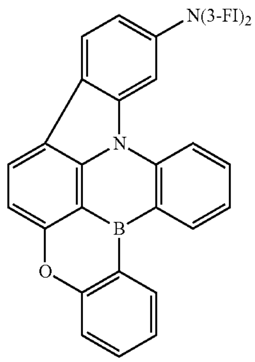
Compound 1-507
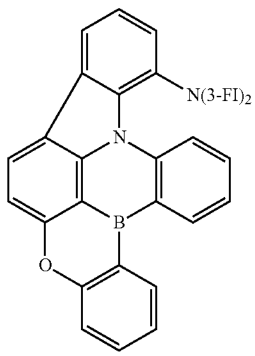
Compound 1-508
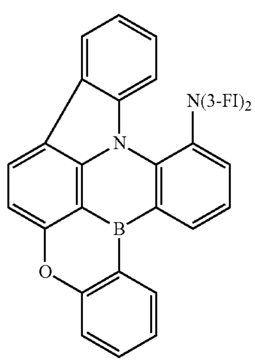
Compound 1-509
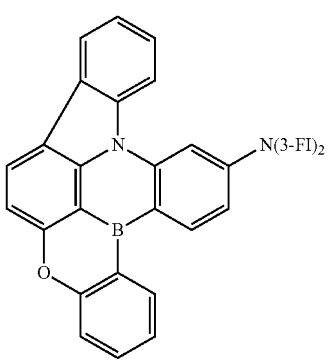
-continued
Compound 1-510
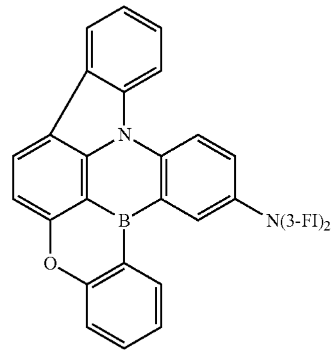
Compound 1-511
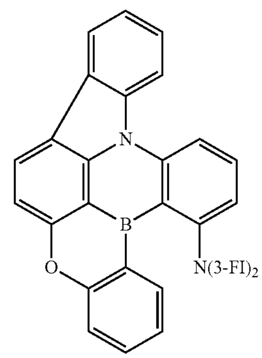
Compound 1-512
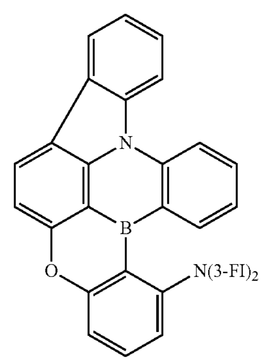
Compound 1-513
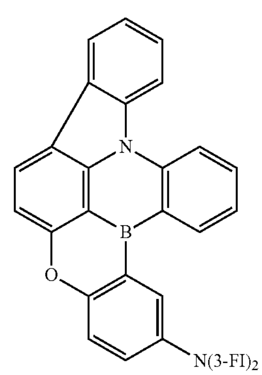

Compound 1-514
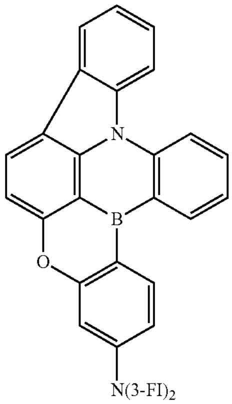
Compound 1-515
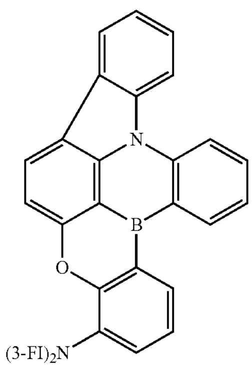
Compound 1-516
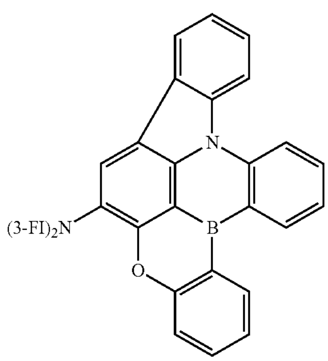
Compound 1-517
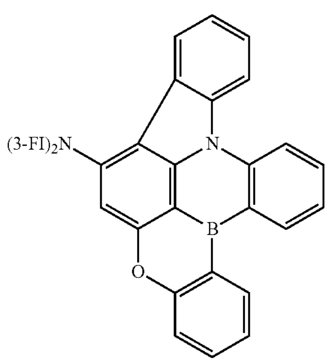
Compound 1-518
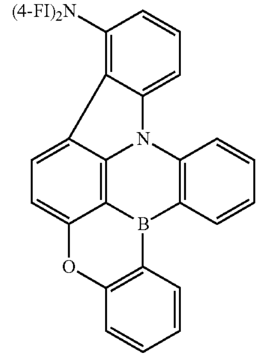
Compound 1-519
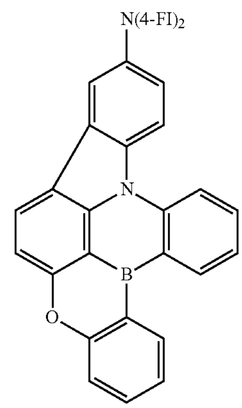
Compound 1-520
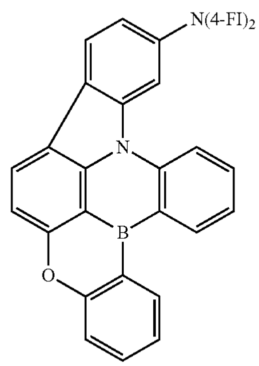
Compound 1-521
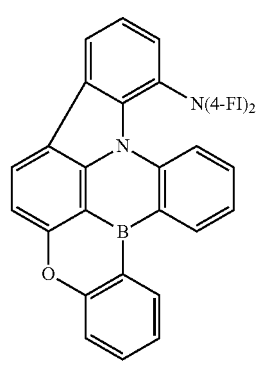

-continued
Compound 1-522
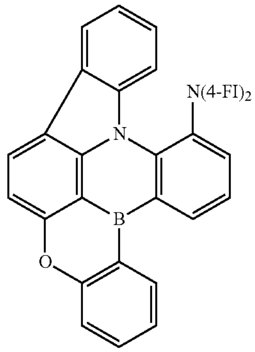
Compound 1-523
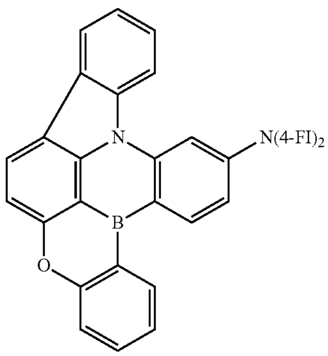
Compound 1-524
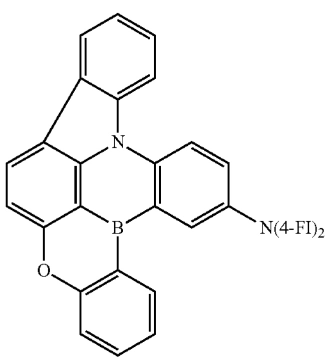
Compound 1-525
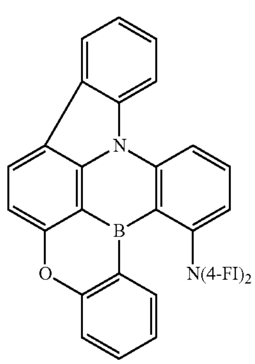
-continued
Compound 1-526
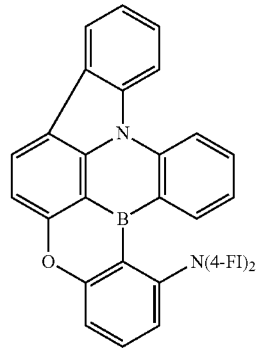
Compound 1-527
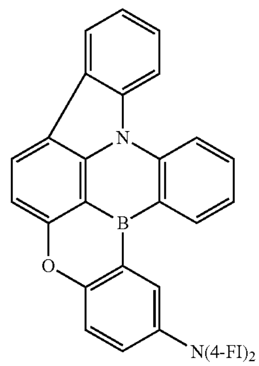
Compound 1-528
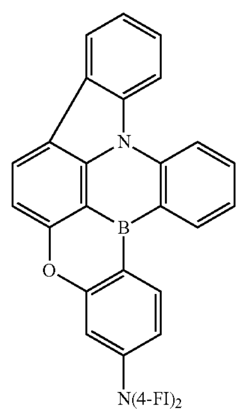
Compound 1-529
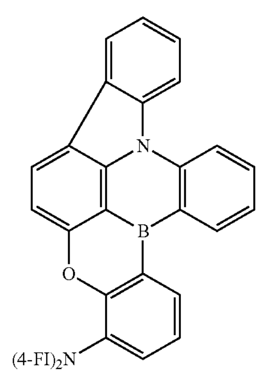

-continued
Compound 1-530
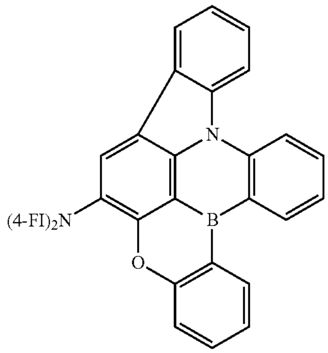
Compound 1-531
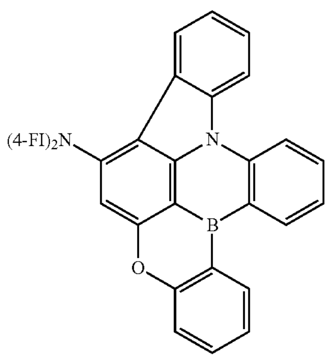
Compound 1-532
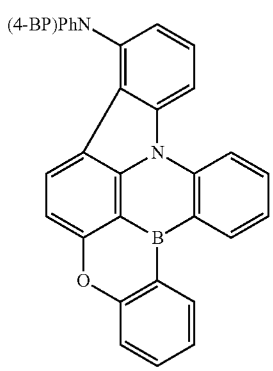
Compound 1-533
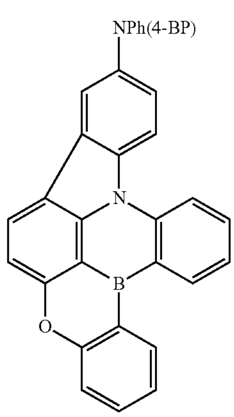
-continued
Compound 1-534
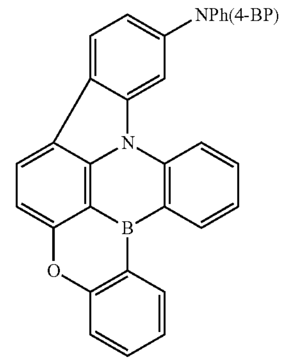
Compound 1-535
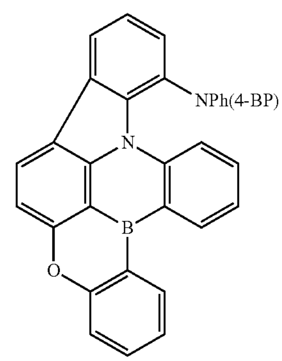
Compound 1-536
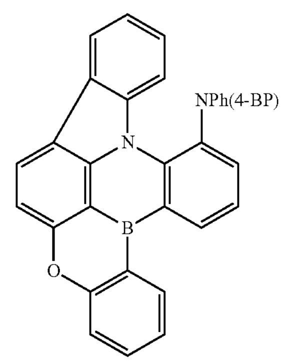
Compound 1-537
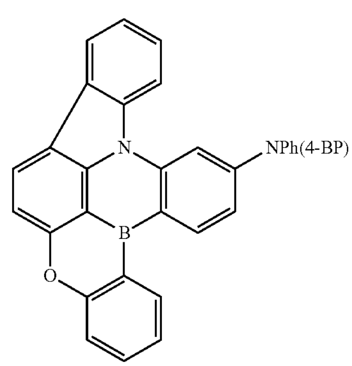

-continued
Compound 1-538
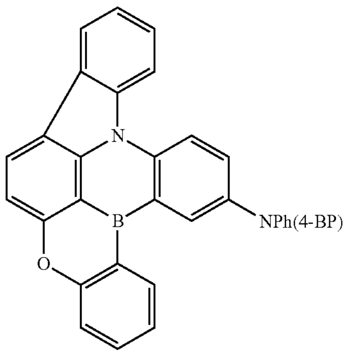
Compound 1-539
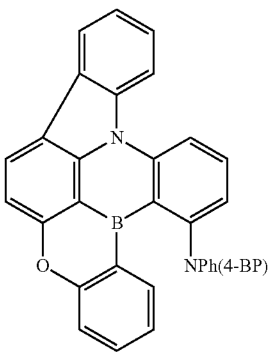
Compound 1-540
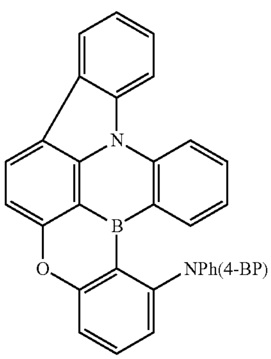
Compound 1-541
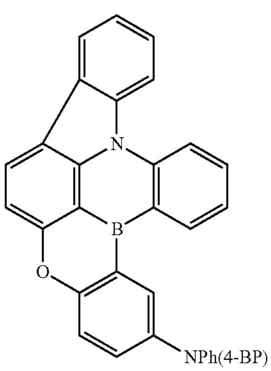
-continued
Compound 1-542
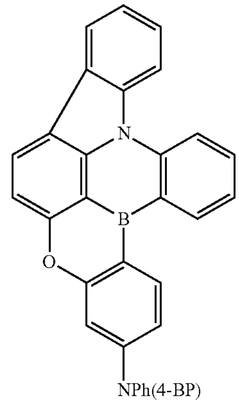
Compound -1-543
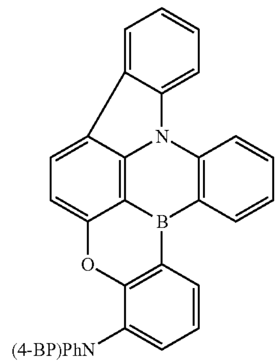
Compound 1-544
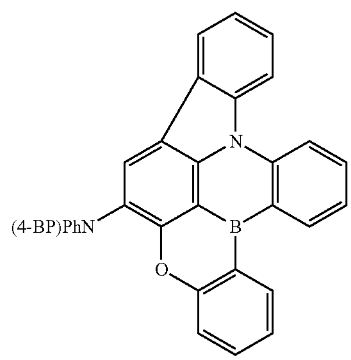
Compound 1-545
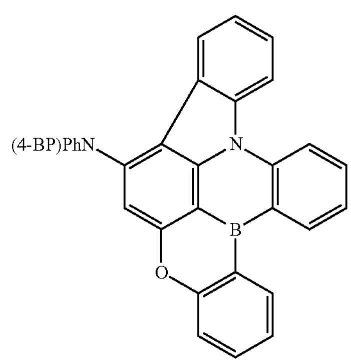

Compound 1-546
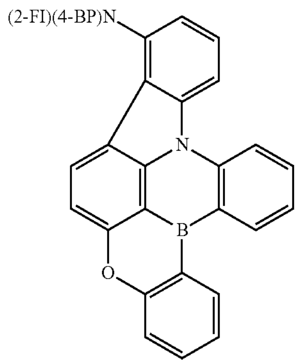
Compound 1-547
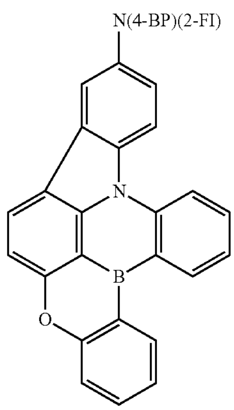
Compound 1-548
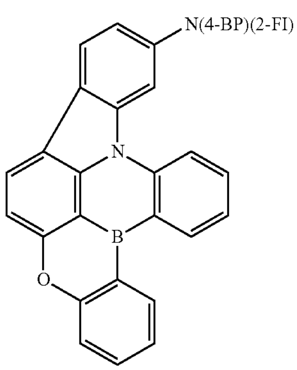
Compound 1-549
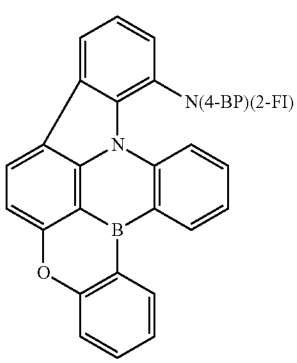
Compound 1-550
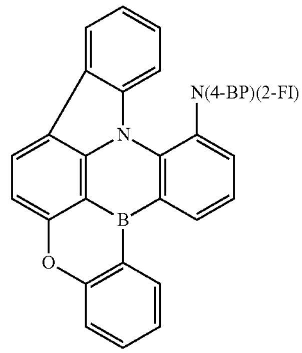
Compound 1-551
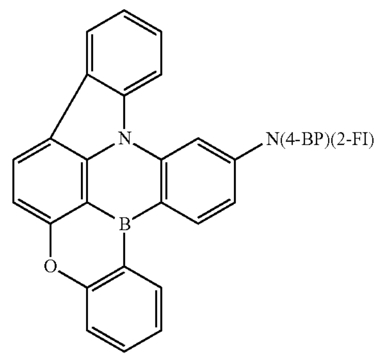
Compound 1-552
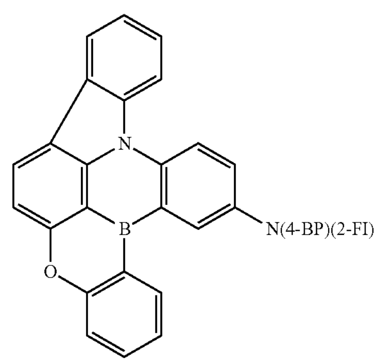
Compound 1-553
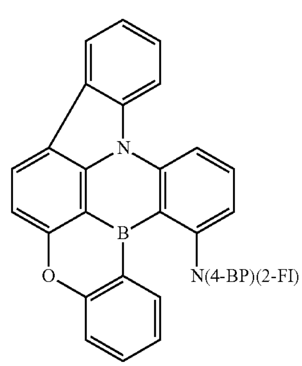

Compound 1-554
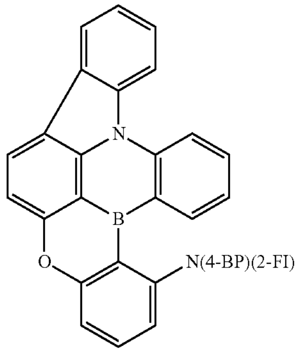
Compound 1-555
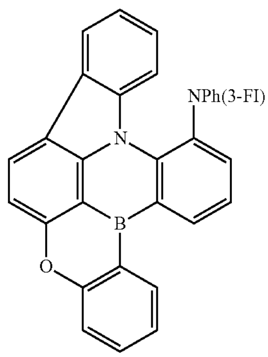
Compound 1-556
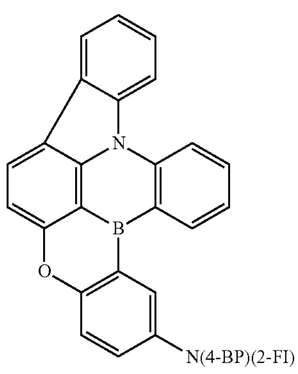
Compound 1-557
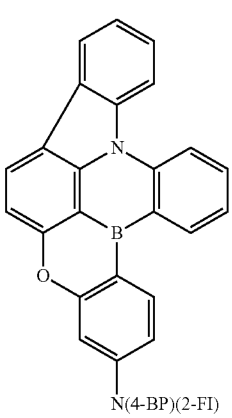
Compound 1-558
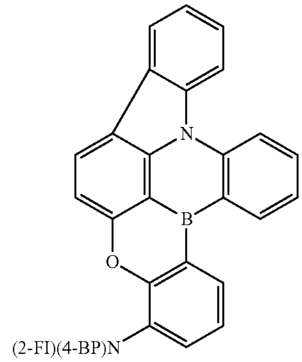
Compound 1-559
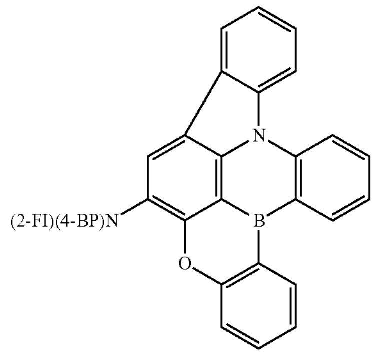
Compound 1-560
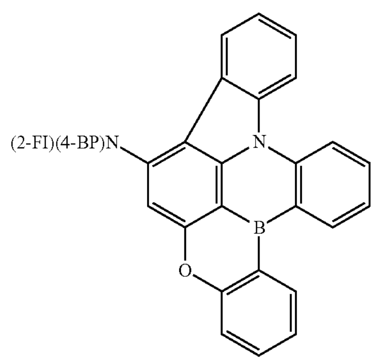
Compound 1-561
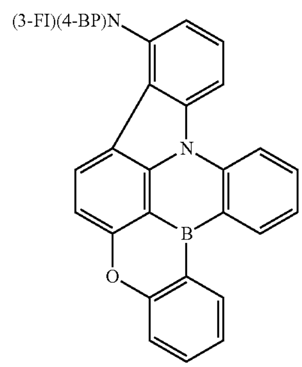

-continued
Compound 1-562
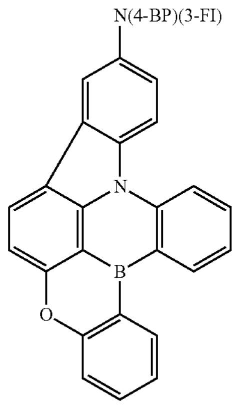
Compound 1-563
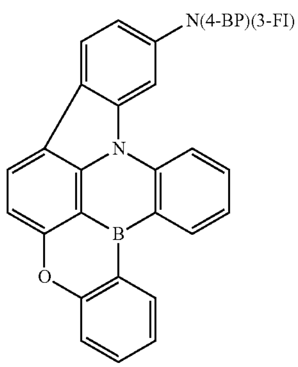
Compound 1-564
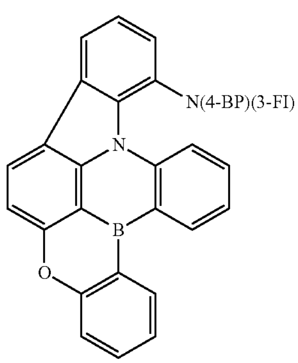
Compound 1-565
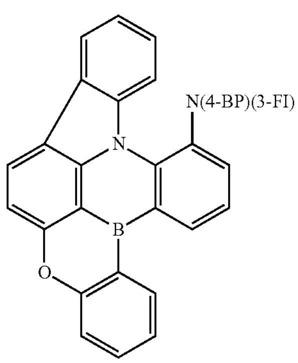
-continued
Compound 1-566
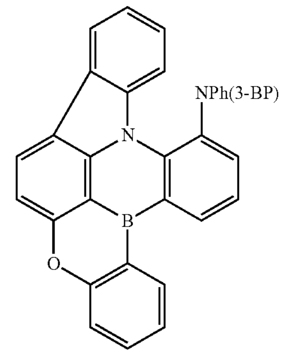
Compound 1-567
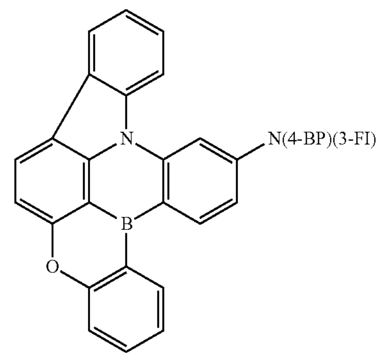
Compound 1-568
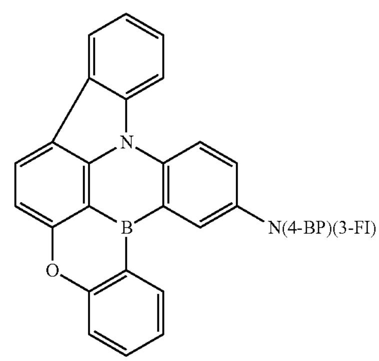
Compound 1-569
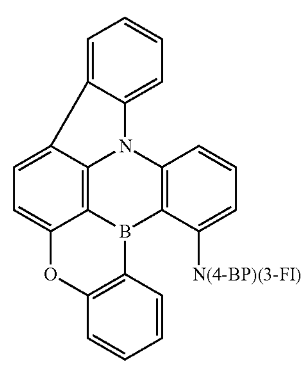

-continued
Compound 1-570
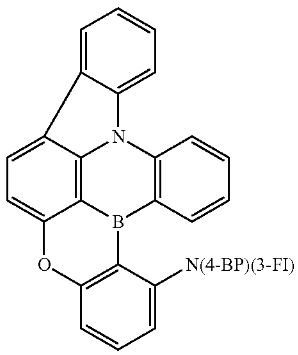
Compound 1-571
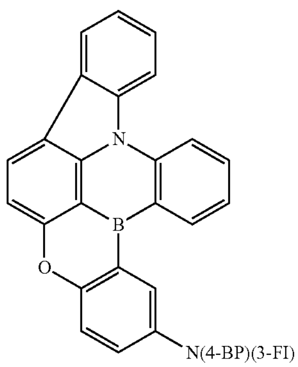
Compound 1-572
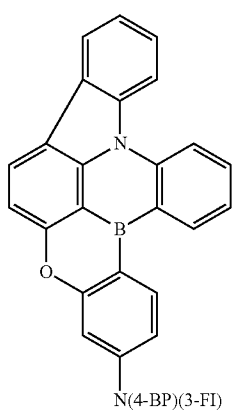
Compound 1-573
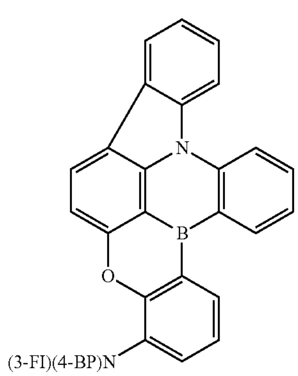
-continued
Compound 1-574
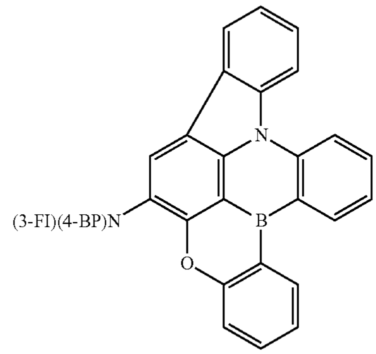
Compound 1-575
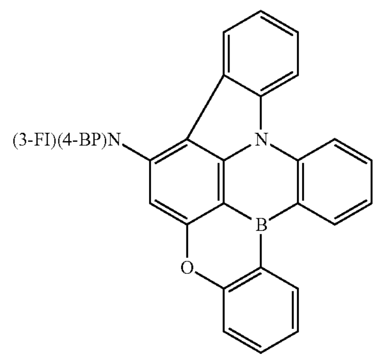
Compound 1-576
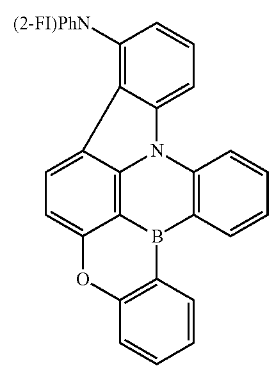
Compound 1-577
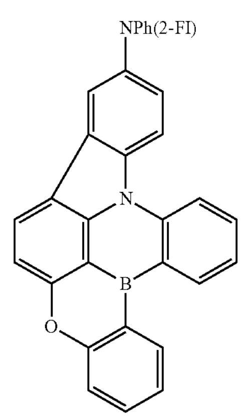

-continued
Compound 1-578
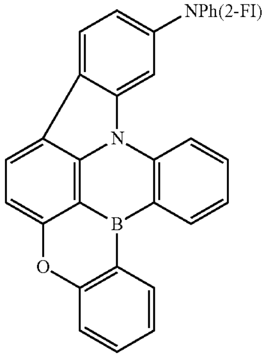
Compound 1-579
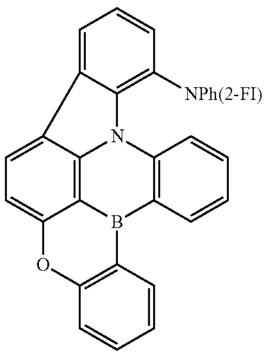
Compound 1-580
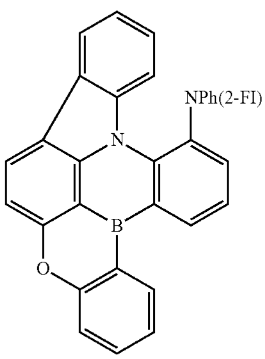
Compound 1-581
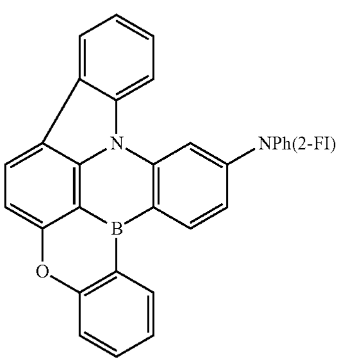
-continued
Compound 1-582
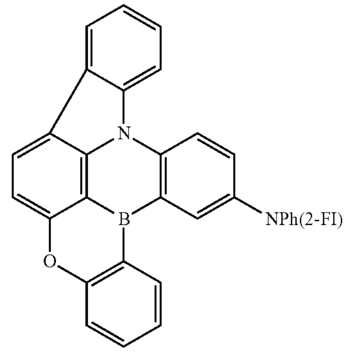
Compound 1-583
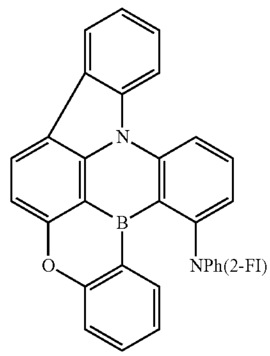
Compound 1-584
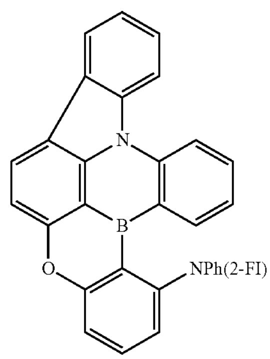
Compound 1-585
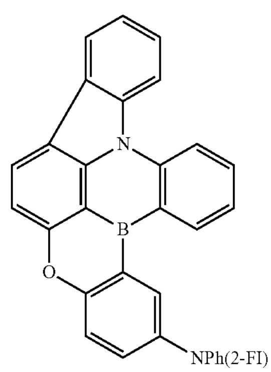

-continued
Compound 1-586
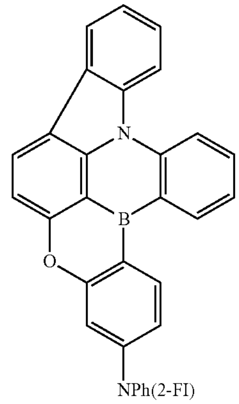
Compound 1-587
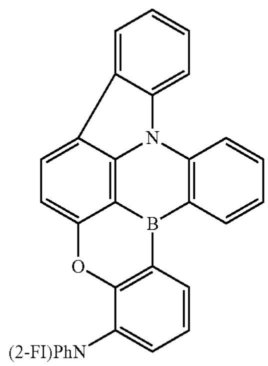
Compound 1-588
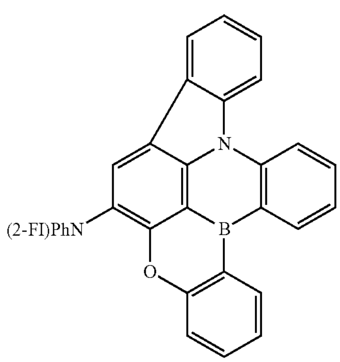
Compound 1-589
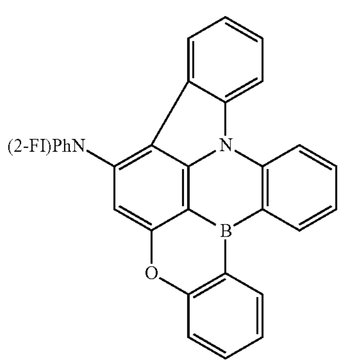
-continued
Compound 1-590
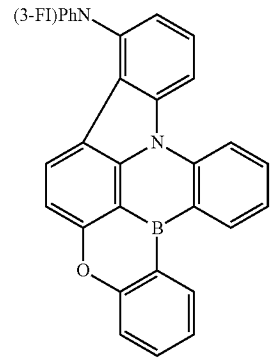
Compound 1-591
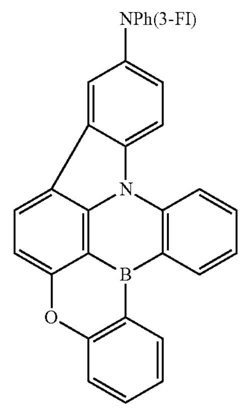
Compound 1-592
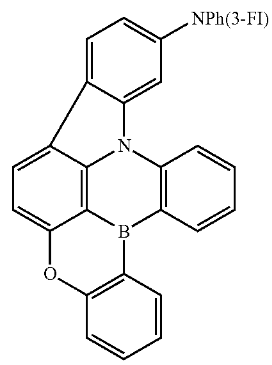
Compound 2-1
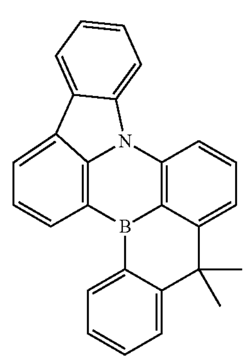

Compound 2-2
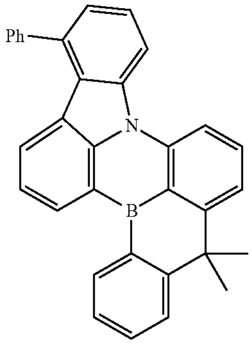
Compound 2-3
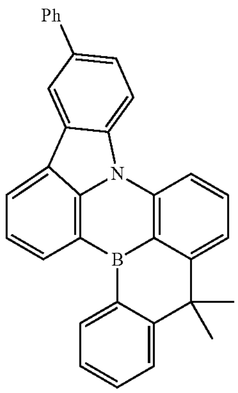
Compound 2-4
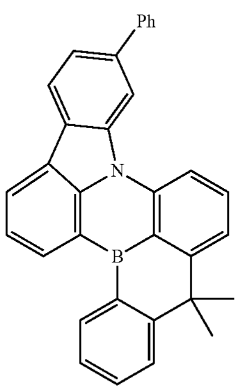
Compound 2-5
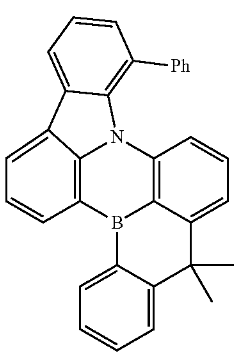
Compound 2-6
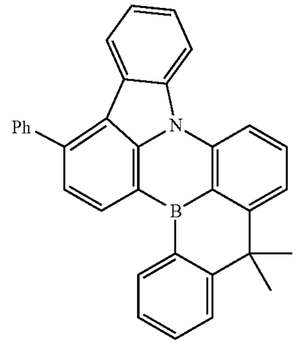
Compound 2-7
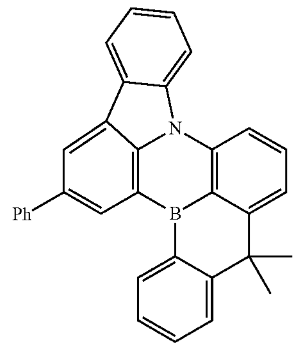
Compound 2-8
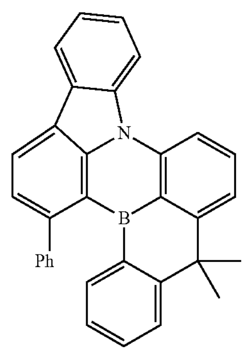
Compound 2-9
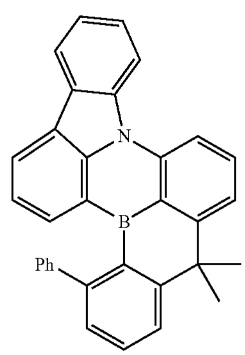

-continued
Compound 2-10
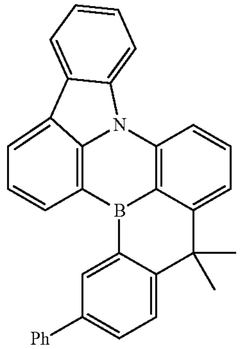
Compound 2-11
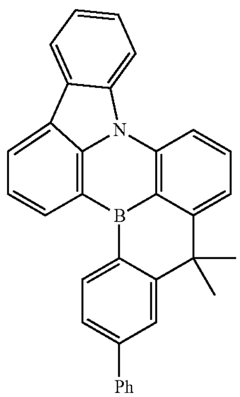
Compound 2-12
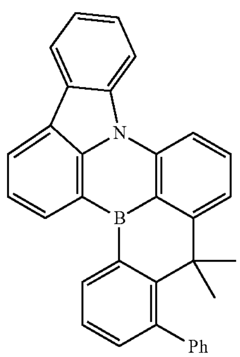
Compound 2-13
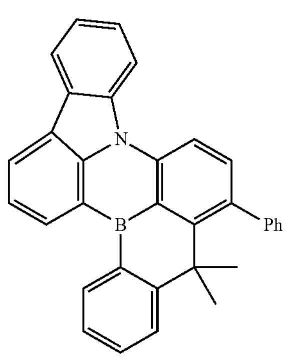
-continued
Compound 2-14
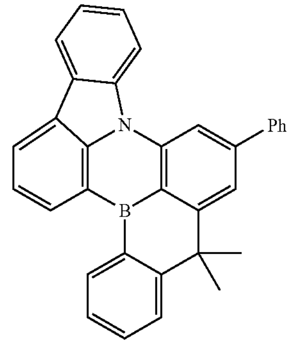
Compound 2-15
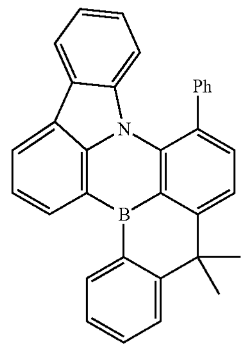
Compound 2-16
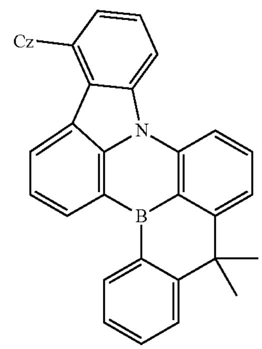
Compound 2-17
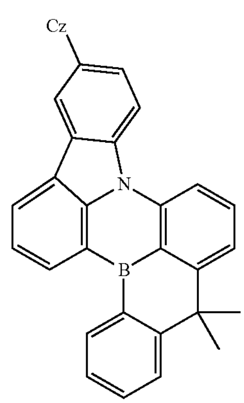

-continued
Compound 2-18
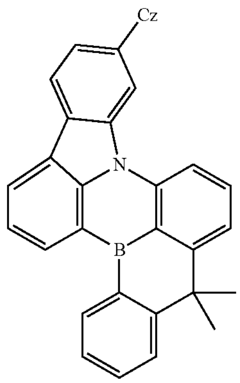
Compound 2-19
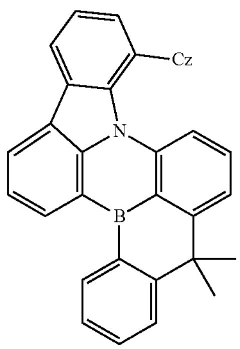
Compound 2-20
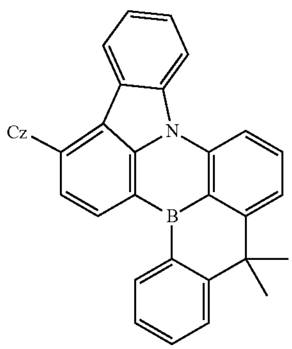
Compound 2-21
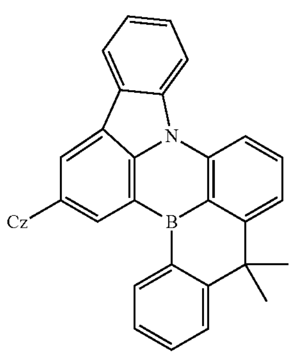
-continued
Compound 2-22
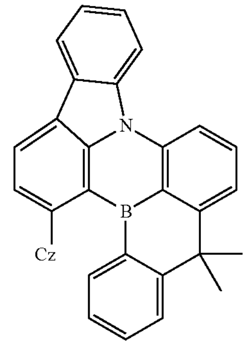
Compound 2-23
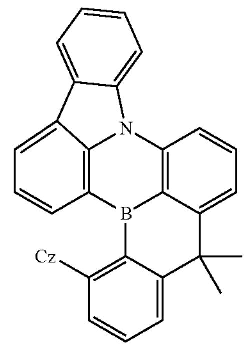
Compound 2-24
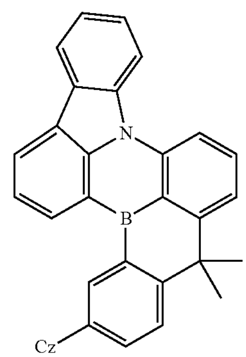
Compound 2-25
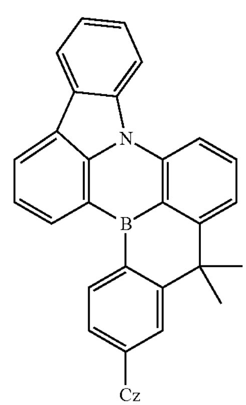

Compound 2-26
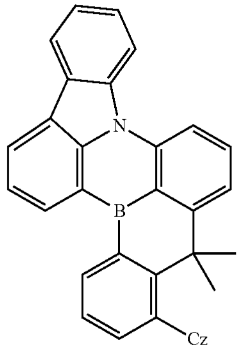
Compound 2-27
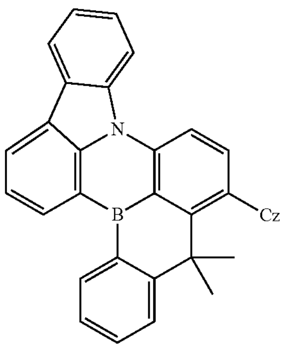
Compound 2-28
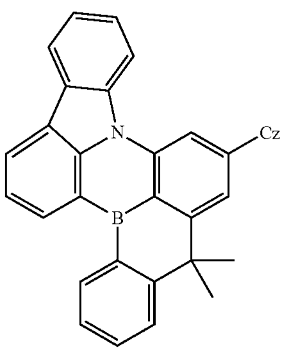
Compound 2-29
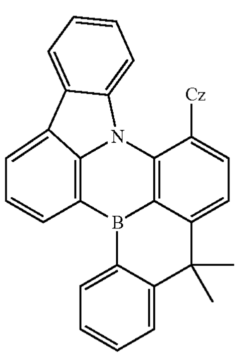
Compound 2-30
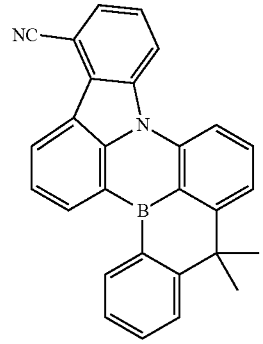
Compound 2-31
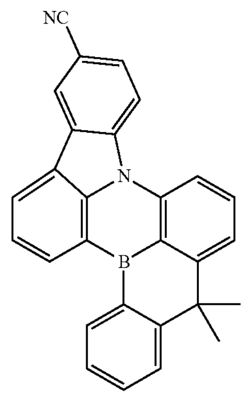
Compound 2-32
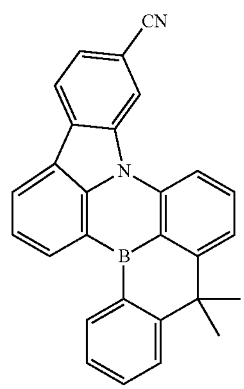
Compound 2-33
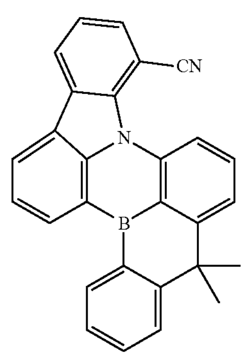

-continued
Compound 2-34
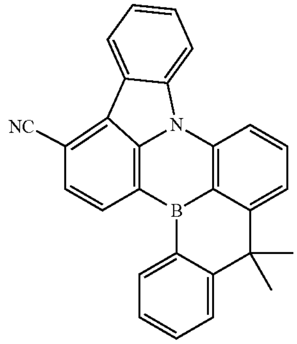
Compound 2-35
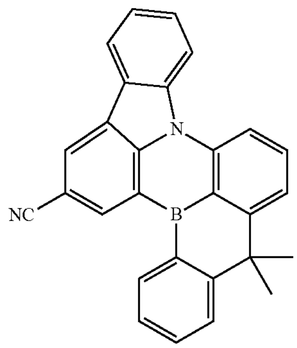
Compound 2-36
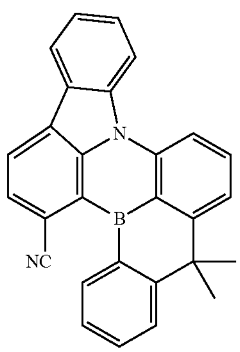
Compound 2-37
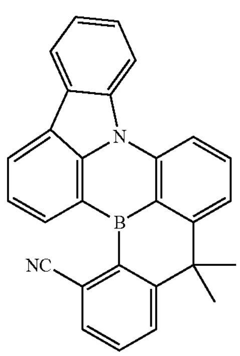
-continued
Compound 2-38
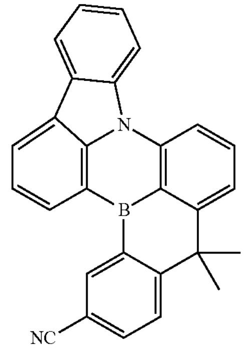
Compound 2-39
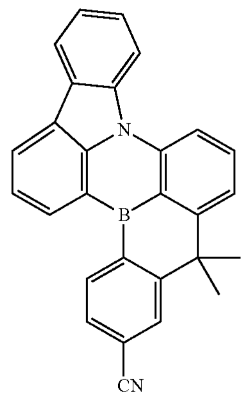
Compound 2-40
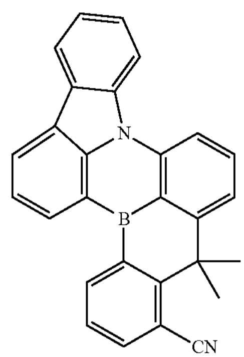
Compound 2-41
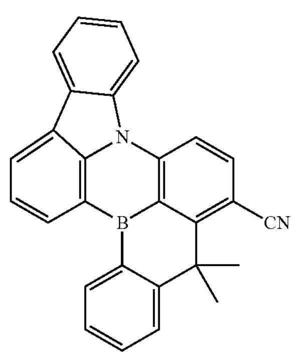

-continued
Compound 2-42
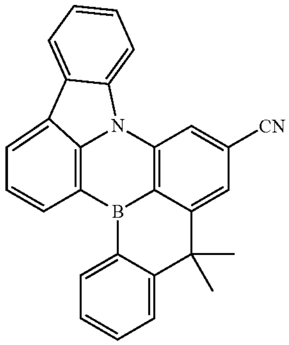
Compound 2-43
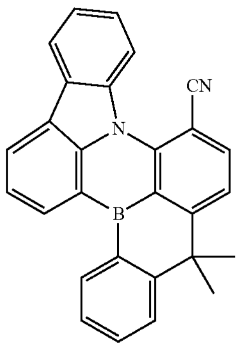
Compound 2-44
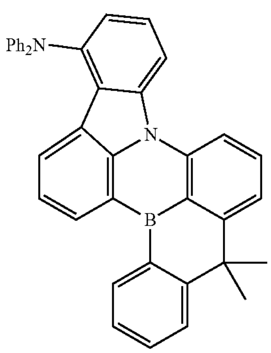
Compound 2-45
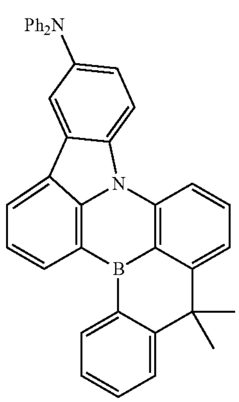
-continued
Compound 2-46
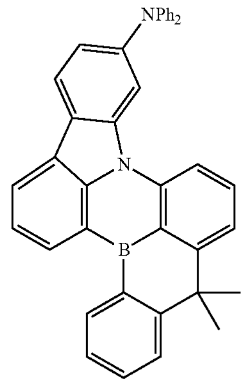
Compound 2-47
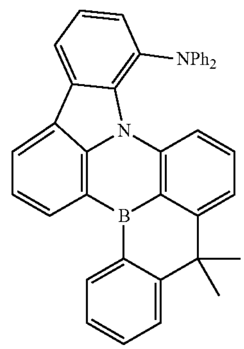
Compound 2-48
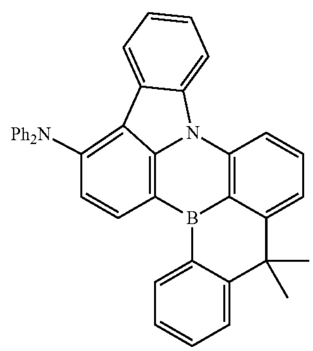
Compound 2-49
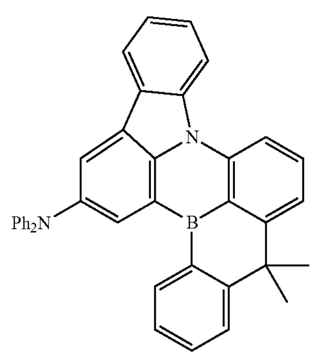

-continued
Compound 2-50
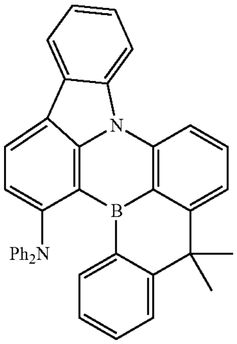
Compound 2-51
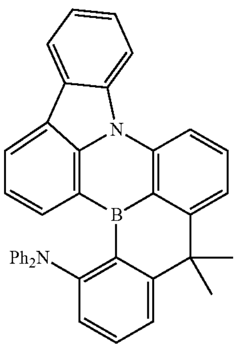
Compound 2-52
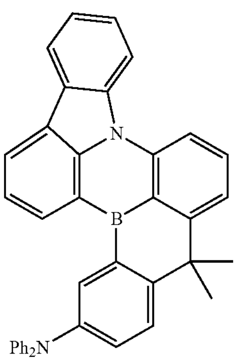
Compound 2-53
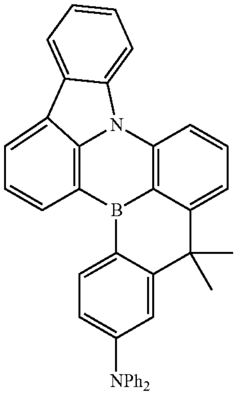
-continued
Compound 2-54
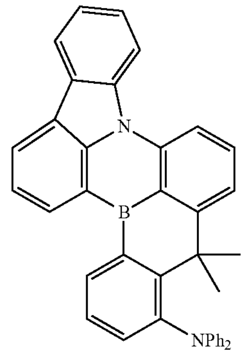
Compound 2-55
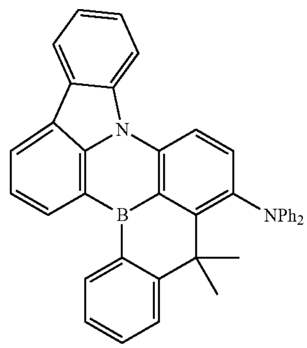
Compound 2-56
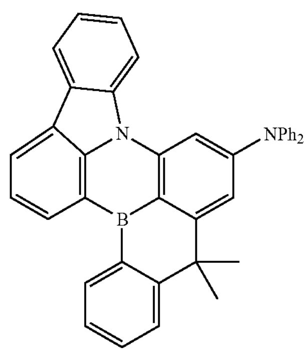
Compound 2-57
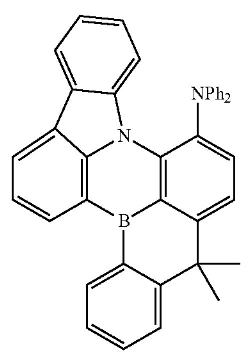

-continued
Compound 2-58
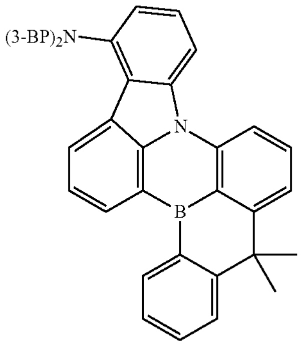
Compound 2-59
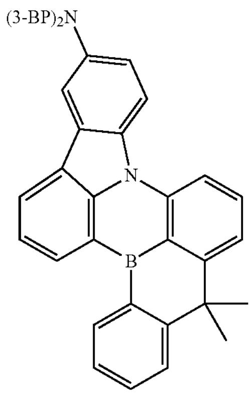
Compound 2-60
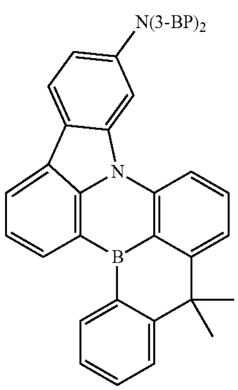
Compound 2-61
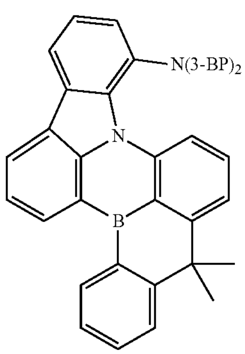
-continued
Compound 2-62
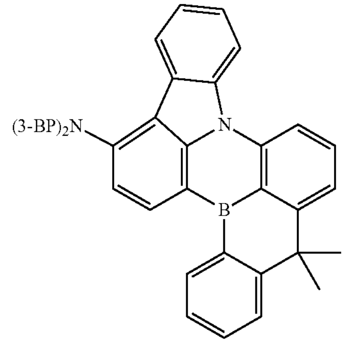
Compound 2-63
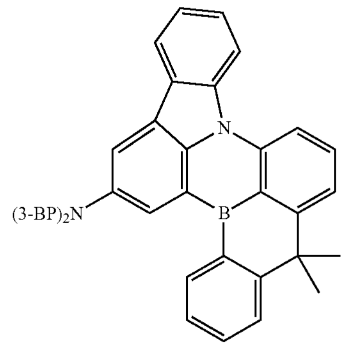
Compound 2-64
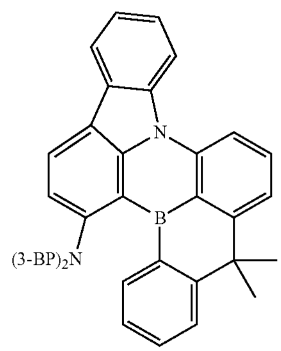
Compound 2-65
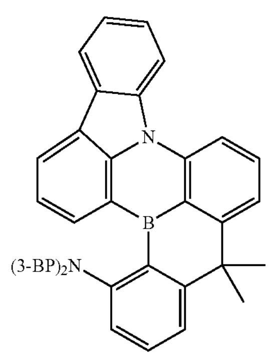

-continued
Compound 2-66
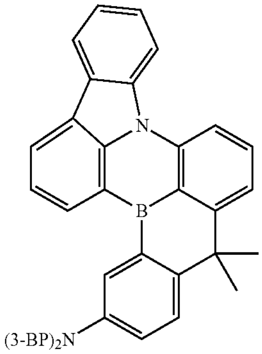
Compound 2-67
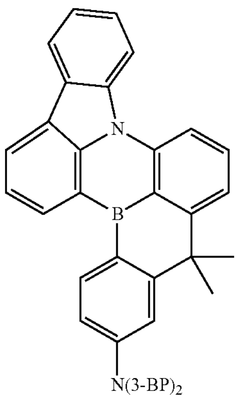
Compound 2-68
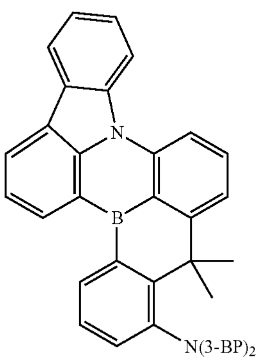
Compound 2-69
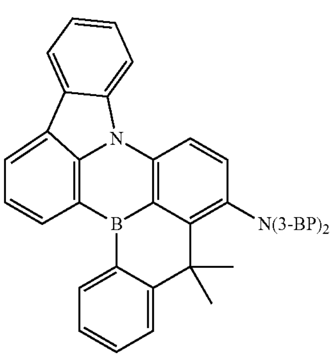
-continued
Compound 2-70
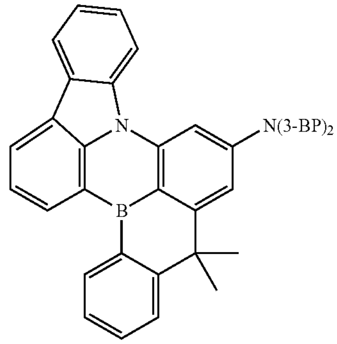
Compound 2-71
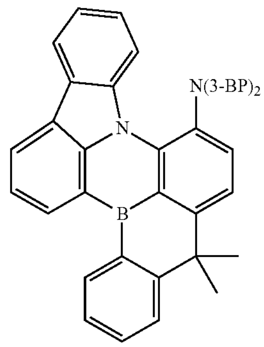
Compound 2-72
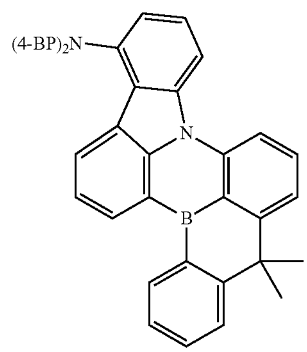
Compound 2-73
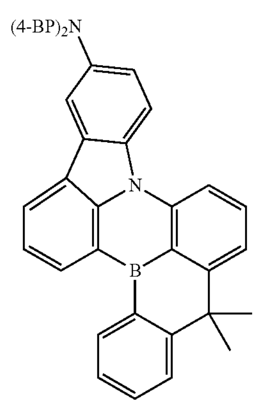

-continued
Compound 2-74
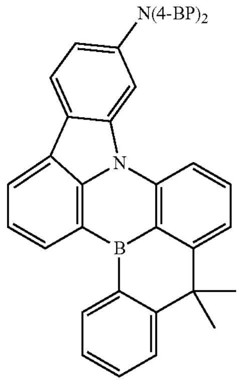
Compound 2-75
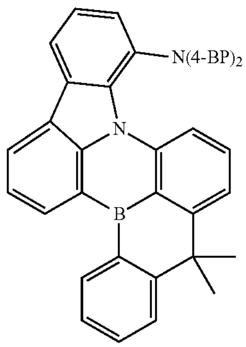
Compound 2-76
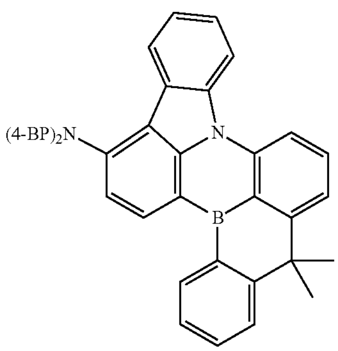
Compound 2-77
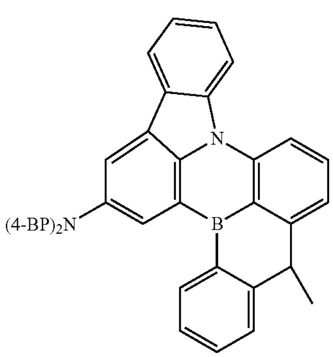
-continued
Compound 2-78
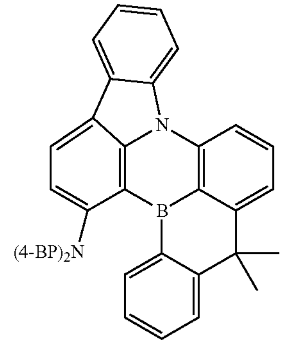
Compound 2-79
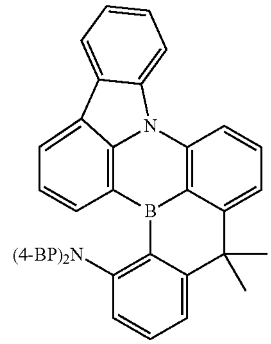
Compound 2-80
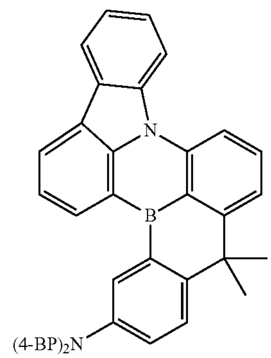
Compound 2-81
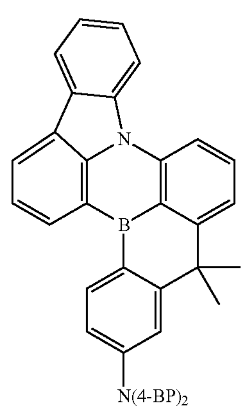

-continued
Compound 2-82
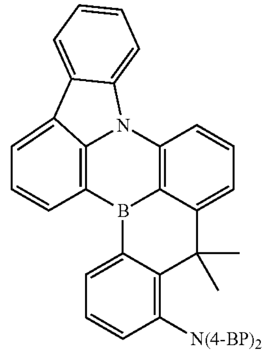
Compound 2-83
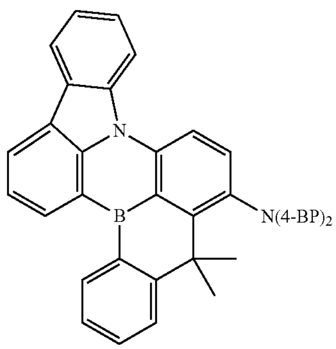
Compound 2-84
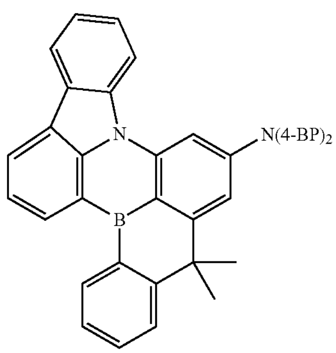
Compound 2-85
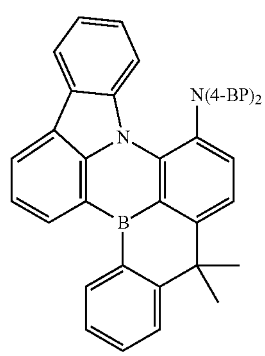
-continued
Compound 2-86
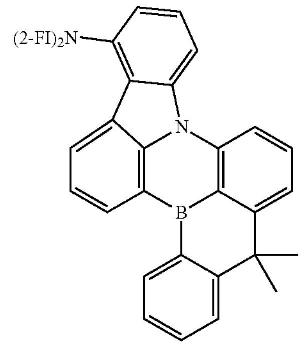
Compound 2-87
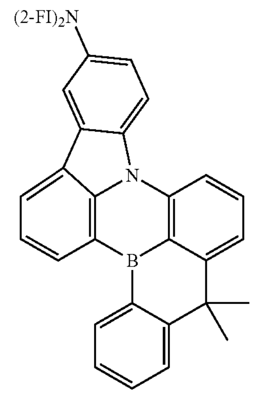
Compound 2-88
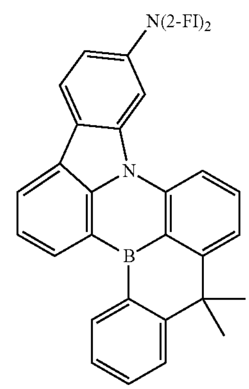
Compound 2-89
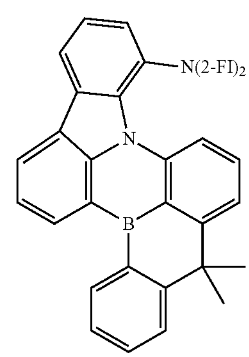

Compound 2-90
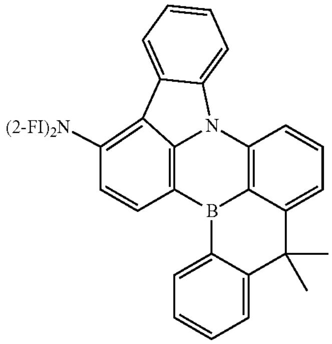
Compound 2-91
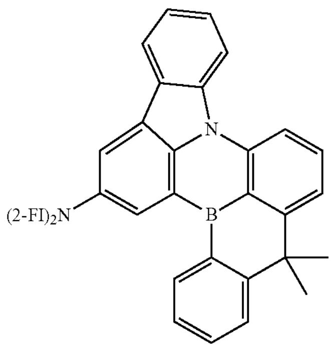
Compound 2-92
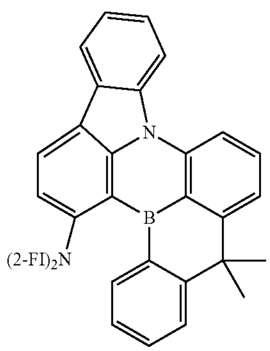
Compound 2-93
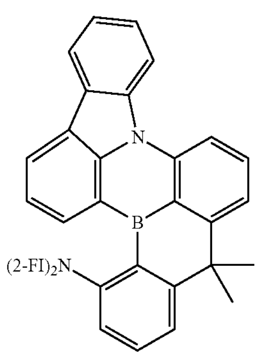
Compound 2-94
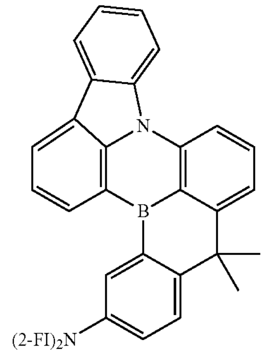
Compound 2-95
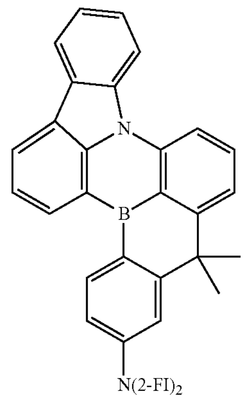
Compound 2-96
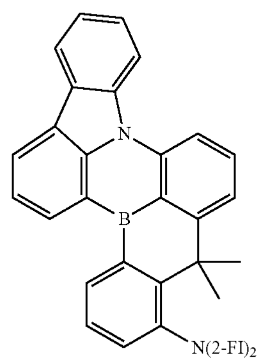
Compound 2-97
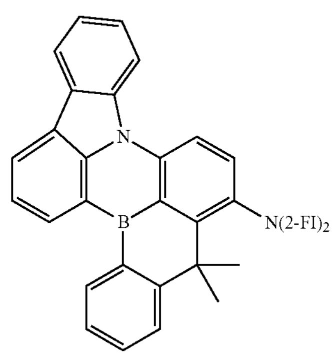

-continued
Compound 2-98
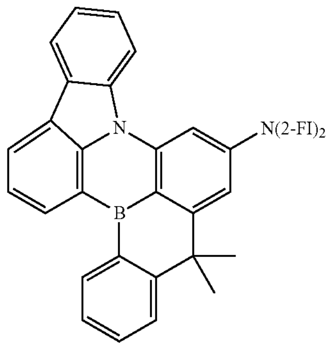
Compound 2-99
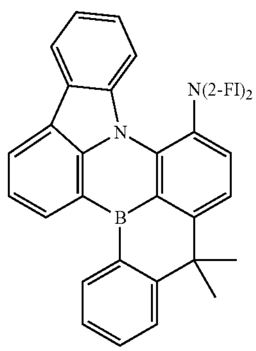
Compound 2-100
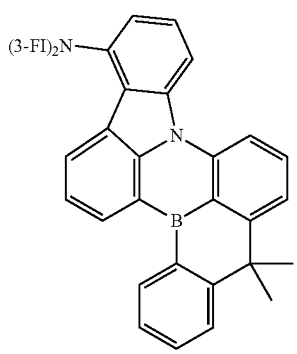
Compound 2-101
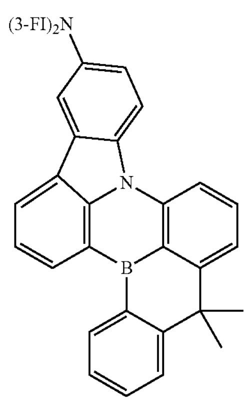
-continued
Compound 2-102
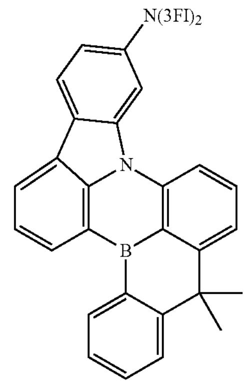
Compound 2-103
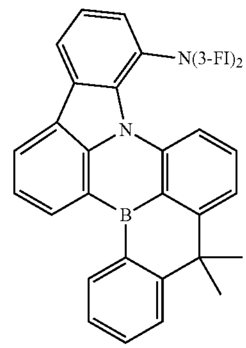
Compound 2-104
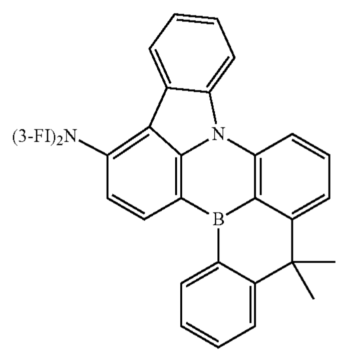
Compound 2-105
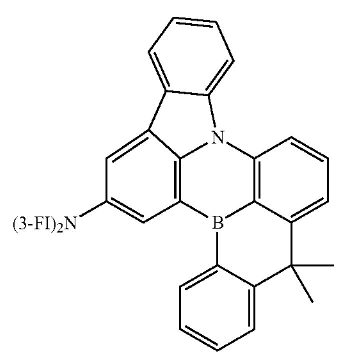

-continued
Compound 2-106
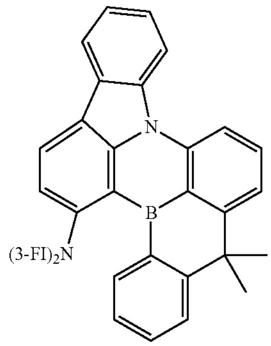
Compound 2-107
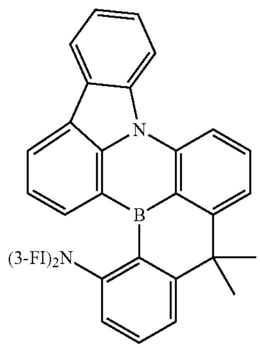
Compound 2-108
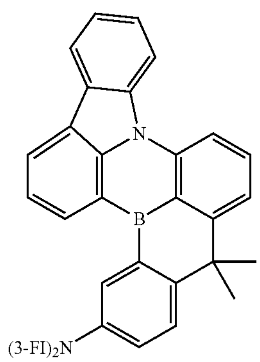
Compound 2-109
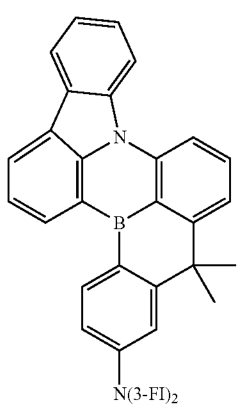
-continued
Compound 2-110
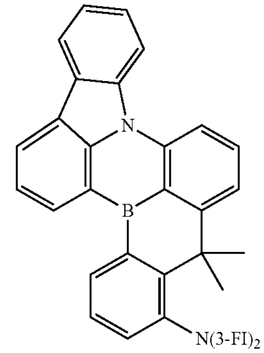
Compound 2-111
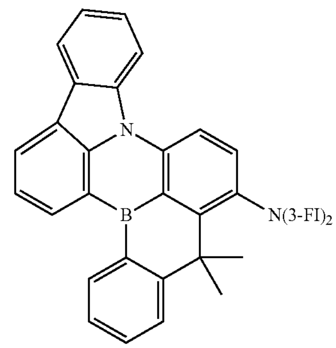
Compound 2-112
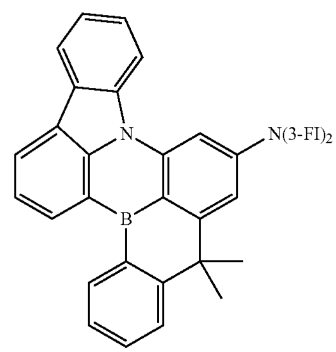
Compound 2-113
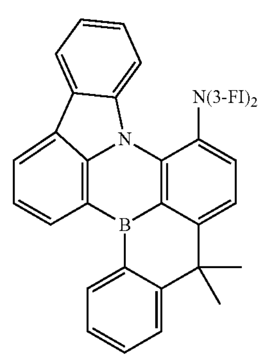

-continued
Compound 2-114
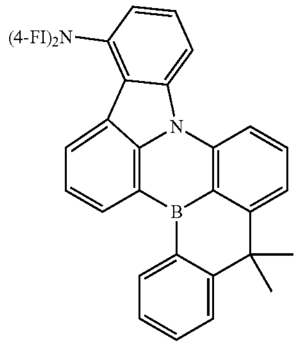
Compound 2-115
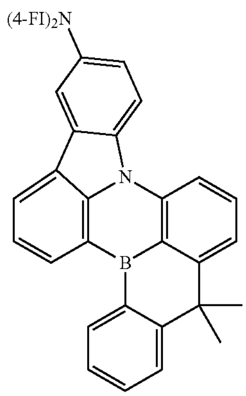
Compound 2-116
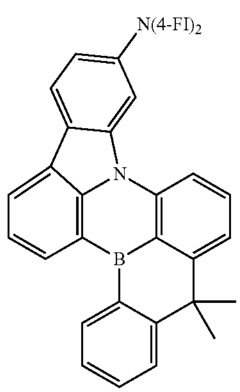
Compound 2-117
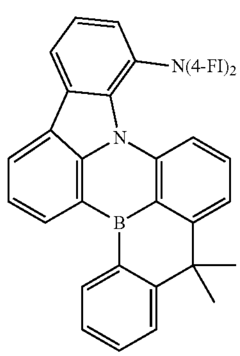
-continued
Compound 2-118
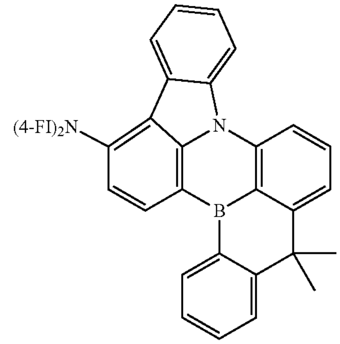
Compound 2-119
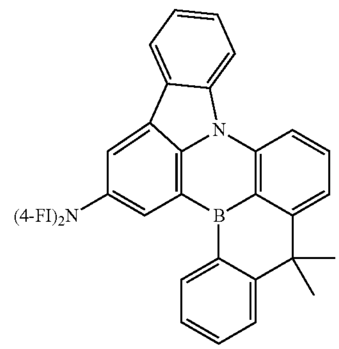
Compound 2-120
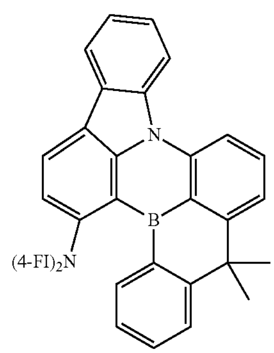
Compound 2-121
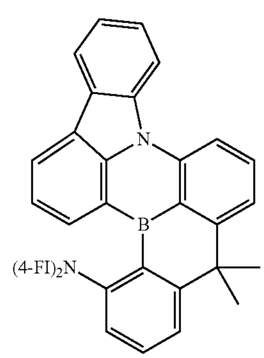

Compound 2-122
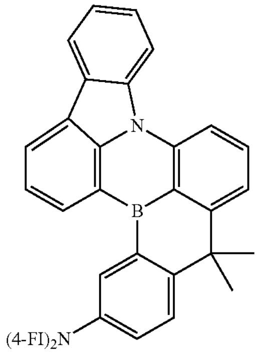
Compound 2-123
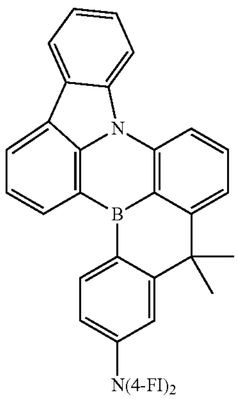
Compound 2-124
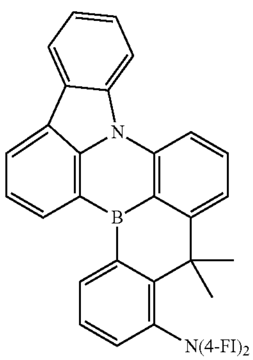
Compound 2-125
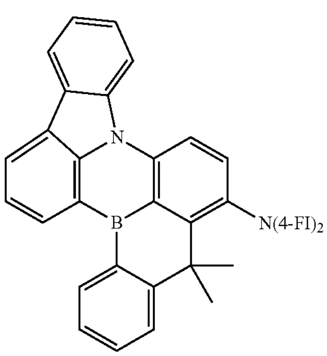
Compound 2-126
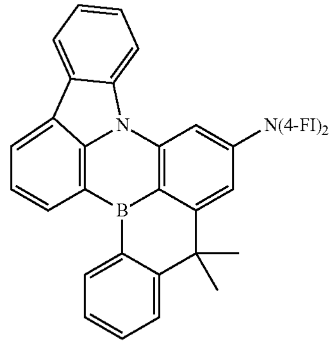
Compound 2-127
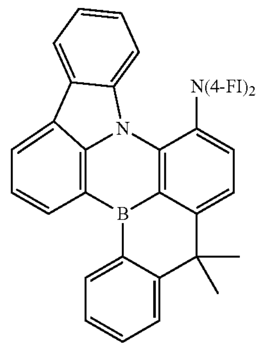
Compound 2-128
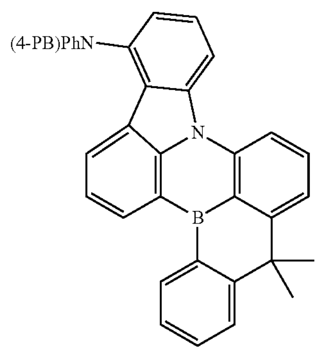
Compound 2-129
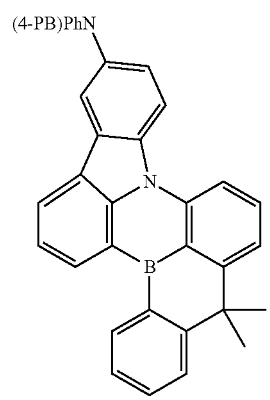

-continued
Compound 2-130
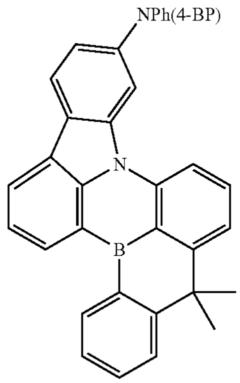
Compound 2-131
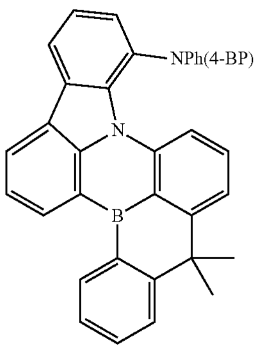
Compound 2-132
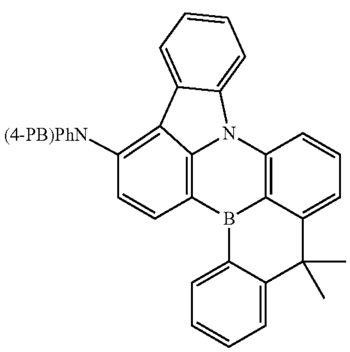
Compound 2-133
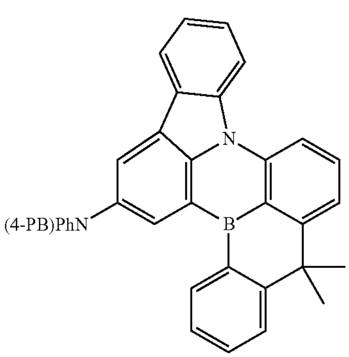
-continued
Compound 2-134
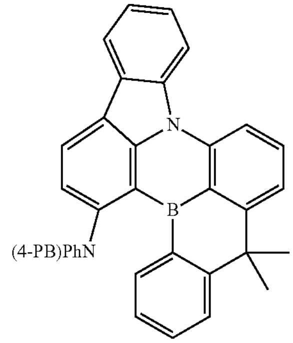
Compound 2-135
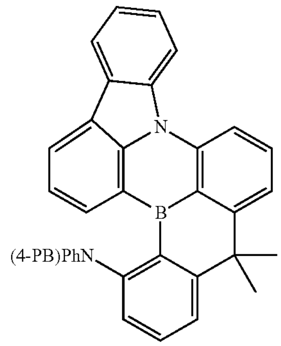
Compound 2-136
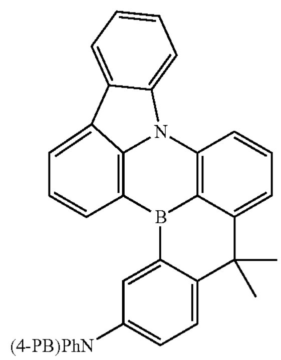
Compound 2-137
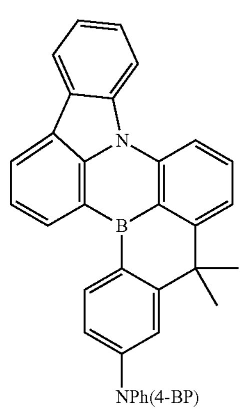

-continued
Compound 2-138
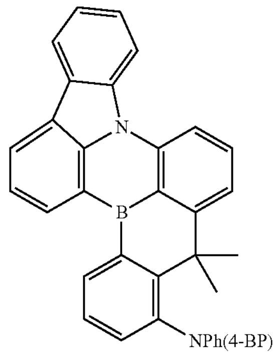
Compound 2-139
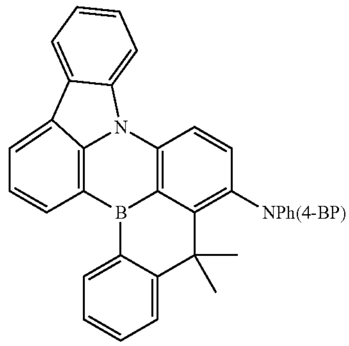
Compound 2-140
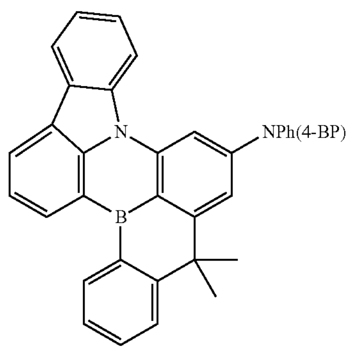
Compound 2-141
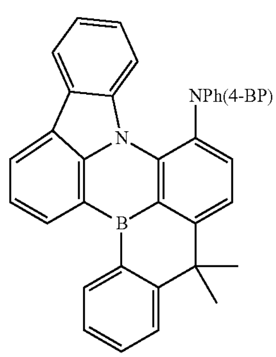
-continued
Compound 2-142
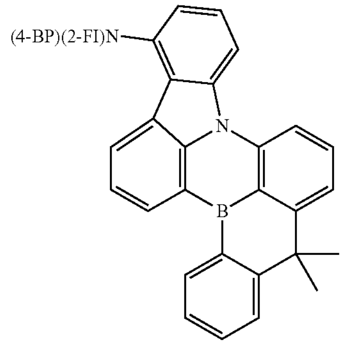
Compound 2-143
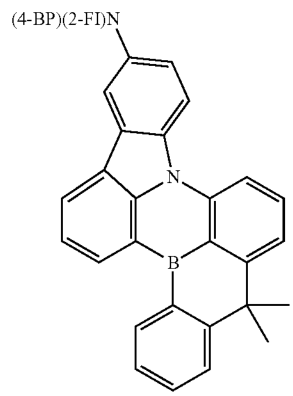
Compound 2-144
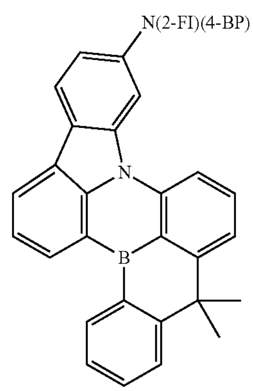
Compound 2-145
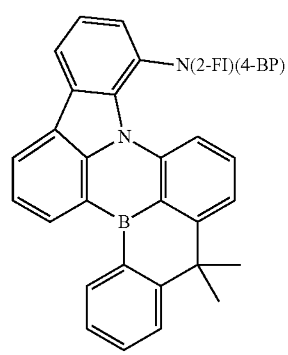

-continued
Compound 2-146
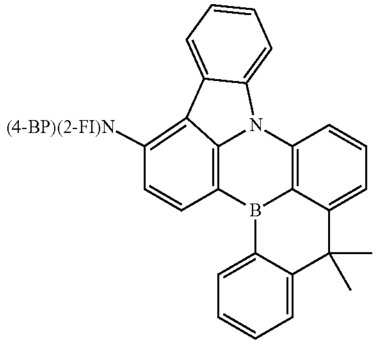
Compound 2-147
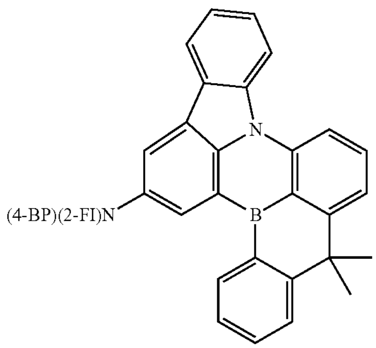
Compound 2-148
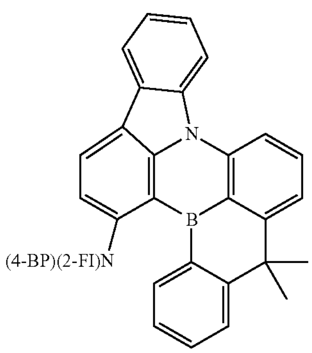
Compound 2-149
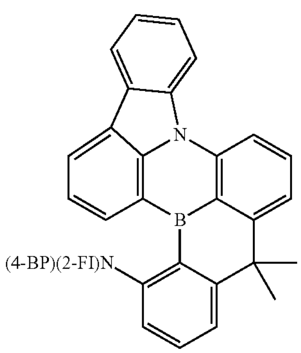
-continued
Compound 2-150
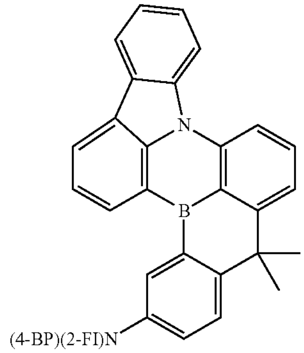
Compound 2-151
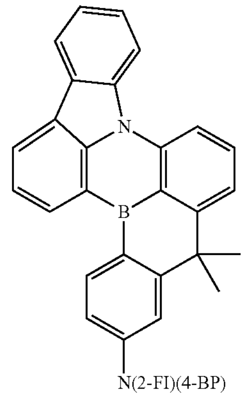
Compound 2-152
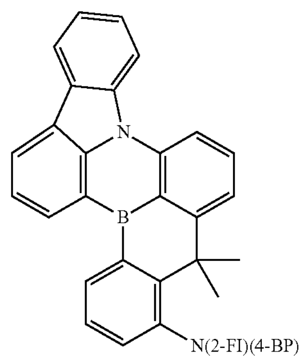
Compound 2-153
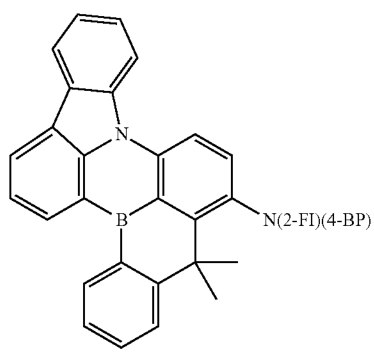

Compound 2-154
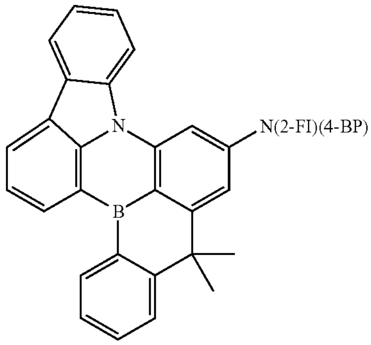
Compound 2-155
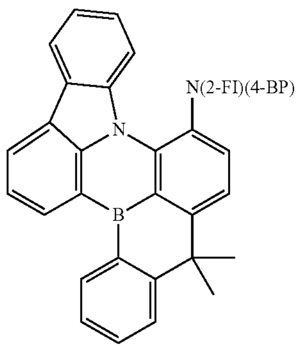
Compound 2-156
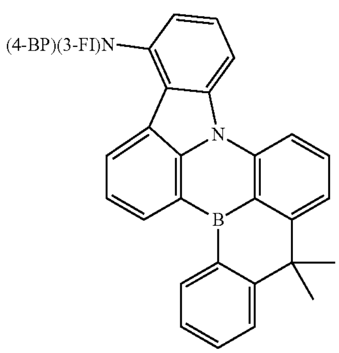
Compound 2-157
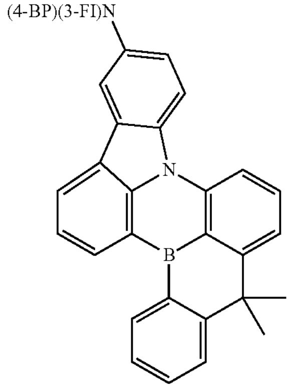
Compound 2-158
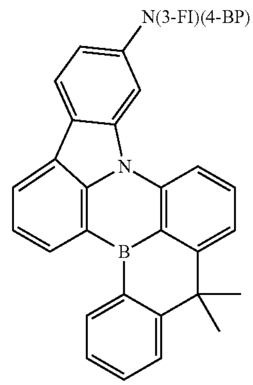
Compound 2-159
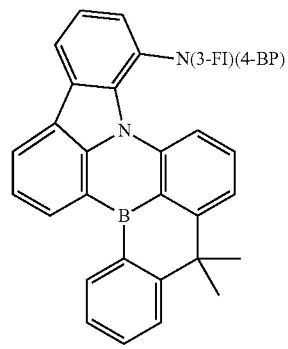
Compound 2-160
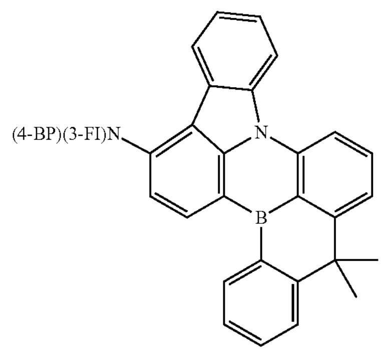
Compound 2-161
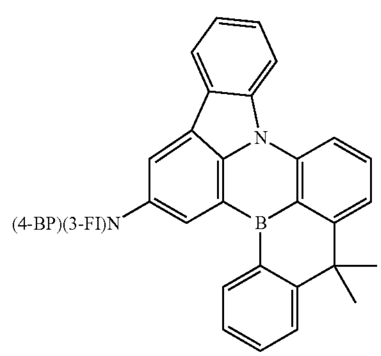

-continued
Compound 2-162
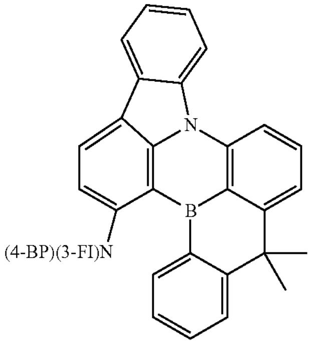
Compound 2-163
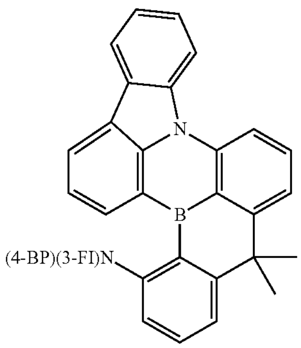
Compound 2-164
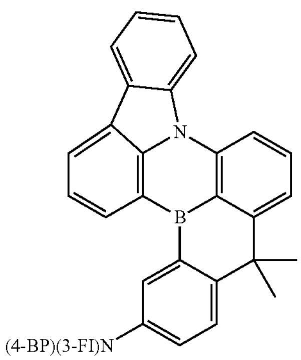
Compound 2-165
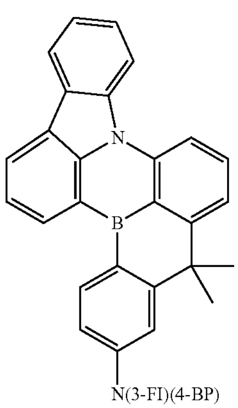
-continued
Compound 2-166
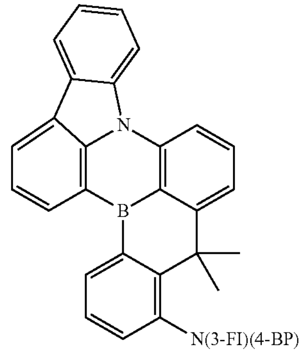
Compound 2-167
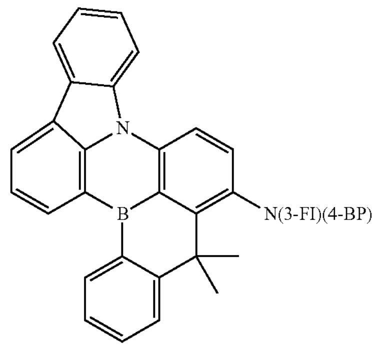
Compound 2-168
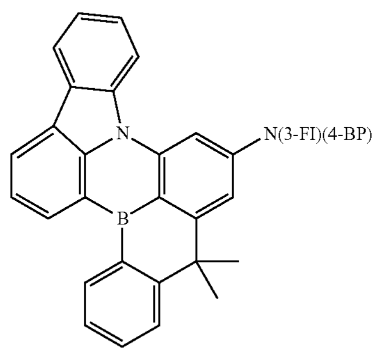
Compound 2-169
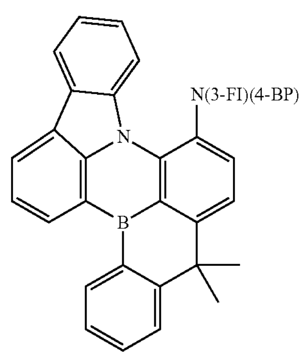

-continued
Compound 2-170
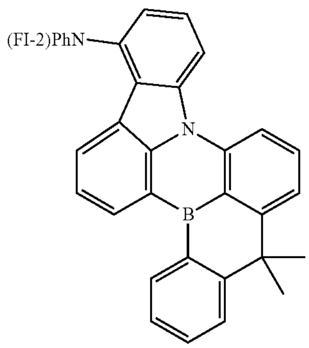
Compound 2-171
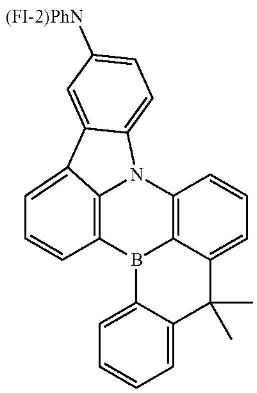
Compound 2-172
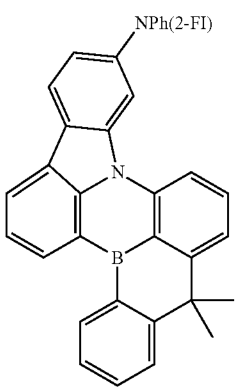
Compound 2-173
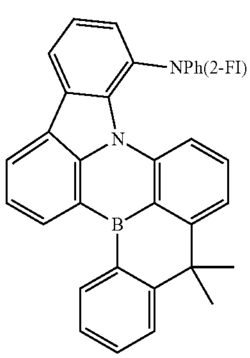
-continued
Compound 2-174
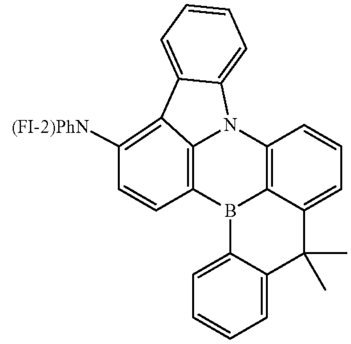
Compound 2-175
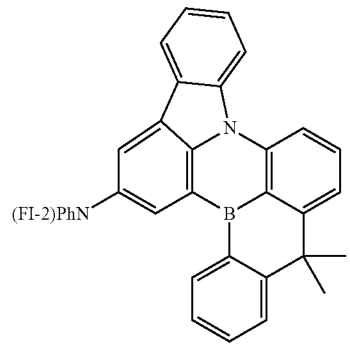
Compound 2-176
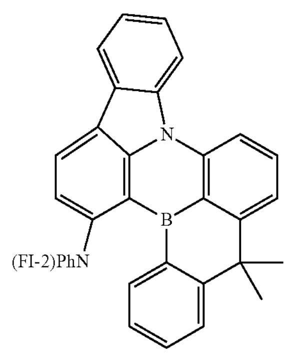
Compound 2-177
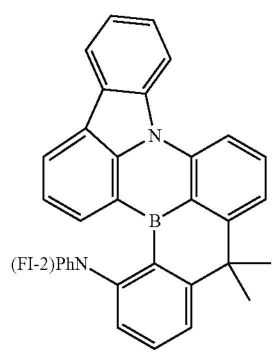

-continued
Compound 2-178
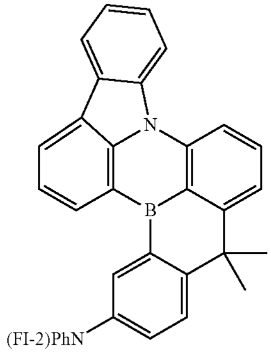
Compound 2-179
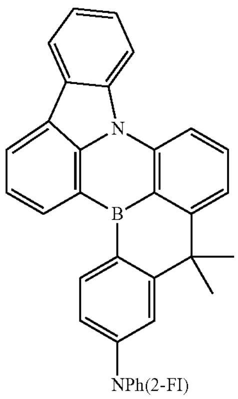
Compound 2-180
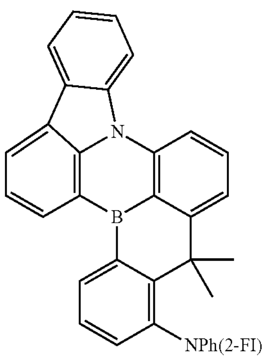
Compound 2-181
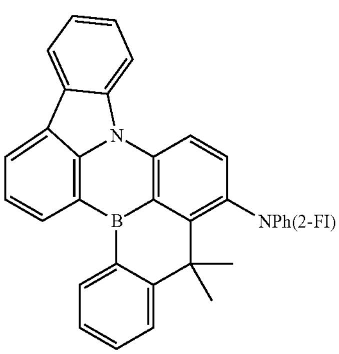
-continued
Compound 2-182
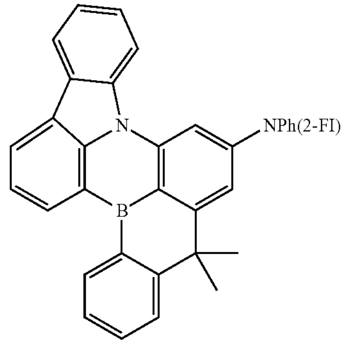
Compound 2-183
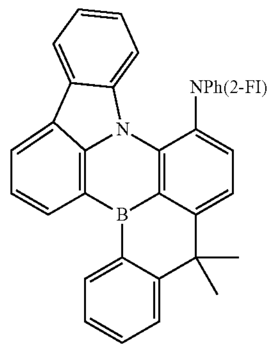
Compound 2-184
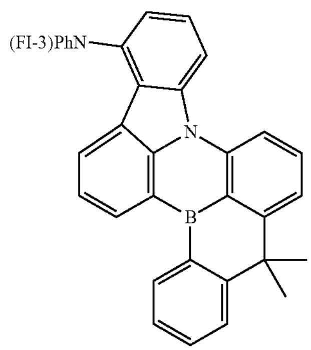
Compound 2-185
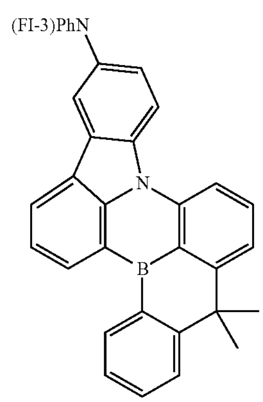

-continued
Compound 2-186
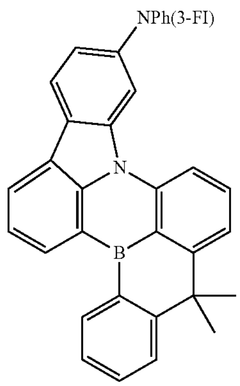
Compound 2-187
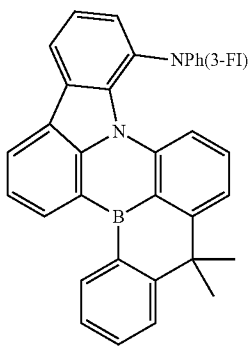
Compound 2-188
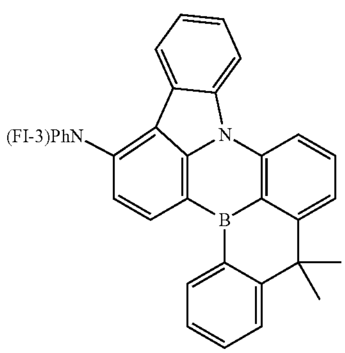
Compound 2-189
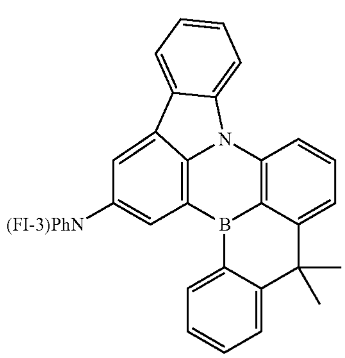
-continued
Compound 2-190
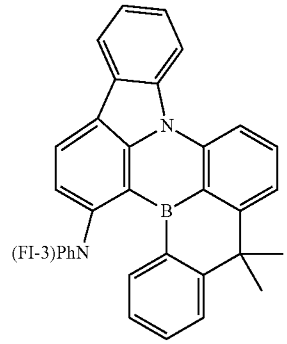
Compound 2-191
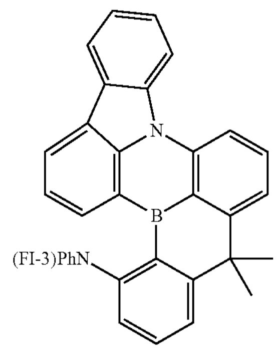
Compound 2-192
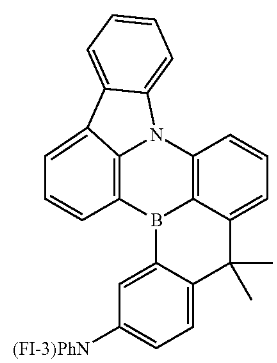
Compound 2-193
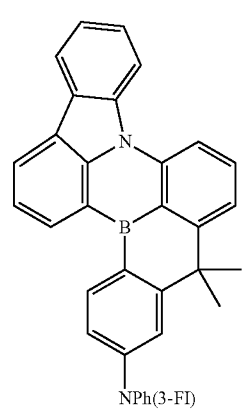

-continued
Compound 2-194
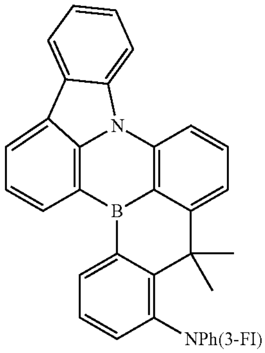
Compound 2-195
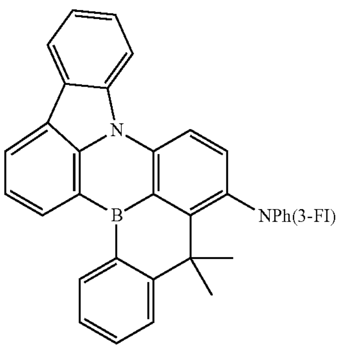
Compound 2-196
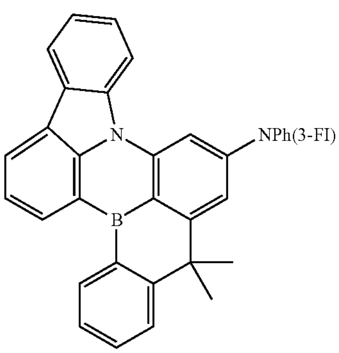
Compound 2-197
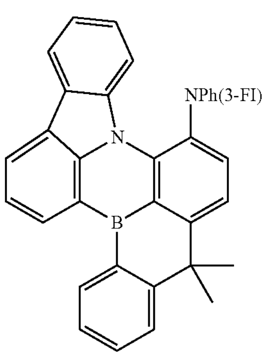
-continued
Compound 2-198
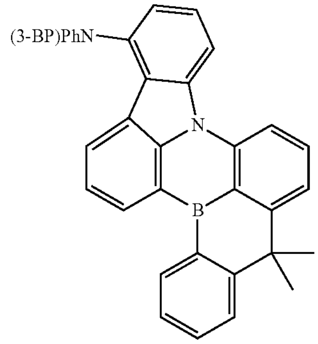
Compound 2-199
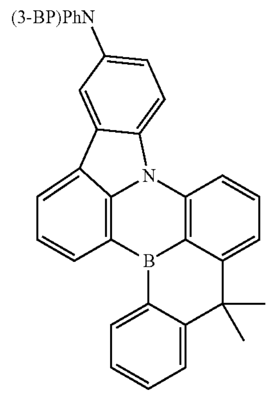
Compound 2-200
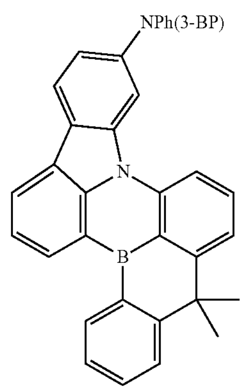
Compound 2-201
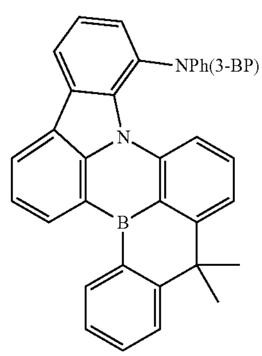

-continued
Compound 2-202
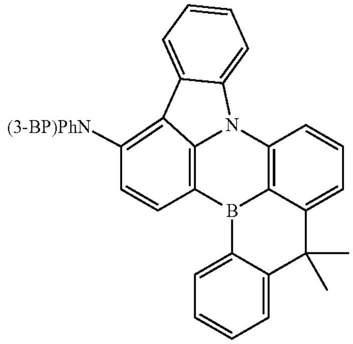
Compound 2-203
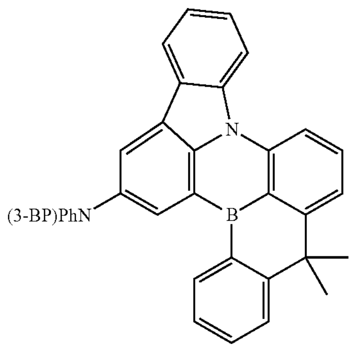
Compound 2-204
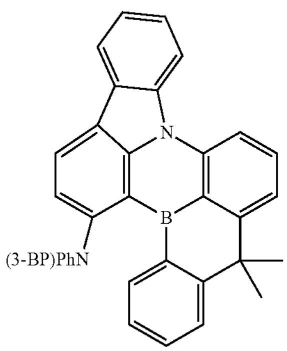
Compound 2-205
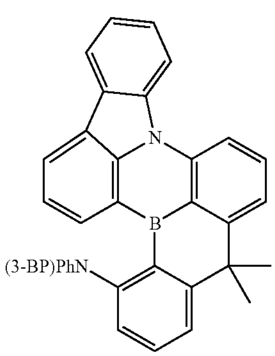
-continued
Compound 2-206
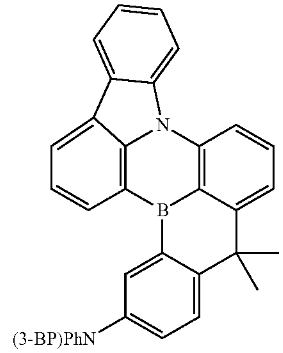
Compound 2-207
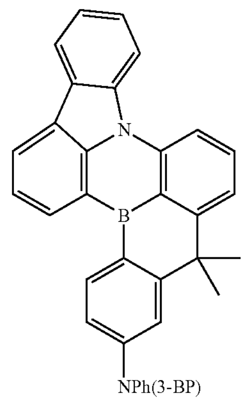
Compound 2-208
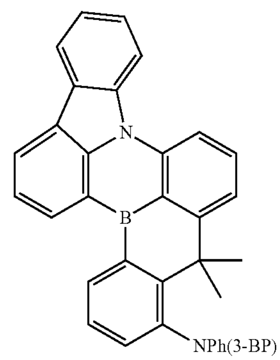
Compound 2-209
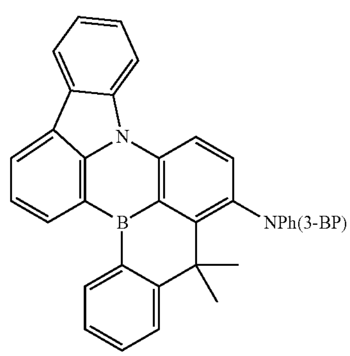

Compound 2-210
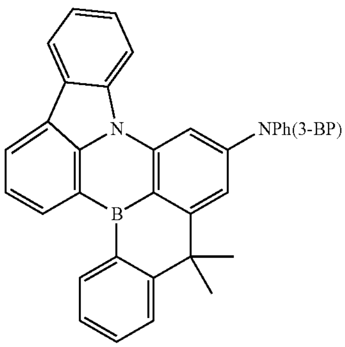
Compound 2-211
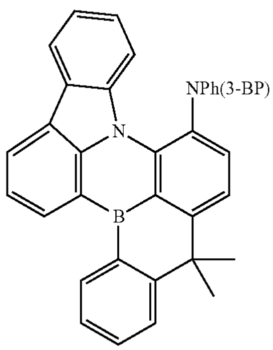
Compound 2-212
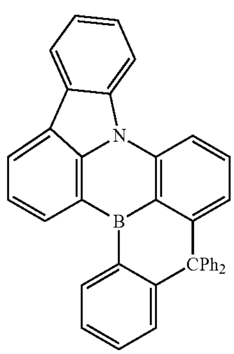
Compound 2-213
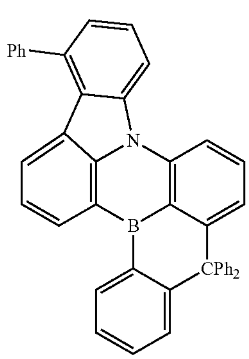
Compound 2-214
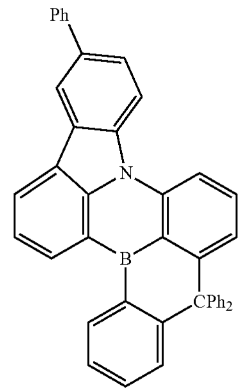
Compound 2-215
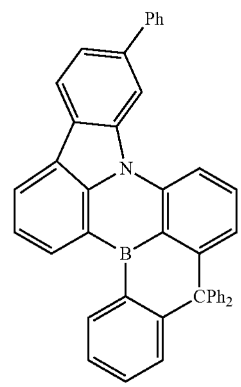
Compound 2-216
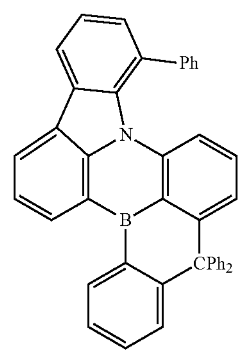
Compound 2-217
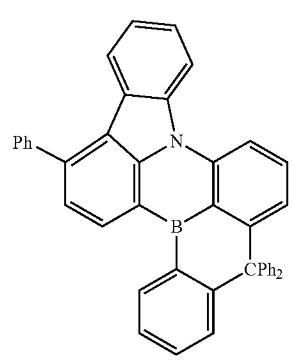

Compound 2-218
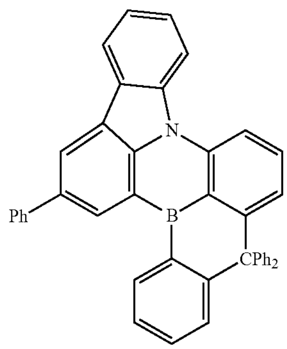
Compound 2-219
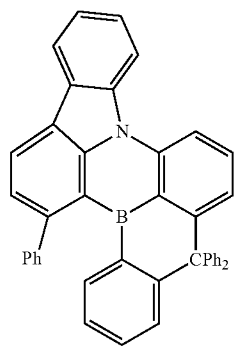
Compound 2-220
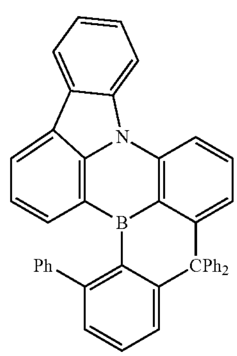
Compound 2-221
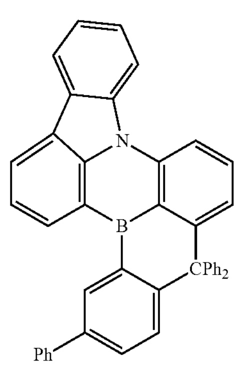
Compound 2-222
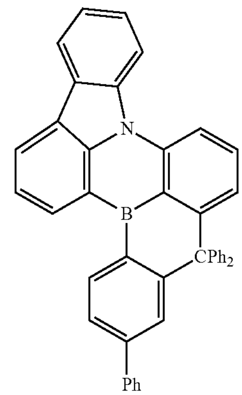
Compound 2-223
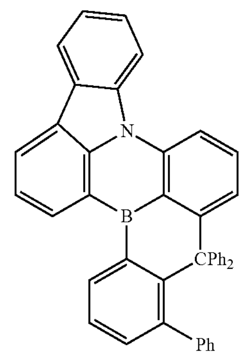
Compound 2-224
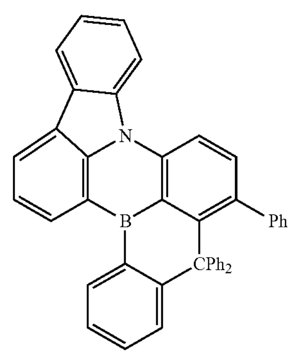
Compound 2-225
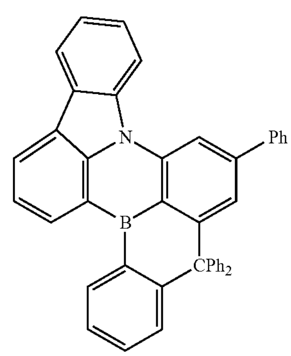

Compound 2-226
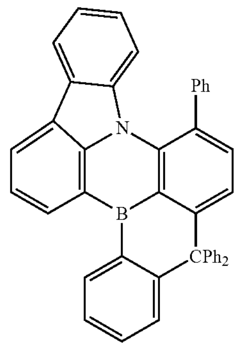
Compound 2-227
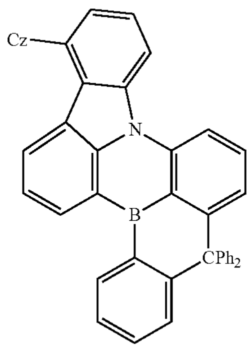
Compound 2-228
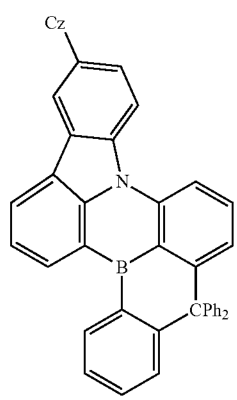
Compound 2-229
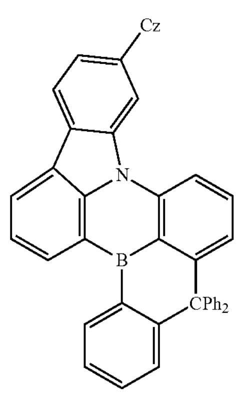
Compound 2-230
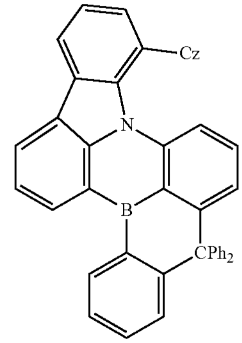
Compound 2-231
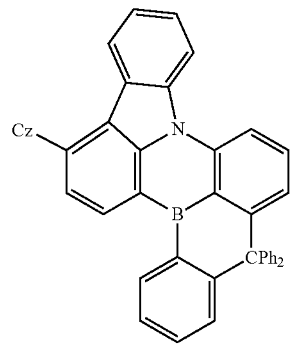
Compound 2-233
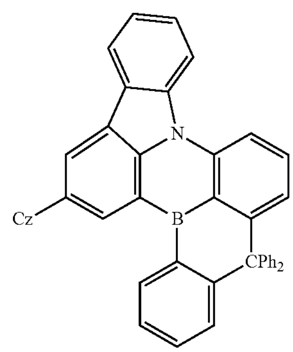
Compound 2-233
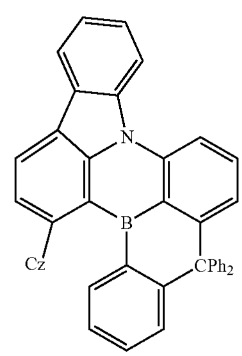

-continued
Compound 2-234
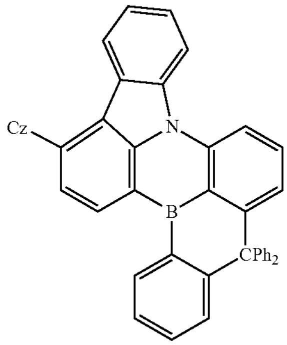
Compound 2-235
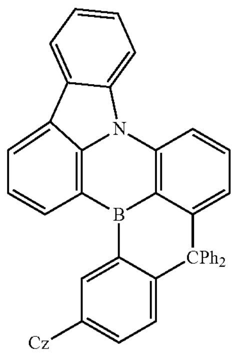
Compound 2-236
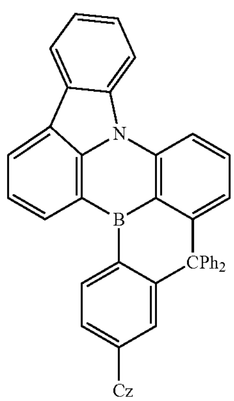
Compound 2-237
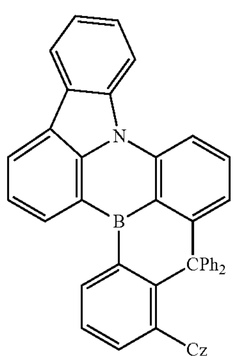
-continued
Compound 2-238
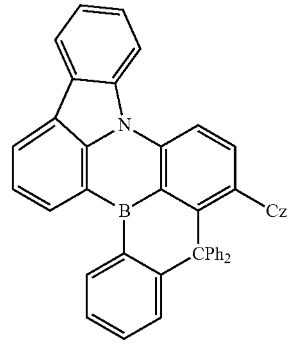
Compound 2-239
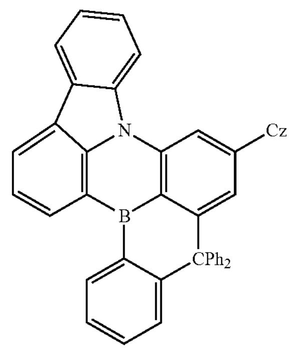
Compound 2-240
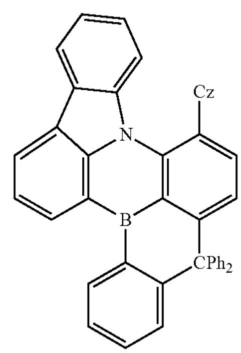
Compound 2-241
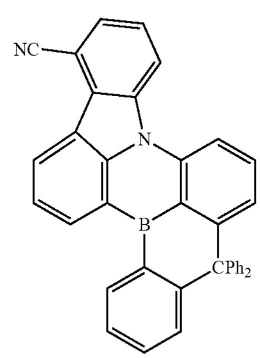

-continued
Compound 2-242
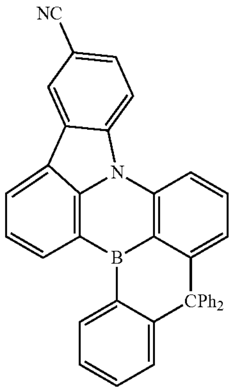
Compound 2-243
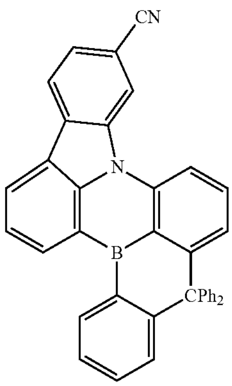
Compound 2-244
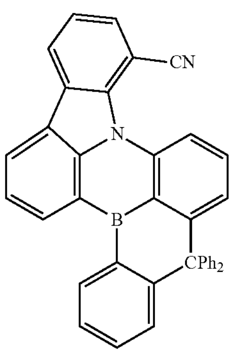
Compound 2-245
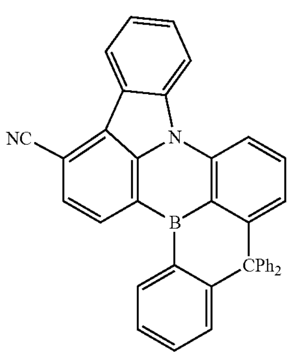
-continued
Compound 2-246
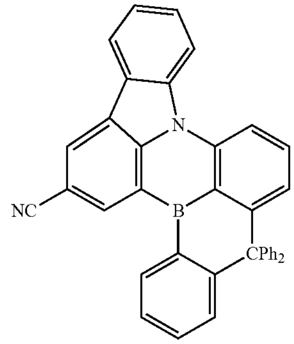
Compound 2-247
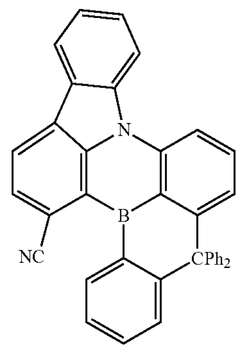
Compound 2-248
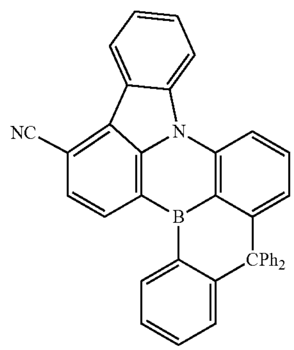
Compound 2-249
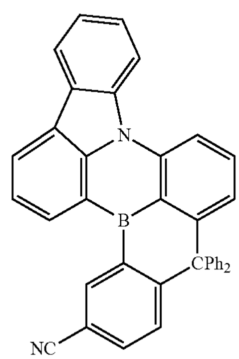

Compound 2-250
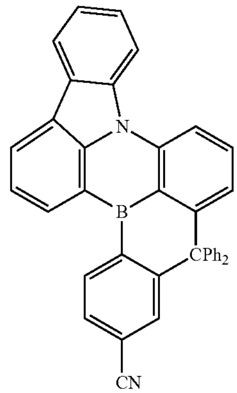
Compound 2-251
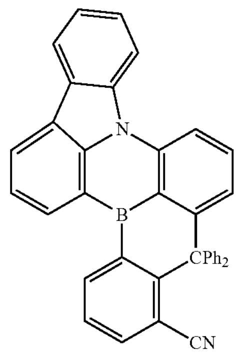
Compound 2-252
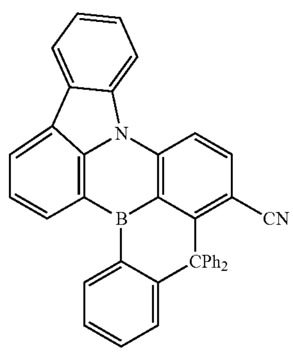
Compound 2-253
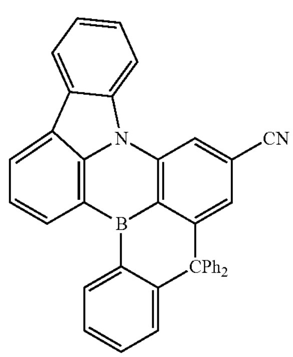
Compound 2-254
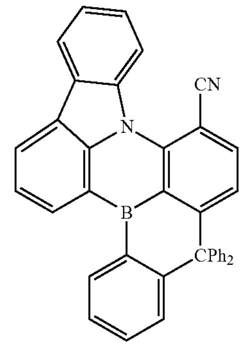
Compound 2-255
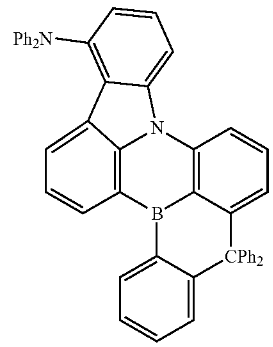
Compound 2-256
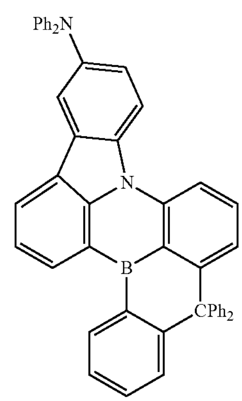
Compound 2-257
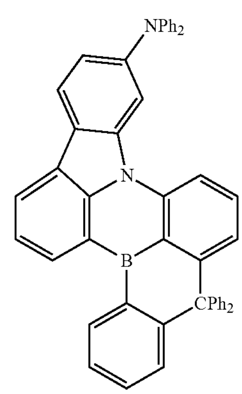

-continued
Compound 2-258
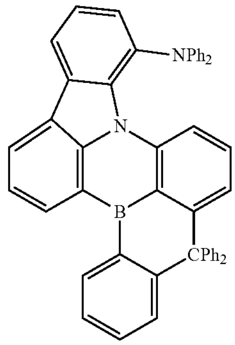
Compound 2-259
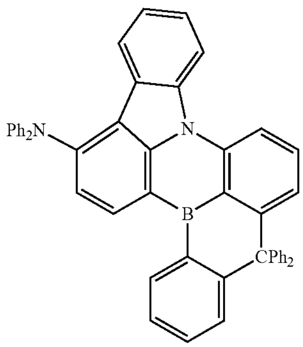
Compound 2-260
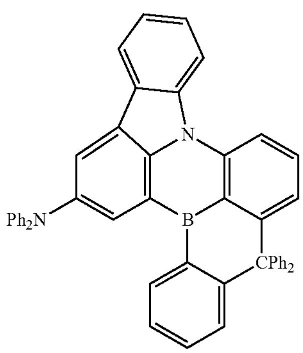
Compound 2-261
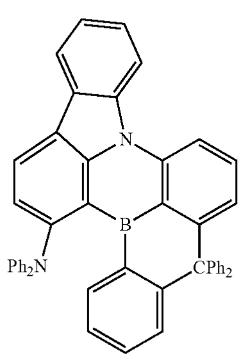
-continued
Compound 2-262
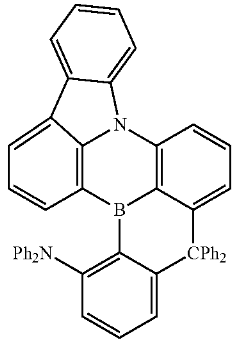
Compound 2-263
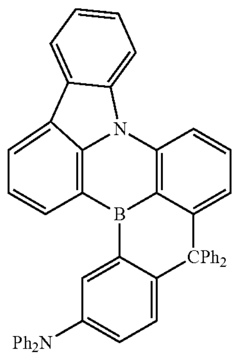
Compound 2-264
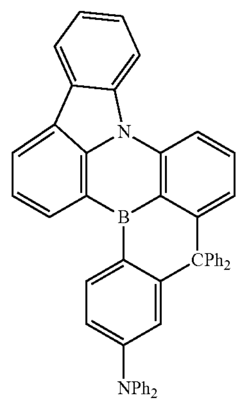
Compound 2-265
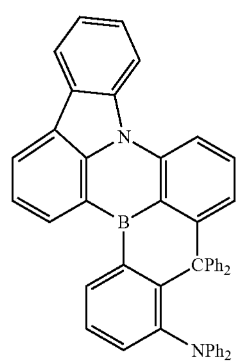

-continued
Compound 2-266
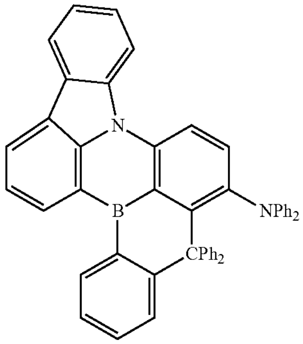
Compound 2-267
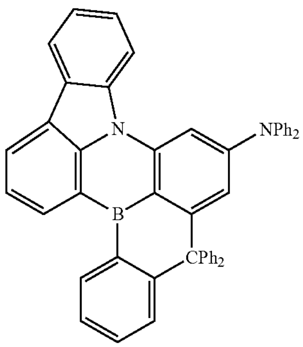
Compound 2-268
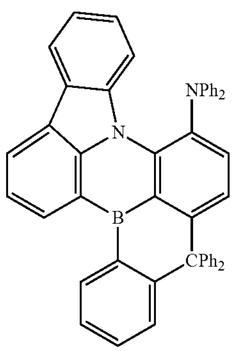
Compound 2-269
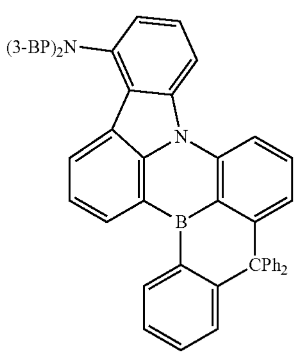
-continued
Compound 2-270
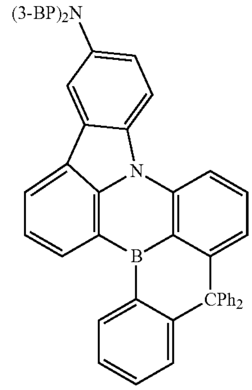
Compound 2-271
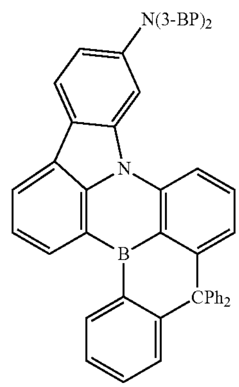
Compound 2-272
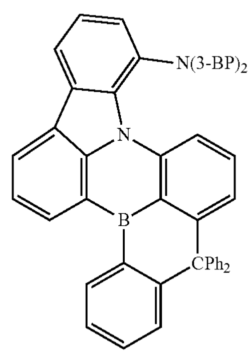
Compound 2-273
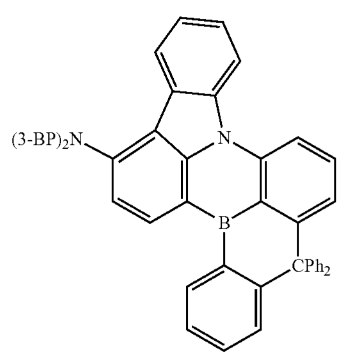

-continued
Compound 2-274
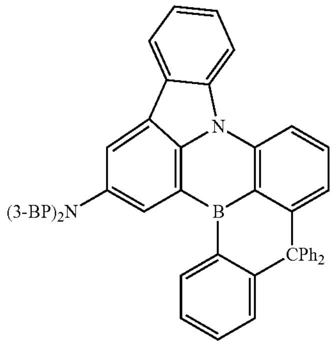
Compound 2-275
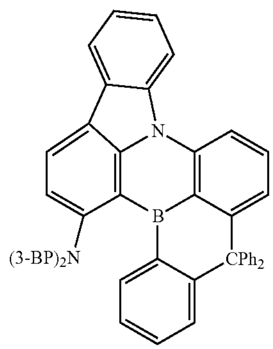
Compound 2-276
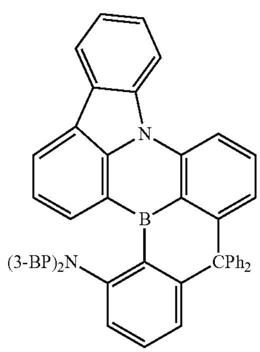
Compound 2-277
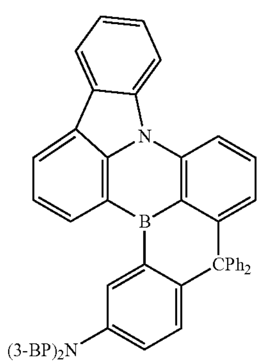
-continued
Compound 2-278
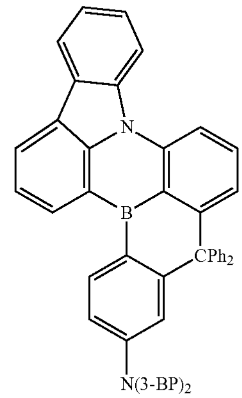
Compound 2-279
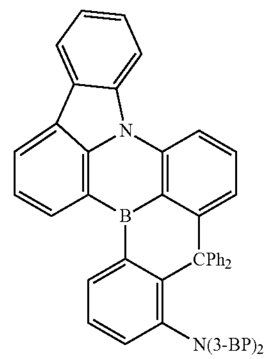
Compound 2-280
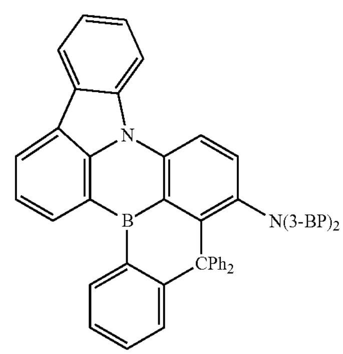
Compound 2-281
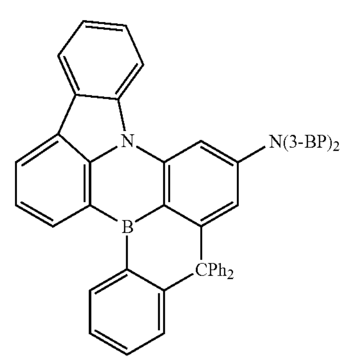

-continued
Compound 2-282
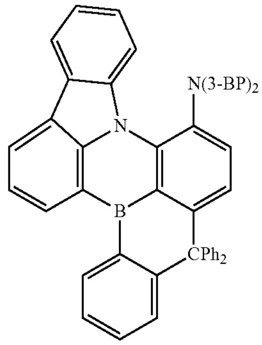
Compound 2-283
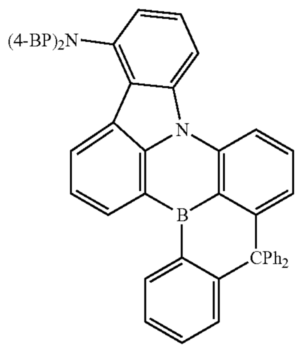
Compound 2-284
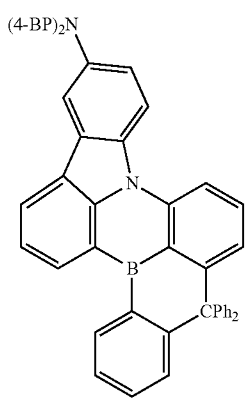
Compound 2-285
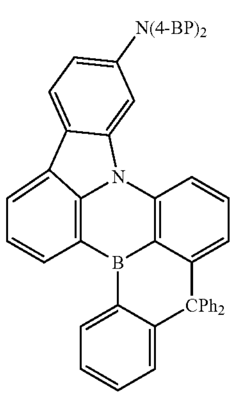
-continued
Compound 2-286
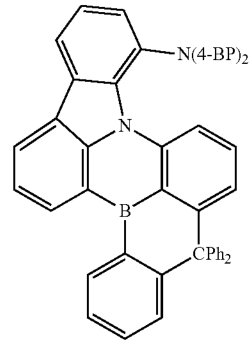
Compound 2-287
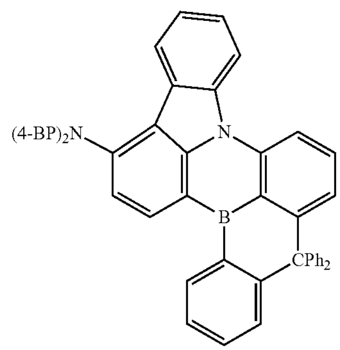
Compound 2-288
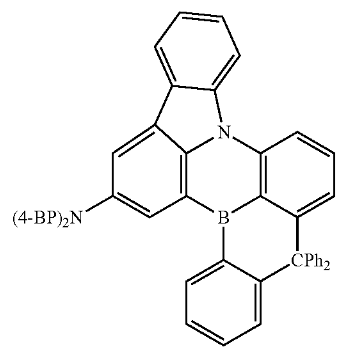
Compound 2-289
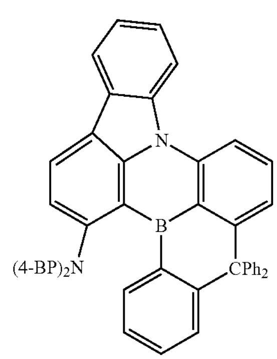

Compound 2-290
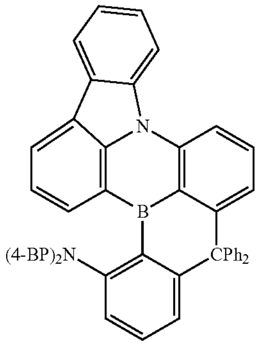
Compound 2-291
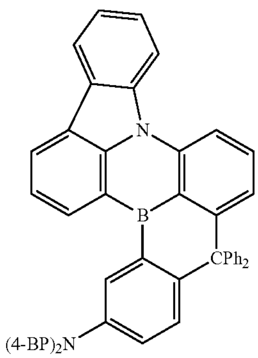
Compound 2-292
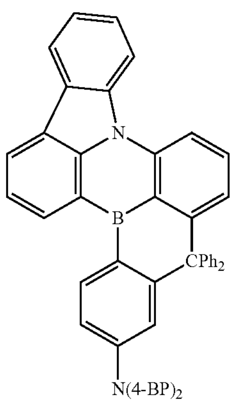
Compound 2-293
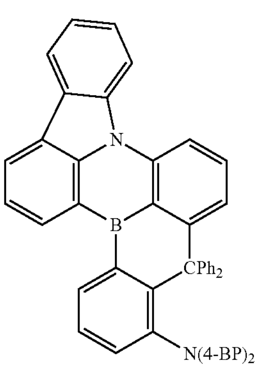
Compoiund 2-294
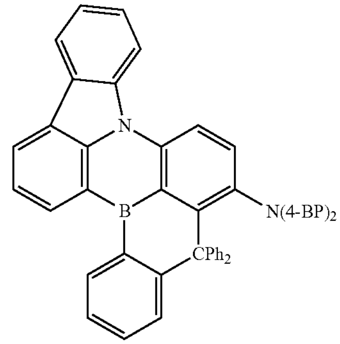
Compound 2-295
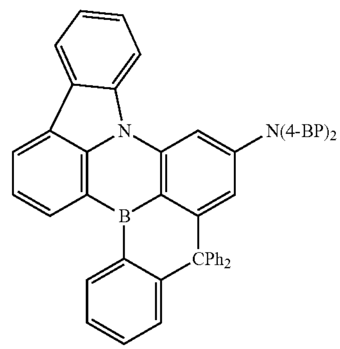
Compound 2-296
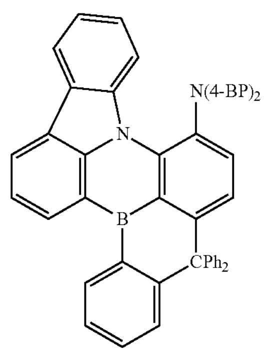
Compound 2-297
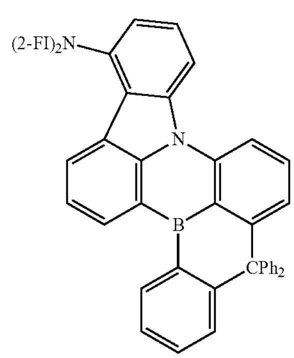

Compound 2-298
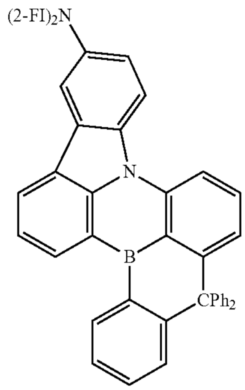
Compound 2-299
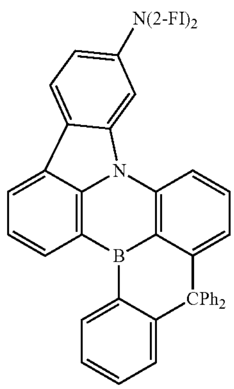
Compound 2-300
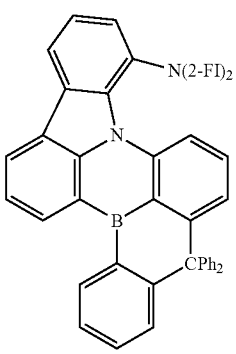
Compound 2-301
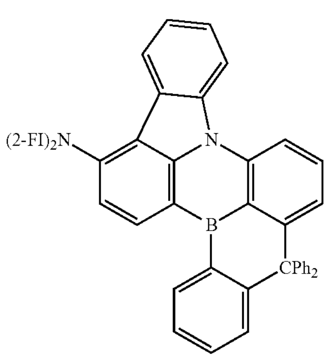
Compound 2-302
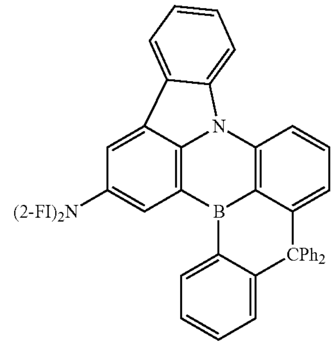
Compound 2-303
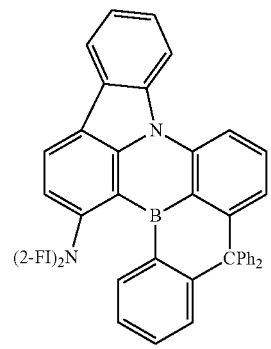
Compound 2-304
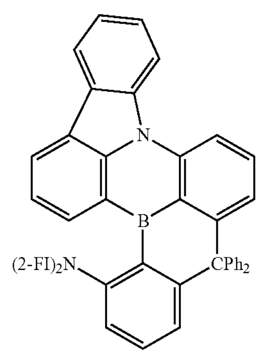
Compound 2-305
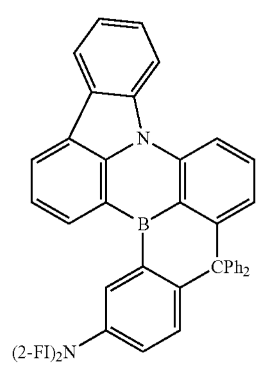

Compound 2-306
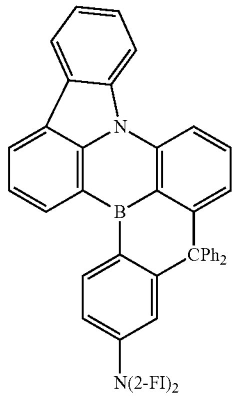
Compound 2-307
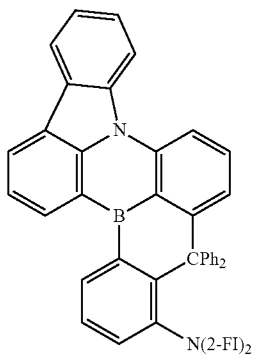
Compound 2-308
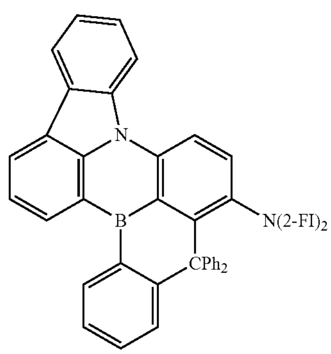
Compound 2-309
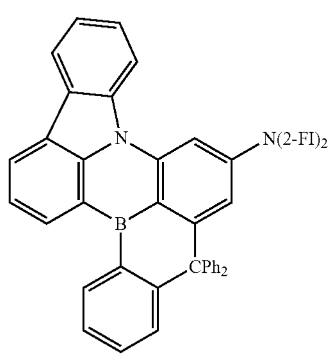
Compound 2-310
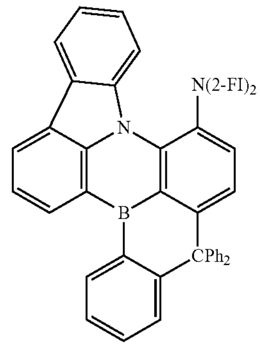
Compound 2-311
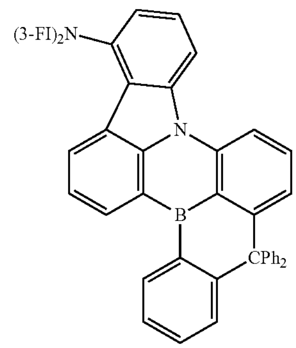
Compouind 2-312
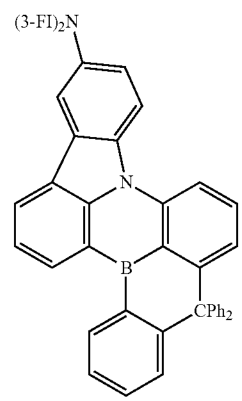
Compound 2-313
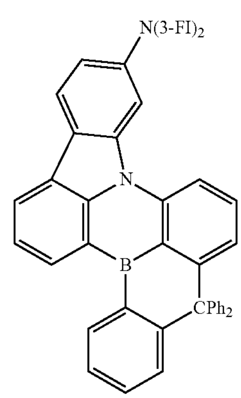

Compound 2-314
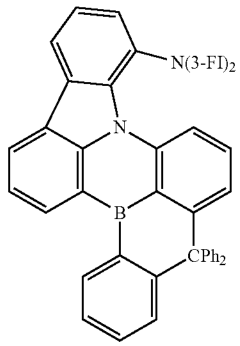
Compound 2-315
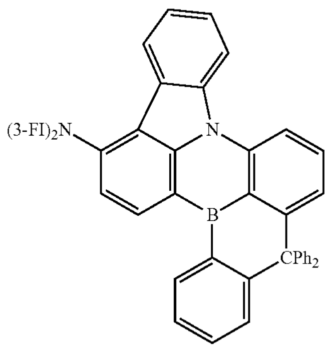
Compound 2-316
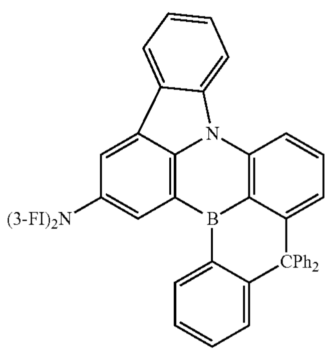
Compound 2-317
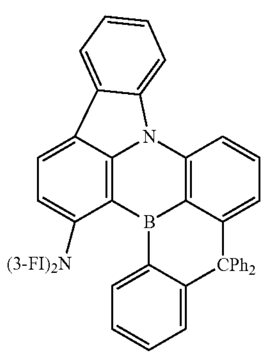
Compound 2-318
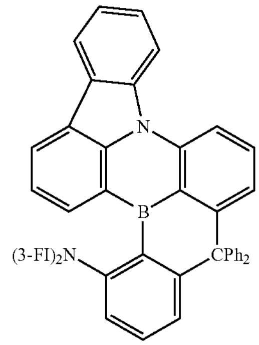
Compound 2-319
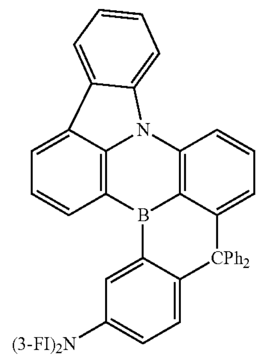
Compound 2-320
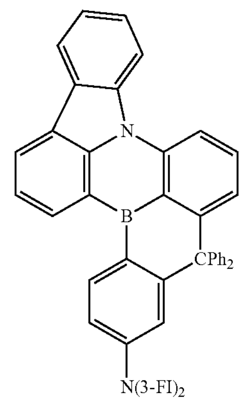
Compound 2-321
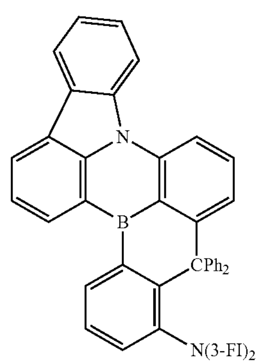

-continued
Compound 2-322
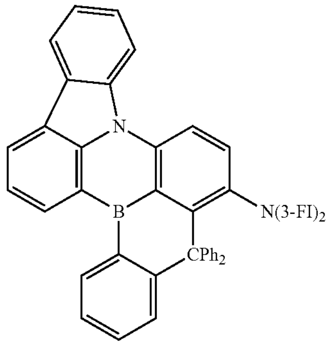
Compound 2-323
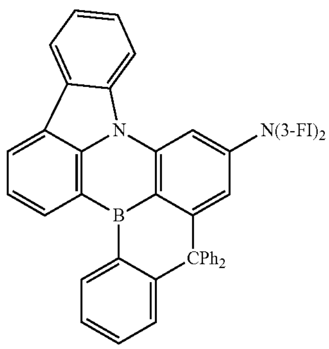
Compound 2-324
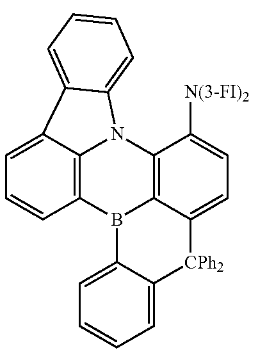
Compound 2-325
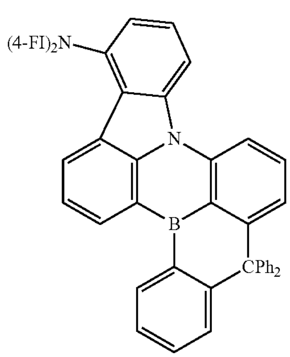
-continued
Compound 2-326
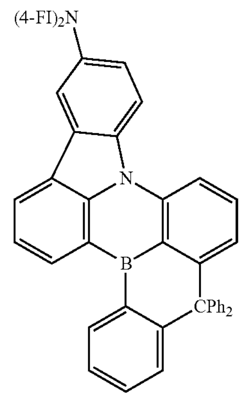
Compound 2-327
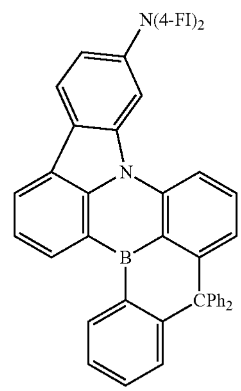
Compound 2-328
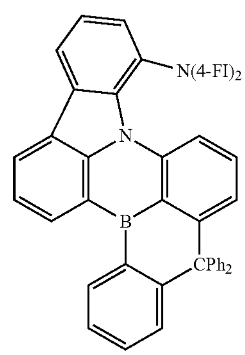
Compound 2-329
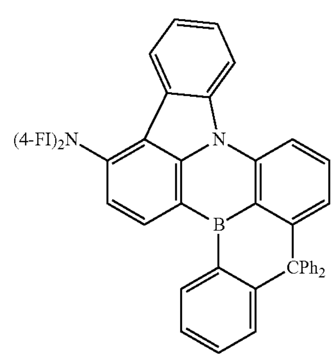

-continued
Compound 2-330
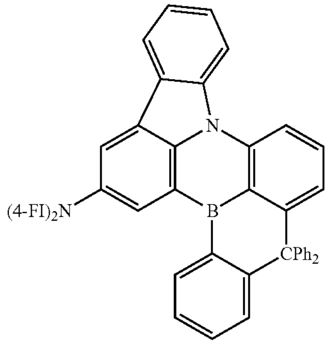
Compound 2-331
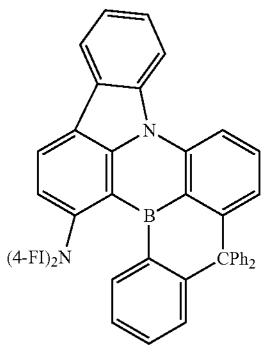
Compound 2-332
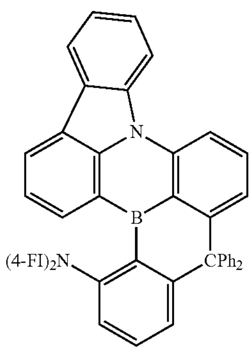
Compound 3-333
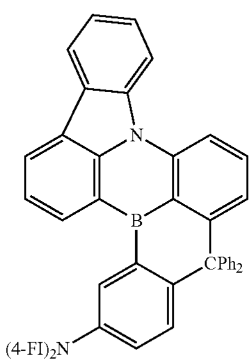
-continued
Compound 2-334
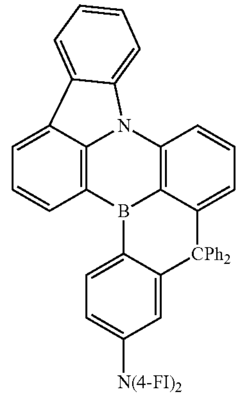
Compound 2-335
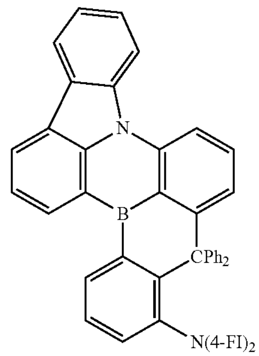
Compound 2-336
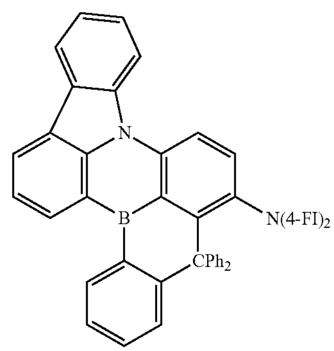
Compound 2-337
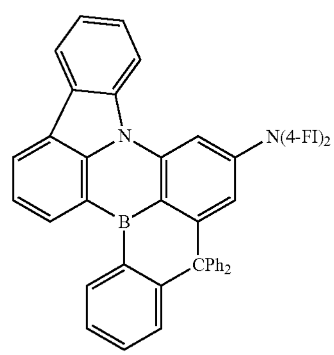

-continued
Compound 2-338
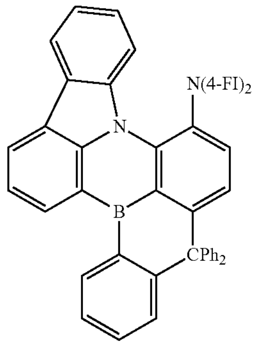
Compound 2-339
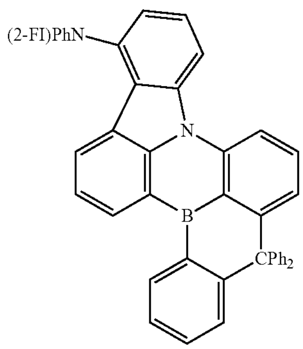
Compound 2-340
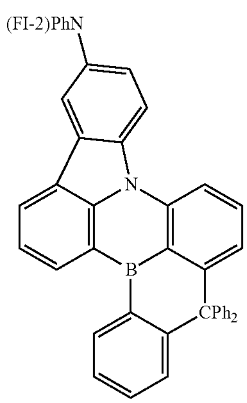
Compound 2-341
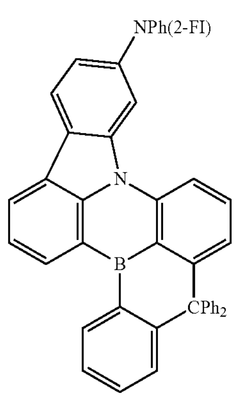
-continued
Compound 2-342
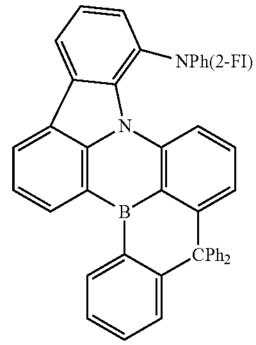
Compound 2-343
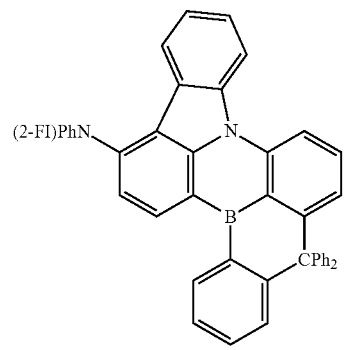
Compound 2-344
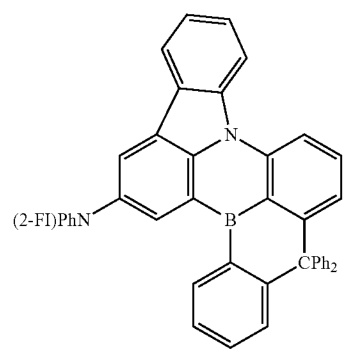
Compound 2-345
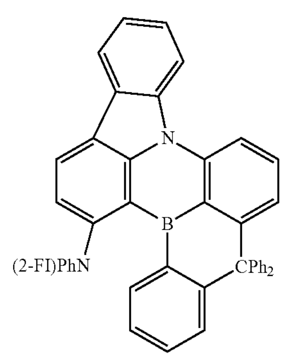

Compound 2-346
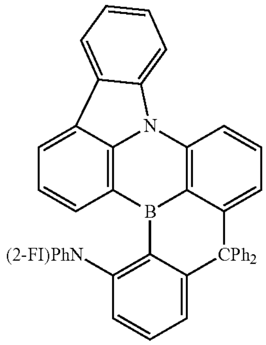
Compound 2-347
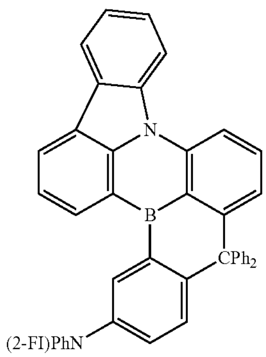
Compound 2-348
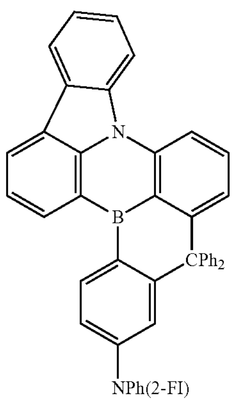
Compound 2-349
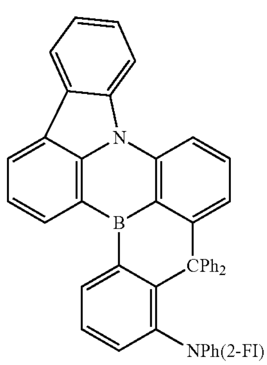
Compoun 2-350
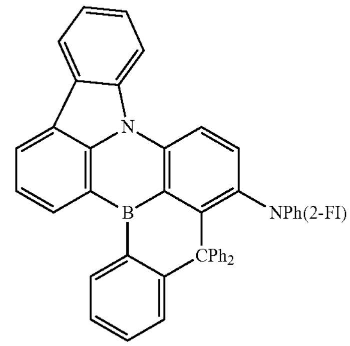
Compound 2-351
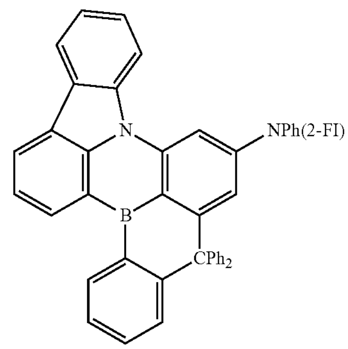
Compound 2-352
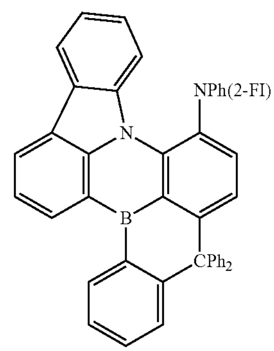
Compound 2-353
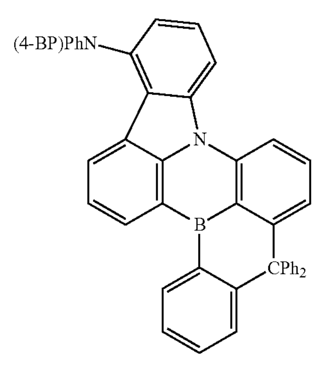

-continued
Compound 2-354
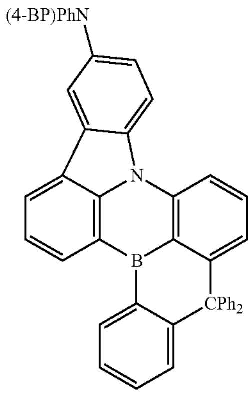
Compound 2-355
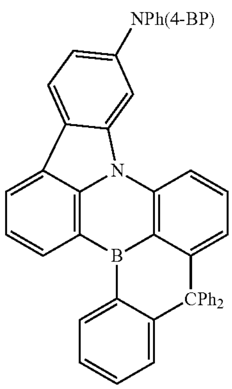
Compound 2-356
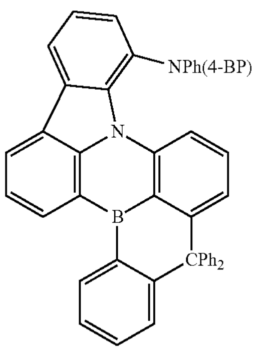
Compound 2-357
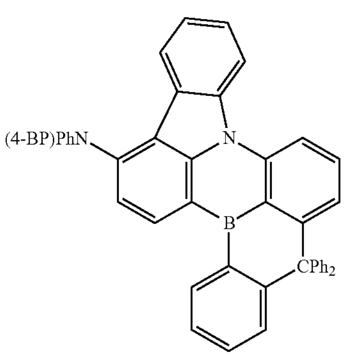
-continued
Compound 2-358
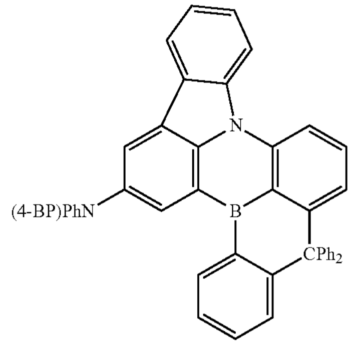
Compound 2-359
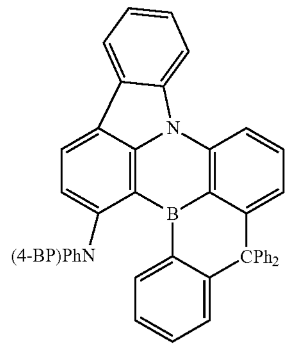
Compound 2-360
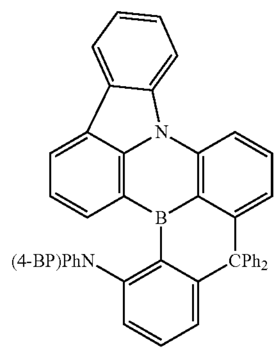
Compound 2-361
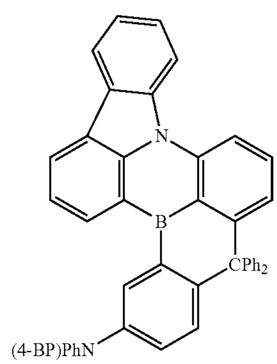

-continued
Compound 2-362
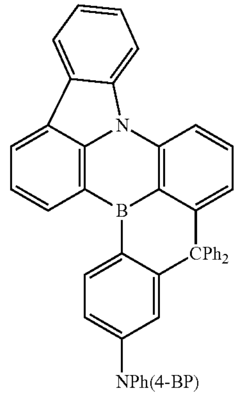
Compound 2-363
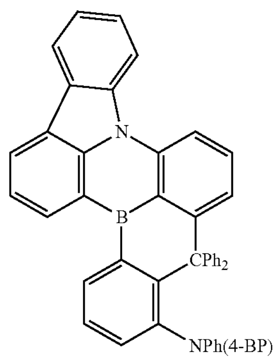
Compound 2-364
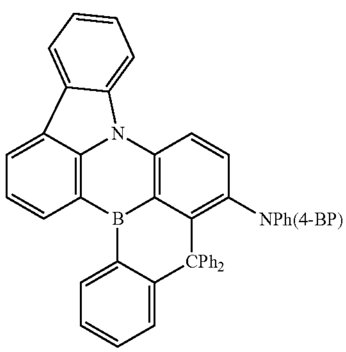
Compound 2-365
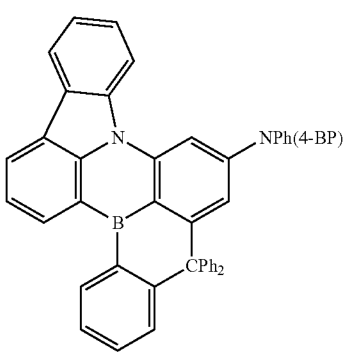
-continued
Compound 2-366
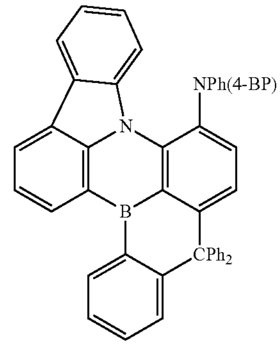
Compound 2-367
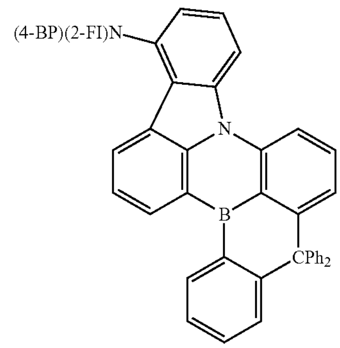
Compound 2-368
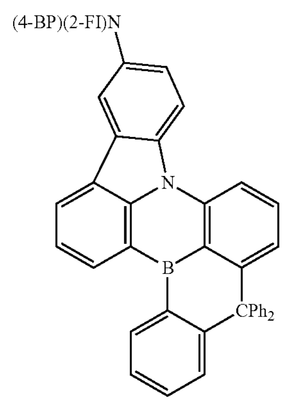
Compound 2-369
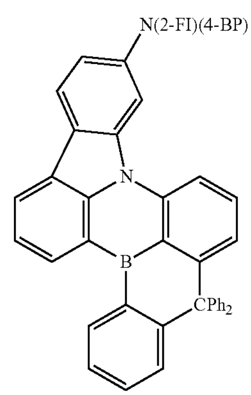

Compound 2-370
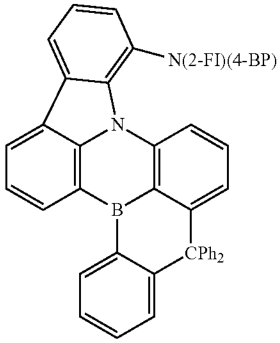
Compound 2-371
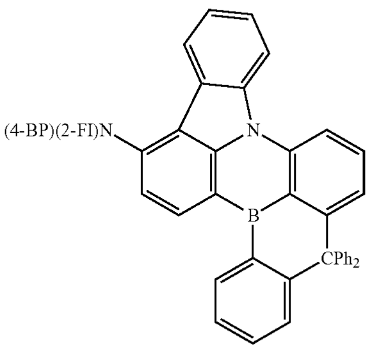
Compound 2-372
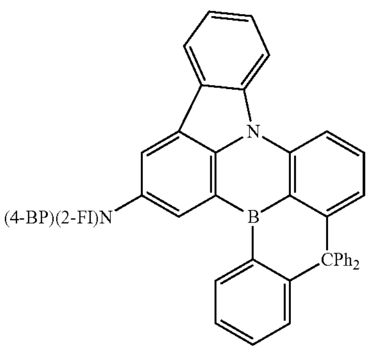
Compound 2-373
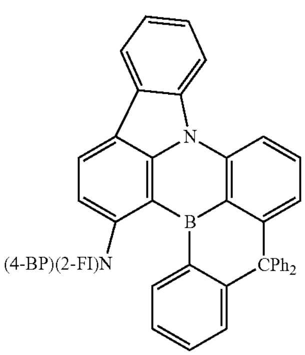
Compound 2-374
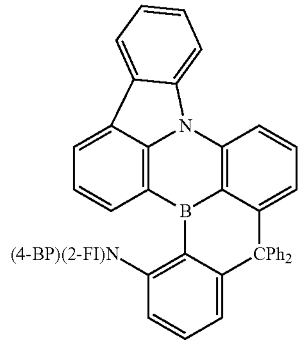
Compound 2-375
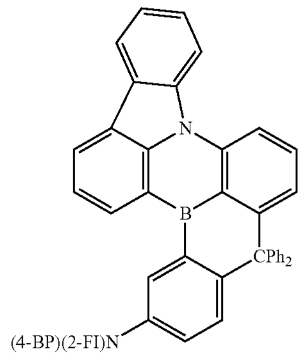
Compound 2-376
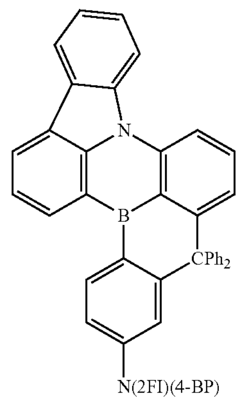
Compound 2-377
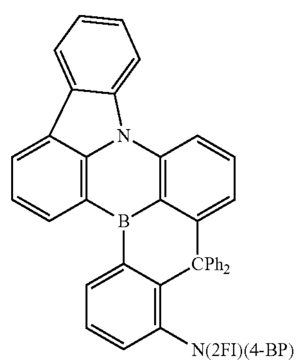

-continued
Compound 2-378
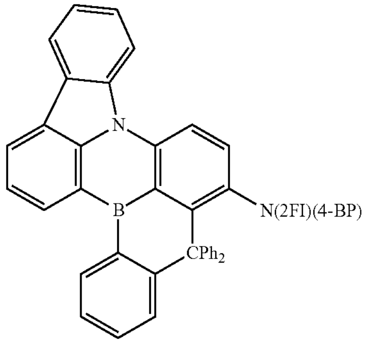
Compound 2-379
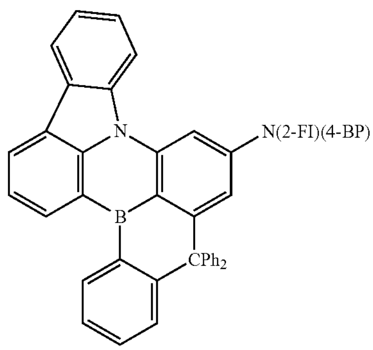
Compound 2-380
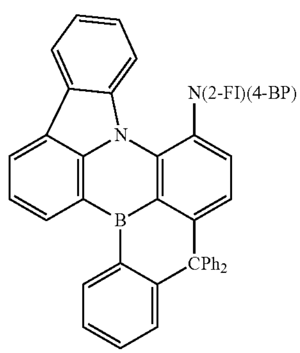
Compound 2-381
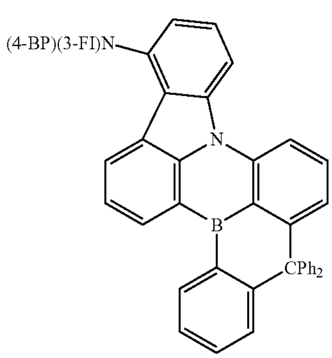
-continued
Compound 2-382
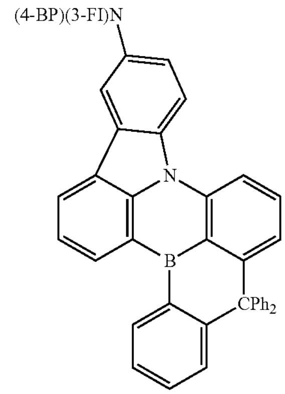
Compound 2-383
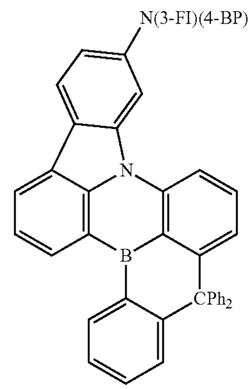
Compound 2-384
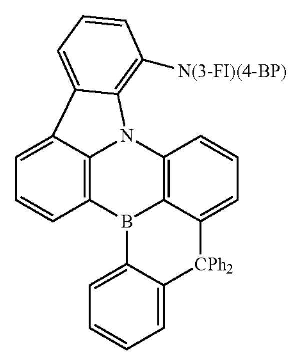
Compound 2-385
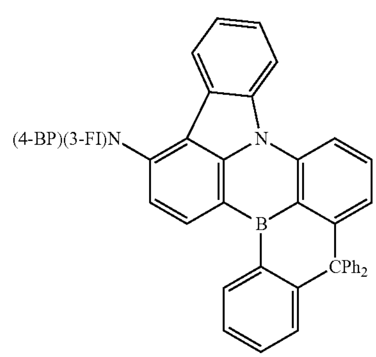

-continued
Compound 2-386
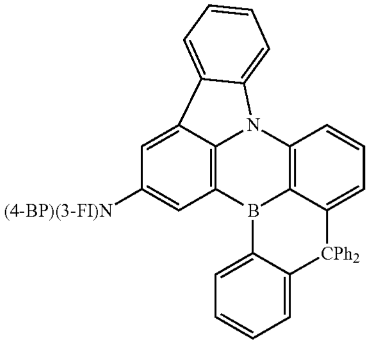
Compound 2-387
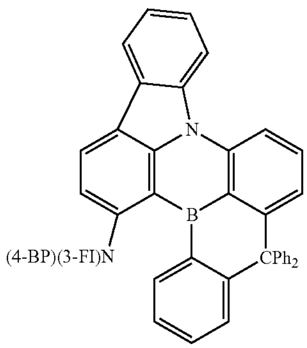
Compound 2-388
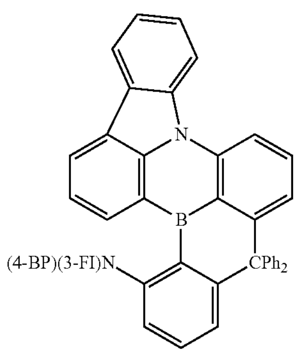
Compound 2-389
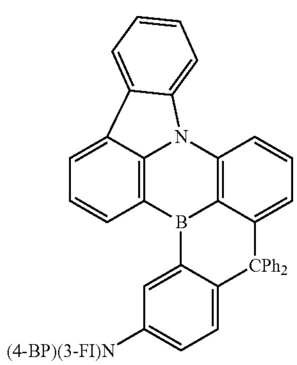
-continued
Compound 2-390
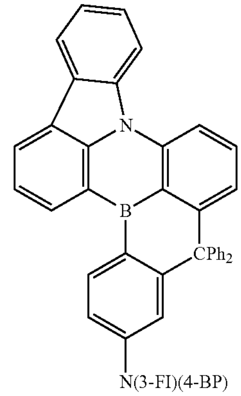
Compound 2-391
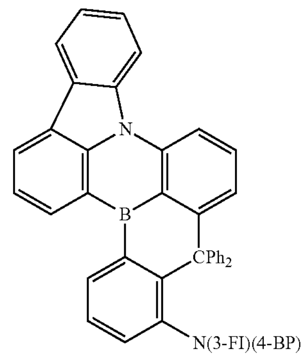
Compound 2-392
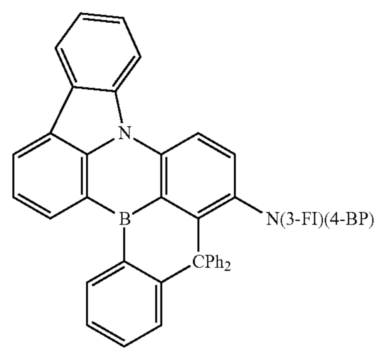
Compound 2-393
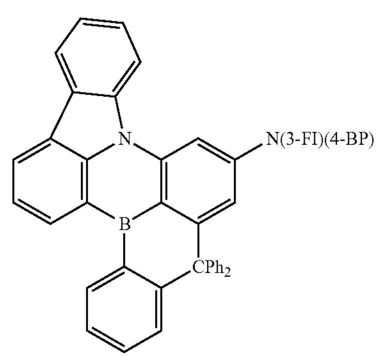

-continued
Compound 2-394
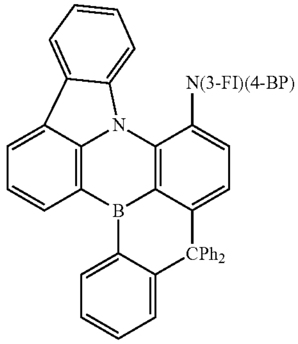
Compound 2-395
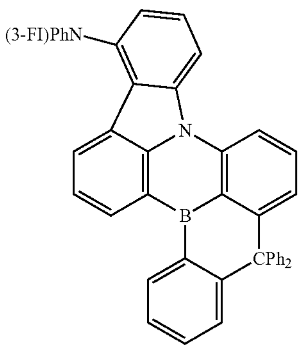
Compound 2-396
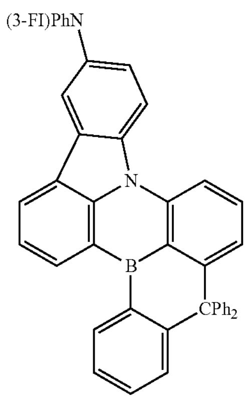
Compound 2-397
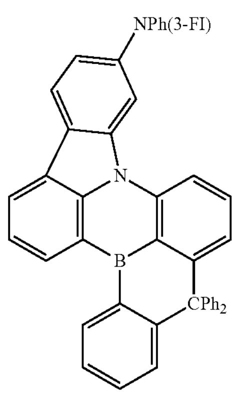
-continued
Compound 2-398
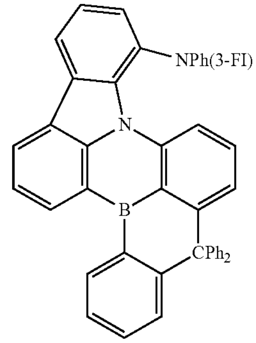
Compound 2-399
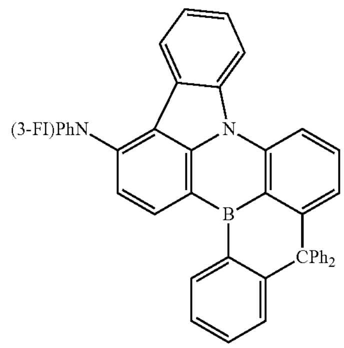
Compound 2-400
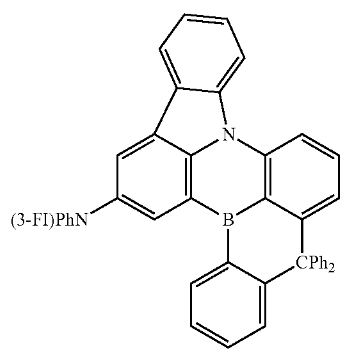
Compound 2-401
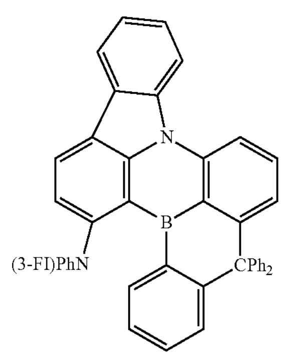

Compound 2-402
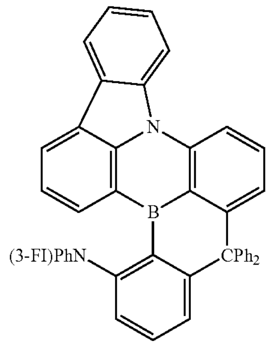
Compound 2-403
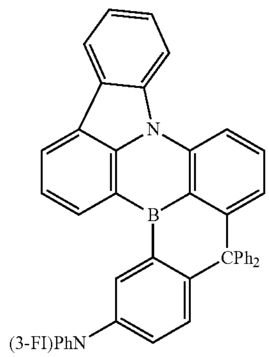
Compound 2-404
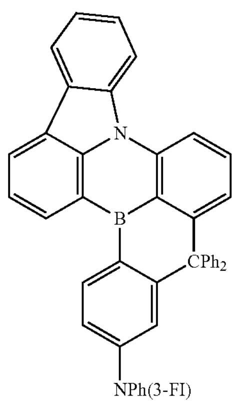
Compound 2-405
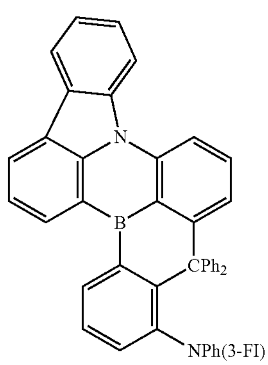
Compound 2-406
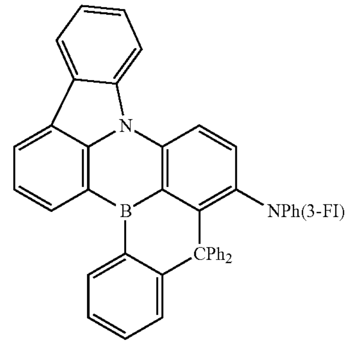
Compound 2-407
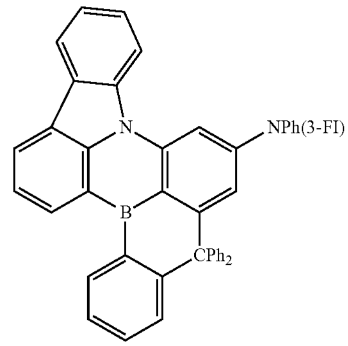
Compound 2-408
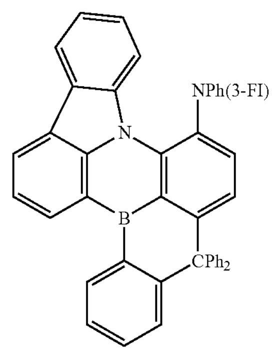
Compound 2-409
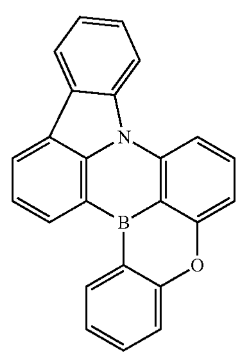

-continued
Compound 2-410
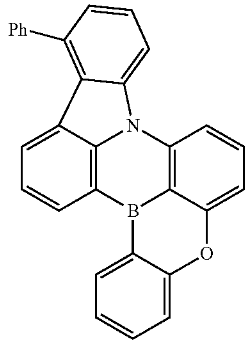
Compound 2-411
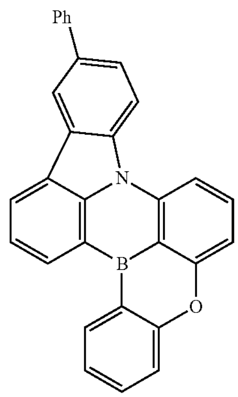
Compound 2-412
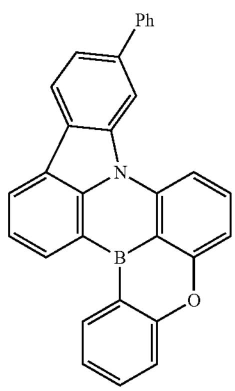
Compound 4-413
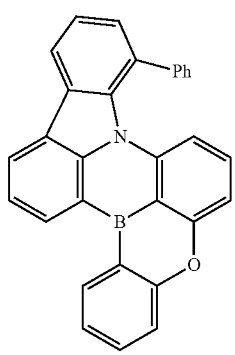
-continued
Compound 2-414
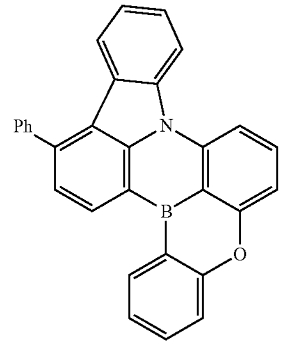
Compound 2-415
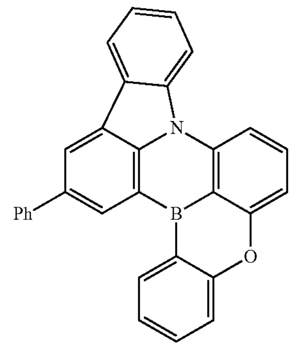
Compound 2-416
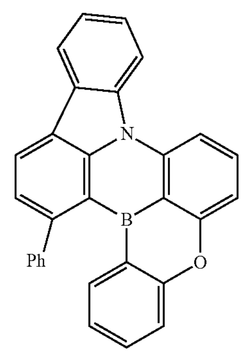
Compound 2-417
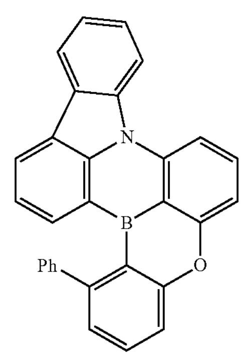

-continued
Compound 2-418
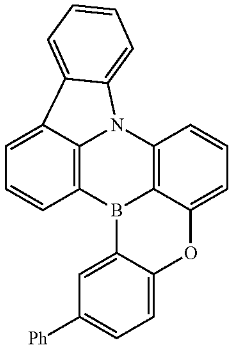
Compound 2-419
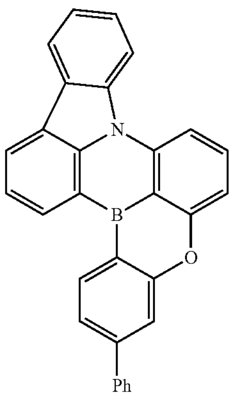
Compound 2-420
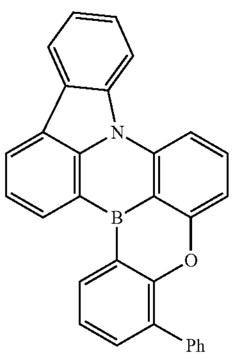
Compound 2-421
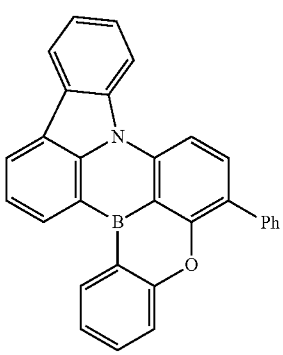
-continued
Compound 2-422
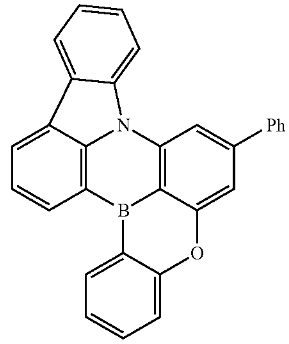
Compound 2-423
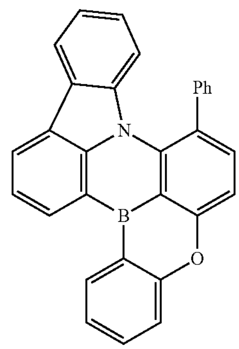
Compound 2-424
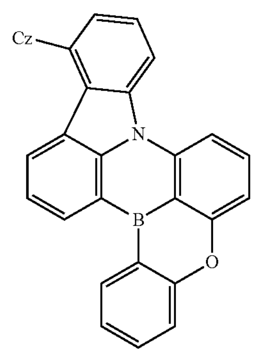
Compound 2-425
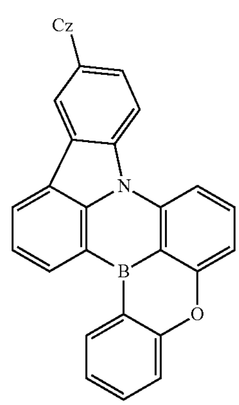

-continued
Compound 2-426
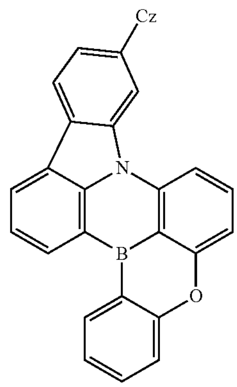
Compound 2-427
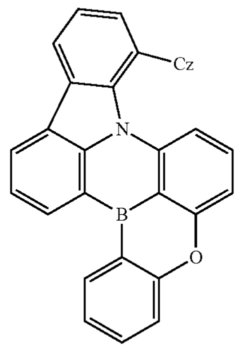
Compound 2-428
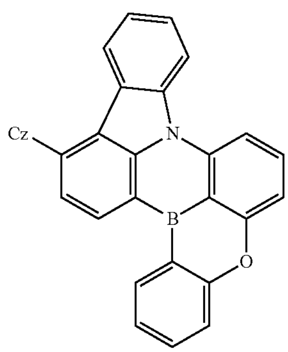
Compound 2-429
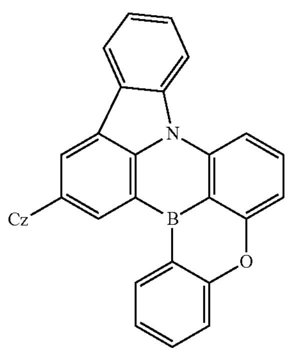
-continued
Compound 2-430
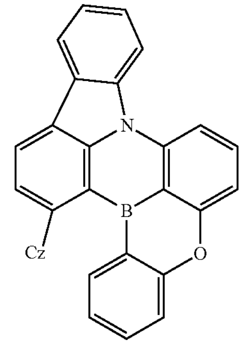
Compound 2-431
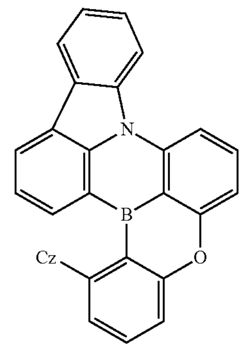
Compound 2-432
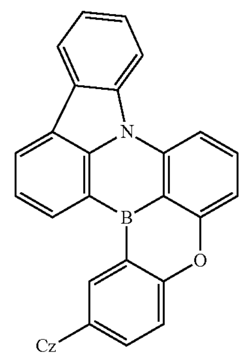
Compound 2-433
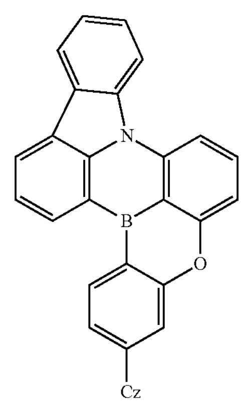

-continued
Compound 2-434
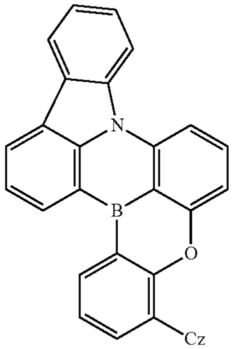
Compound 2-435
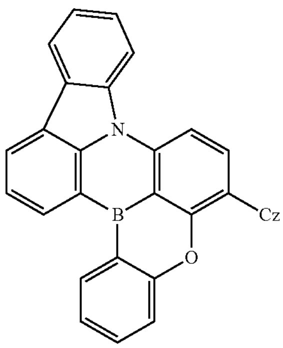
Compound 2-436
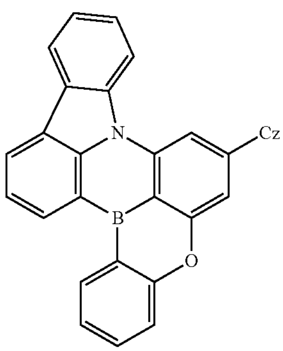
Compound 2-437
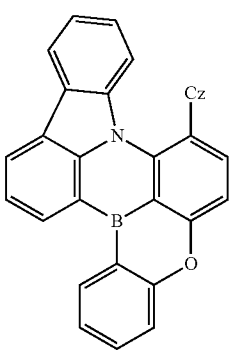
-continued
Compound 2-438
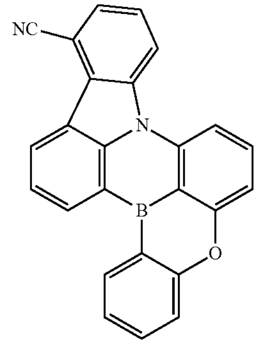
Compound 2-439
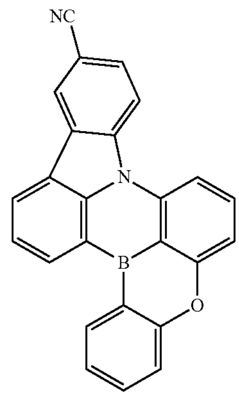
Compound 2-440
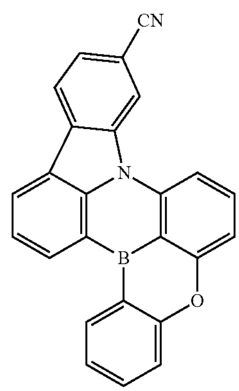
Compound 2-441
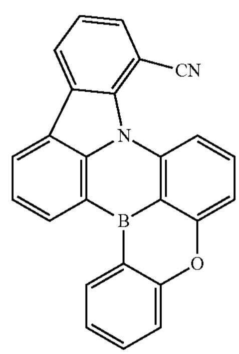

-continued
Compound 2-442
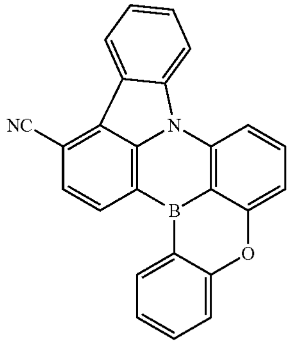
Compound 2-443
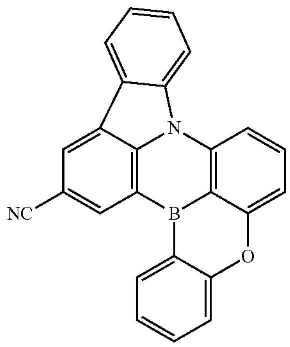
Compound 2-444
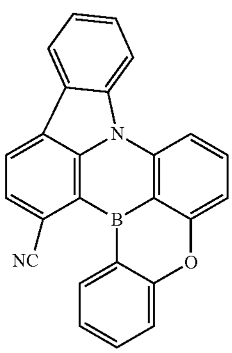
Compound 2-445
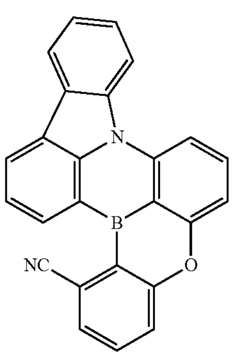
-continued
Compound 2-446
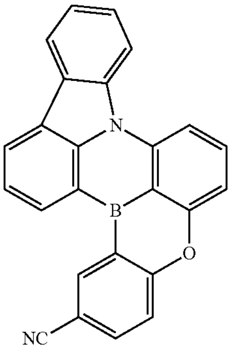
Compound 2-447
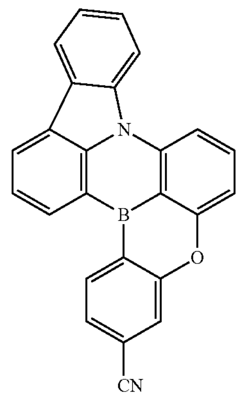
Compound 2-448
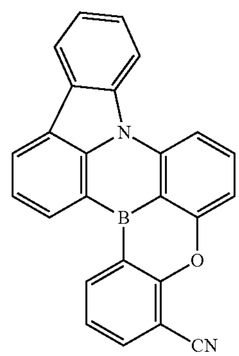
Compound 2-449
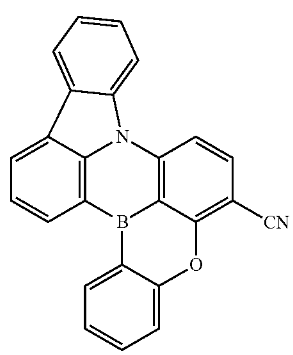

Compound 2-450
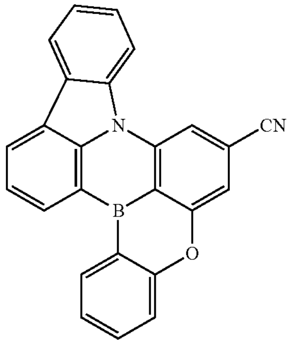
Compound 2-451
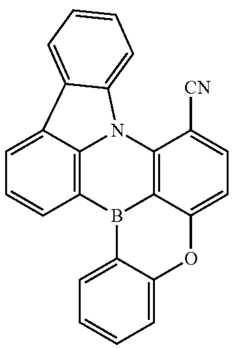
Compound 2-452
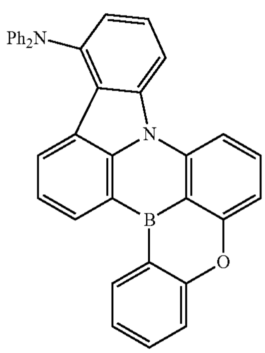
Compound 2-453
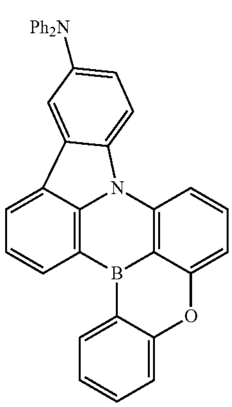
Compound 2-454
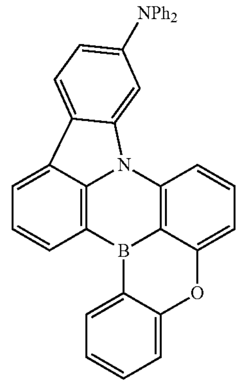
Compound 2-455
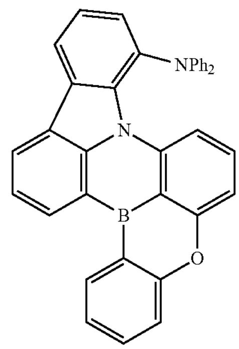
Compound 2-456
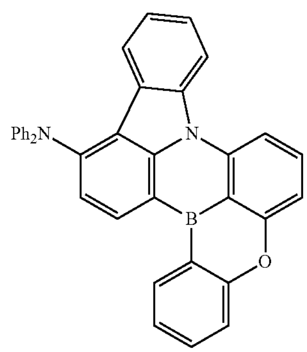
Compound 2-457
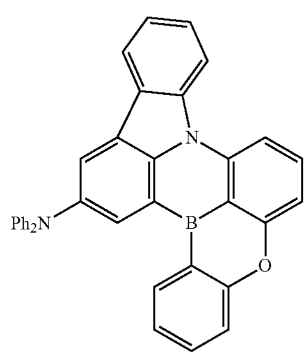

-continued
Compound 2-458
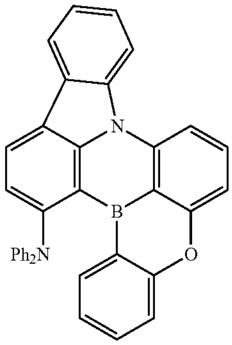
Compound 2-459
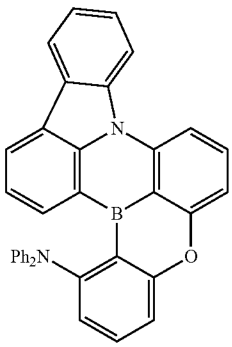
Compound 2-460
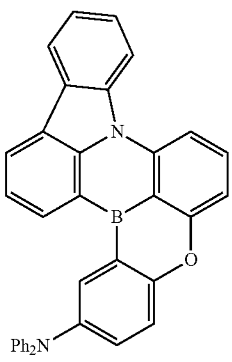
Compound 2-461
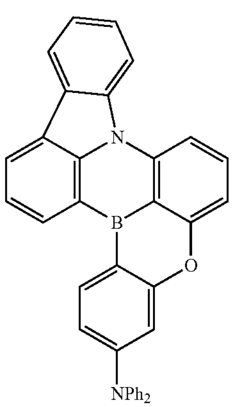
-continued
Compound 2-462
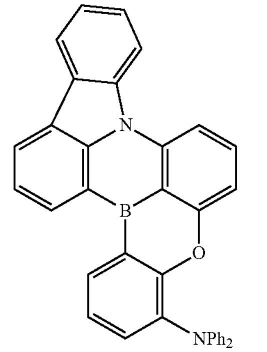
Compound 2-463
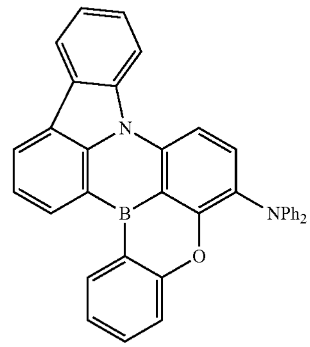
Compound 2-464
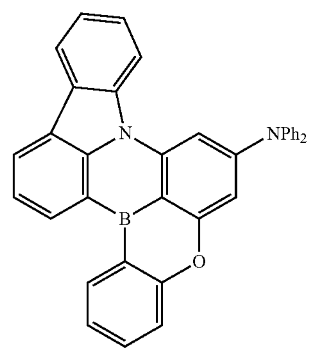
Compound 2-465
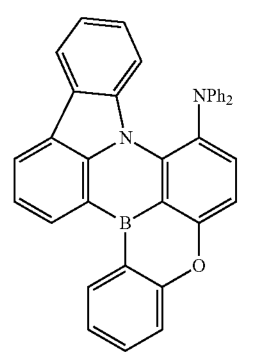

-continued
Compound 2-466
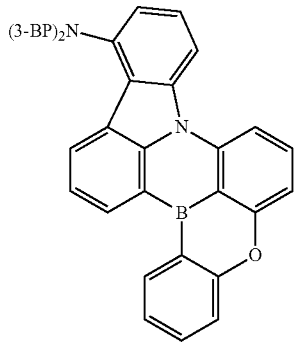
Compound 2-467
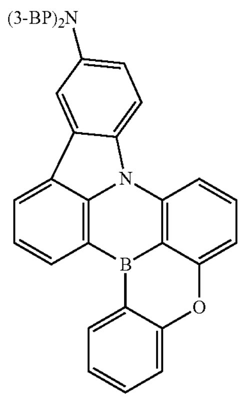
Compound 2-468
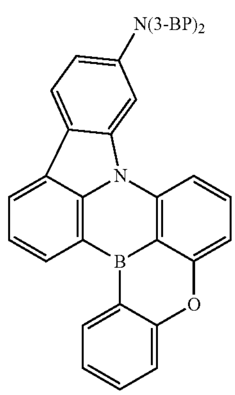
Compound 2-469
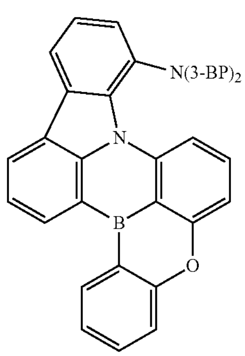
-continued
Compound 2-470
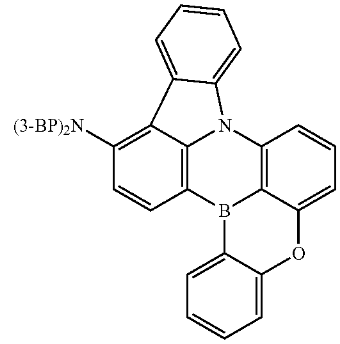
Compound 2-471
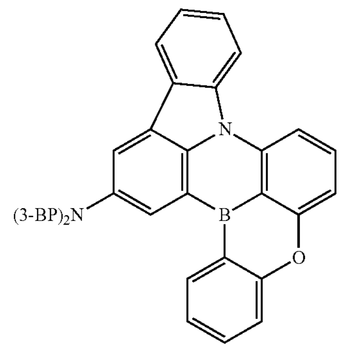
Compound 2-472
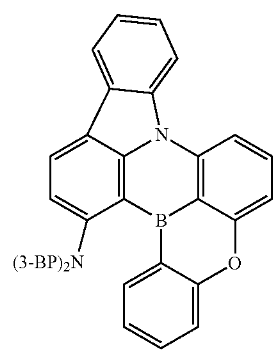
Compound 2-473
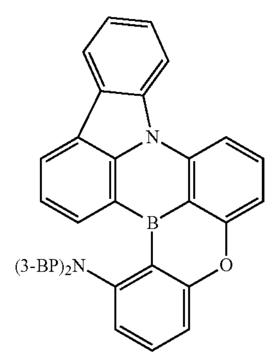

-continued
Compound 2-474
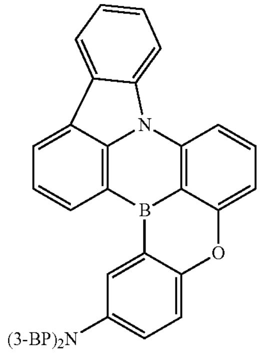
Compound 2-475
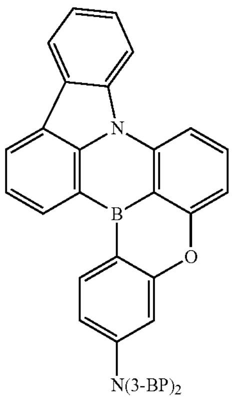
Compound 2-476
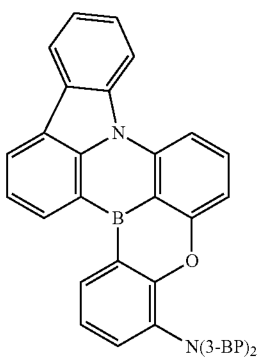
Compound 2-477
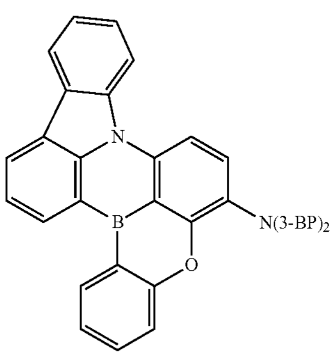
-continued
Compound 2-478
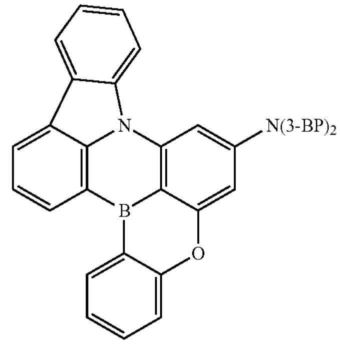
Compound 2-479
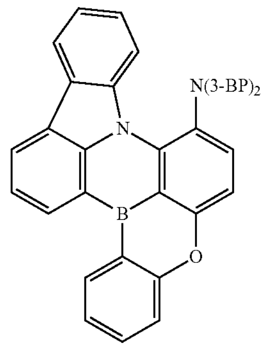
Compound 2-480
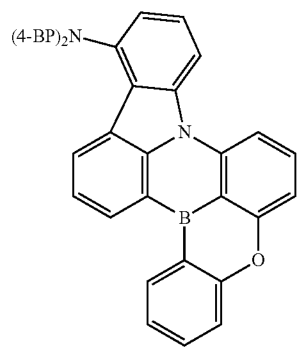
Compound 2-481
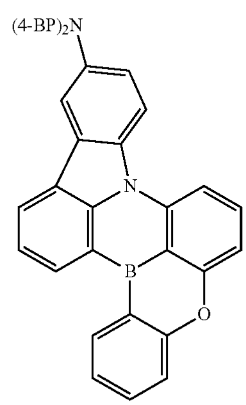

-continued
Compound 2-482
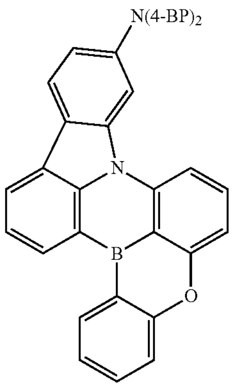
Compound 2-483
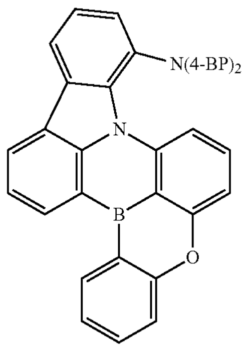
Compound 2-484
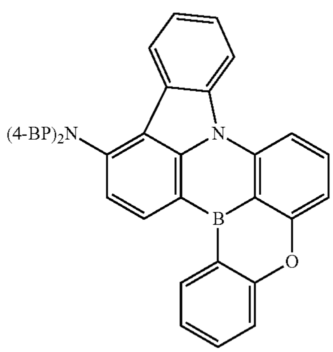
Compound 2-485
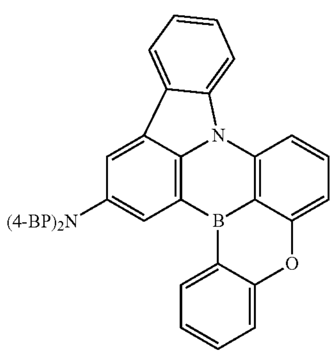
-continued
Compound 2-486
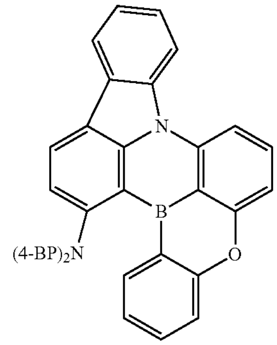
Compound 2-487
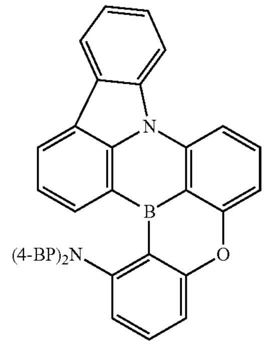
Compound 2-488
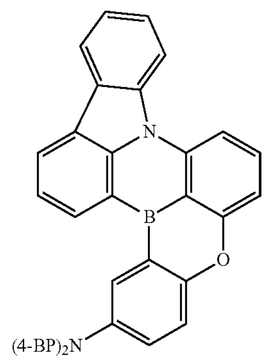
Compound 2-489
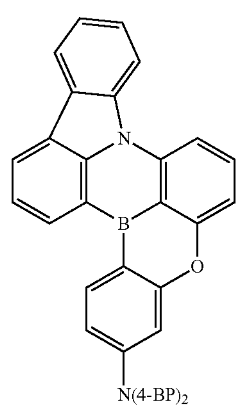

-continued
Compound 2-490
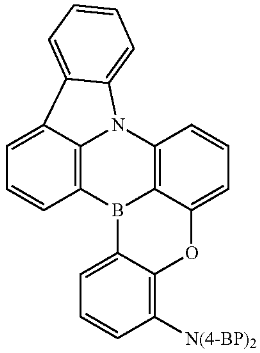
Compound 2-491
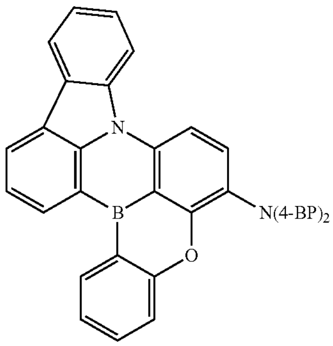
Compound 2-492
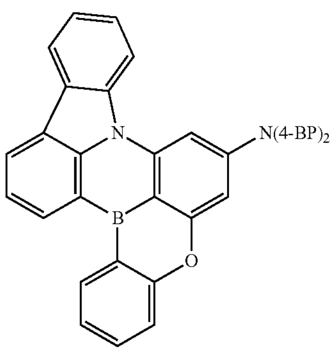
Compound 2-493
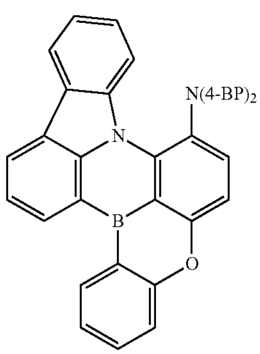
-continued
Compound 2-494
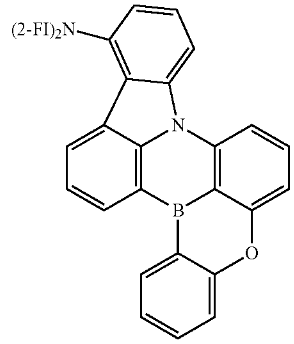
Compound 2-495
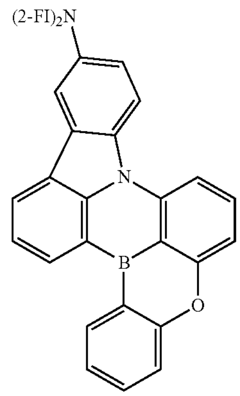
Compound 2-496
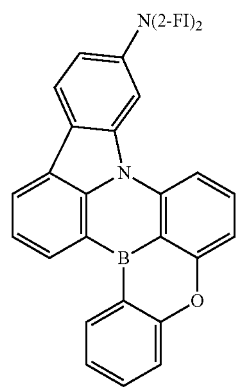
Compound 2-497
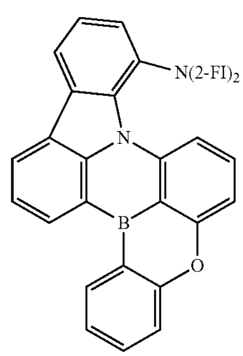

-continued
Compound 2-498
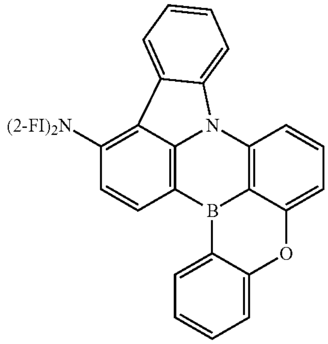
Compound 2-499
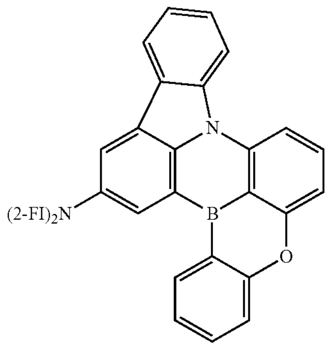
Compound 2-500
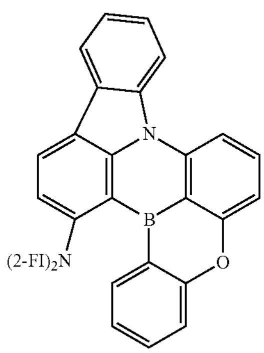
Compound 2-501
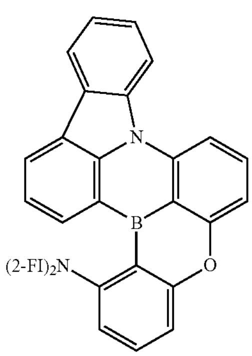
-continued
Compound 2-502
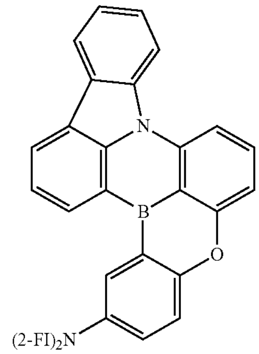
Compound 2-503
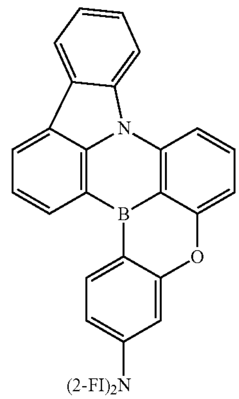
Compound 2-504
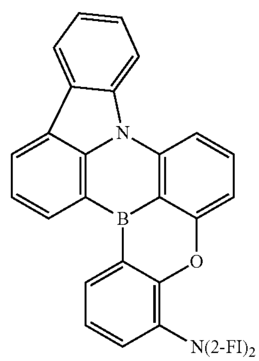
Compound 2-505
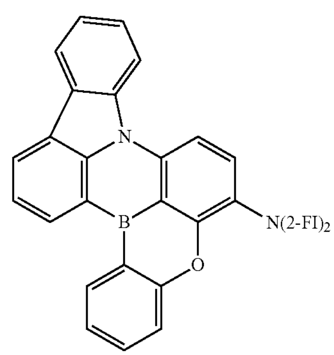

-continued
Compound 2-506
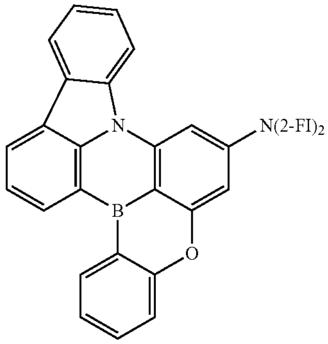
Compound 2-507
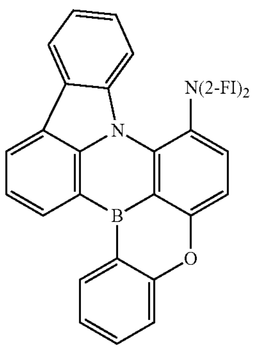
Compound 2-508
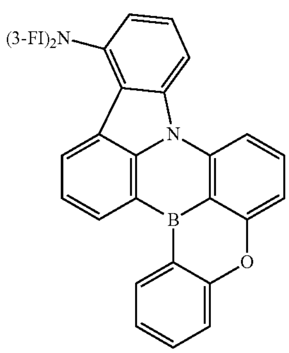
Compound 2-509
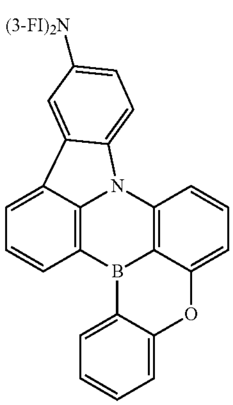
-continued
Compound 2-510
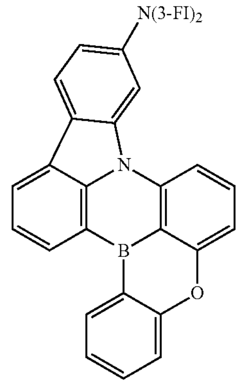
Compound 2-511
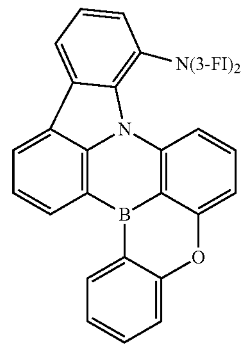
Compound 2-512
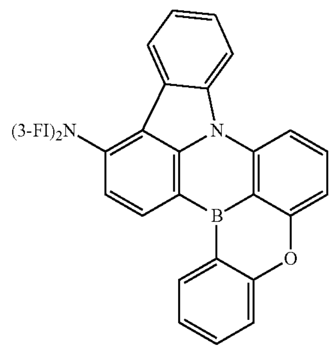
Compound 2-513
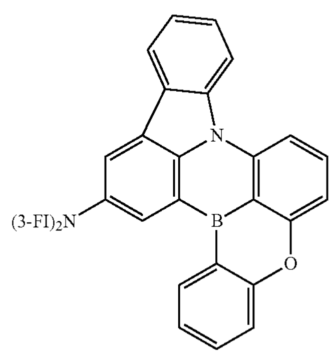

-continued
Compound 2-514
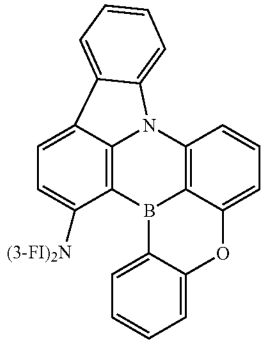
Compound 2-515
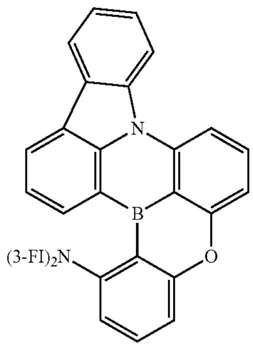
Compound 2-516
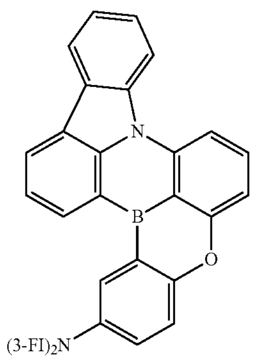
Compound 2-517
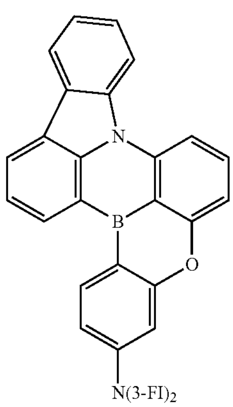
-continued
Compound 2-518
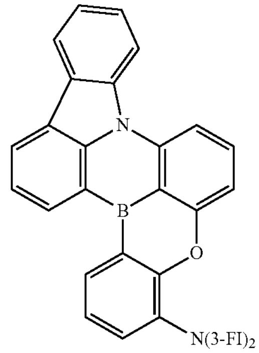
Compound 2-519
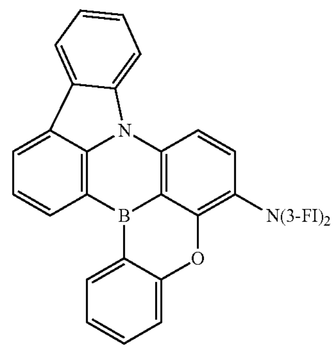
Compound 2-520
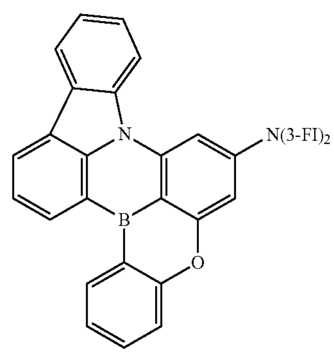
Compound 2-521
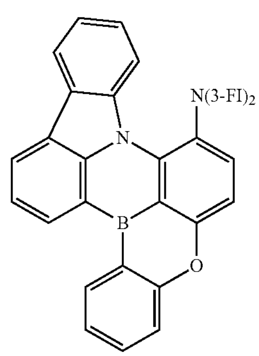

Compound 2-522
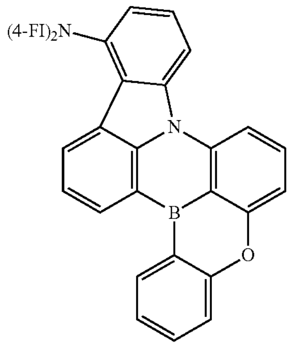
Compound 2-523
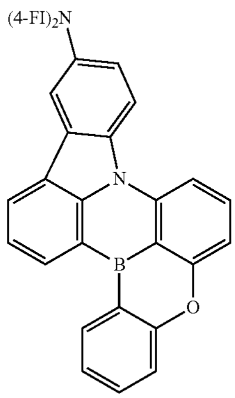
Compound 2-524
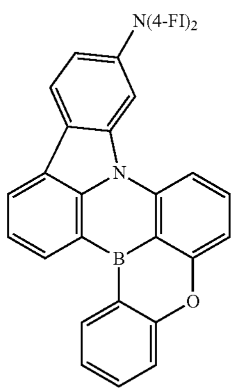
Compound 2-525
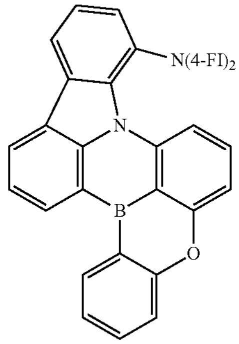
Compound 2-526
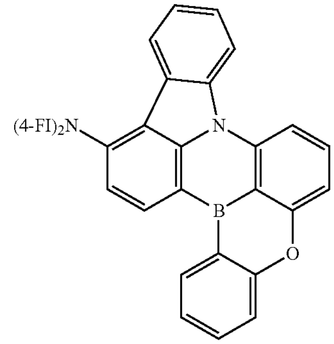
Compound 2-527
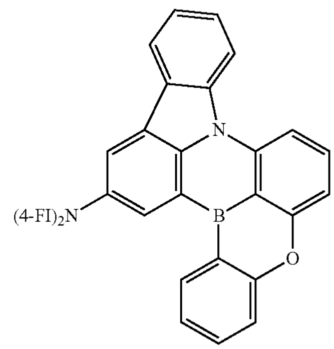
Compound 2-528
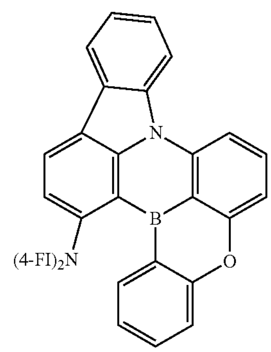
Compound 2-529
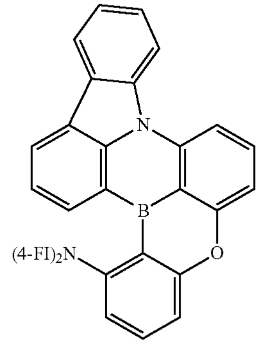

-continued
Compound 2-530
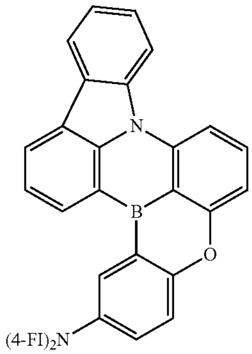
Compound 2-531
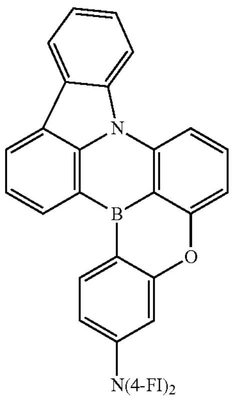
Compound 2-532
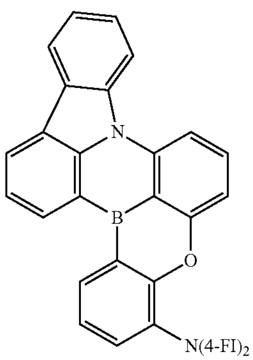
Compound 2-533
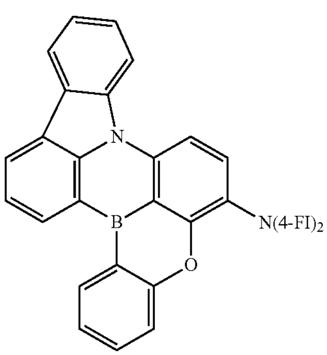
-continued
Compound 2-534
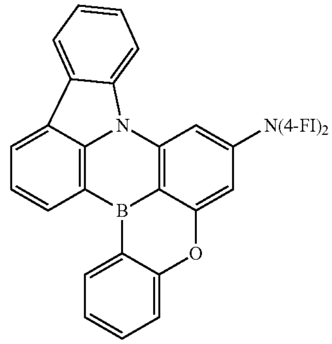
Compound 2-535
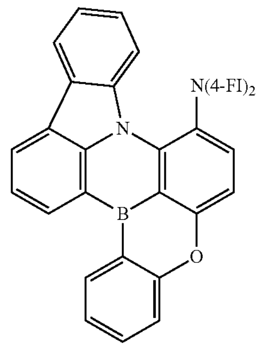
Compound 2-536
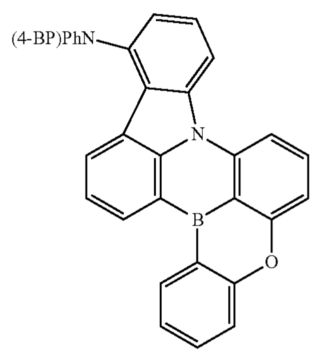
Compound 2-537
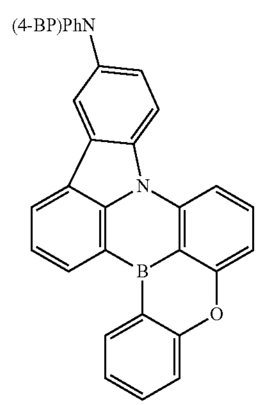

Compound 2-538
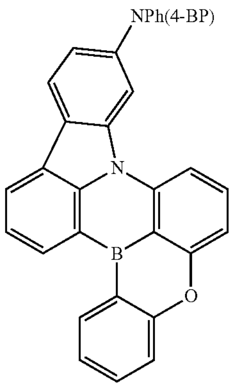
Compound 2-539
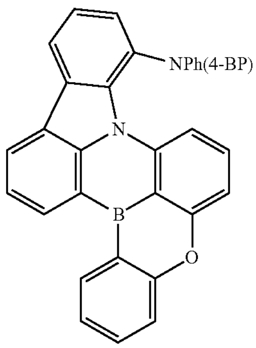
Compound 2-540
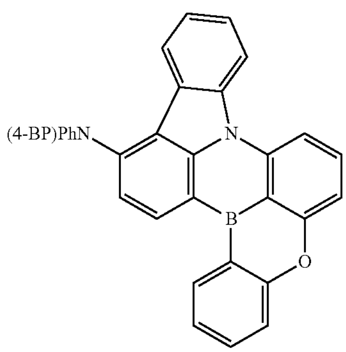
Compound 2-541
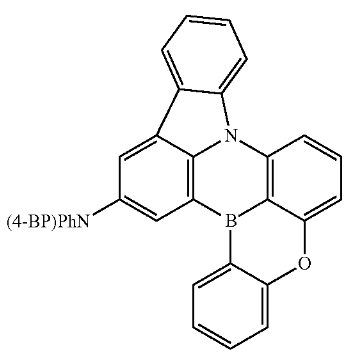
Compound 2-542
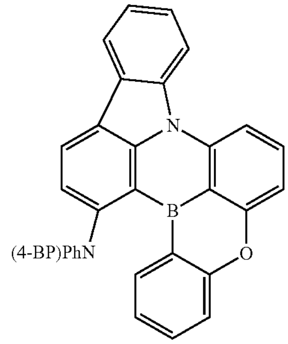
Compound 2-543
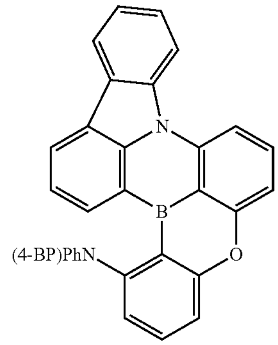
Compound 2-544
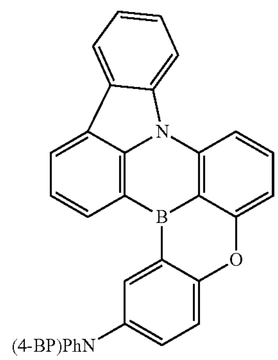
Compound 2-545
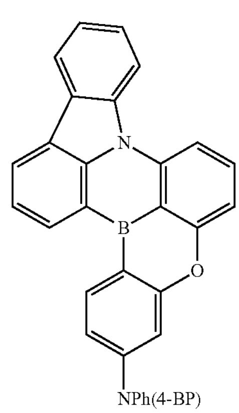

Compound 2-546
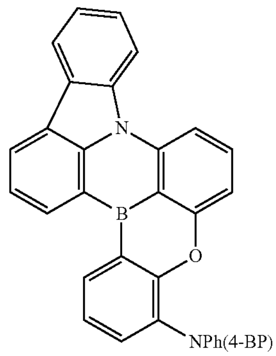
Compound 2-547
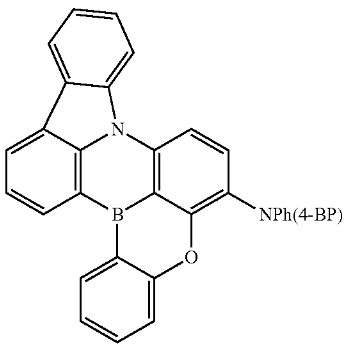
Compound 2-548
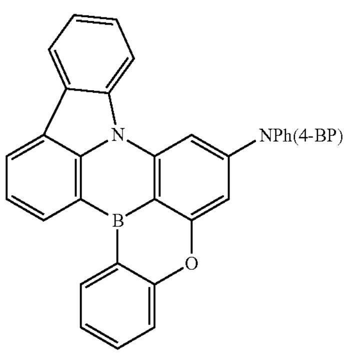
Compound 2-549
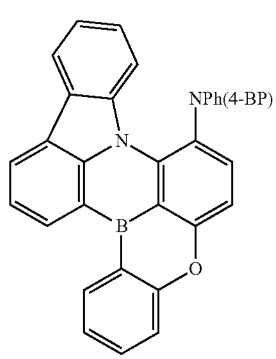
Compound 2-550
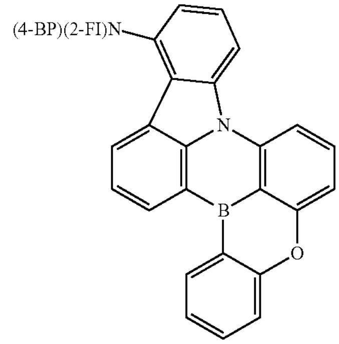
Compound 2-551
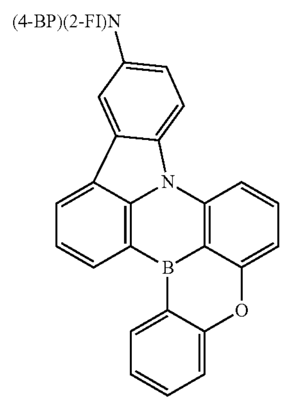
Compound 2-552
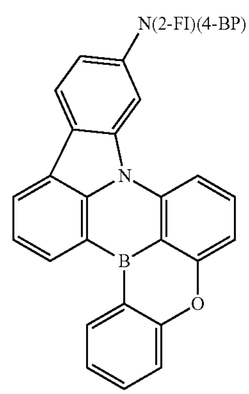
Compound 2-553
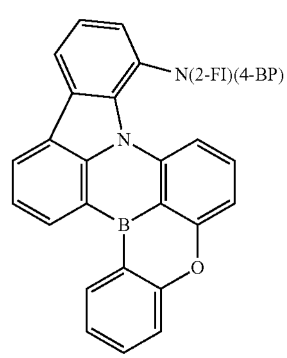

-continued
Compound 2-554
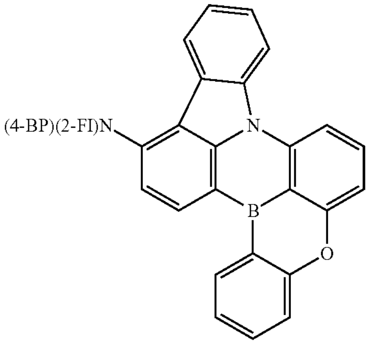
Compound 2-555
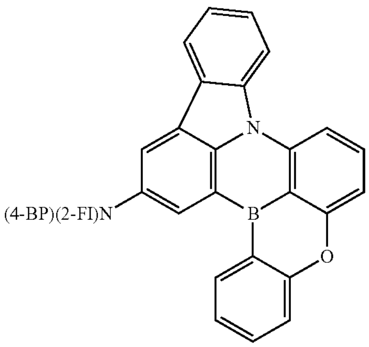
Compound 2-556
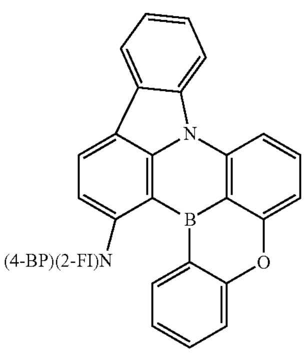
Compound 2-557
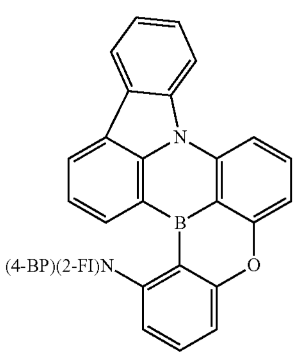
-continued
Compound 2-558
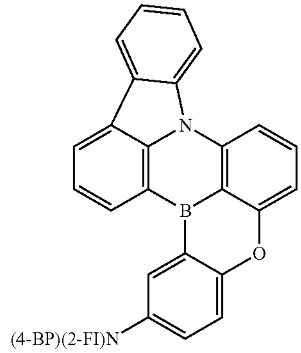
Compound 2-559
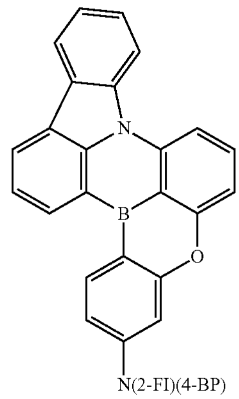
Compound 2-560
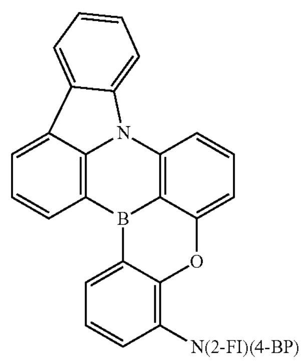
Compound 2-561
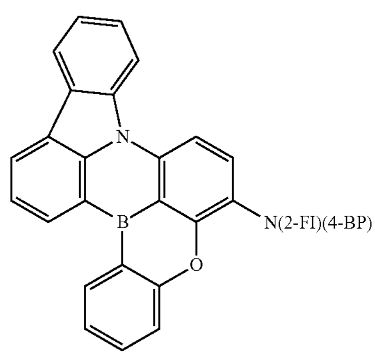

Compound 2-562
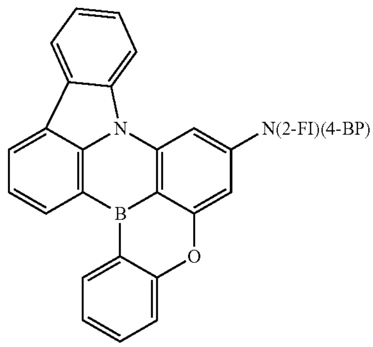
Compound 2-563
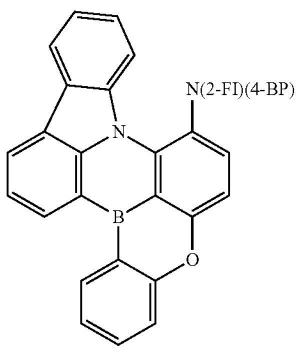
Compound 2-564
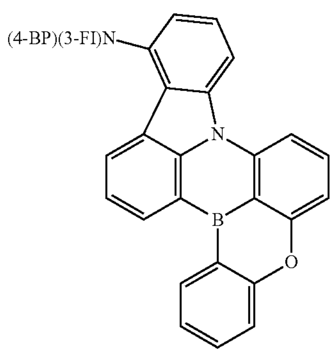
Compound 2-565
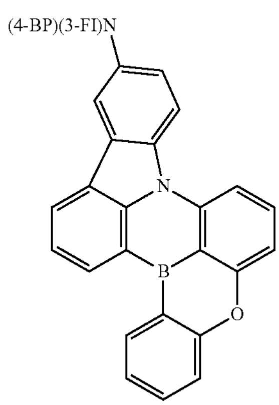
Compound 2-566
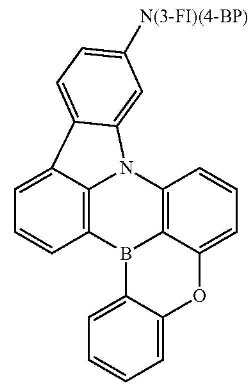
Compound 2-567
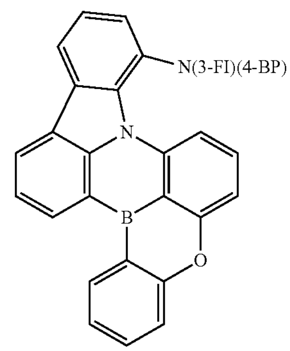
Compound 2-568
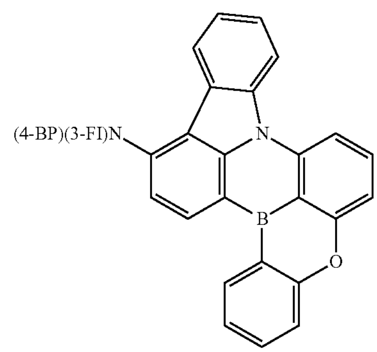
Compound 2-569
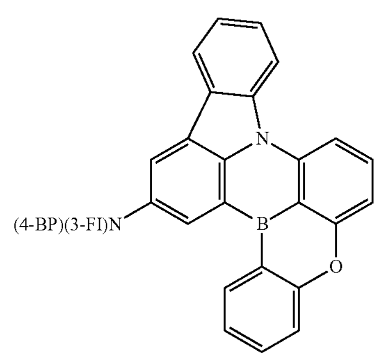

Compound 2-570
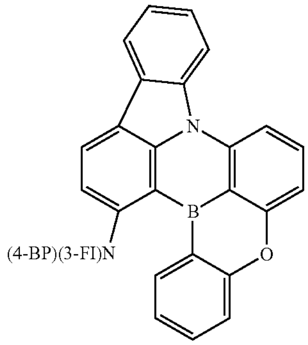
Compound 2-571
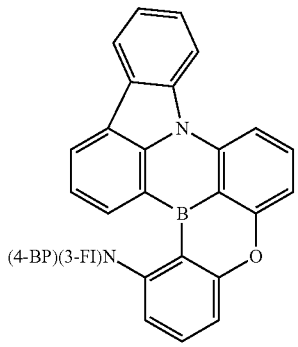
Compound 2-572
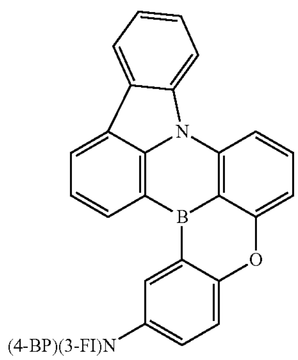
Compound 2-573
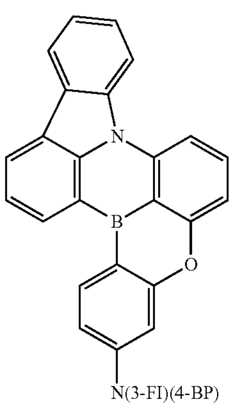
Compound 2-574
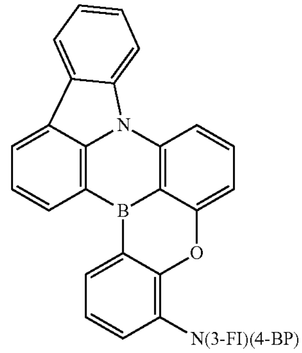
Compound 2-575
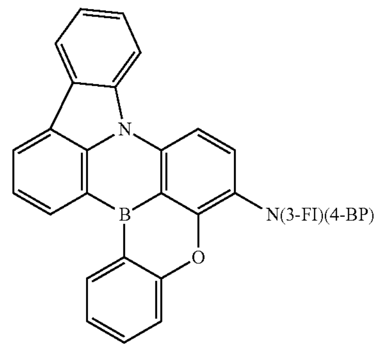
Compound 2-576
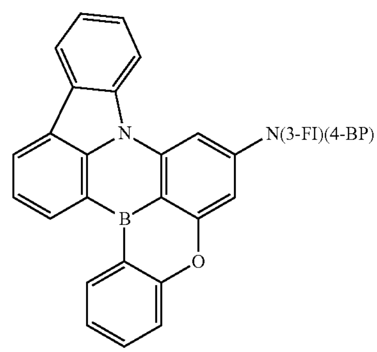
Compound 2-577
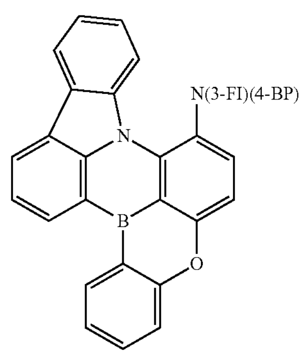

-continued
Compound 2-578
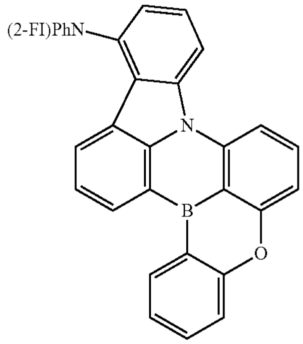
Compound 2-579
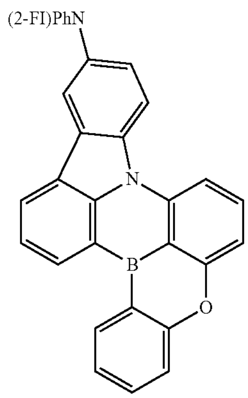
Compound 2-580
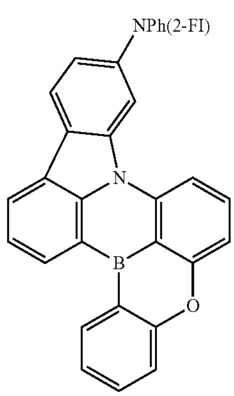
Compound 2-581
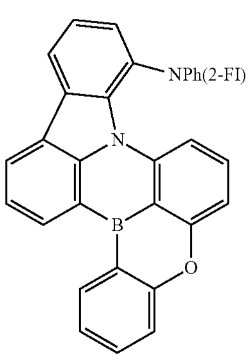
-continued
Compound 2-582
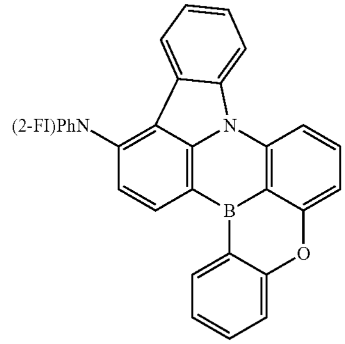
Compound 2-583
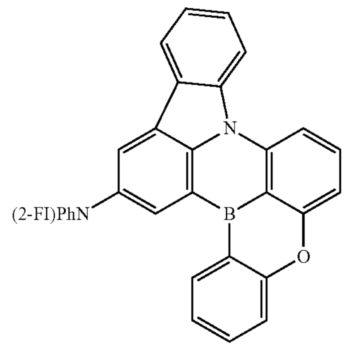
Compound 2-584
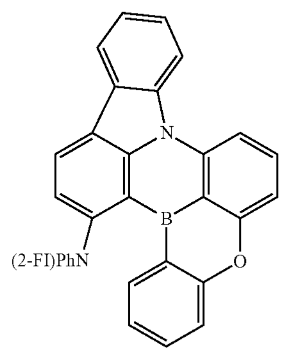
Compound 2-585
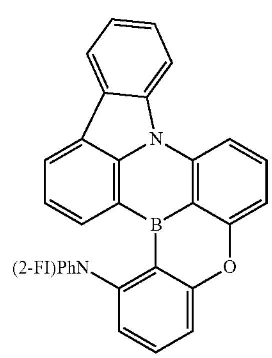

-continued
Compound 2-586
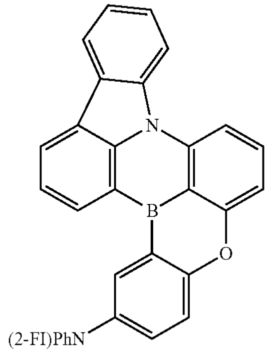
Compound 2-587
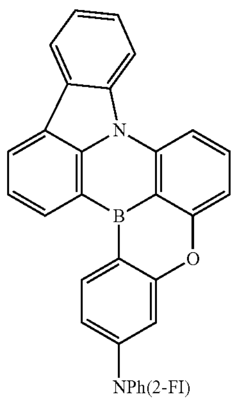
Compound 2-588
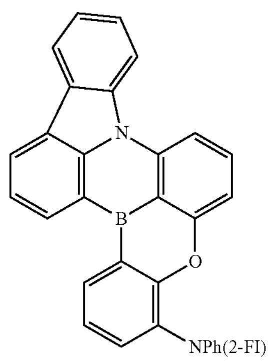
Compound 2-589
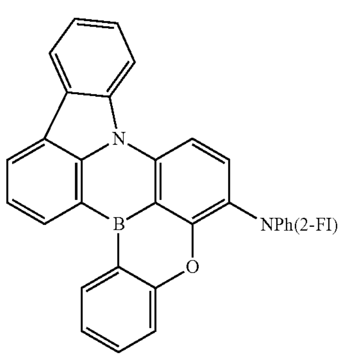
-continued
Compound 2-590
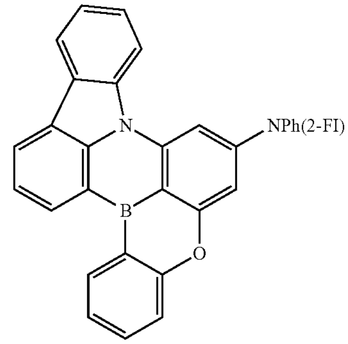
Compound 2-591
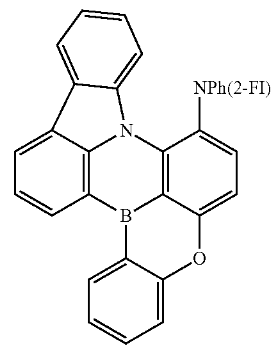
Compound 2-592
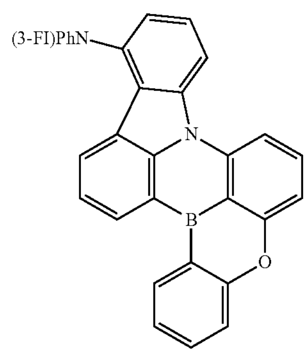
Compound 2-593
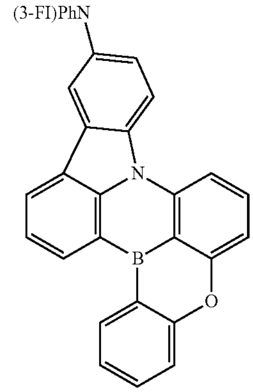

-continued
Compound 2-594
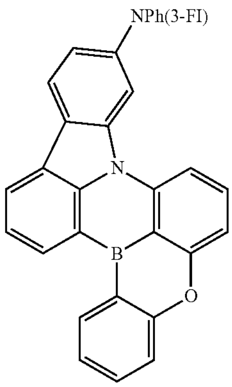
Compound 2-595
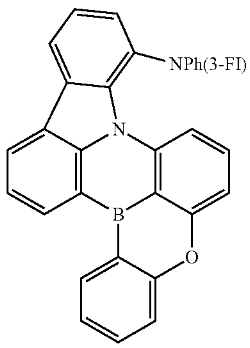
Compound 2-596
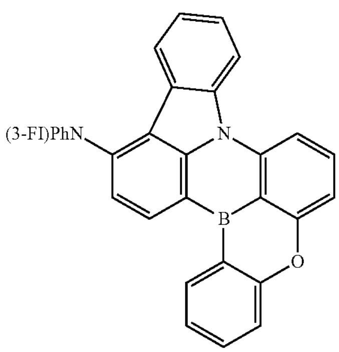
Compound 2-597
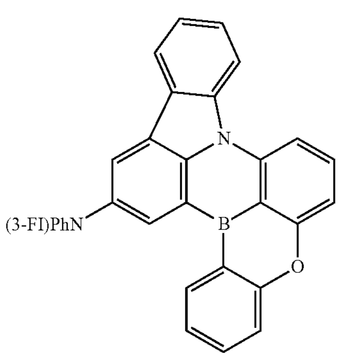
-continued
Compound 2-598
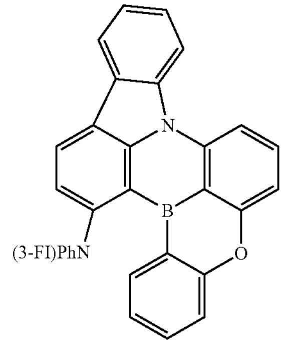
Compound 2-599
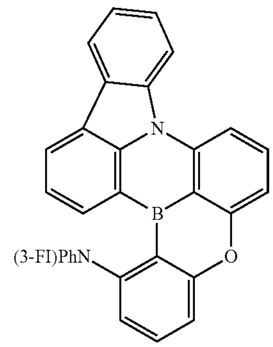
Compound 2-600
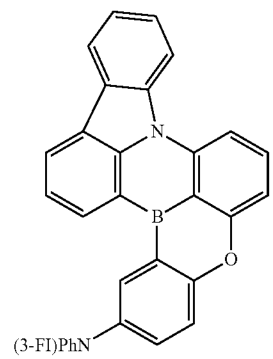
Compound 2-601
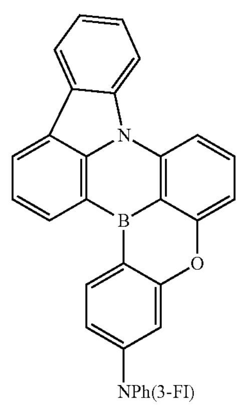

-continued
Compound 2-602
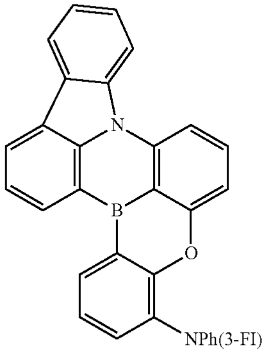
Compound 2-603
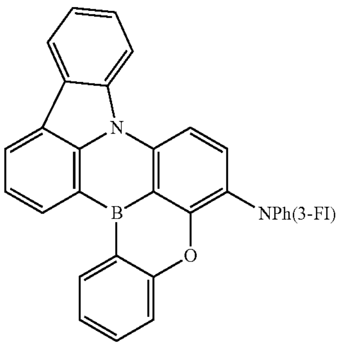
Compound 2-604
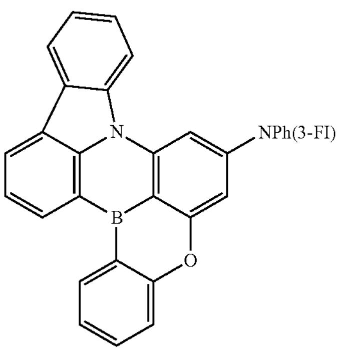
Compound 2-605
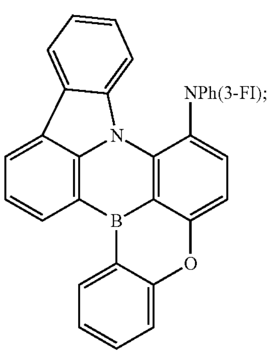
In the structure of the compounds above, wherein
Ph is 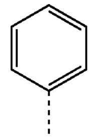, Cz is 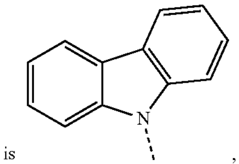,
$NPh_2$ is 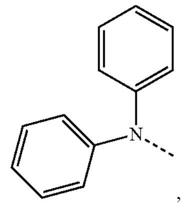,
N(3-BP)$_2$ is 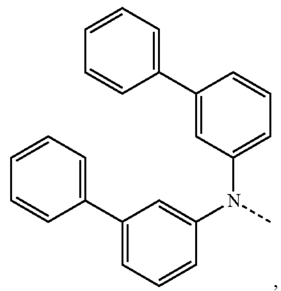,
N(4-BP)$_2$ is 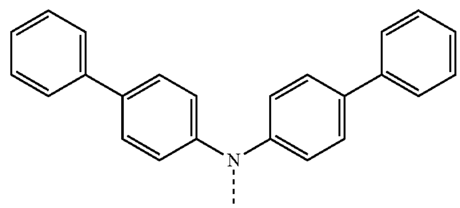,
N(2-Fl)$_2$ is 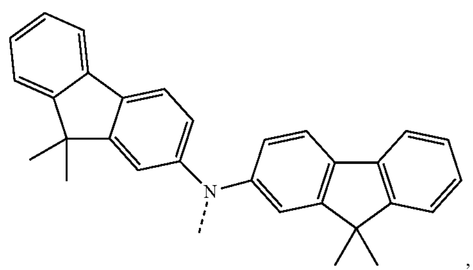,
N(3-Fl)$_2$ is 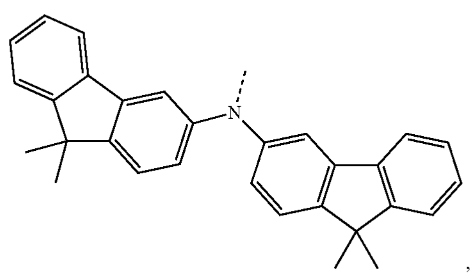,
N(4-Fl)$_2$ is 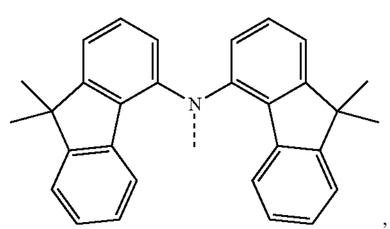, -continued
NPh(4-BP) is 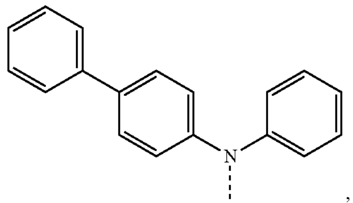 ,
N(2-Fl)(4-BP) is 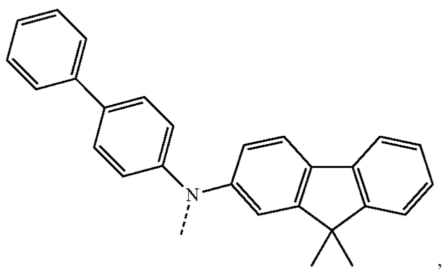 ,
N(3-Fl)(4-BP) is 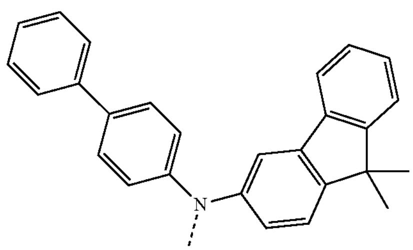 ,
NPh(2-Fl) is 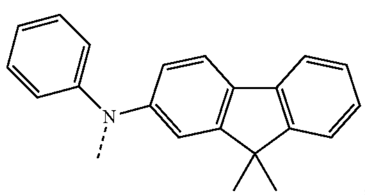 ,
NPh(3-Fl) is 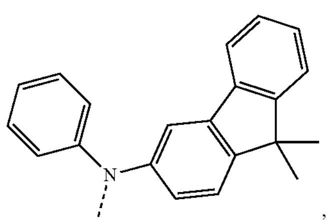 ,
NPh(3-BP) is 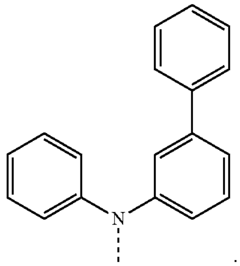 .
According to one embodiment of the present invention, wherein the compound is selected from the group consisting of:
Compound 3-1
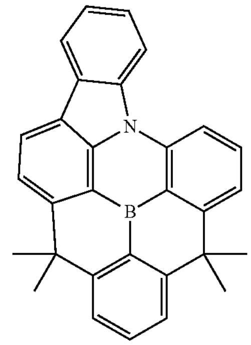
Compound 3-2
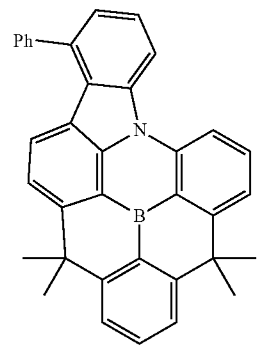
Compound 3-3
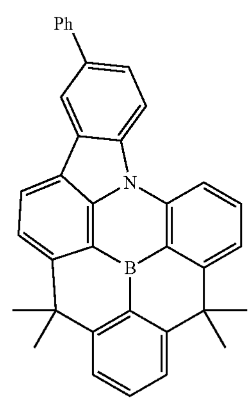
Compound 3-4
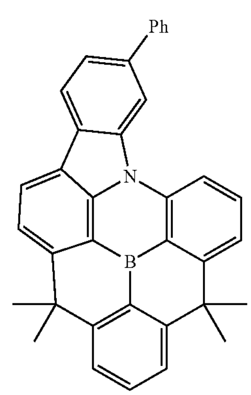

-continued
Compound 3-5
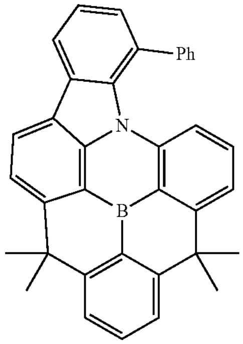
Compound 3-6
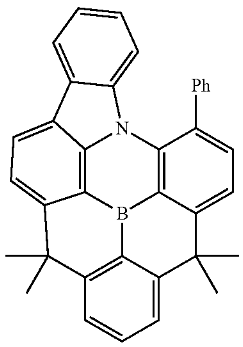
Compound 3-7
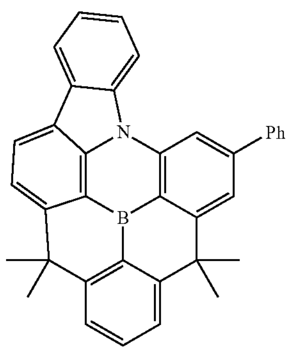
Compound 3-8
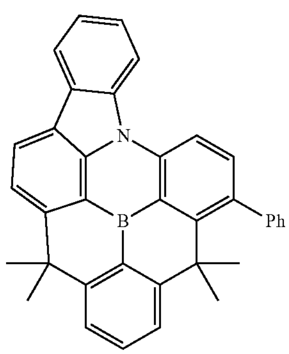
-continued
Compound 3-9
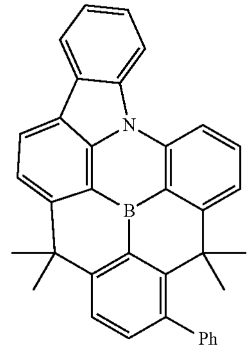
Compound 3-10
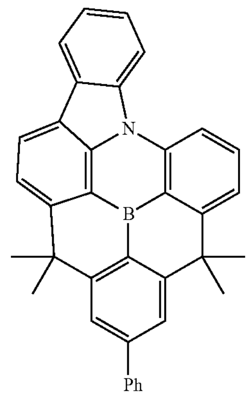
Compound 3-11
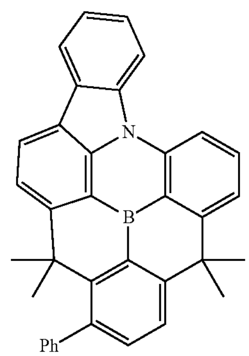
Compound 3-12
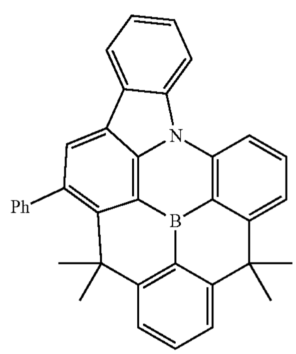

Compound 3-13
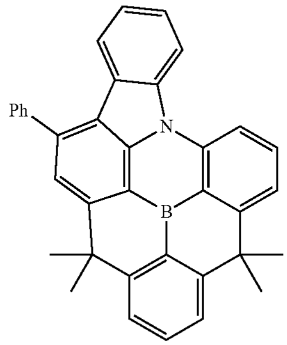
Compound 3-14
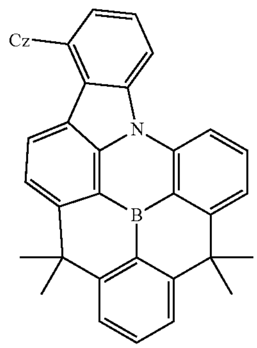
Compound 3-15
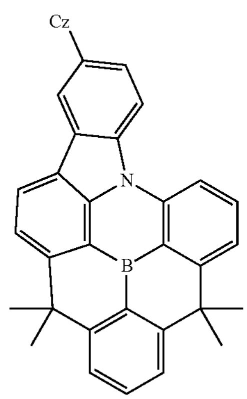
Compound 3-16
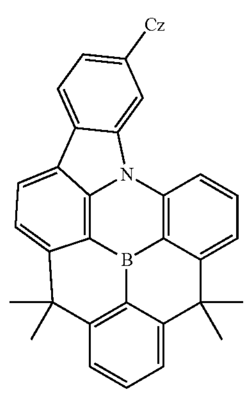
Compound 3-17
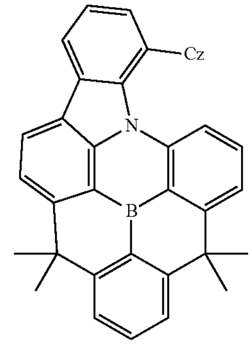
Compound 3-18
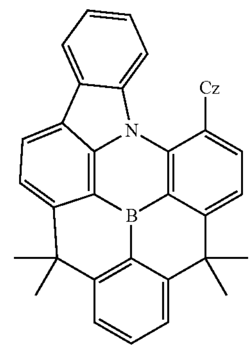
Compound 3-19
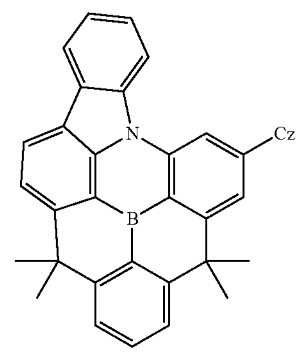
Compound 3-20
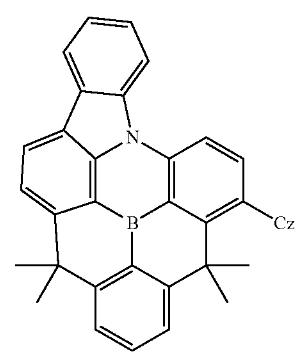

-continued
Compound 3-21
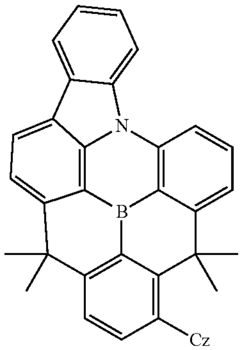
Compound 3-22
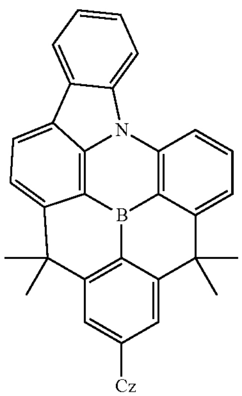
Compound 3-23
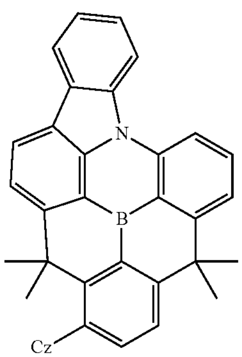
Compound 3-24
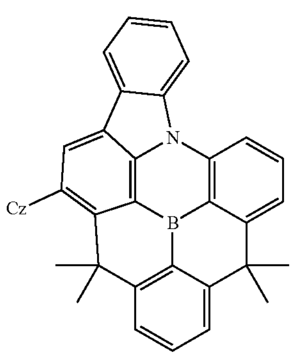
-continued
Compound 3-25
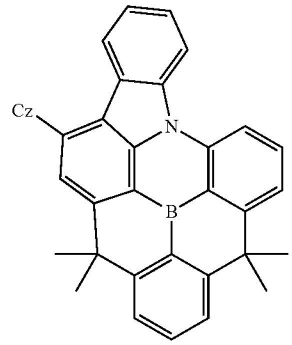
Compound 3-26
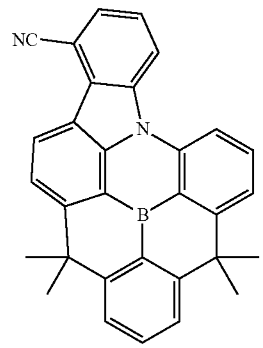
Compound 3-27
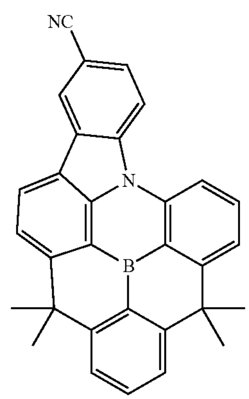
Compound 3-28
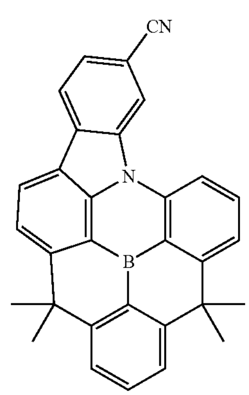

Compound 3-29
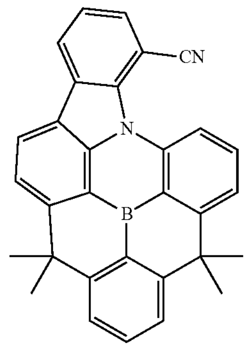
Compound 3-30
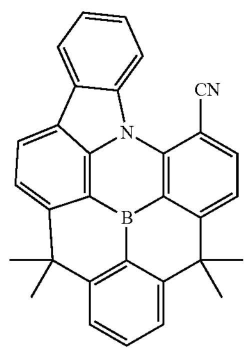
Compound 3-31
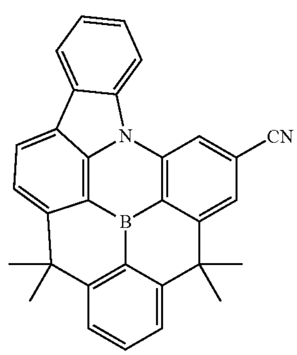
Compound 3-32
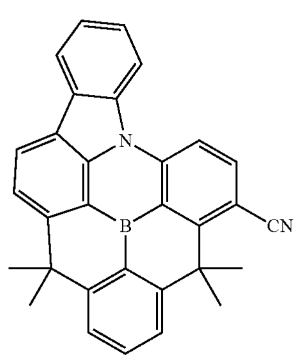
Compound 3-33
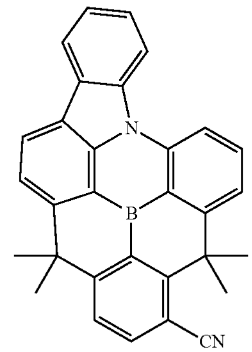
Compound 3-34
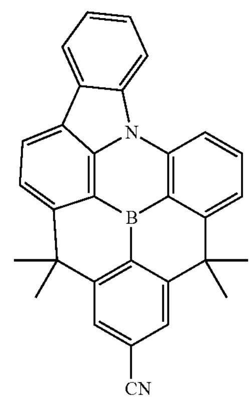
Compound 3-35
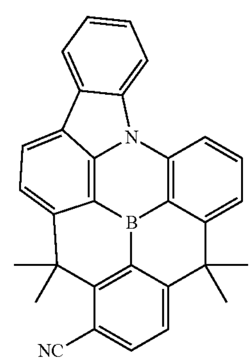
Compound 3-36
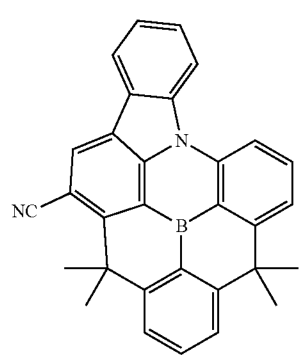

-continued
Compound 3-37
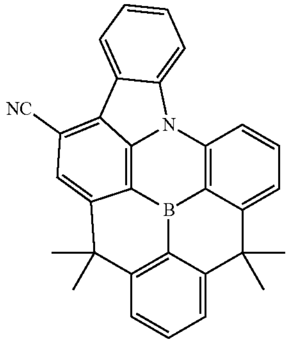
Compound 3-38
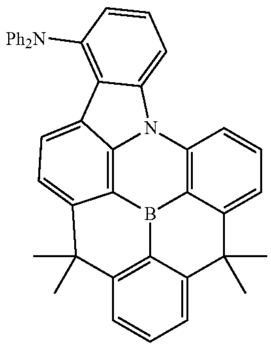
Compound 3-39
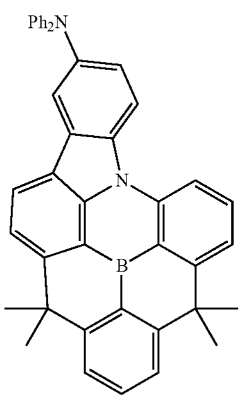
Compound 3-40
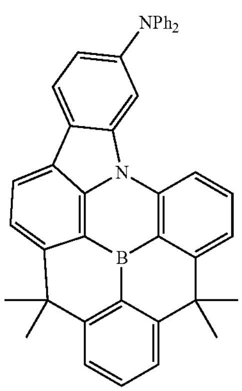
-continued
Compound 3-41
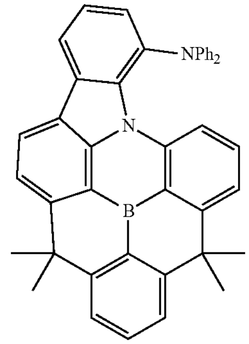
Compound 3-42
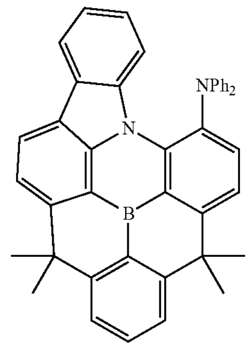
Compound 3-43
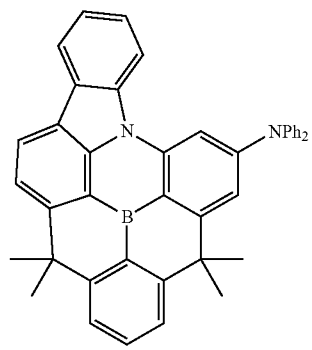
Compound 3-44
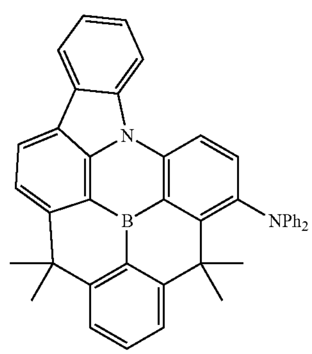

-continued
Compound 3-45
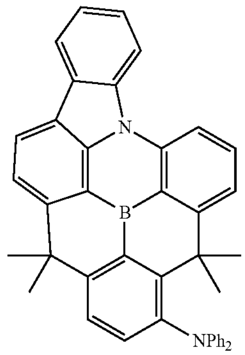
Compound 3-46
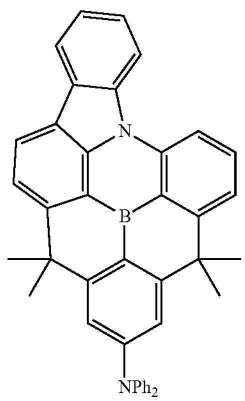
Compound 3-47
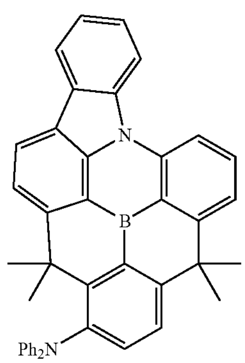
Compound 3-48
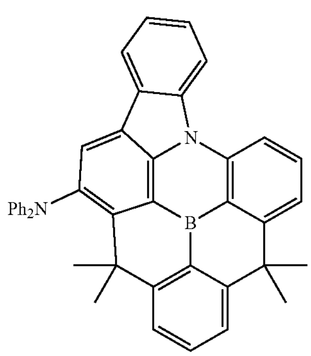
-continued
Compound 3-49
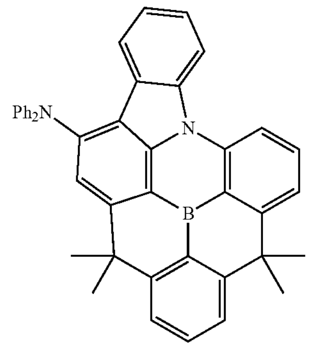
Compound 3-50
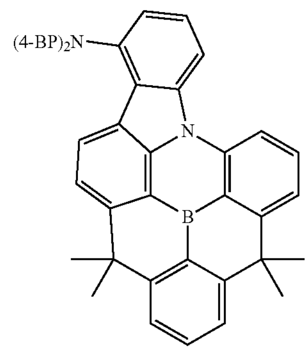
Compound 3-51
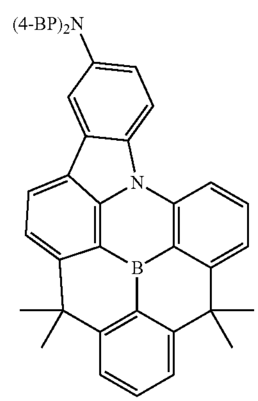
Compound 3-52
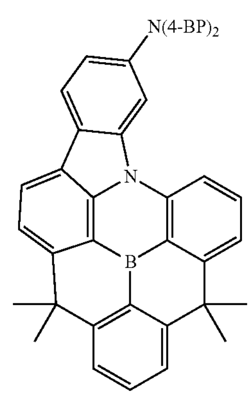

-continued
Compound 3-53
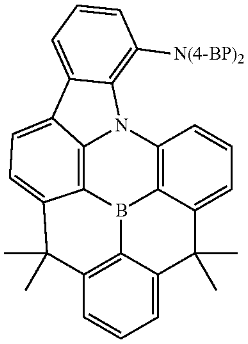
Compound 3-54
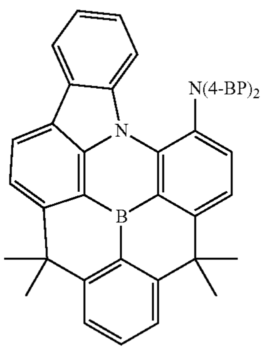
Compound 3-55
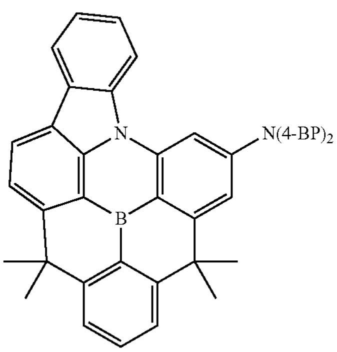
Compound 3-56
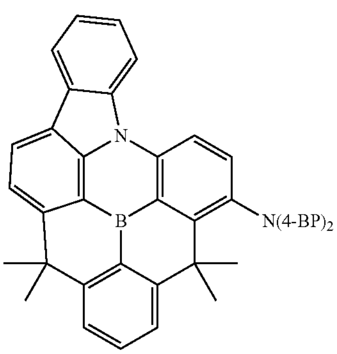
-continued
Compound 3-57
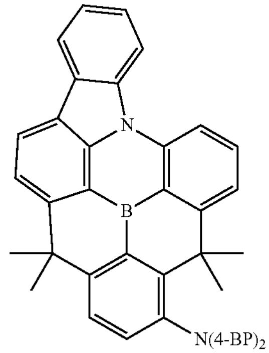
Compound 3-58
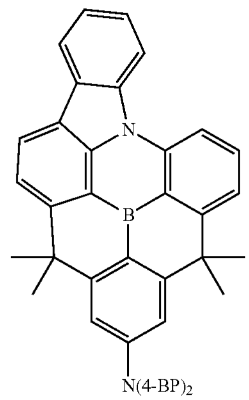
Compound 3-59
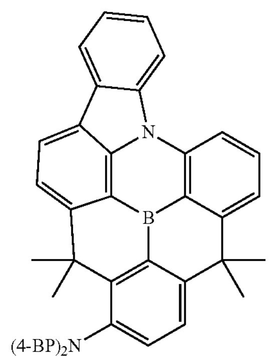
Compound 3-60
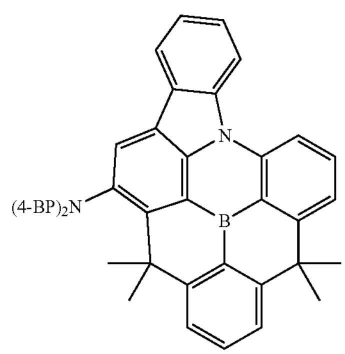

Compound 3-61
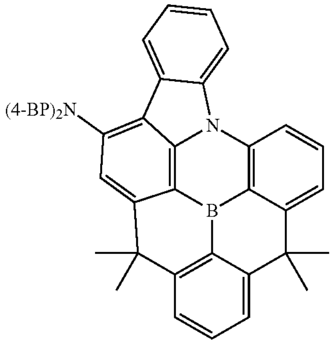
Compound 3-62
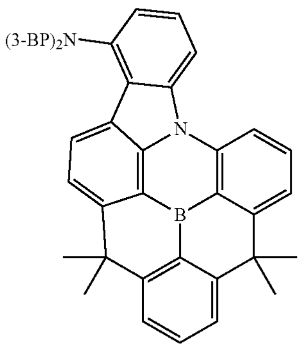
Compound 3-63
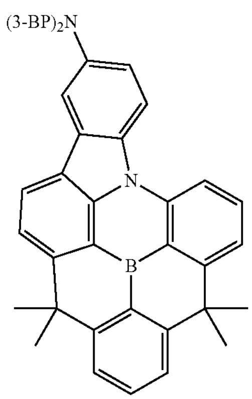
Compound 3-64
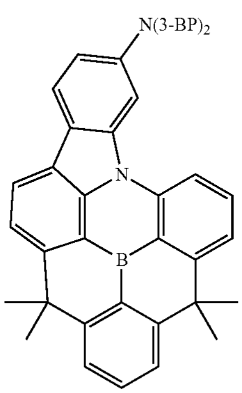
Compound 3-65
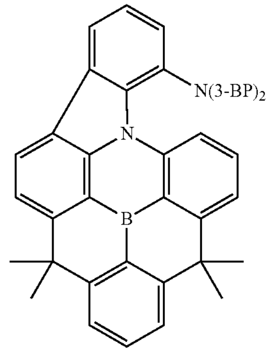
Compound 3-66
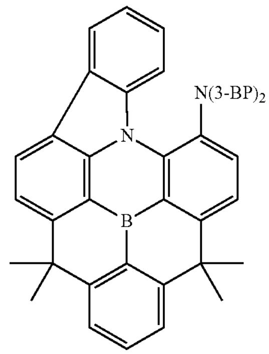
Compound 3-67
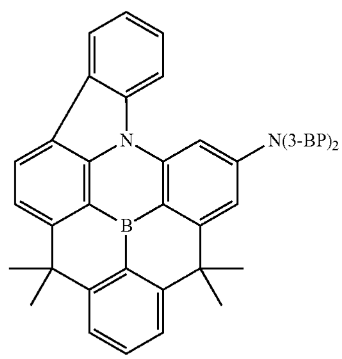
Compound 3-68
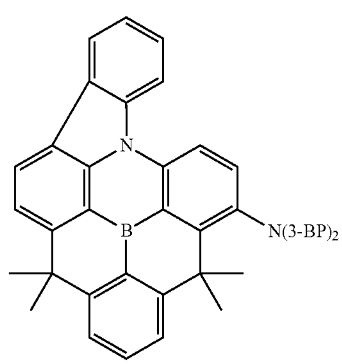

-continued
Compound 3-69
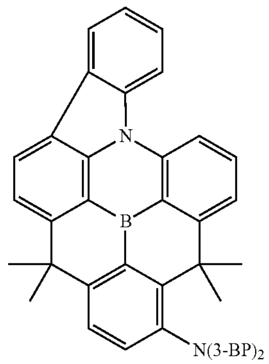
Compound 3-70
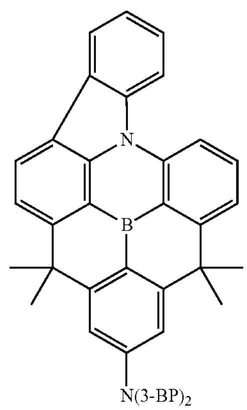
Compound 3-71
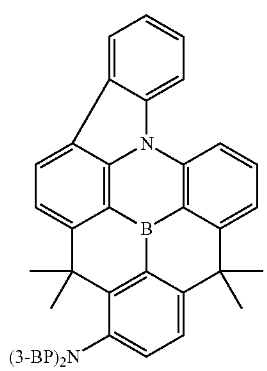
Compound 3-72
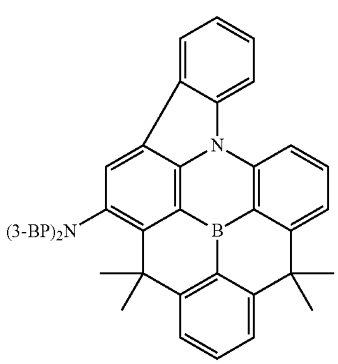
-continued
Compound 3-73
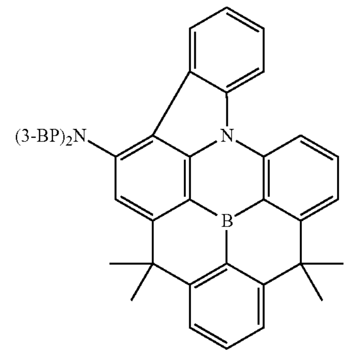
Compound 3-74
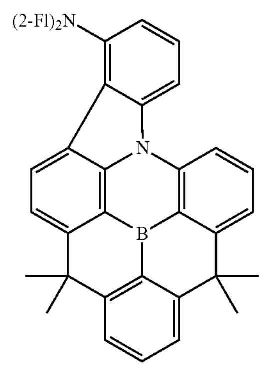
Compound 3-75
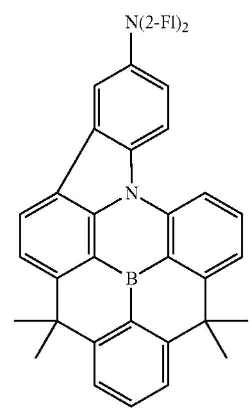
Compound 3-76
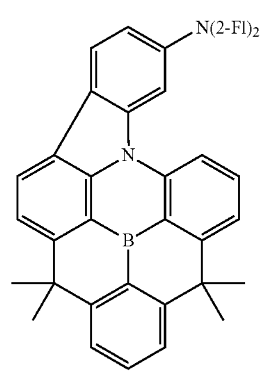

-continued
Compound 3-77
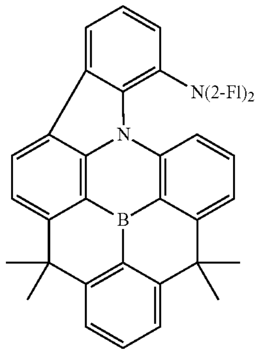
Compound 3-78
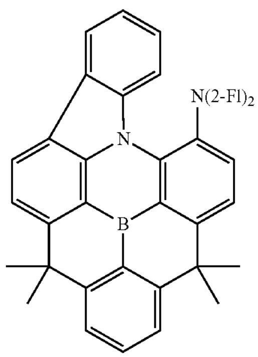
Compound 3-79
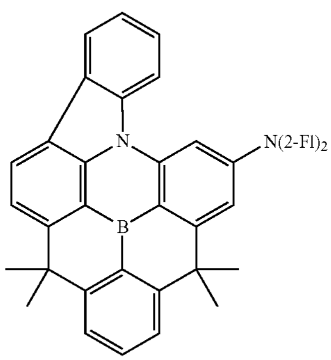
Compound 3-80
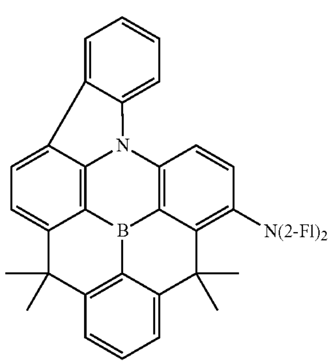
-continued
Compound 3-81
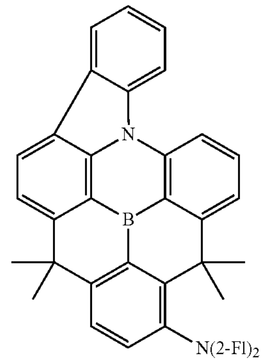
Compound 3-82
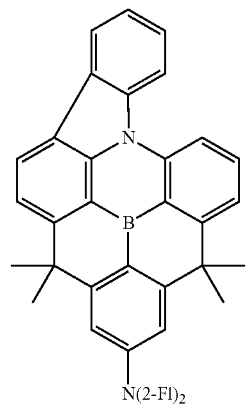
Compound 3-83
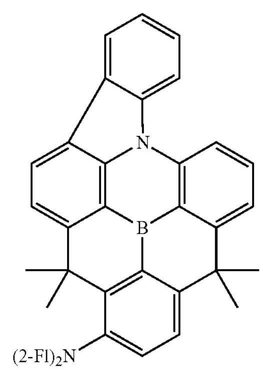
Compound 3-84
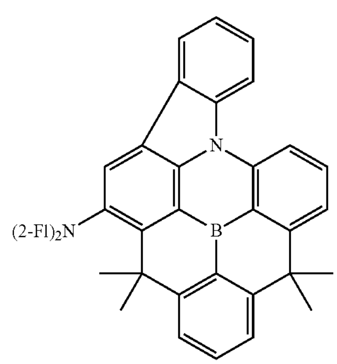

-continued
Compound 3-85
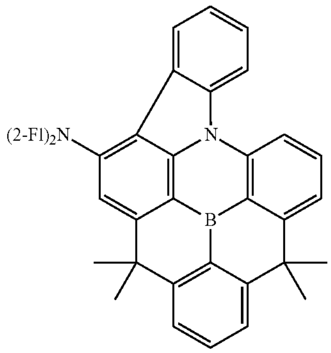
Compound 3-86
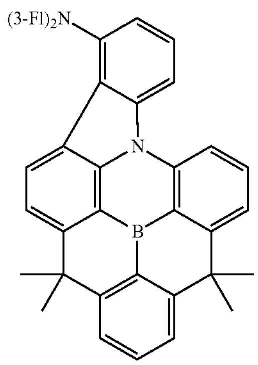
Compound 3-87
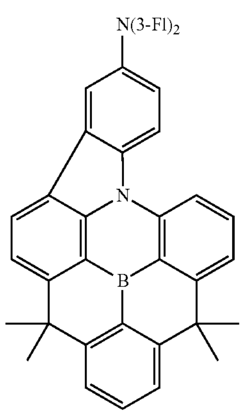
Compound 3-88
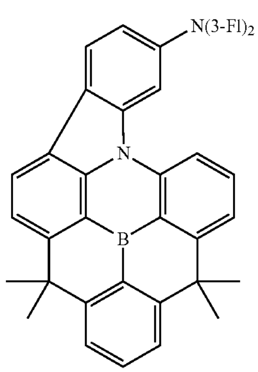
-continued
Compound 3-89
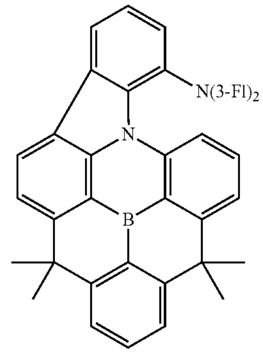
Compound 3-90
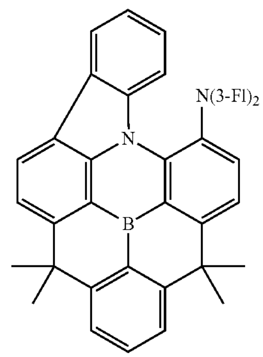
Compound 3-91
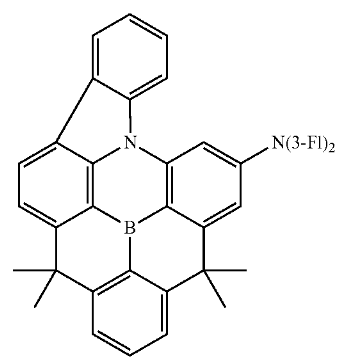
Compound 3-92
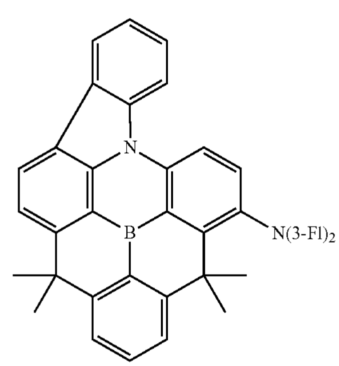

Compound 3-93
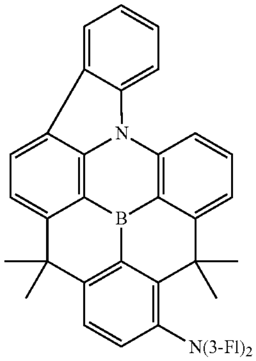
Compound 3-94
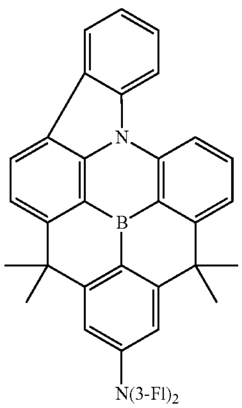
Compound 3-95
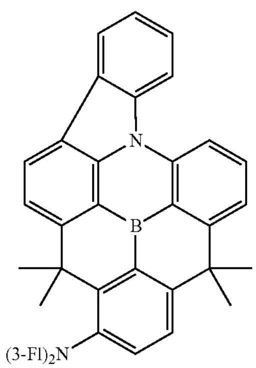
Compound 3-96
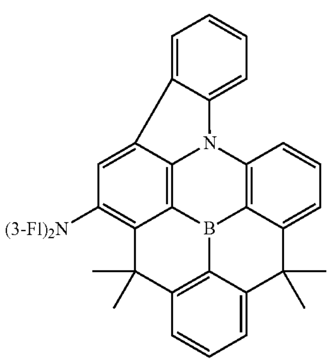
Compound 3-97
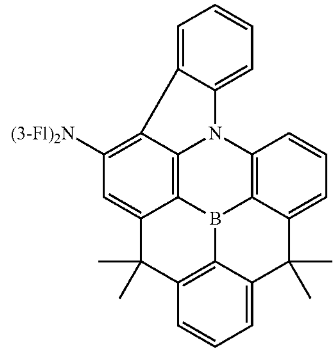
Compound 3-98
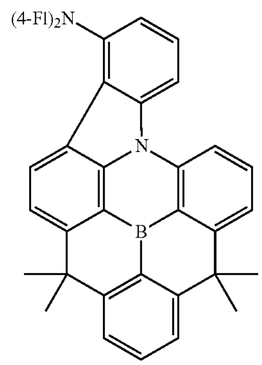
Compound 3-99
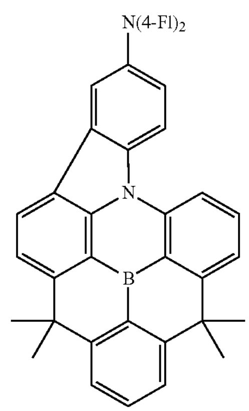
Compound 3-100
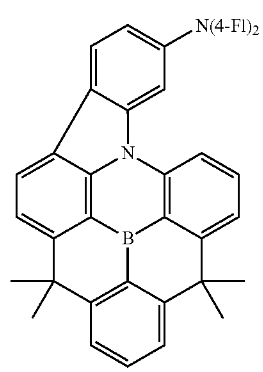

-continued
Compound 3-101
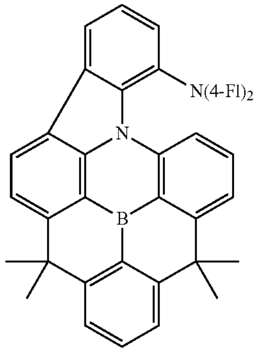
Compound 3-102
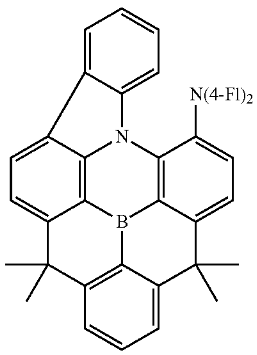
Compound 3-103
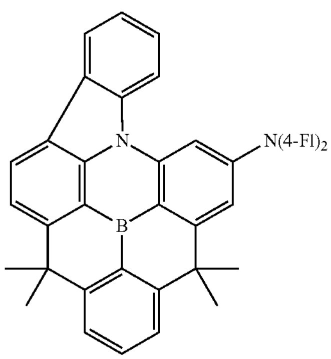
Compound 3-104
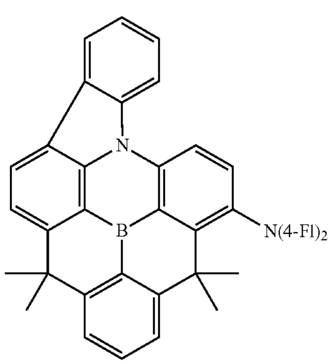
-continued
Compound 3-105
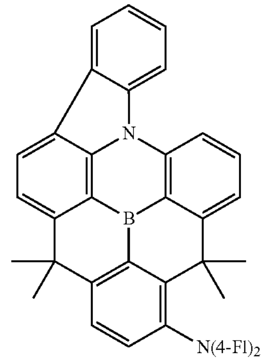
Compound 3-106
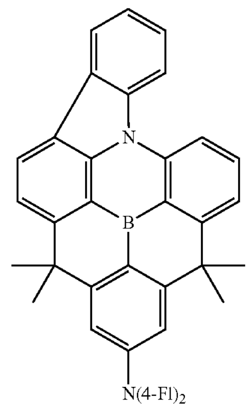
Compound 3-107
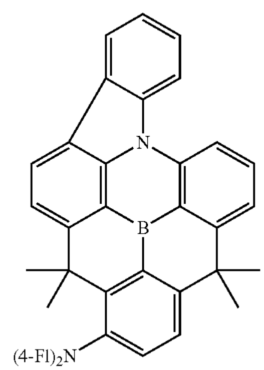
Compound 3-108
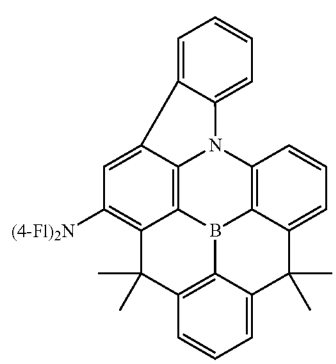

Compound 3-109
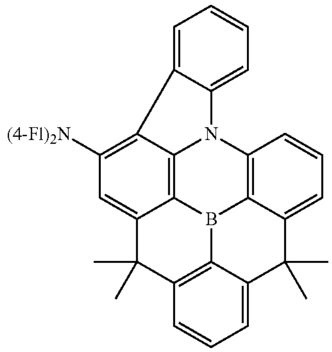
Compound 3-110
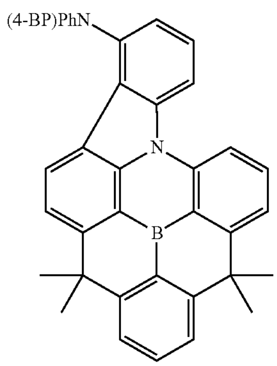
Compound 3-111
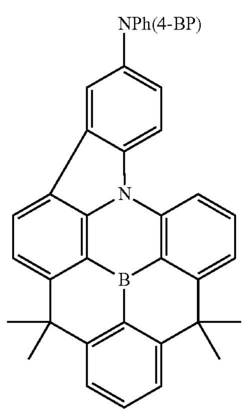
Compound 3-112
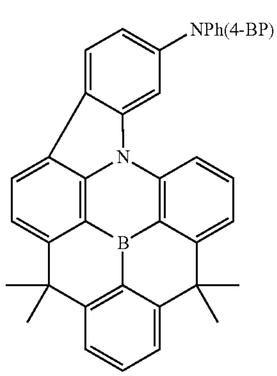
Compound 3-113
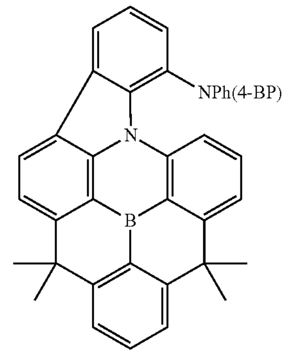
Compound 3-114
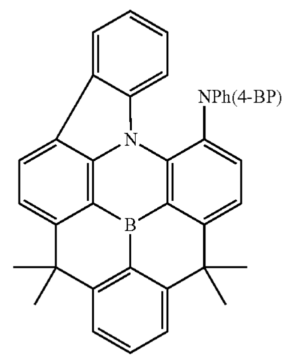
Compound 3-115
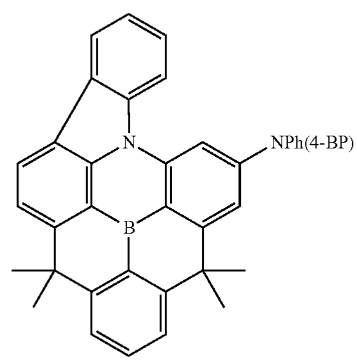
Compound 3-116
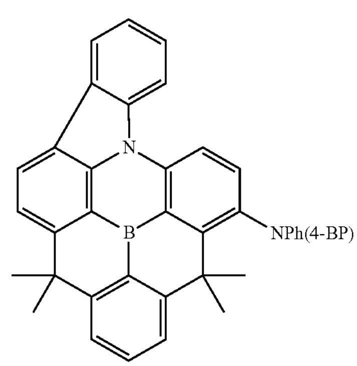

Compound 3-117
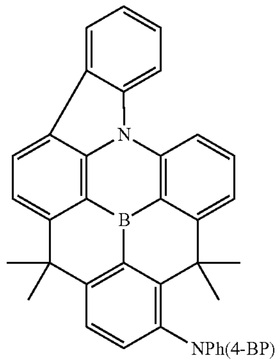
Compound 3-118
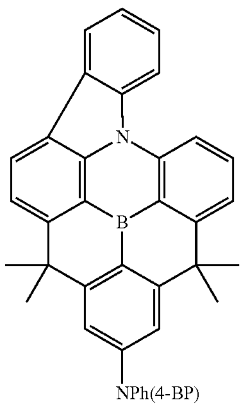
Compound 3-119
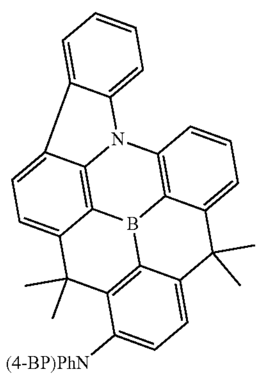
Compound 3-120
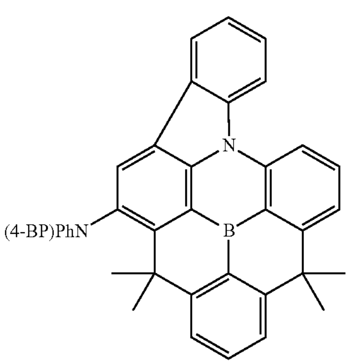
Compound 3-121
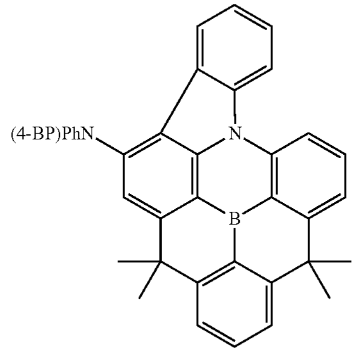
Compound 3-122
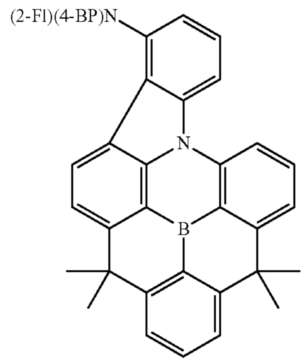
Compound 3-123
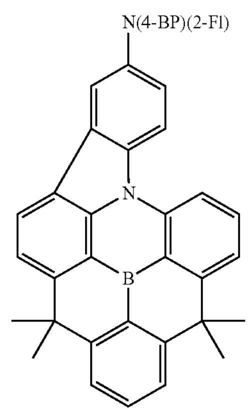
Compound 3-124
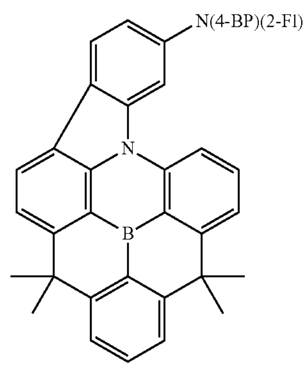

-continued
Compound 3-125
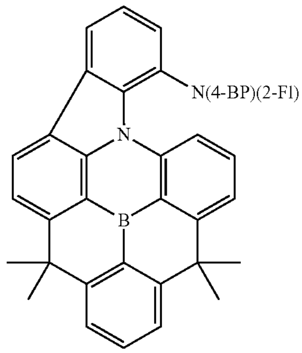
Compound 3-126
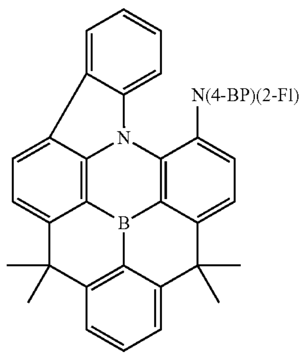
Compound 3-127
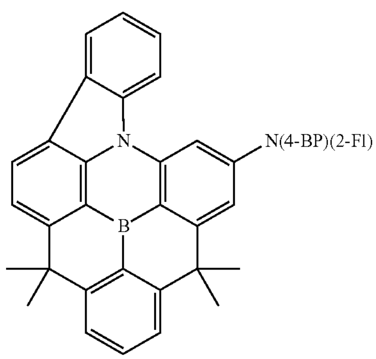
Compound 3-128
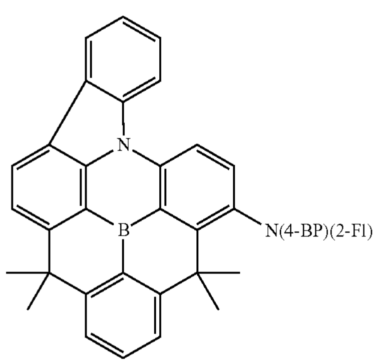
-continued
Compound 3-129
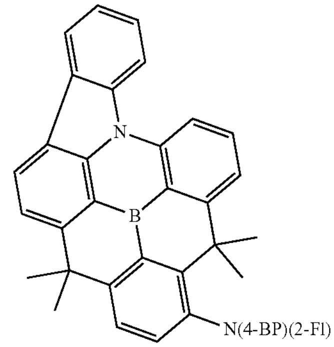
Compound 3-130
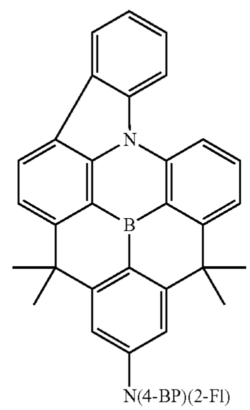
Compound 3-131
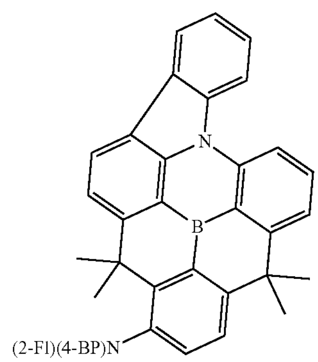
Compound 3-132
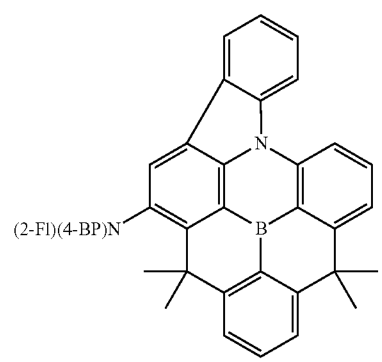

-continued
Compound 3-133
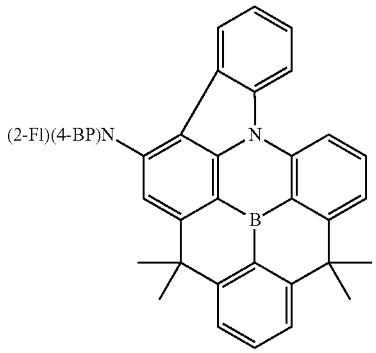
Compound 3-134
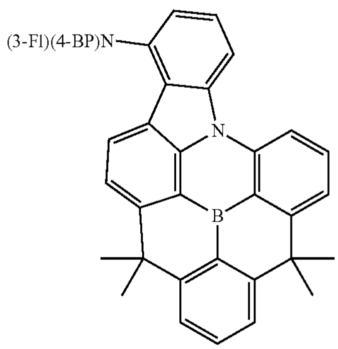
Compound 3-135
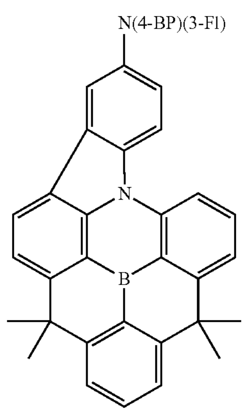
Compound 3-136
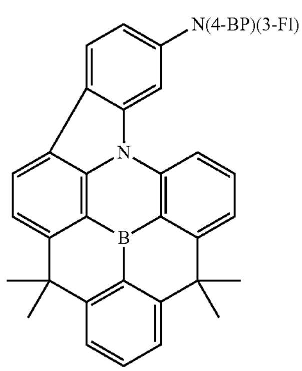
-continued
Compound 3-137
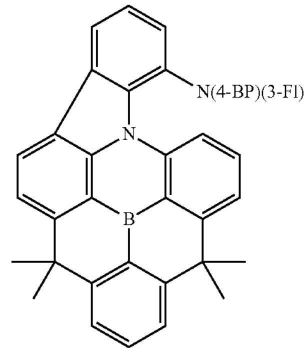
Compound 3-138
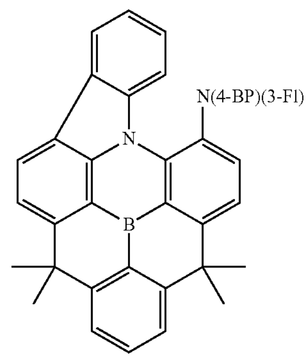
Compound 3-139
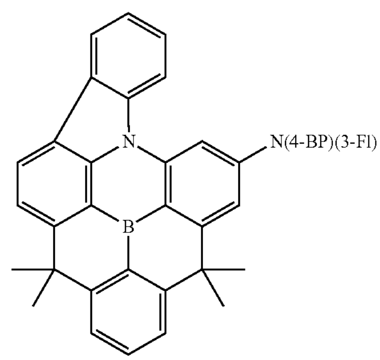
Compound 3-140
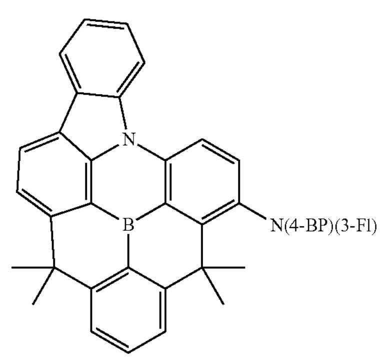

-continued
Compound 3-141
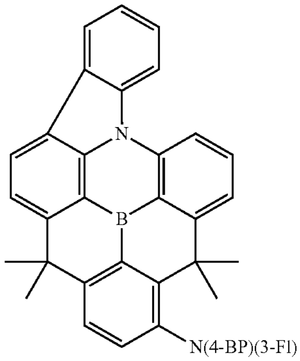
Compound 3-142
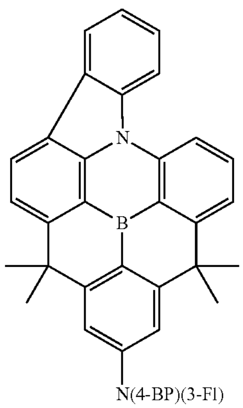
Compound 3-143
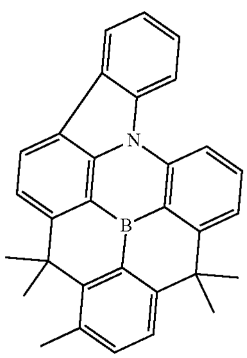
Compound 3-144
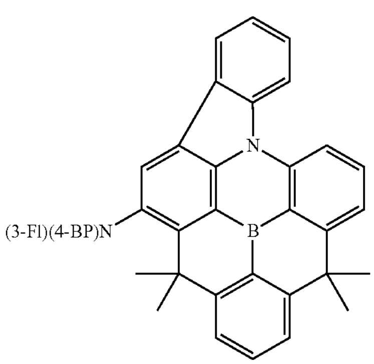
-continued
Compound 3-145
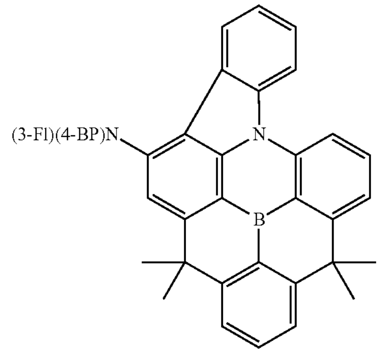
Compound 3-146
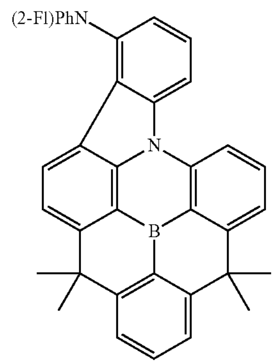
Compound 3-147
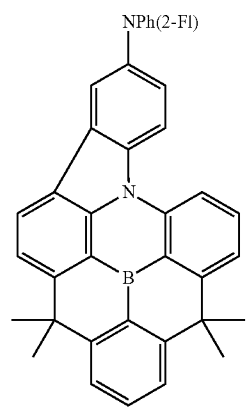
Compound 3-148
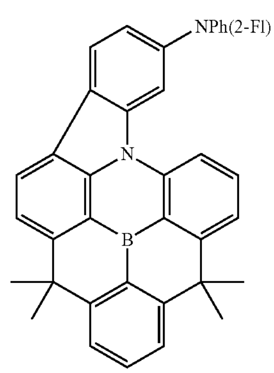

Compound 3-149
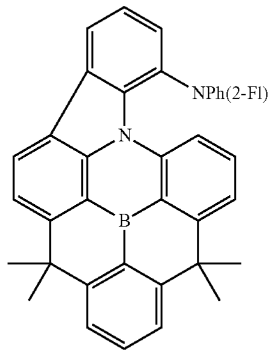
Compound 3-150
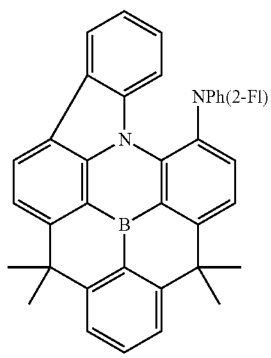
Compound 3-151
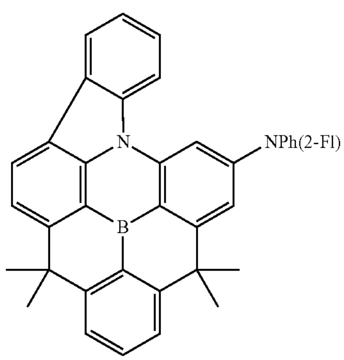
Compound 3-152
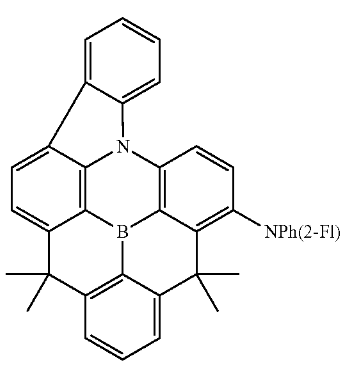
Compound 3-153
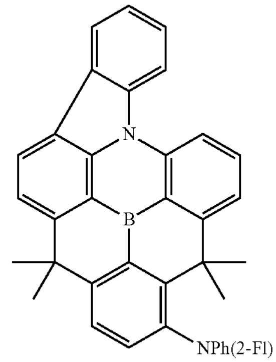
Compound 3-154
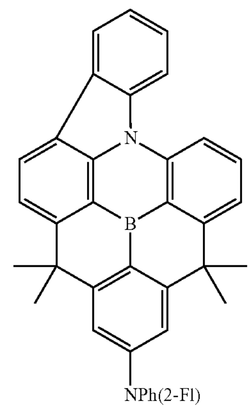
Compound 3-155
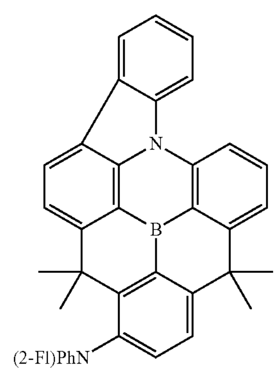
Compound 3-156
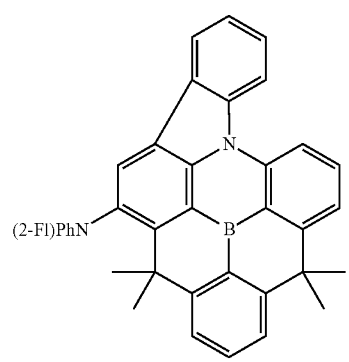

-continued
Compound 3-157
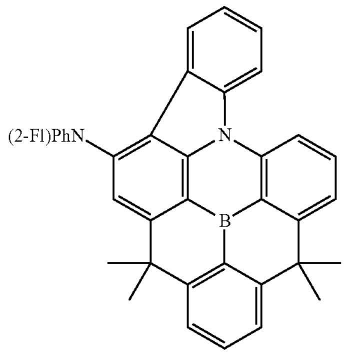
Compound 3-158
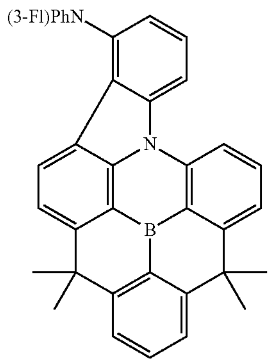
Compound 3-159
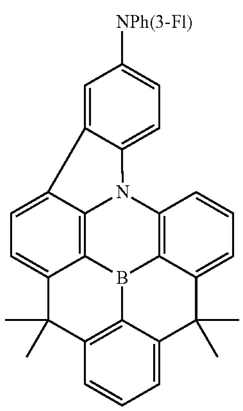
Compound 3-160
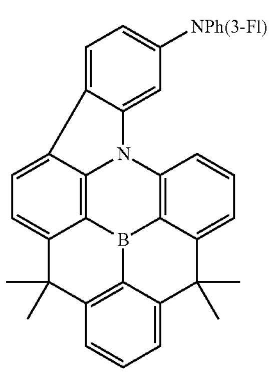
-continued
Compound 3-161
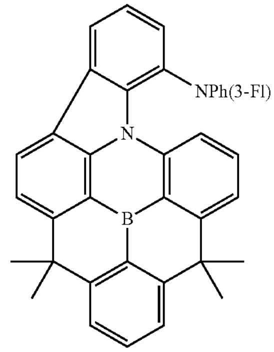
Compound 3-162
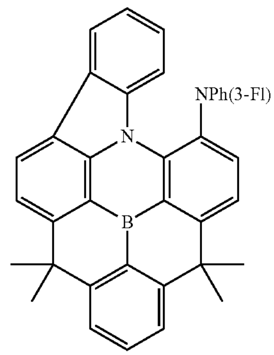
Compound 3-163
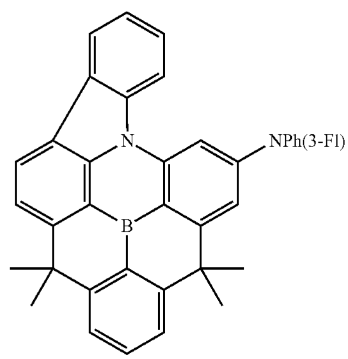
Compound 3-164
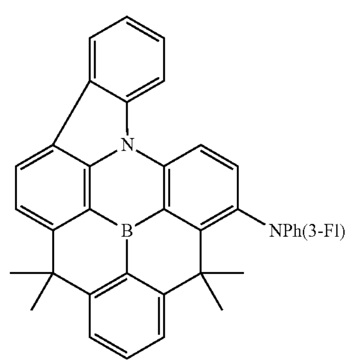

-continued
Compound 3-165
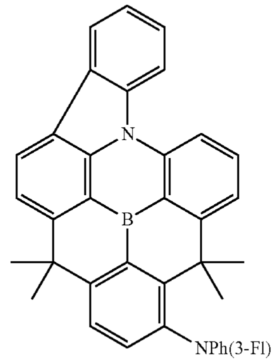
Compound 3-166
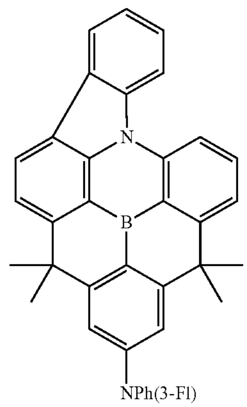
Compound 3-167
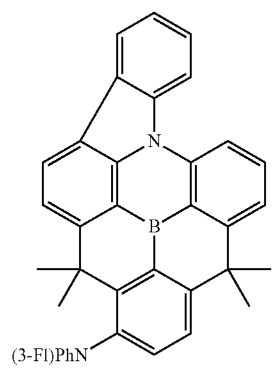
Compound 3-168
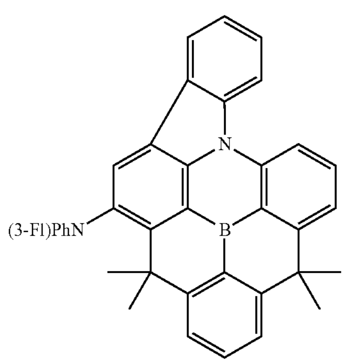
-continued
Compound 3-169
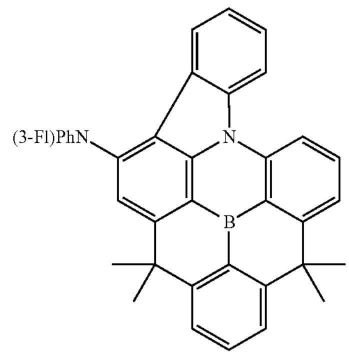
Compound 3-170
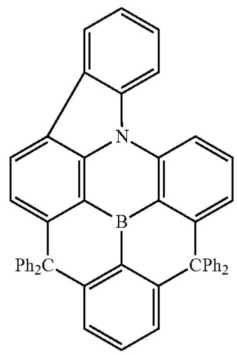
Compound 3-171
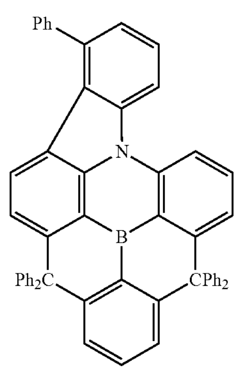
Compound 3-172
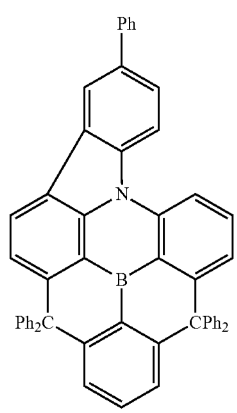

-continued
Compound 3-173
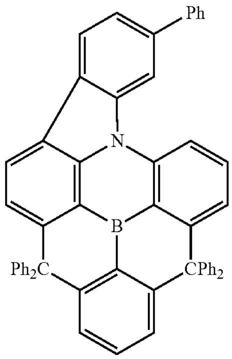
Compound 3-174
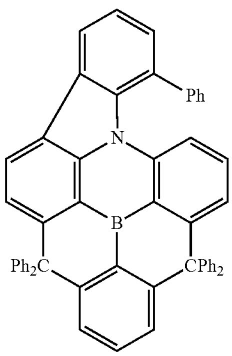
Compound 3-175
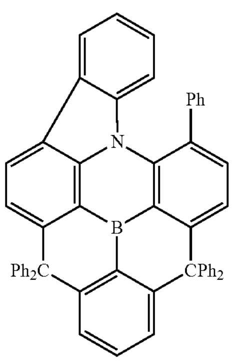
Compound 3-176
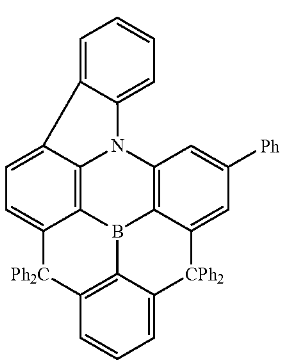
-continued
Compound 3-177
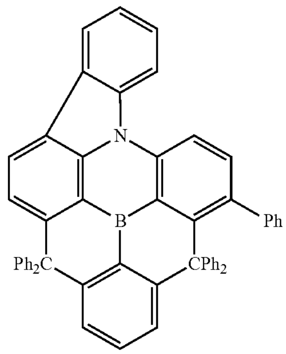
Compound 3-178
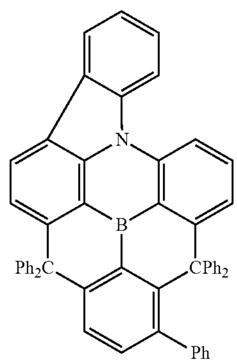
Compound 3-179
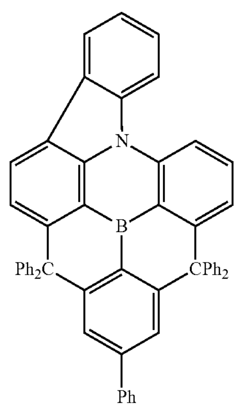
Compound 3-180
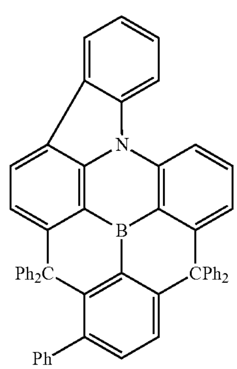

-continued
Compound 3-181
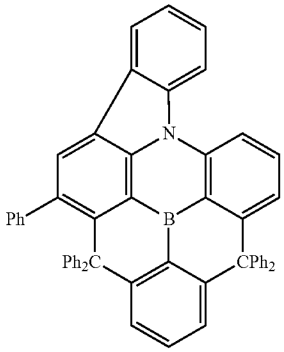
Compound 3-182
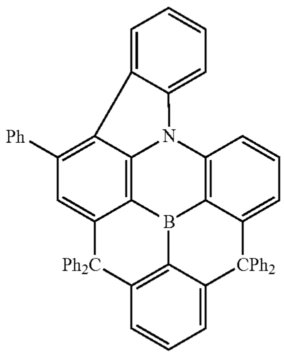
Compound 3-183
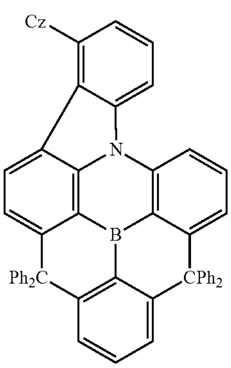
Compound 3-184
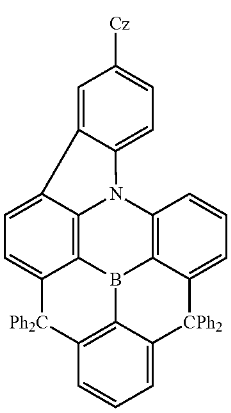
-continued
Compound 3-185
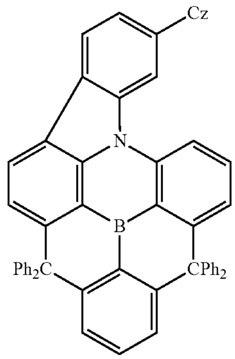
Compound 3-186
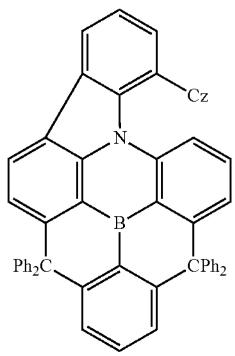
Compound 3-187
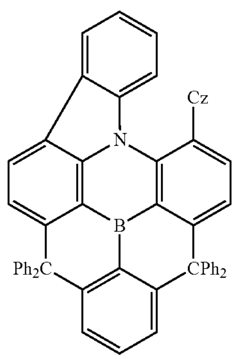
Compound 3-188
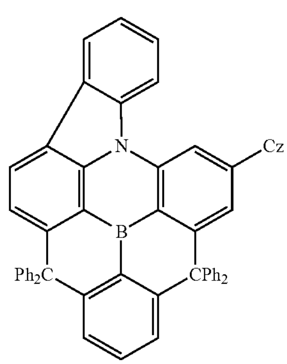

-continued
Compound 3-189
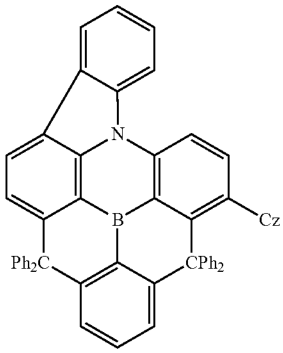
Compound 3-190
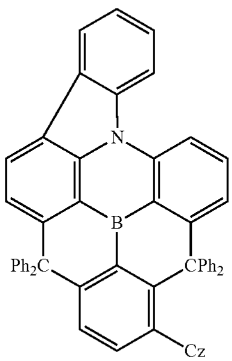
Compound 3-191
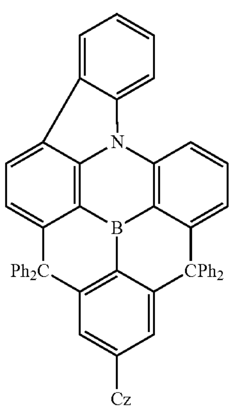
Compound 3-192
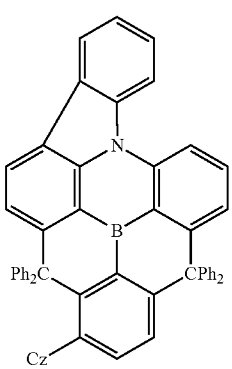
-continued
Compound 3-193
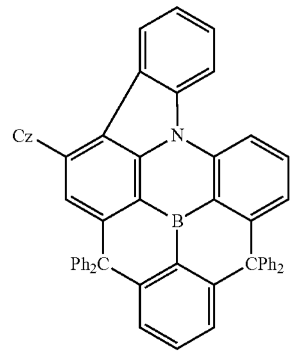
Compound 3-194
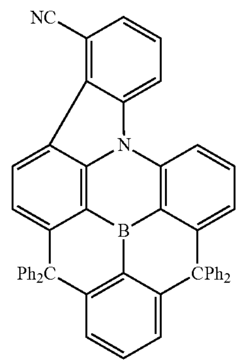
Compound 3-195
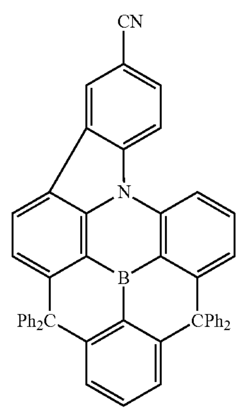
Compound 3-196
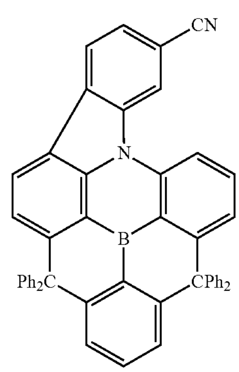

Compound 3-197
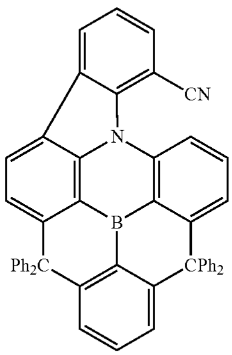
Compound 3-198
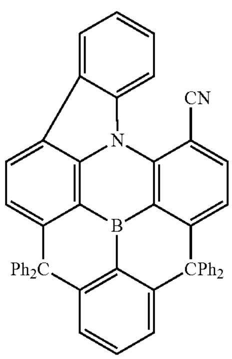
Compound 3-199
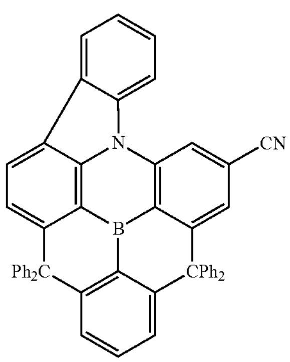
Compound 3-200
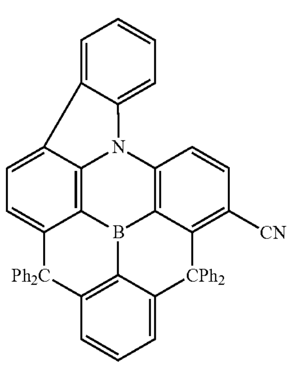
Compound 3-201
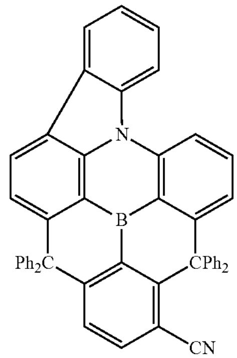
Compound 3-202
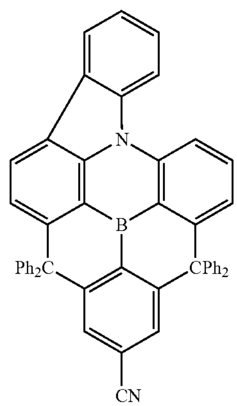
Compound 3-203
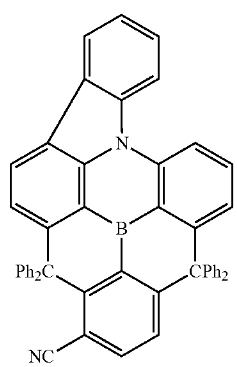
Compound 3-204
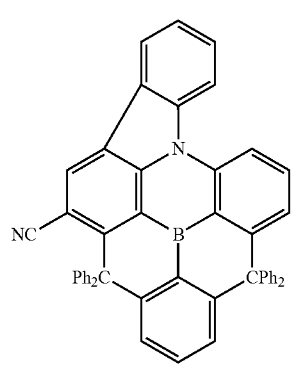

-continued
Compound 3-205
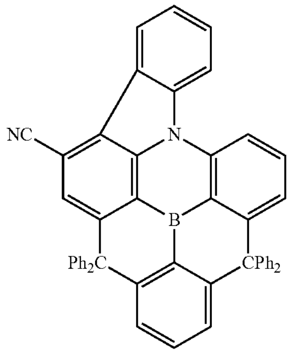
Compound 3-206
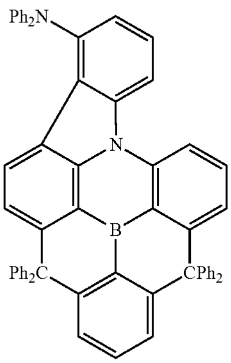
Compound 3-207
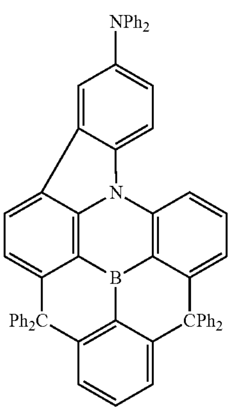
Compound 3-208
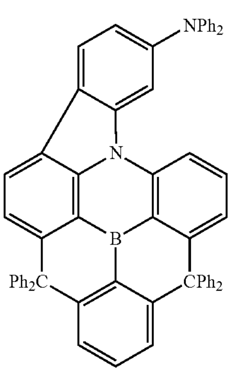
-continued
Compound 3-209
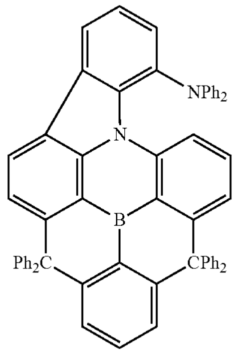
Compound 3-210
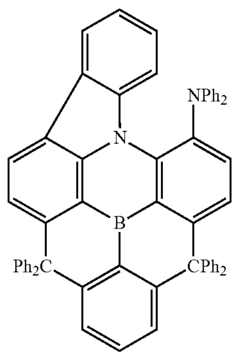
Compound 3-211
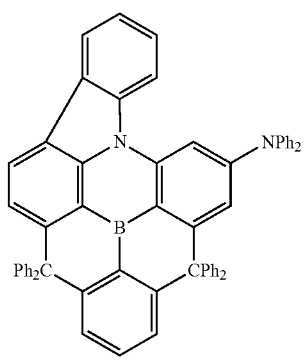
Compound 3-212
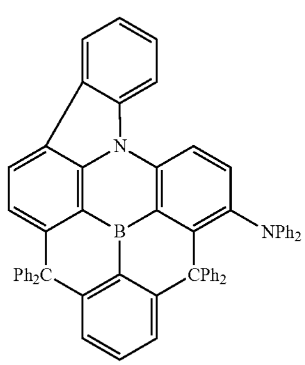

Compound 3-213
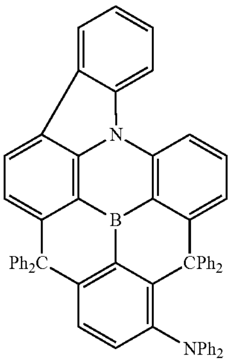
Compound 3-214
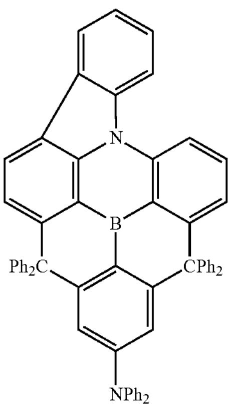
Compound 3-215
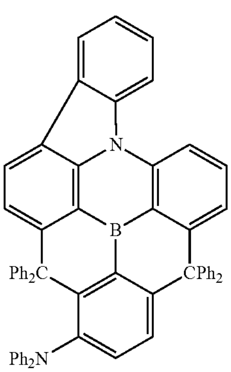
Compound 3-216
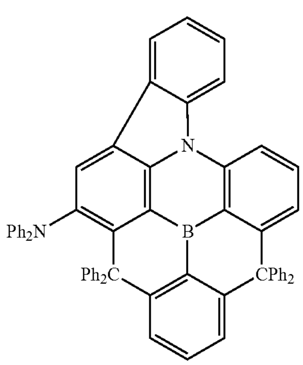
Compound 3-217
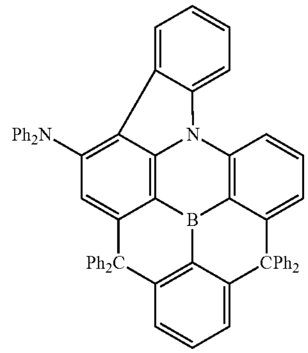
Compound 3-218
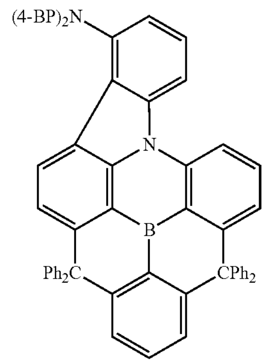
Compound 3-219
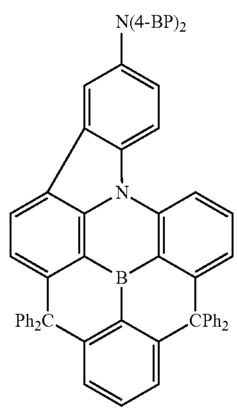
Compound 3-220
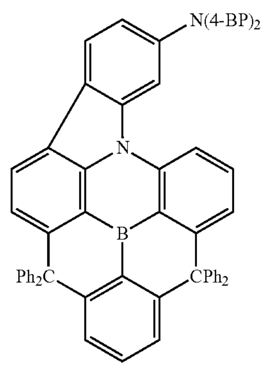

Compound 3-221
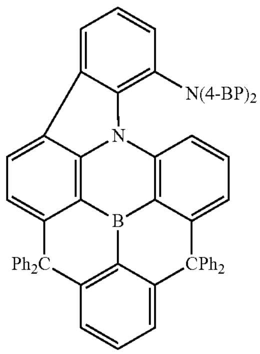
Compound 3-222
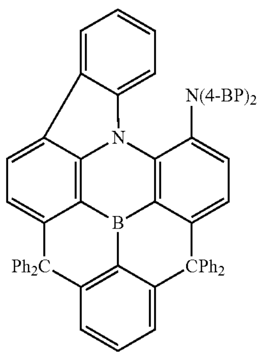
Compound 3-223
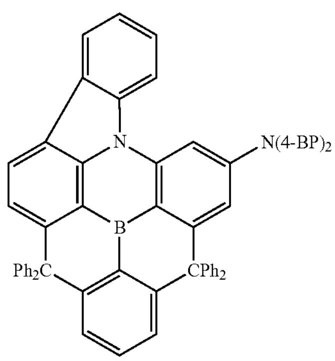
Compound 3-224
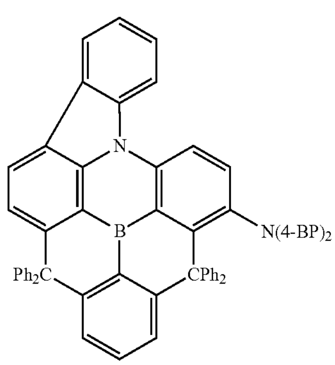
Compound 3-225
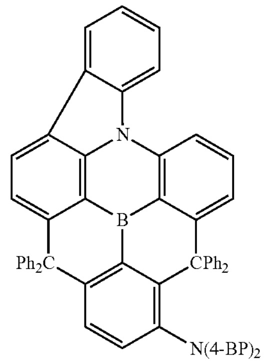
Compound 3-226
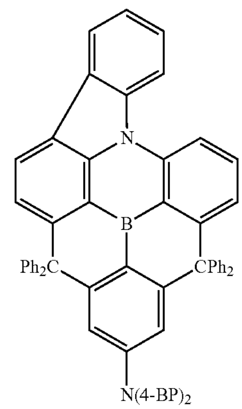
Compound 3-227
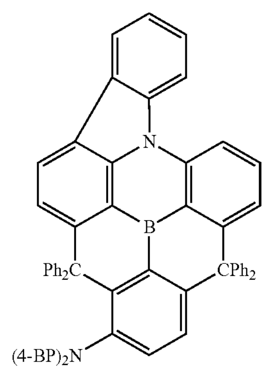
Compound 3-228
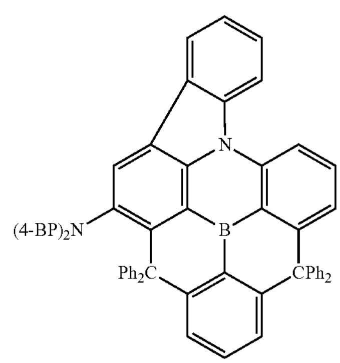

Compound 3-229
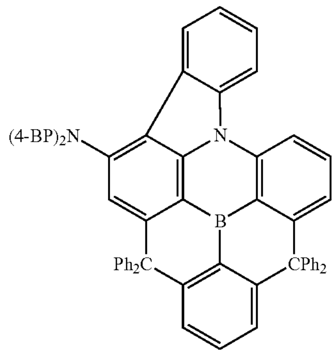
Compound 3-230
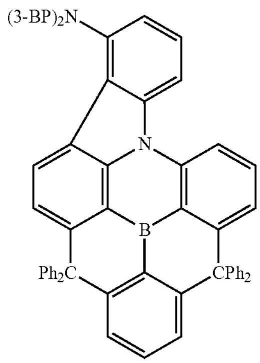
Compound 3-231
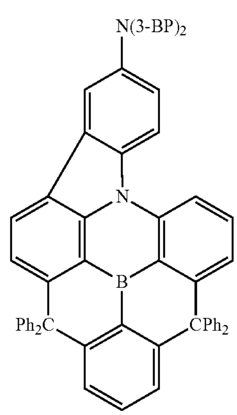
Compound 3-232
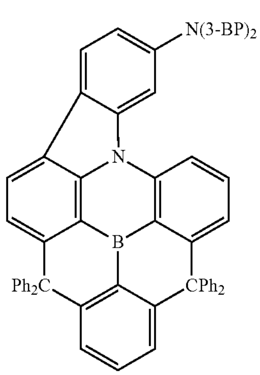
Compound 3-233
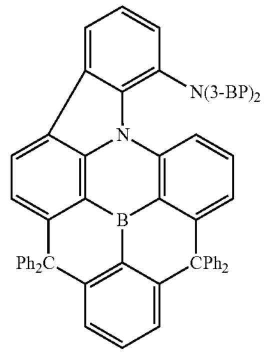
Compound 3-234
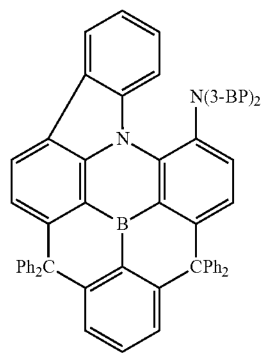
Compound 3-235
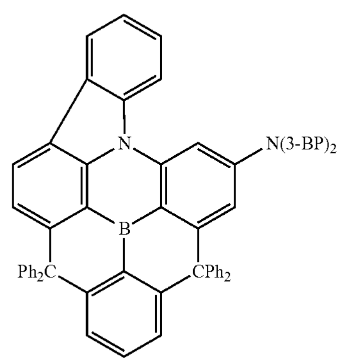
Compound 3-236
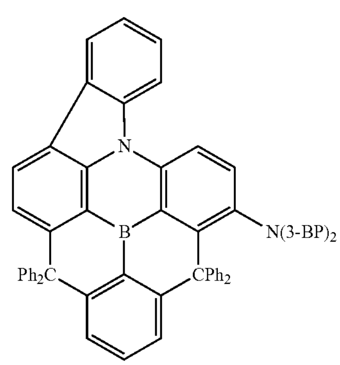

Compound 3-237
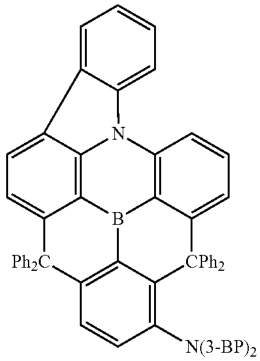
Compound 3-238
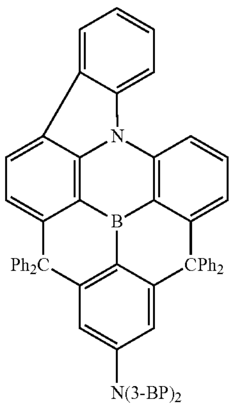
Compound 3-239
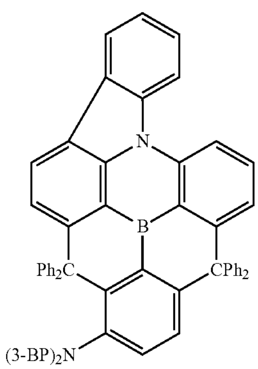
Compound 3-240
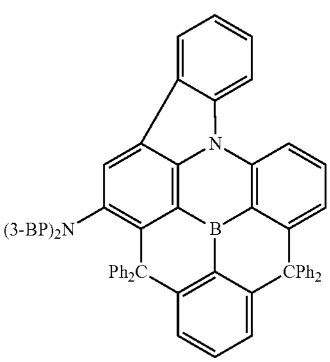
Compound 3-241
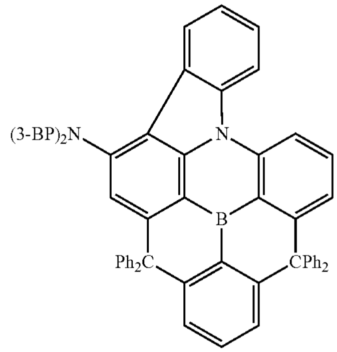
Compound 3-242
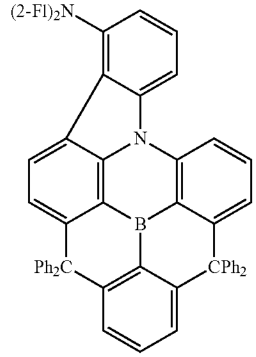
Compound 3-243
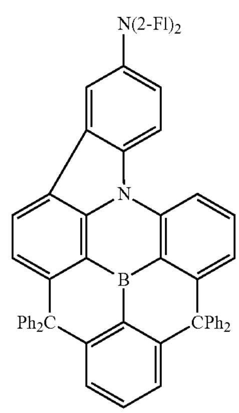
Compound 3-244
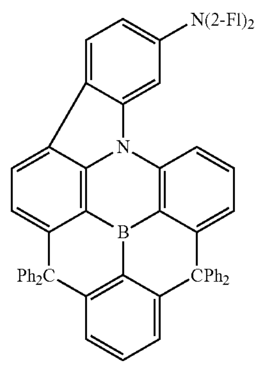

Compound 3-245
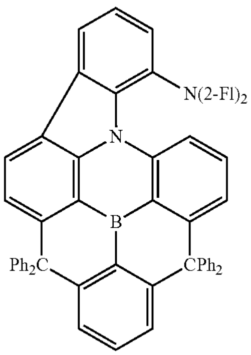
Compound 3-246
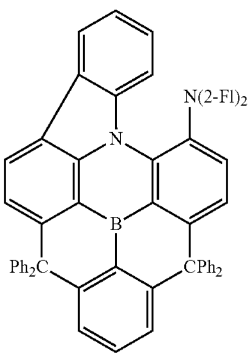
Compound 3-247
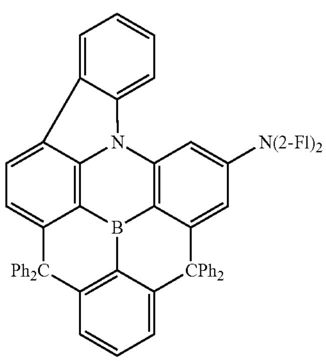
Compound 3-248
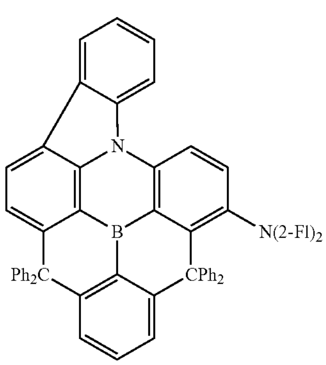
Compound 3-249
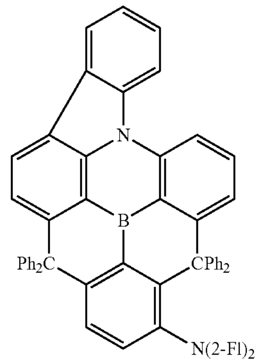
Compound 3-250
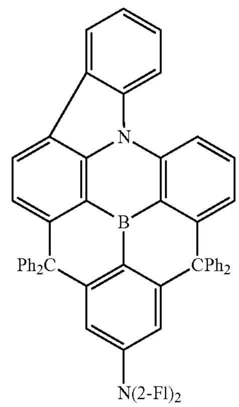
Compound 3-251
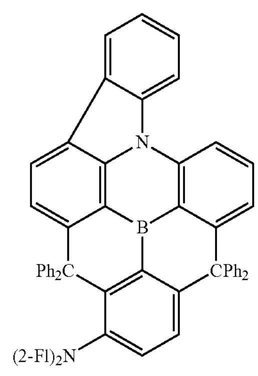
Compound 3-252
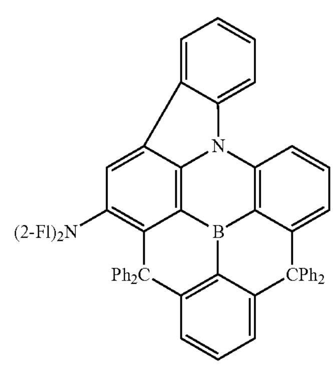

-continued
Compound 3-253
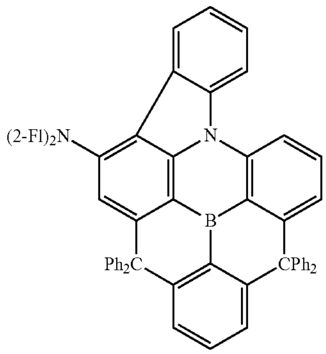
Compound 3-254
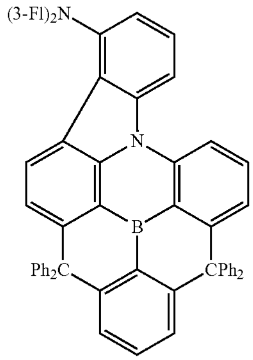
Compound 3-255
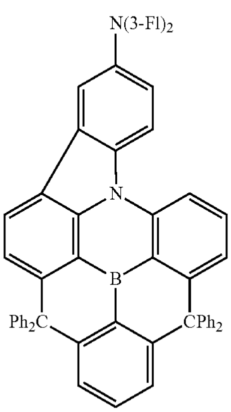
Compound 3-256
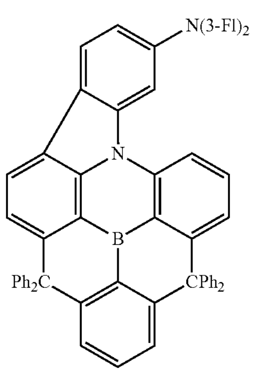
-continued
Compound 3-257
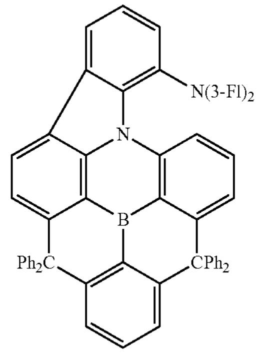
Compound 3-258
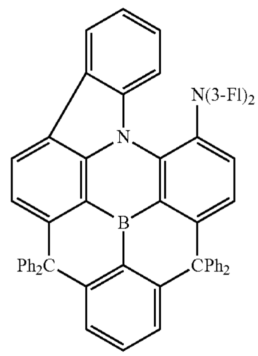
Compound 3-259
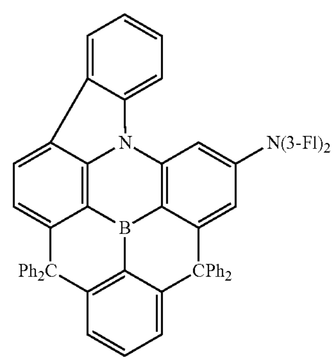
Compound 3-260
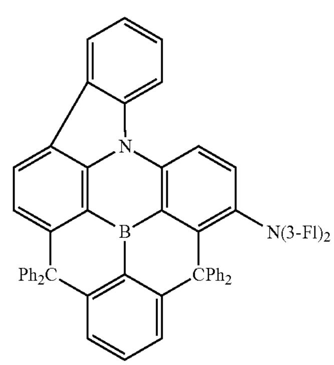

-continued
Compound 3-261
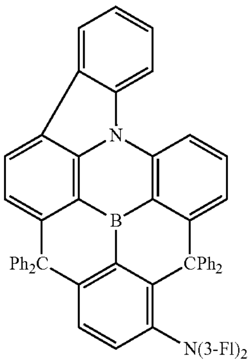
Compound 3-262
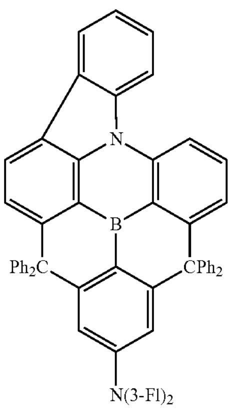
Compound 3-263
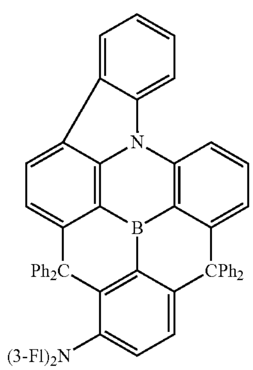
Compound 3-264
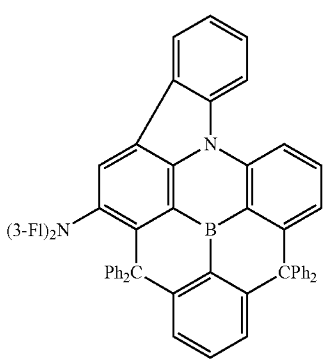
-continued
Compound 3-265
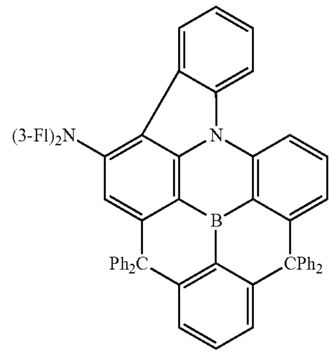
Compound 3-266
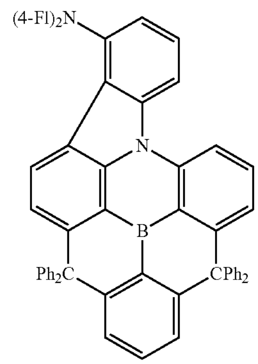
Compound 3-267
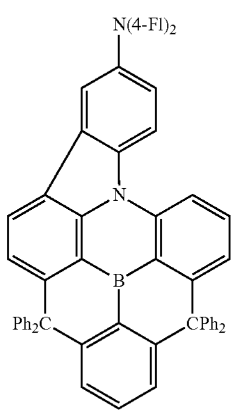
Compound 3-268
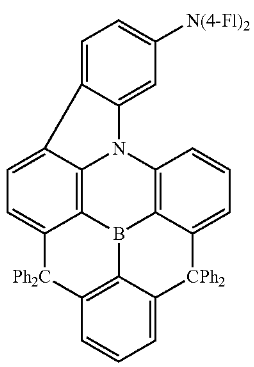

-continued
Compound 3-269
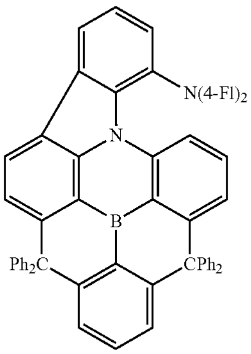
Compound 3-270
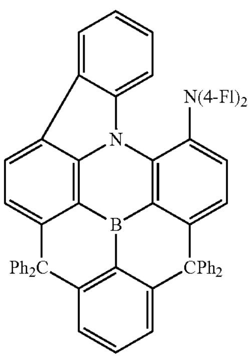
Compound 3-271
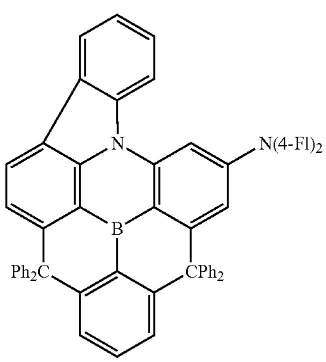
Compound 3-272
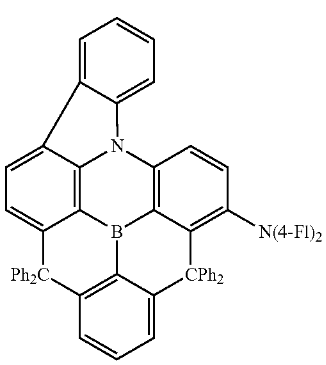
-continued
Compound 3-273
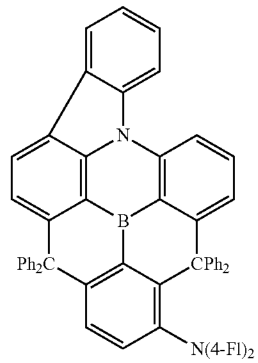
Compound 3-274
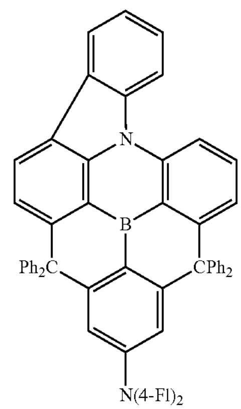
Compound 3-275
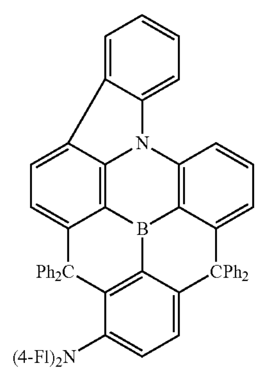
Compound 3-276
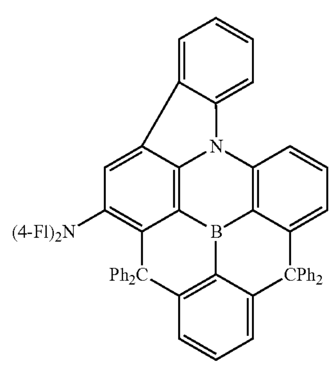

-continued
Compound 3-277
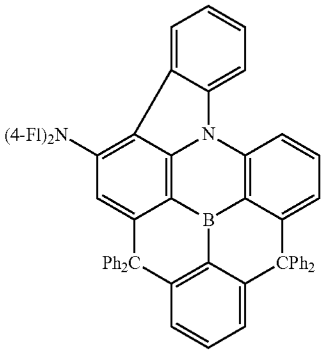
Compound 3-278
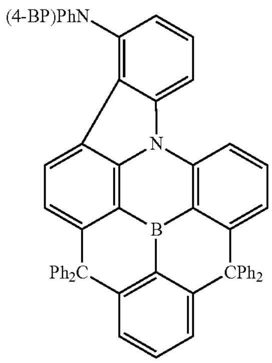
Compound 3-279
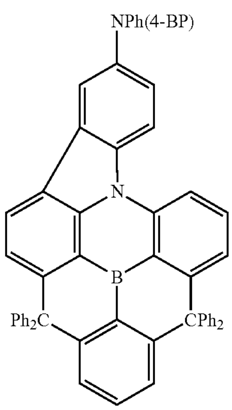
Compound 3-280
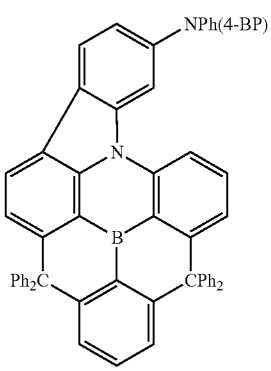
-continued
Compound 3-281
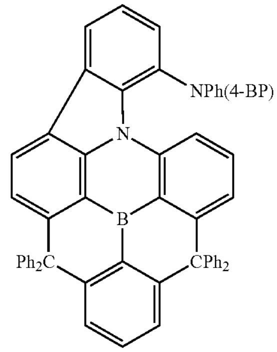
Compound 3-282
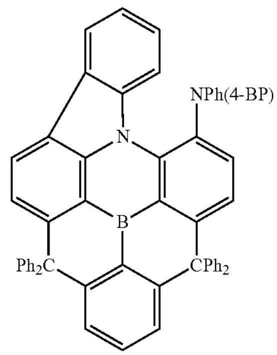
Compound 3-283
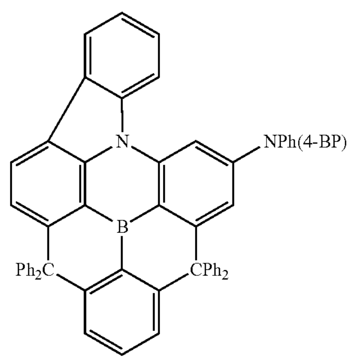
Compound 3-284
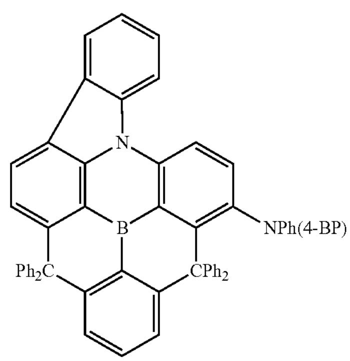

-continued
Compound 3-285
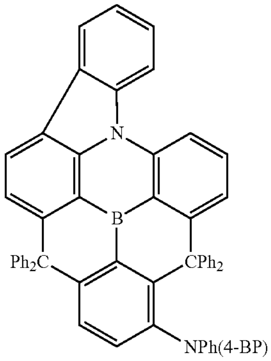
Compound 3-286
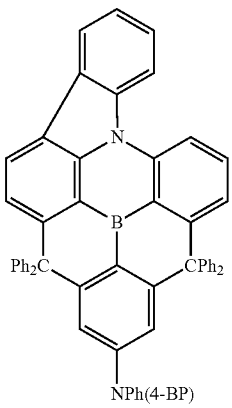
Compound 3-287
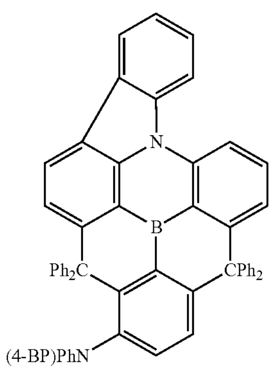
Compound 3-288
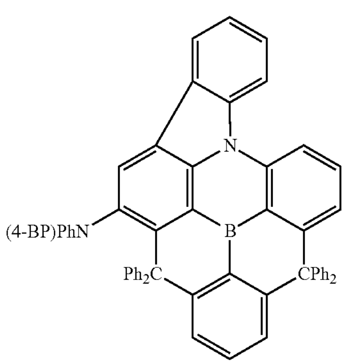
-continued
Compound 3-289
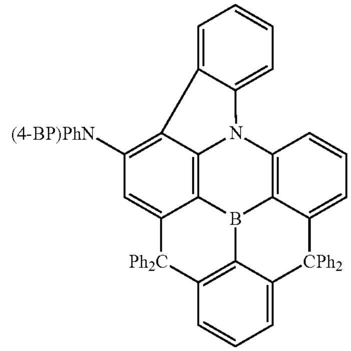
Compound 3-290
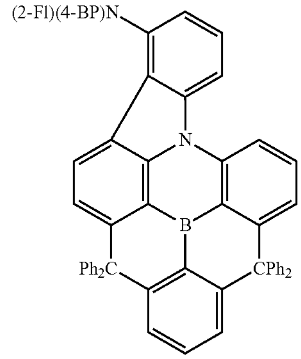
Compound 3-291
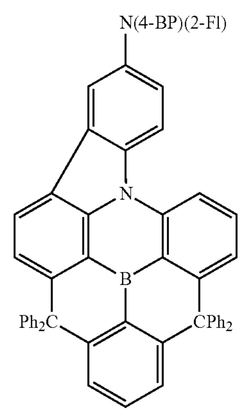
Compound 3-292
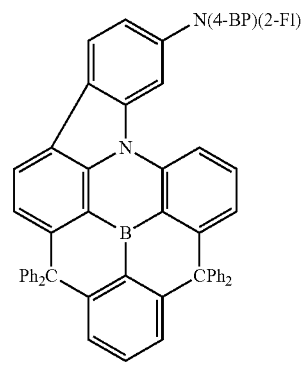

-continued
Compound 3-293
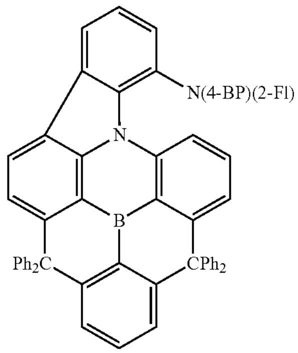
Compound 3-294
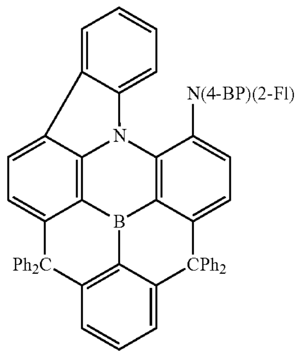
Compound 3-295
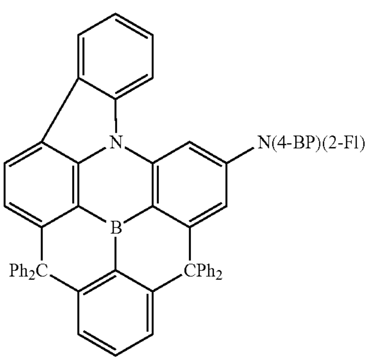
Compound 3-296
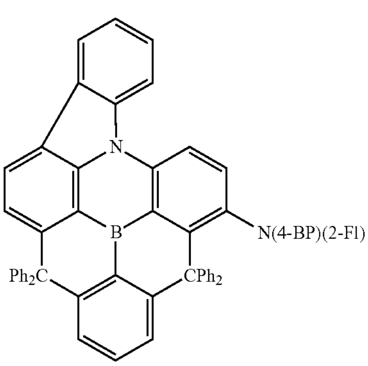
-continued
Compound 3-297
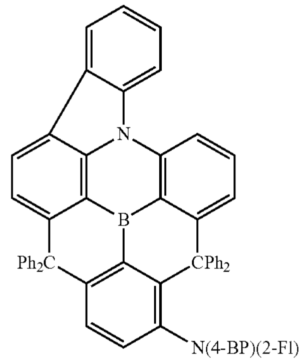
Compound 3-298
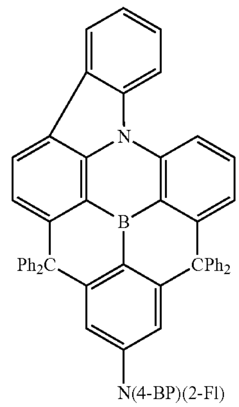
Compound 3-299
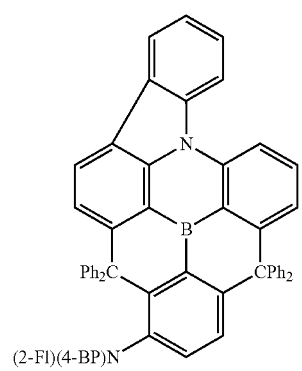
Compound 3-300
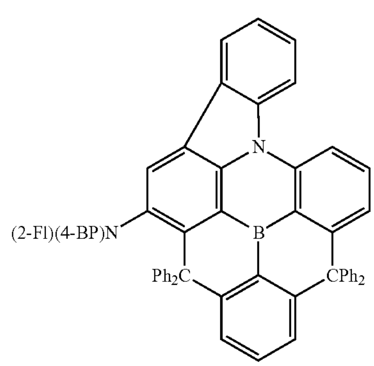

Compound 3-301
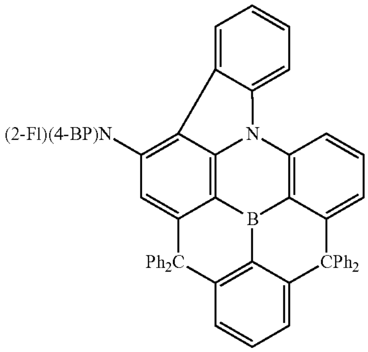
Compound 3-302
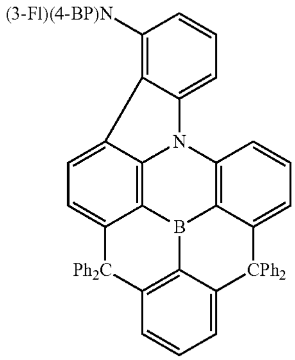
Compound 3-303
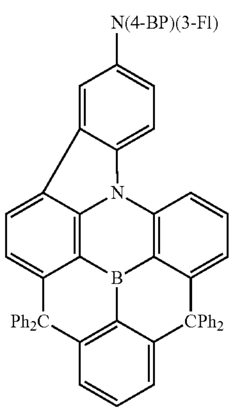
Compound 3-304
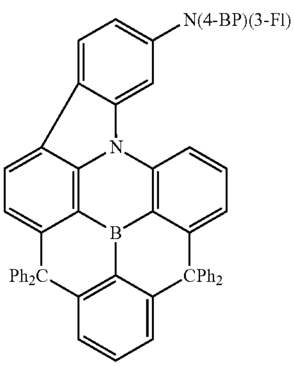
Compound 3-305
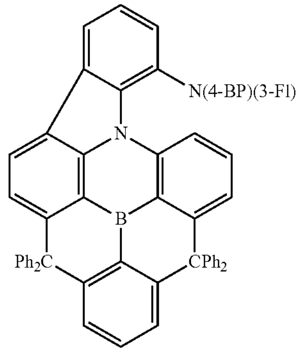
Compound 3-306
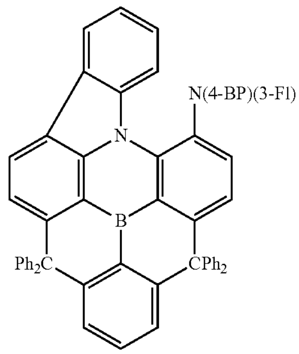
Compound 3-307
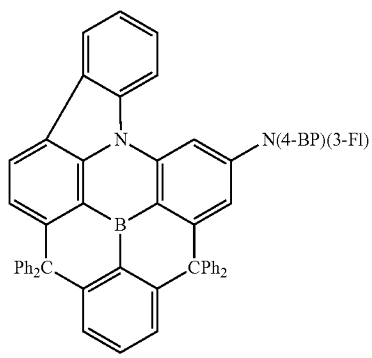
Compound 3-308
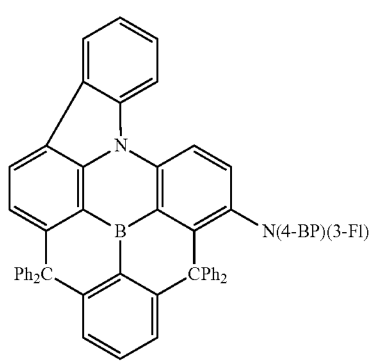

-continued
Compound 3-309
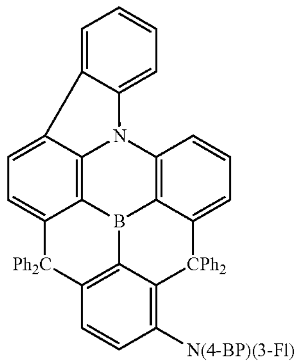
Compound 3-310
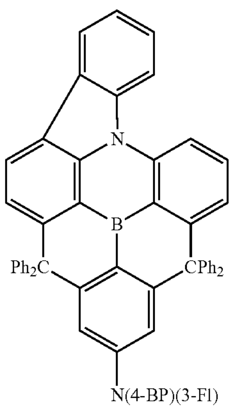
Compound 3-311
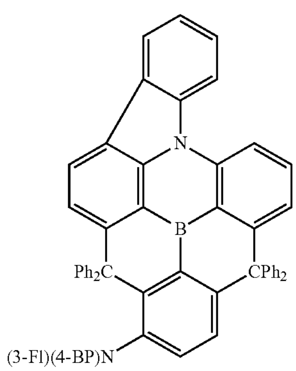
Compound 3-312
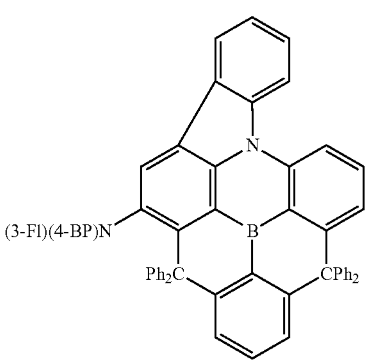
-continued
Compound 3-313
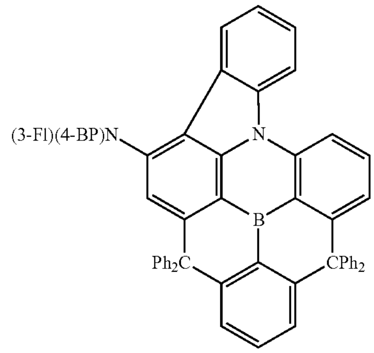
Compound 3-314
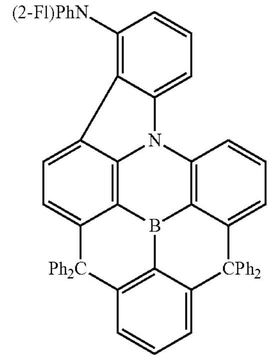
Compound 3-315
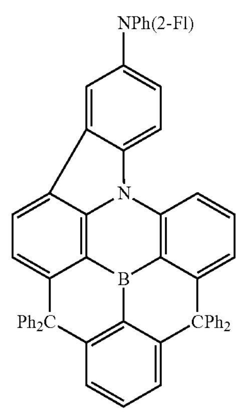
Compound 3-316
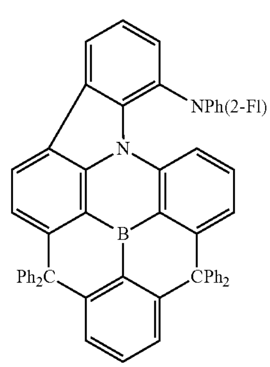

Compound 3-317
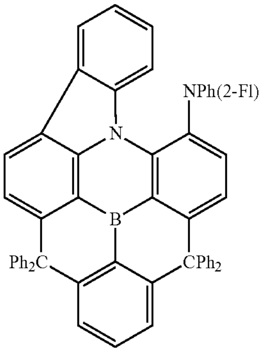
Compound 3-318
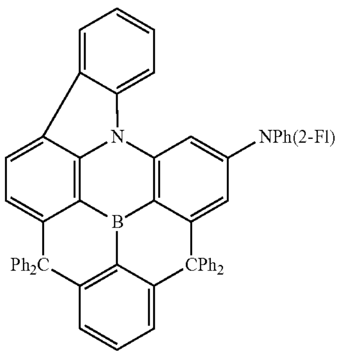
Compound 3-319
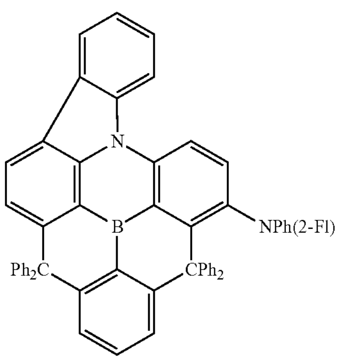
Compound 3-320
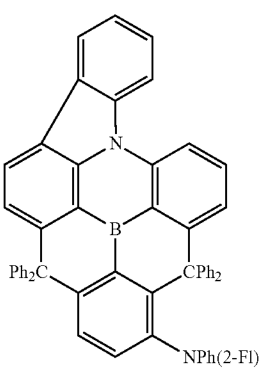
Compound 3-321
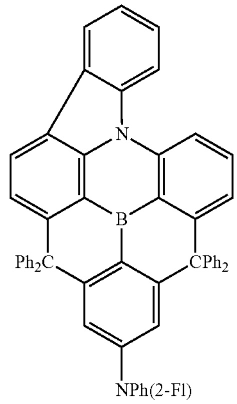
Compound 3-322
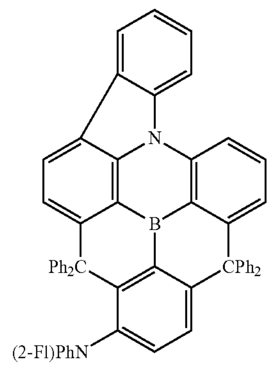
Compound 3-323
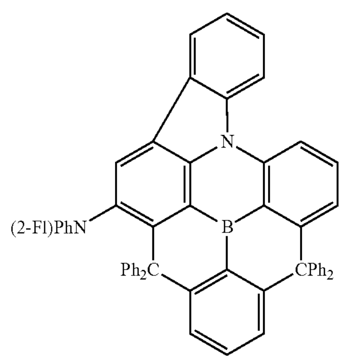
Compound 3-324
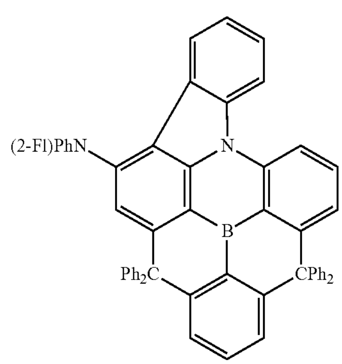

-continued
Compound 3-325
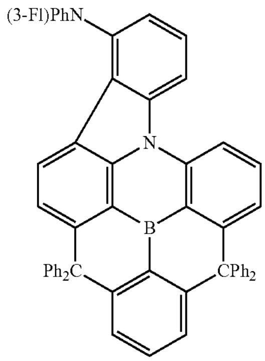
Compound 3-326
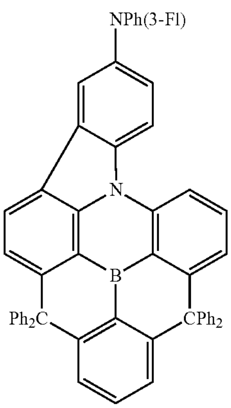
Compound 3-327
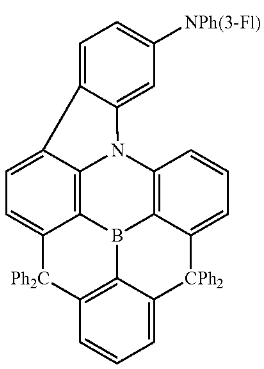
Compound 3-328
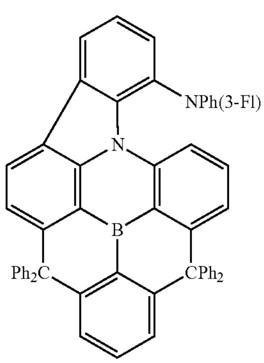
-continued
Compound 3-329
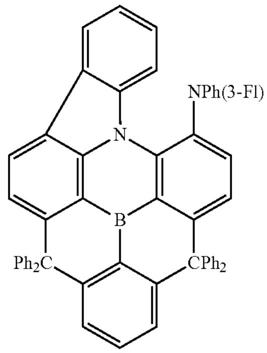
Compound 3-330
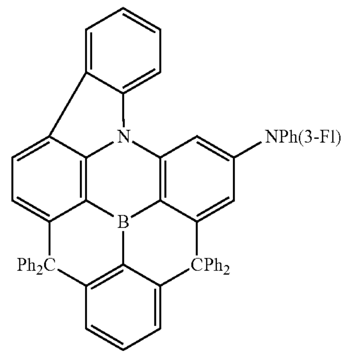
Compound 3-331
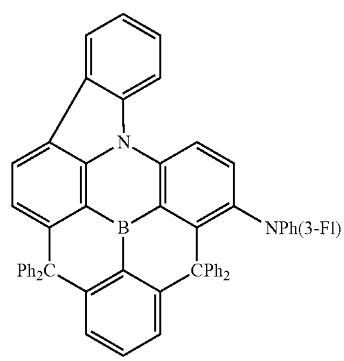
Compound 3-332
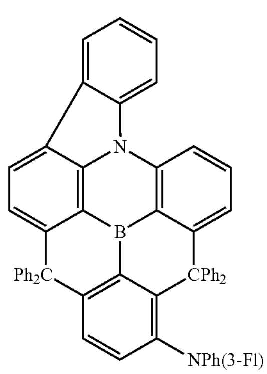

-continued
Compound 3-333
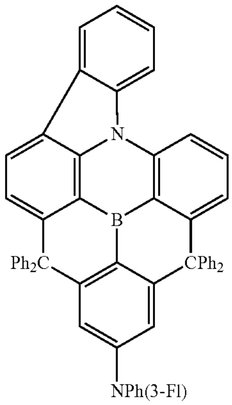
Compound 3-334
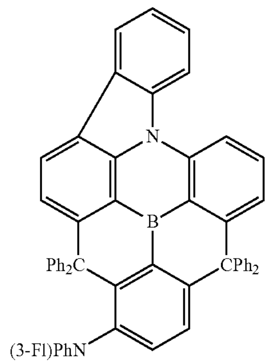
Compound 3-335
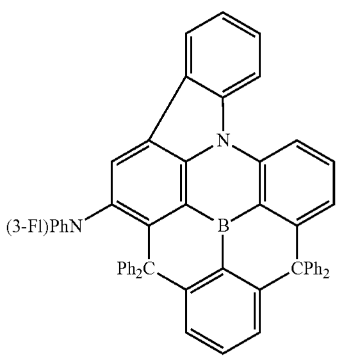
Compound 3-336
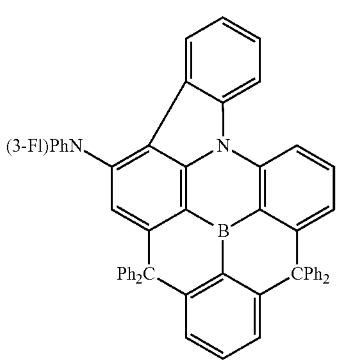
-continued
Compound 3-337
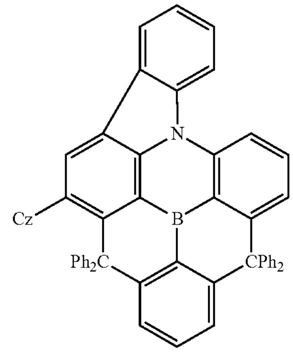
Compound 3-338
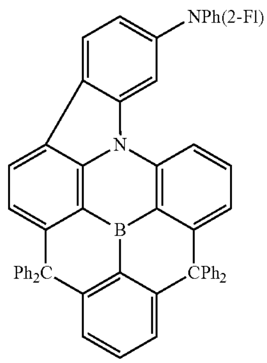
Compound 3-339
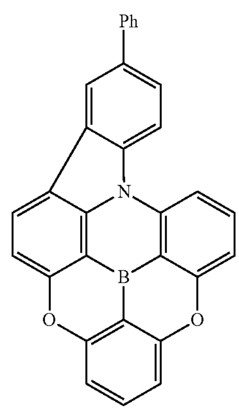
Compound 3-340
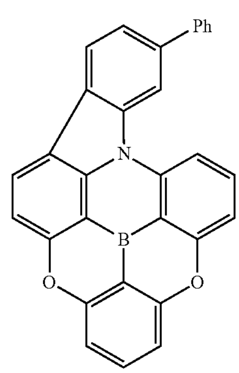

Compound 3-341
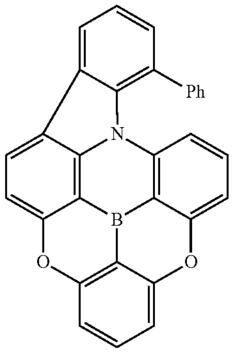
Compound 3-342
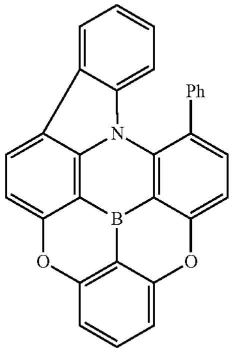
Compound 3-343
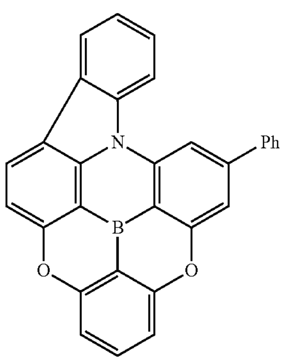
Compound 3-344
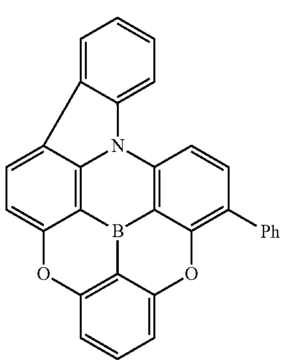
Compound 3-345
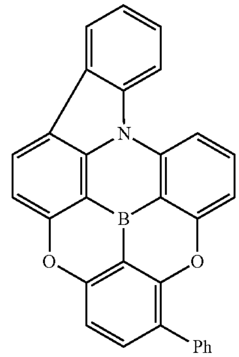
Compound 3-346
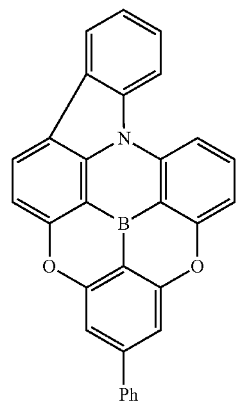
Compound 3-347
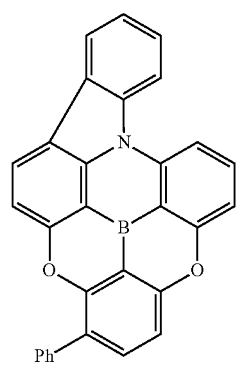
Compound 3-348
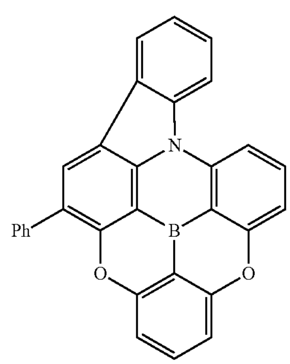

-continued
Compound 3-349
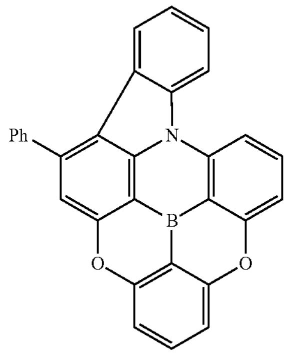
Compound 3-350
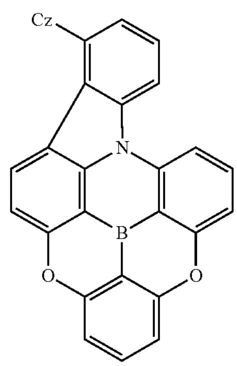
Compound 3-351
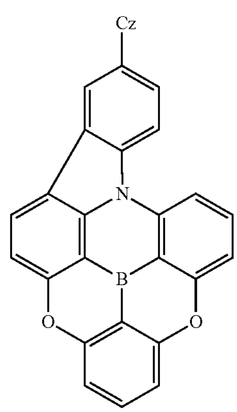
Compound 3-352
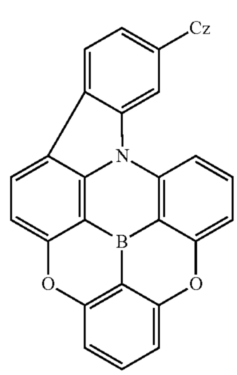
-continued
Compound 3-353
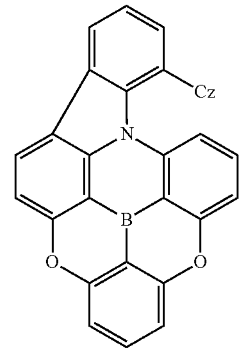
Compound 3-354
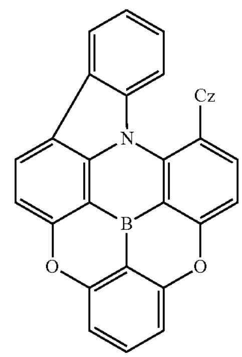
Compound 3-355
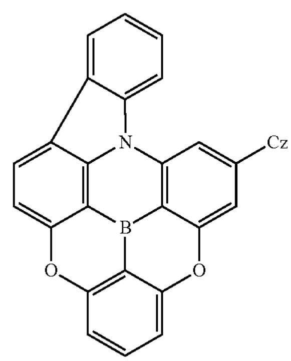
Compound 3-356
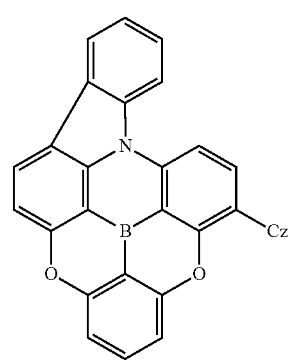

-continued
Compound 3-357
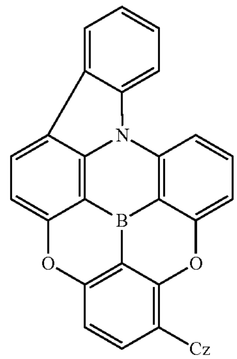
Compound 3-358
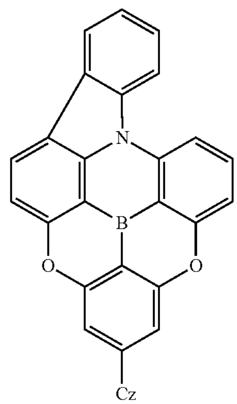
Compound 3-359
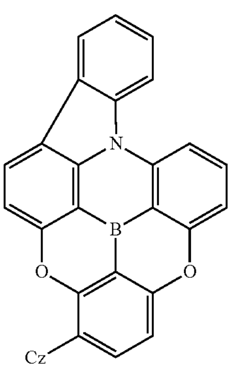
Compound 3-360
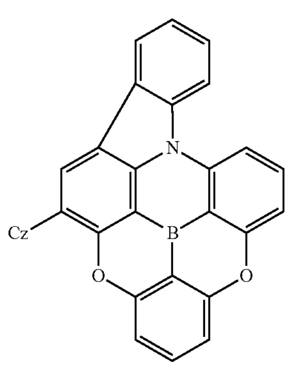
-continued
Compound 3-361
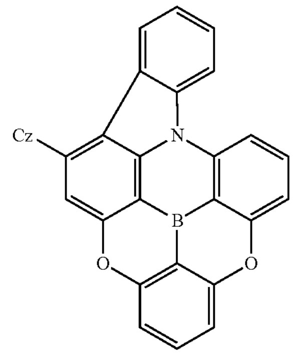
Compound 3-362
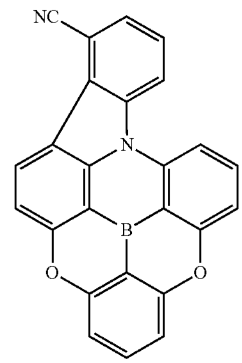
Compound 3-363
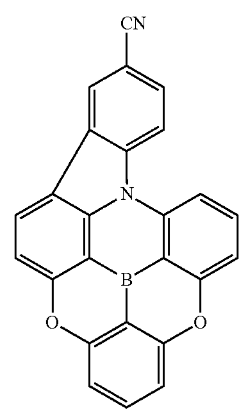
Compound 3-364
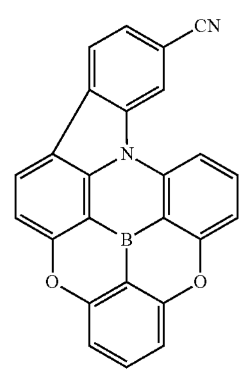

-continued
Compound 3-365
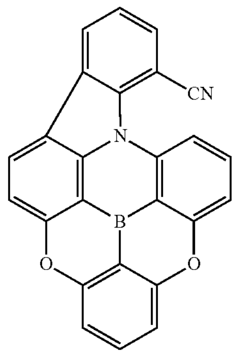
Compound 3-366
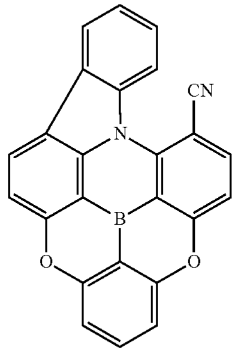
Compound 3-367
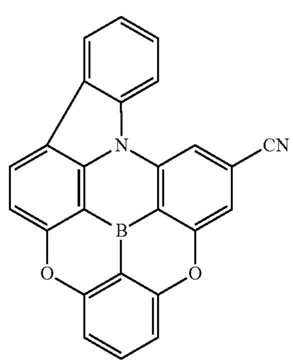
Compound 3-368
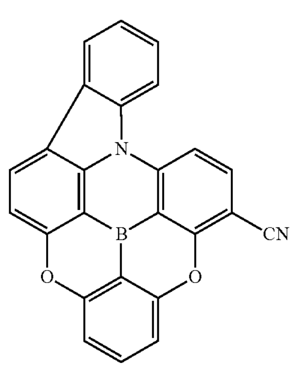
-continued
Compound 3-369
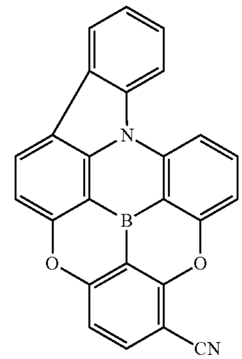
Compound 3-370
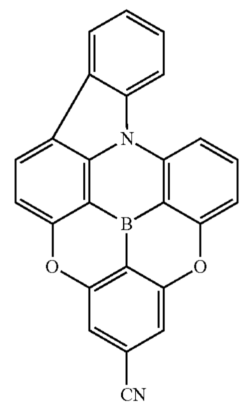
Compound 3-371
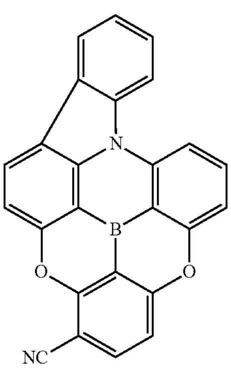
Compound 3-372
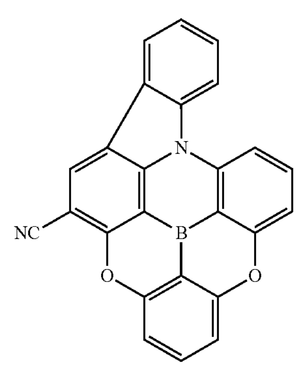

Compound 3-373
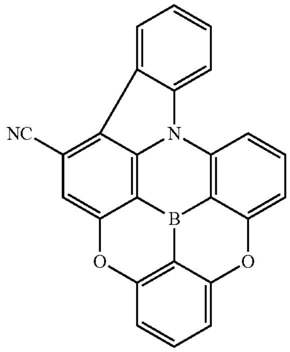
Compound 3-374
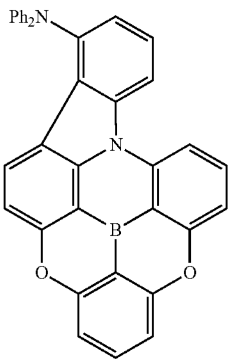
Compound 3-375
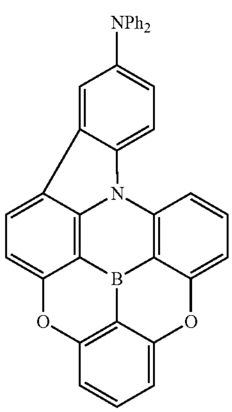
Compound 3-376
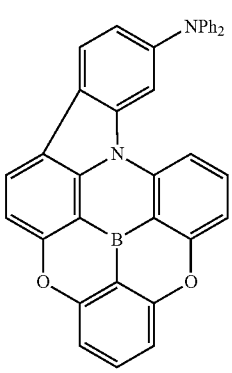
Compound 3-377
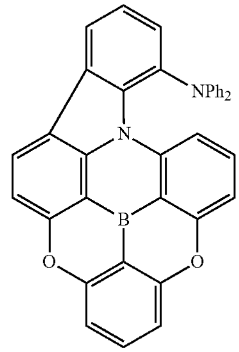
Compound 3-378
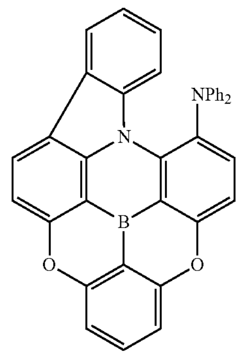
Compound 3-379
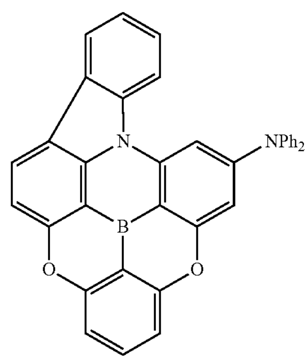
Compound 3-380
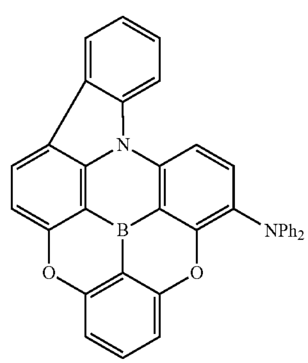

-continued
Compound 3-381
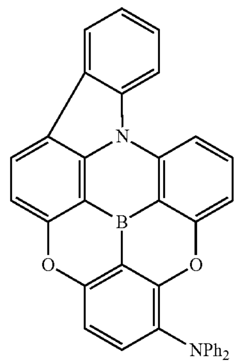
Compound 3-382
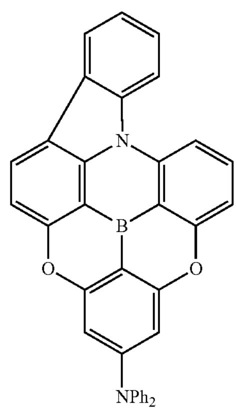
Compound 3-383
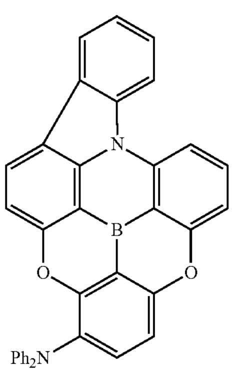
Compound 3-384
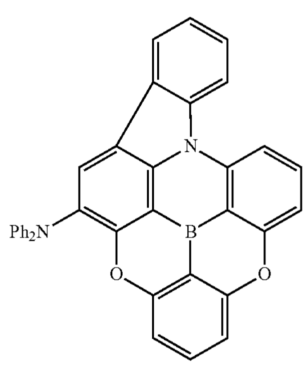
-continued
Compound 3-385
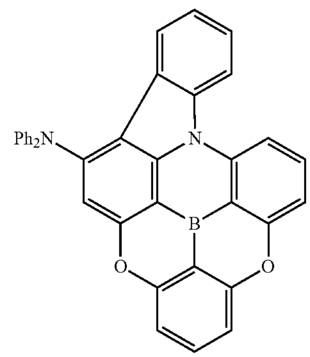
Compound 3-386
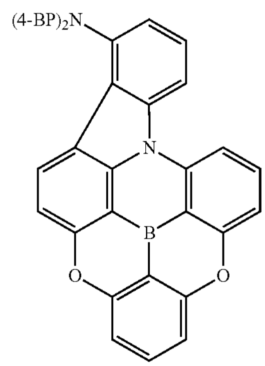
Compound 3-387
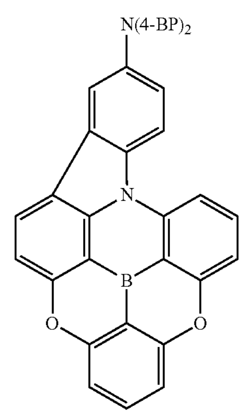
Compound 3-388
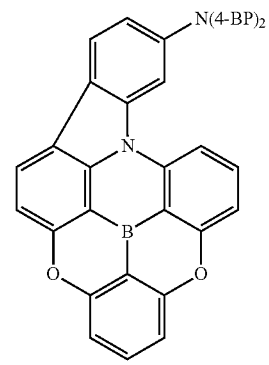

Compound 3-389
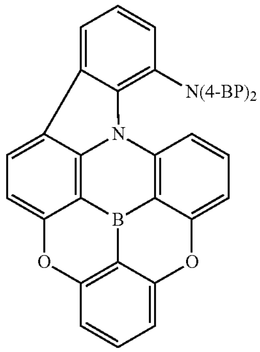
Compound 3-390
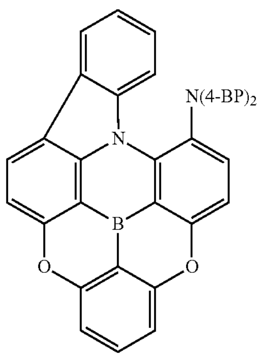
Compound 3-391
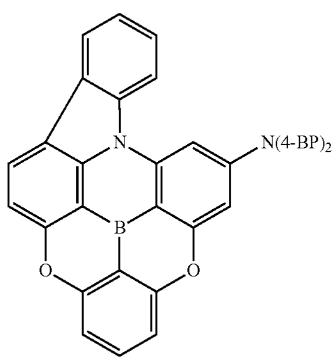
Compound 3-392
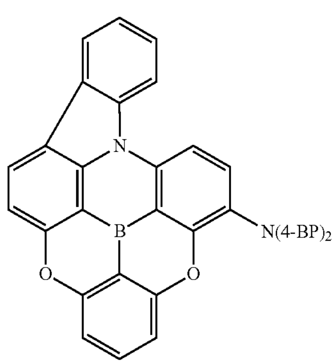
Compound 3-393
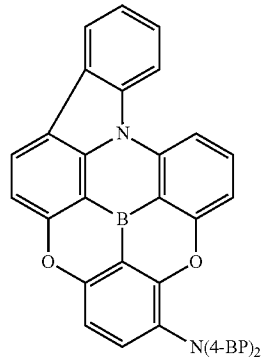
Compound 3-394
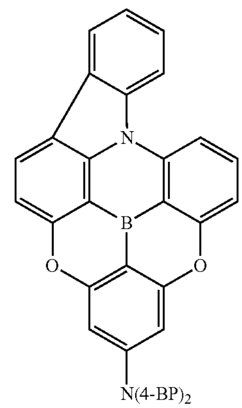
Compound 3-395
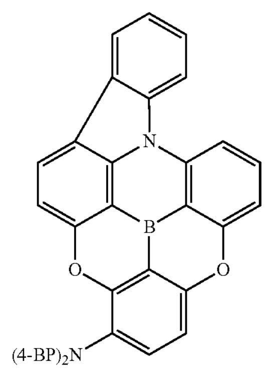
Compound 3-396
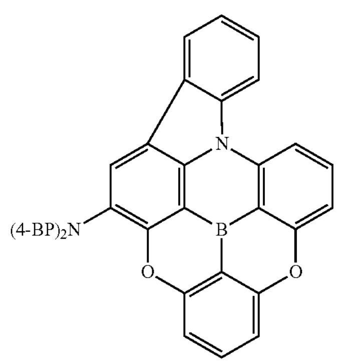

-continued
Compound 3-397
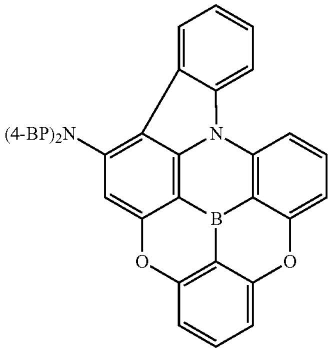
Compound 3-398
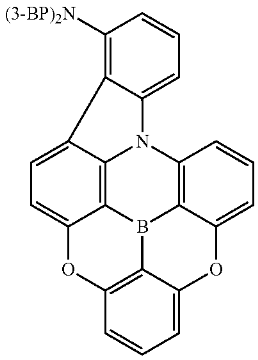
Compound 3-399
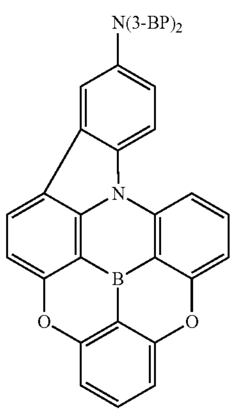
Compound 3-400
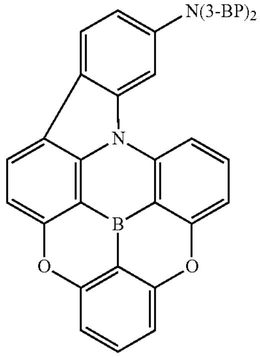
-continued
Compound 3-401
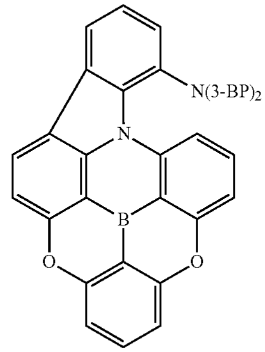
Compound 3-402
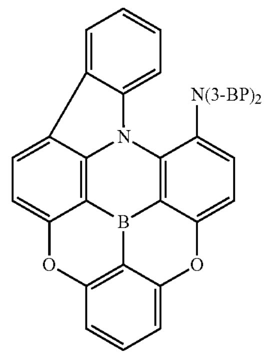
Compound 3-403
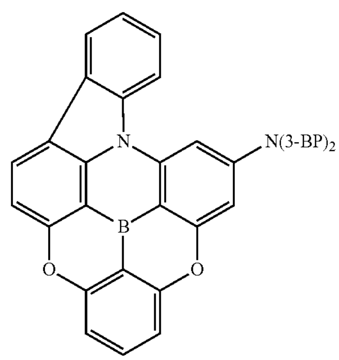
Compound 3-404
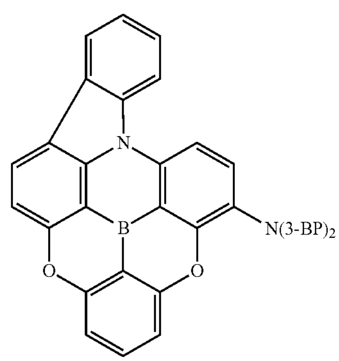

-continued
Compound 3-405
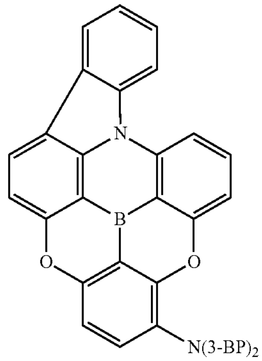
Compound 3-406
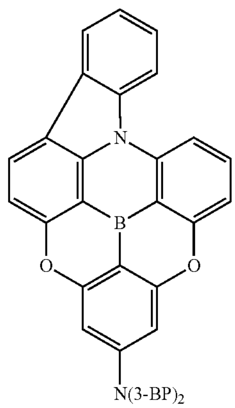
Compound 3-407
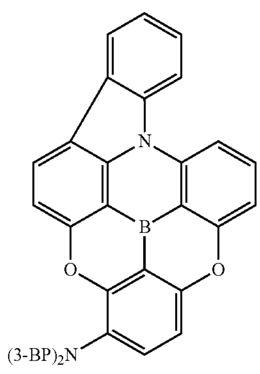
Compound 3-408
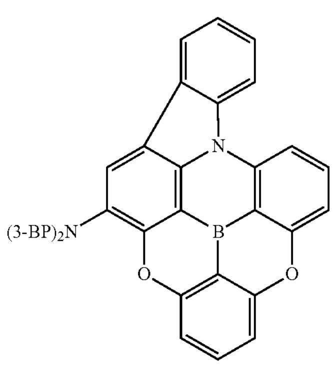
-continued
Compound 3-409
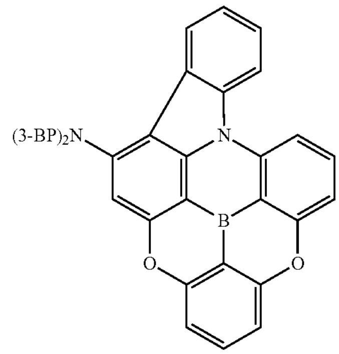
Compound 3-410
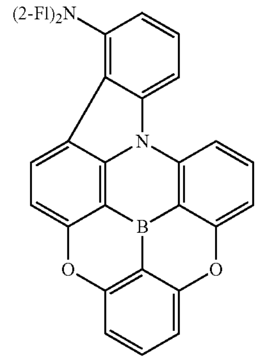
Compound 3-411
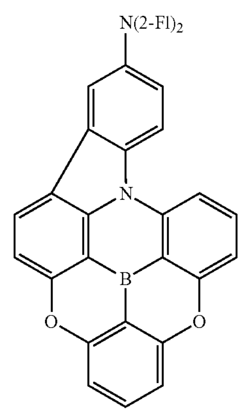
Compound 3-412
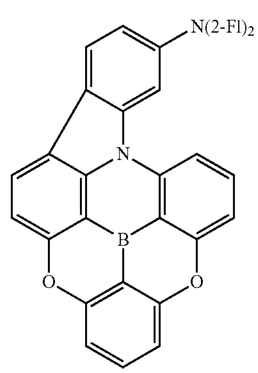

-continued
Compound 3-413
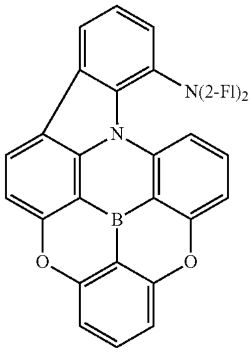
Compound 3-414
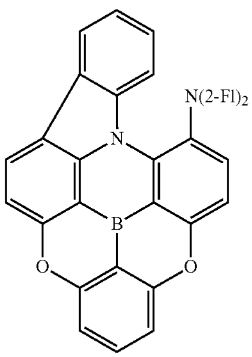
Compound 3-415
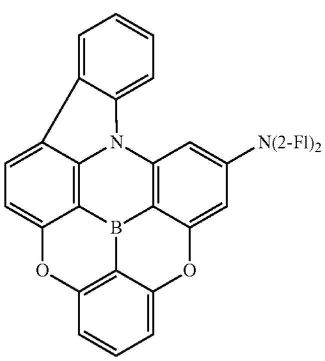
Compound 3-416
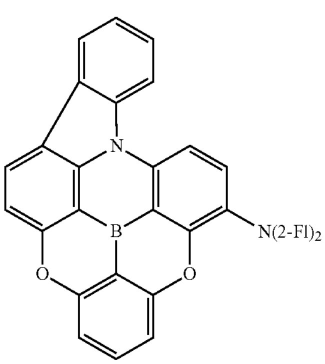
-continued
Compound 3-417
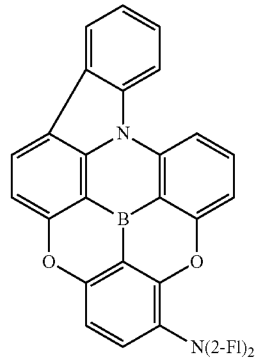
Compound 3-418
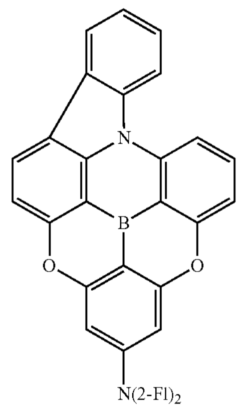
Compound 3-419
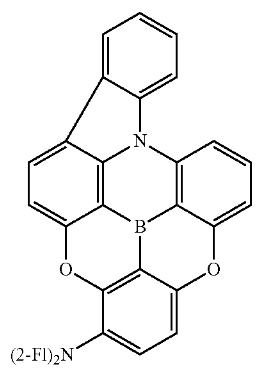
Compound 3-420
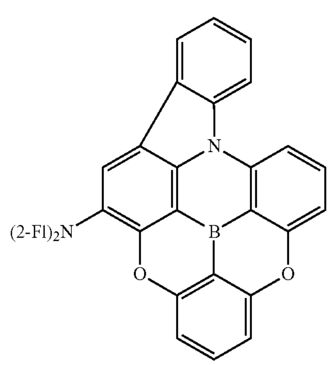

-continued
Compound 3-421
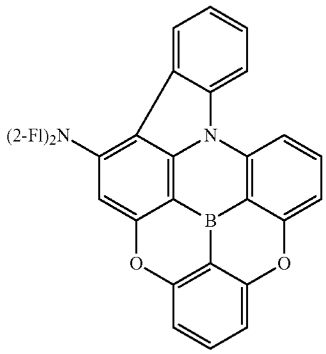
Compound 3-422
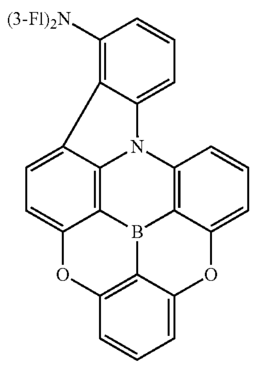
Compound 3-423
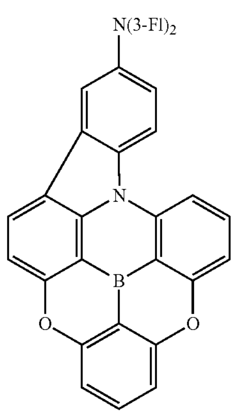
Compound 3-424
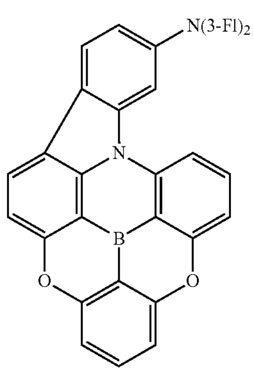
Compound 3-425
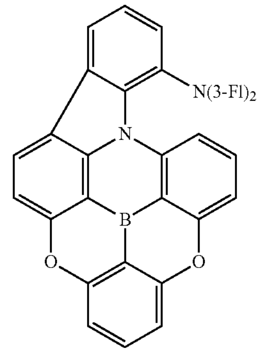
Compound 3-426
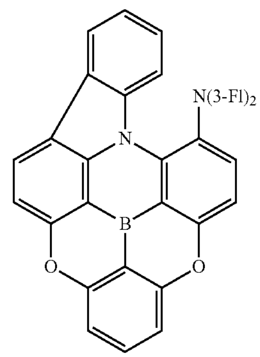
Compound 3-427
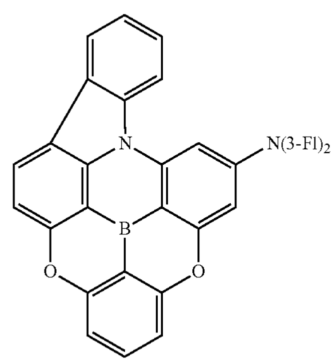
Compound 3-428
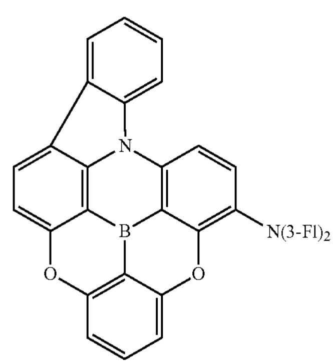

-continued
Compound 3-429
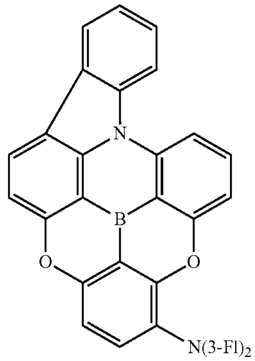
Compound 3-430
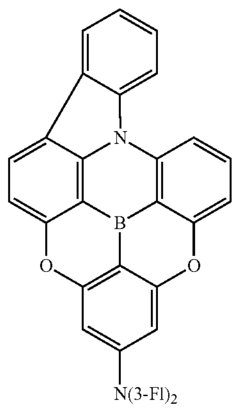
Compound 3-431
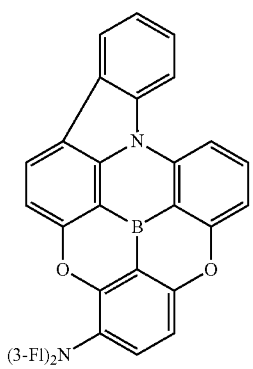
Compound 3-432
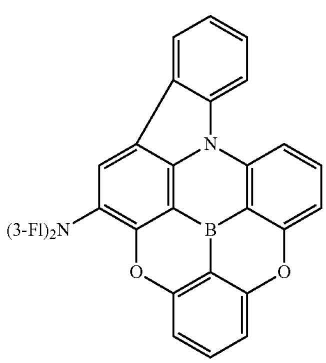
-continued
Compound 3-433
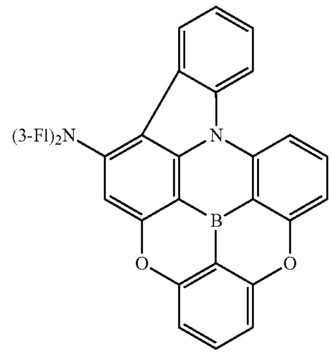
Compound 3-434
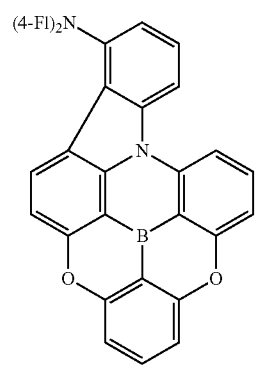
Compound 3-435
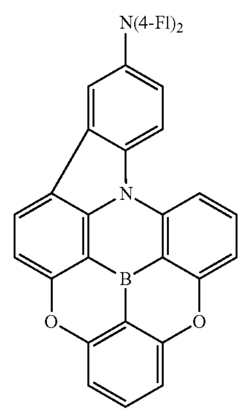
Compound 3-436
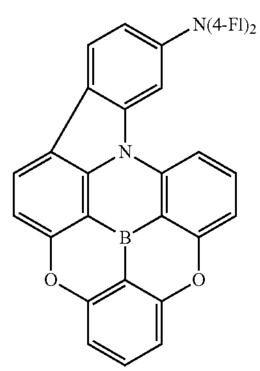

-continued
Compound 3-437
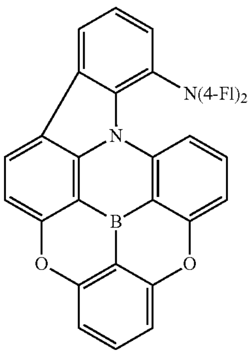
Compound 3-438
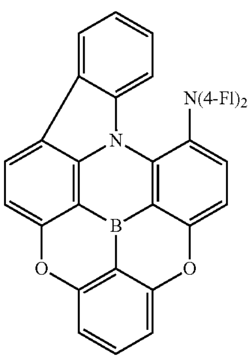
Compound 3-439
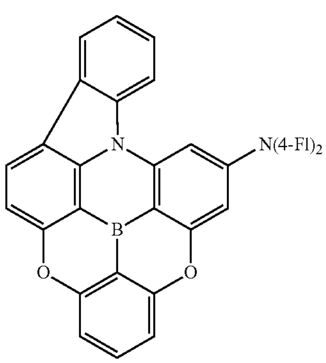
Compound 3-440
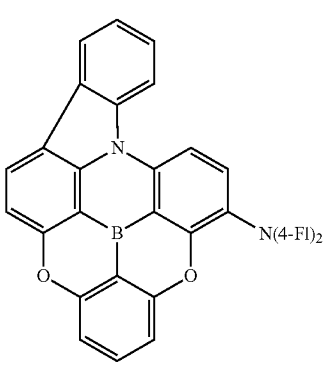
-continued
Compound 3-441
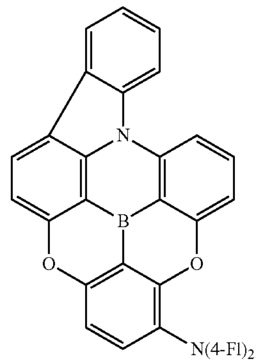
Compound 3-442
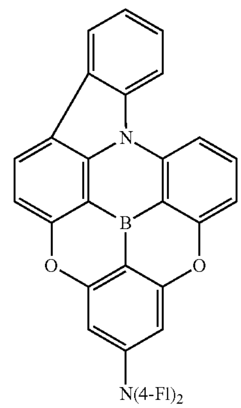
Compound 3-443
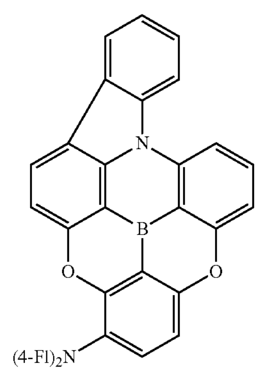
Compound 3-444
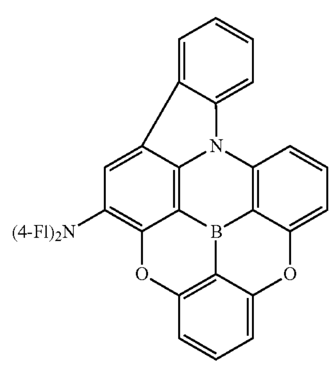

-continued
Compound 3-445
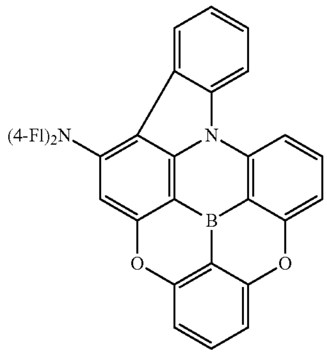
Compound 3-446
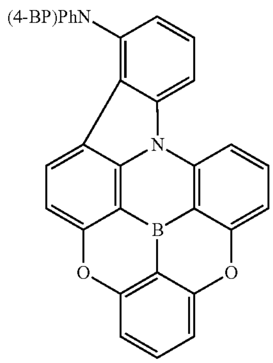
Compound 3-447
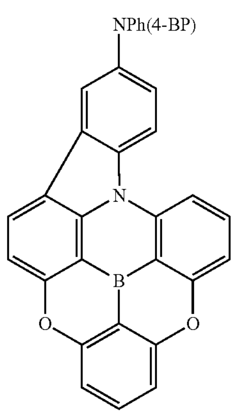
Compound 3-448
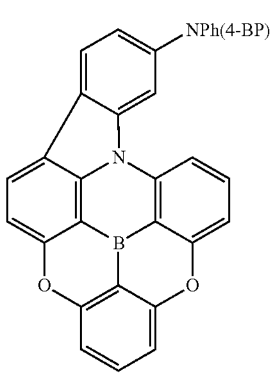
-continued
Compound 3-449
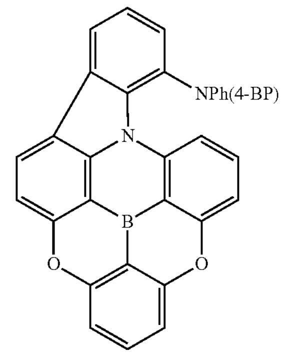
Compound 3-450
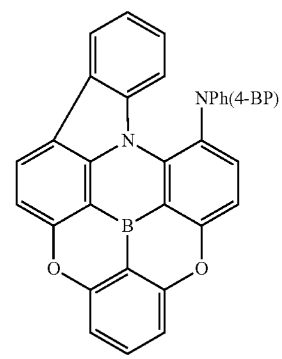
Compound 3-451
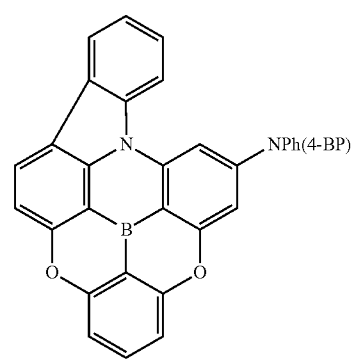
Compound 3-452
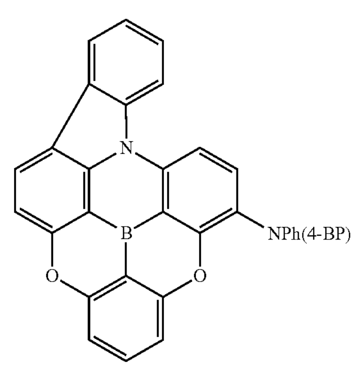

-continued
Compound 3-453
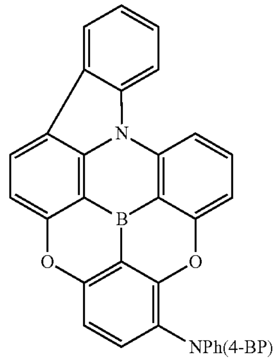
Compound 3-454
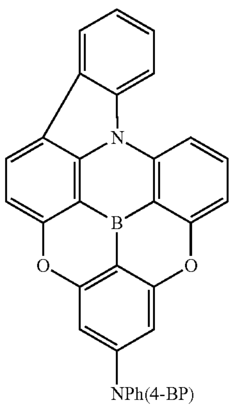
Compound 3-455
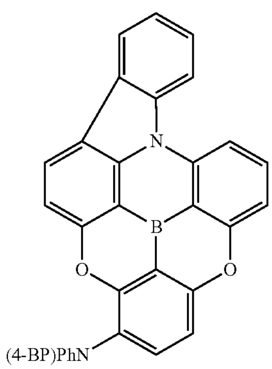
Compound 3-456
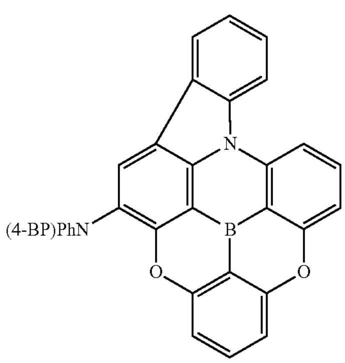
-continued
Compound 3-457
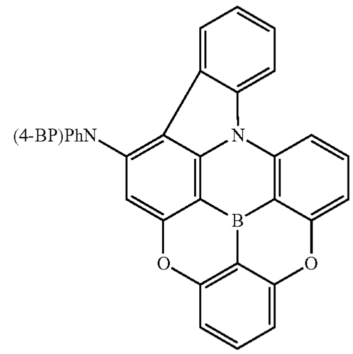
Compound 3-458
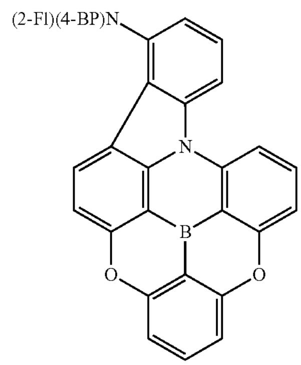
Compound 3-459
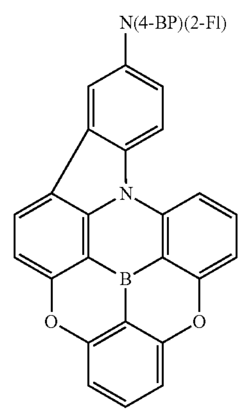
Compound 3-460
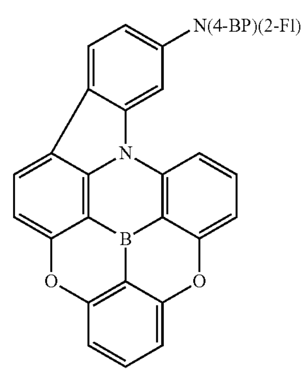

Compound 3-461
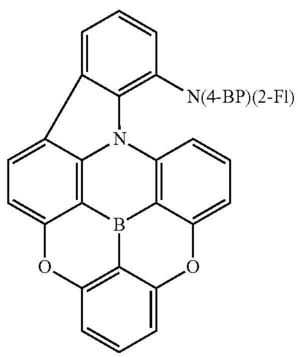
Compound 3-462
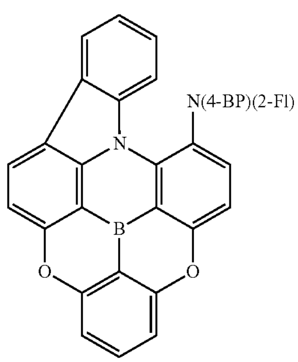
Compound 3-463
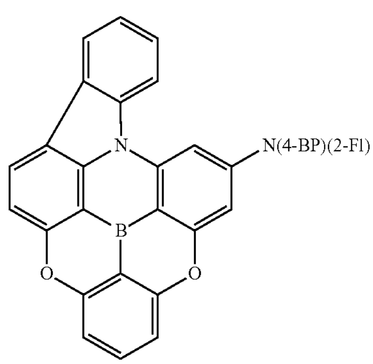
Compound 3-464
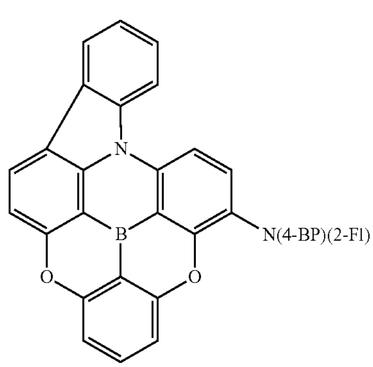
Compound 3-465
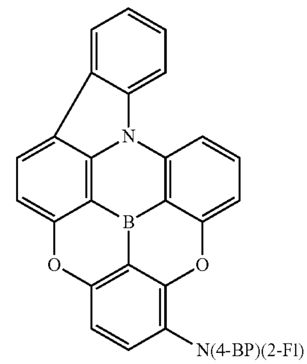
Compound 3-466
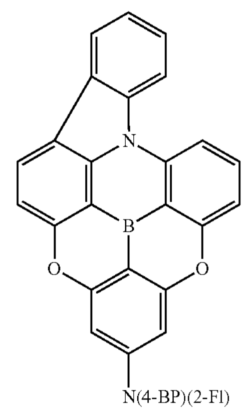
Compound 3-467
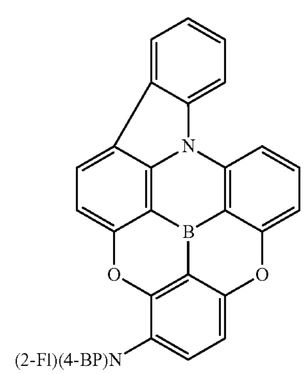
Compound 3-468
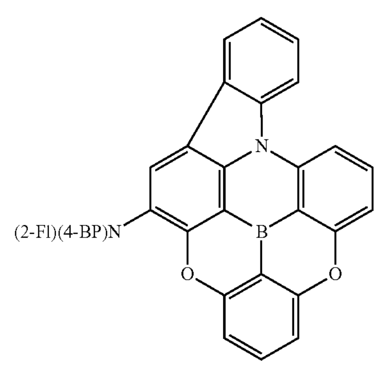

-continued
Compound 3-469
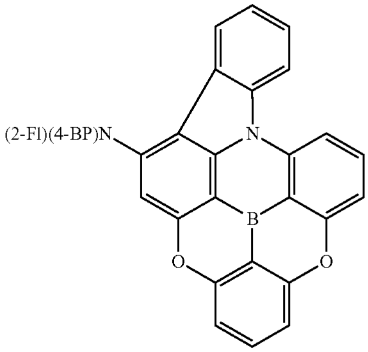
Compound 3-470
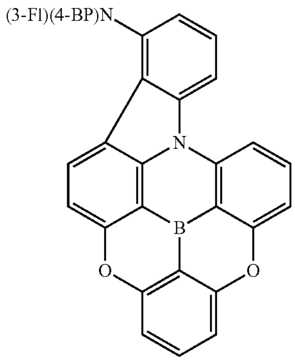
Compound 3-471
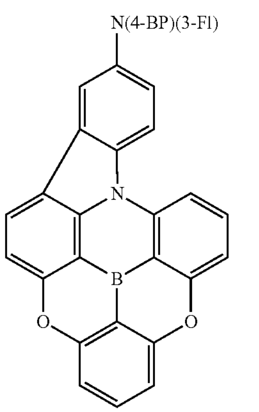
Compound 3-472
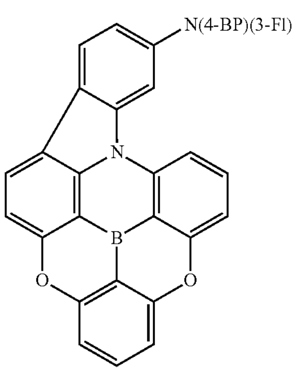
-continued
Compound 3-473
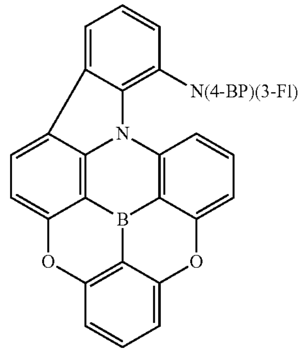
Compound 3-474
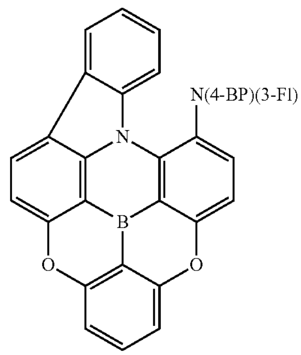
Compound 3-475
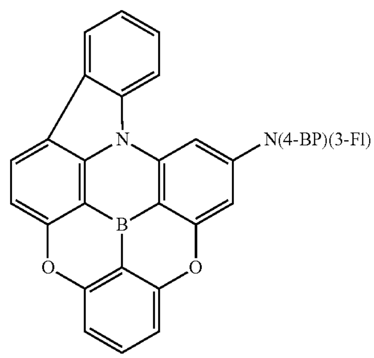
Compound 3-476
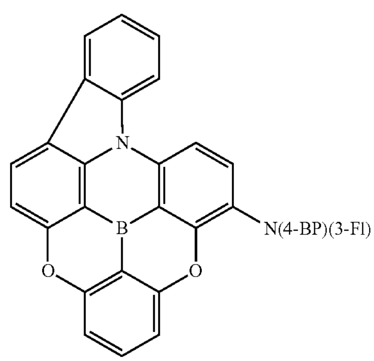

Compound 3-477
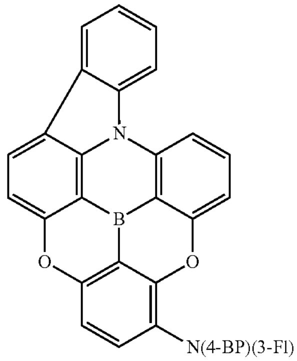
Compound 3-478
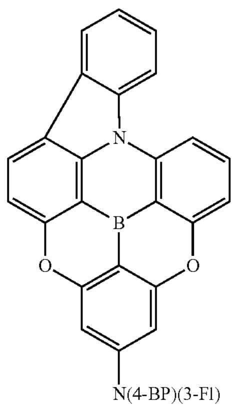
Compound 3-479
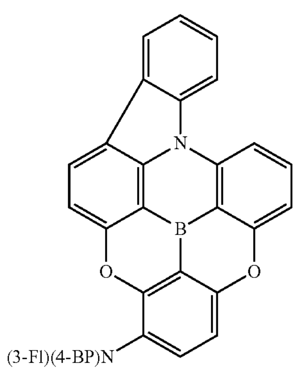
Compound 3-480
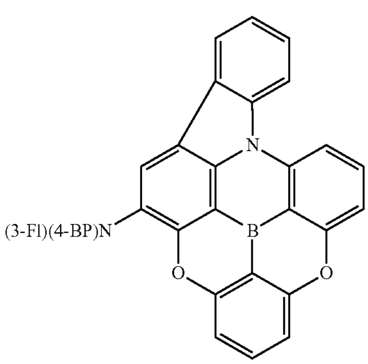
Compound 3-481
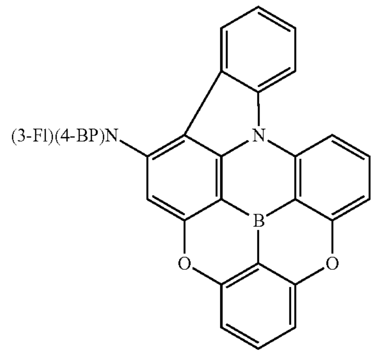
Compound 3-482
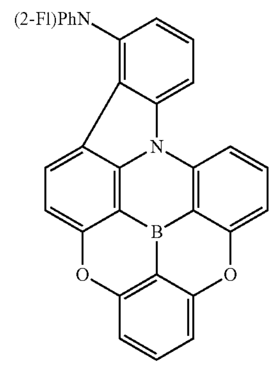
Compound 3-483
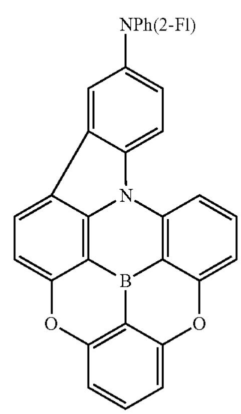
Compound 3-484
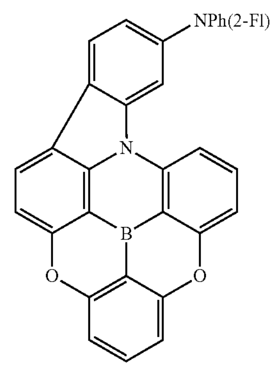

-continued
Compound 3-485
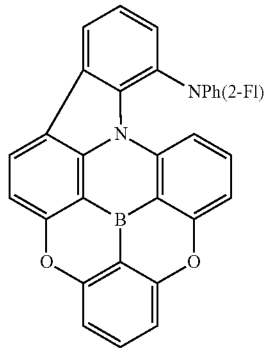
Compound 3-486
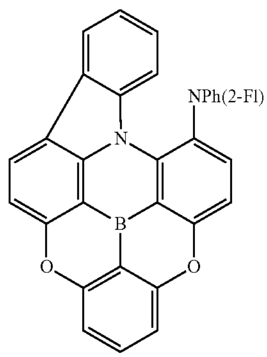
Compound 3-487
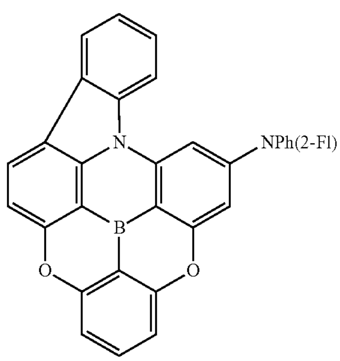
Compound 3-488
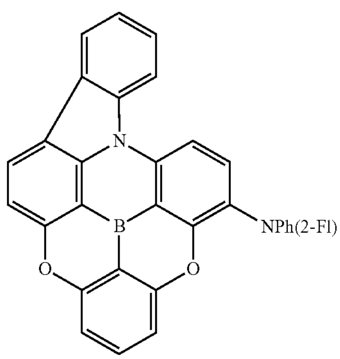
-continued
Compound 3-489
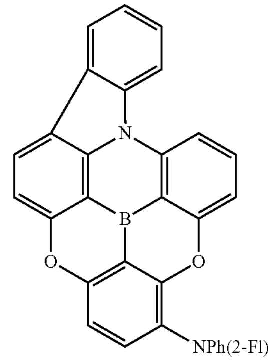
Compound 3-490
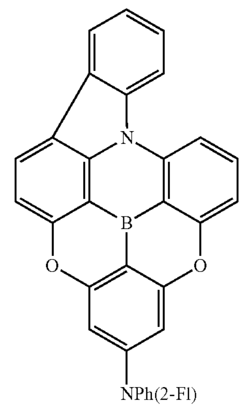
Compound 3-491
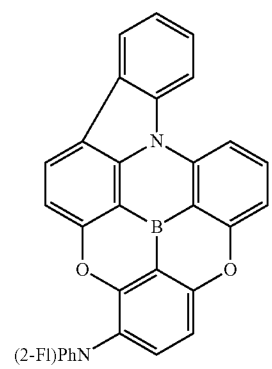
Compound 3-492
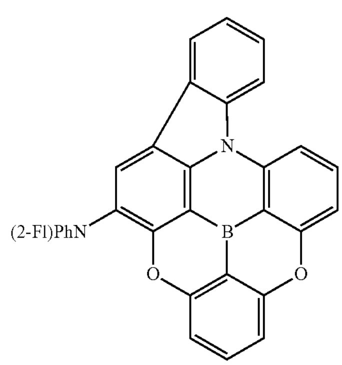

-continued
Compound 3-493
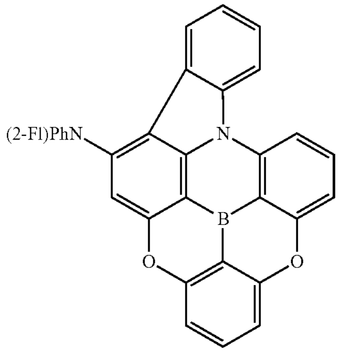
Compound 3-494
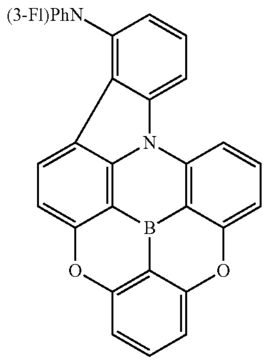
Compound 3-495
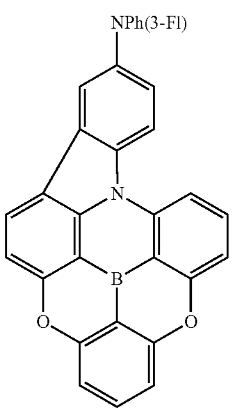
Compound 3-496
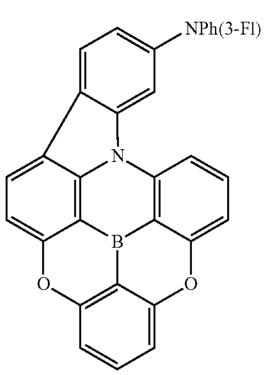
-continued
Compound 3-497
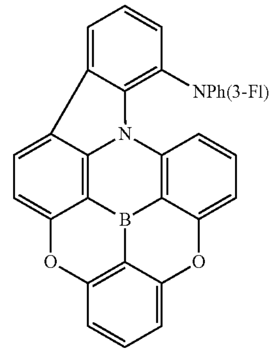
Compound 3-498
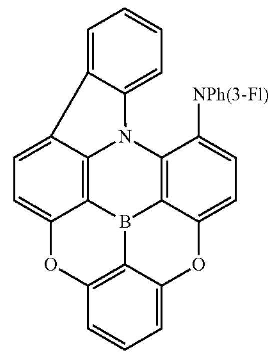
Compound 3-499
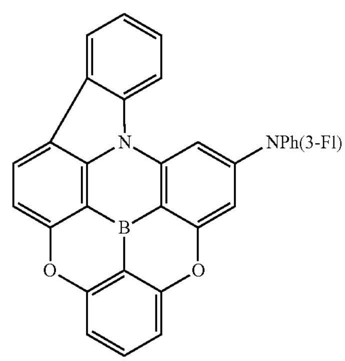
Compound 3-500
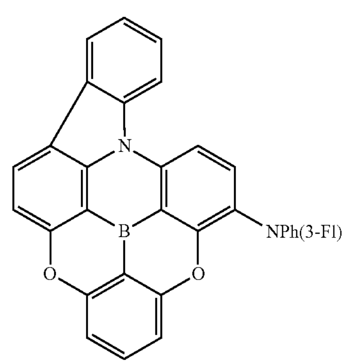

-continued
Compound 3-501
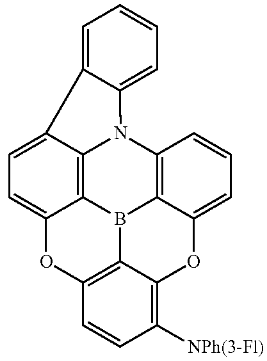
Compound 3-502
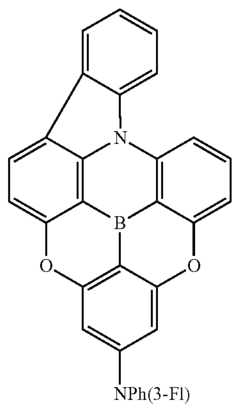
Compound 3-503
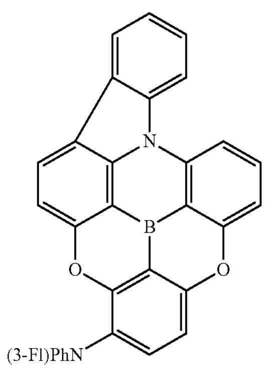
Compound 3-504
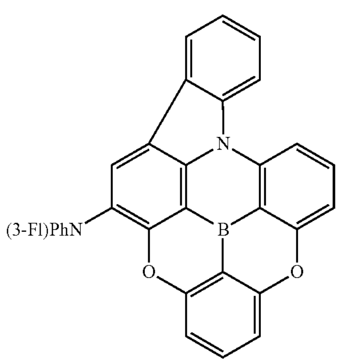
-continued
Compound 3-505
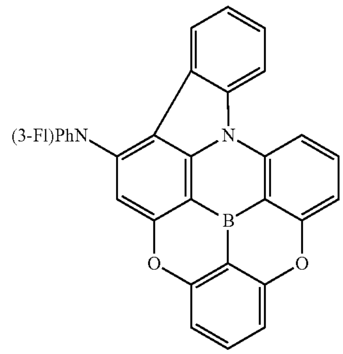
Compound 3-506
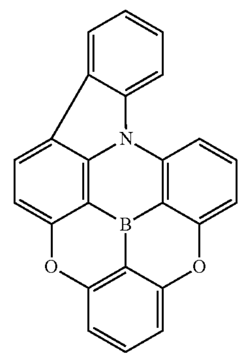
Compound 3-507
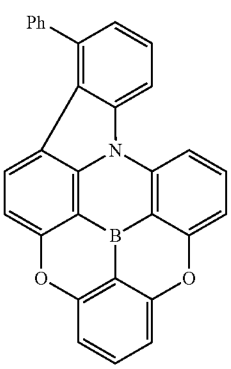
;
In the structure of the compounds above, wherein
Ph is 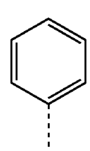, Cz is 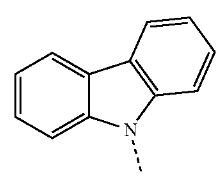, $NPh_2$ is 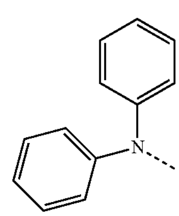, $N(3\text{-}BP)_2$ is -continued

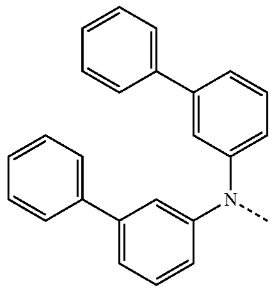

, N(4-BP)$_2$ is

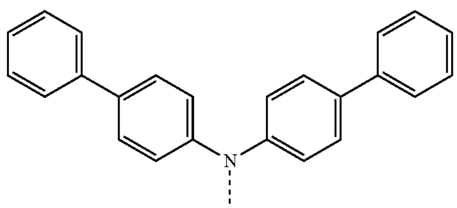

, N(2-F1)$_2$ is

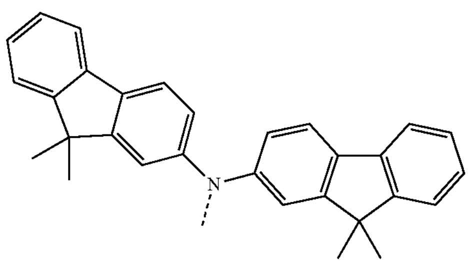

,

N(3-F1)$_2$ is

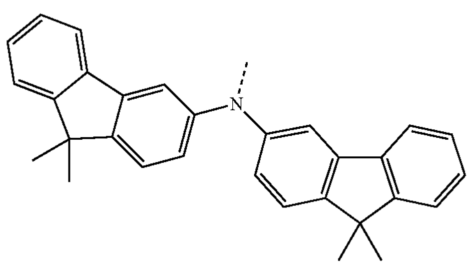

,

N(4-F1)$_2$ is

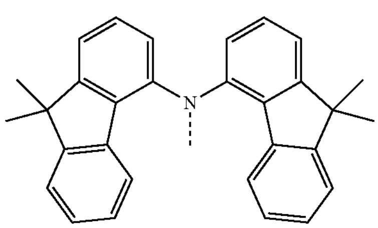

,

NPh(4-BP) is

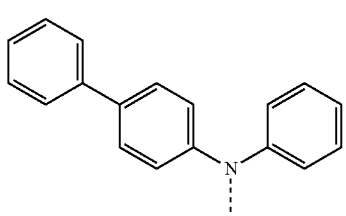

,

-continued

N(2-F1)(4-BP) is

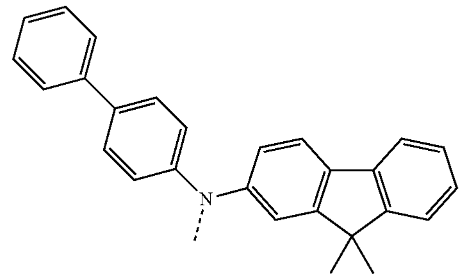

,

N(3-F1)(4-BP) is

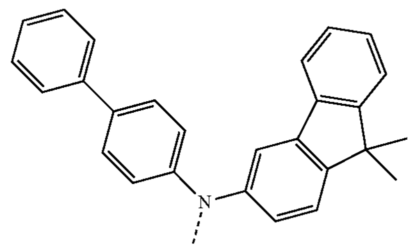

,

NPh(2-F1) is

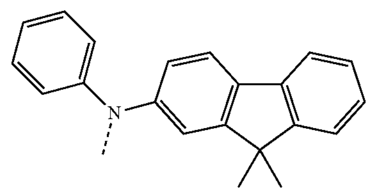

,

NPh(3-F1) is

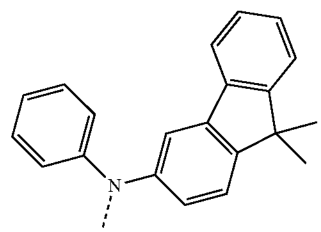

,

NPh(3-BP) is

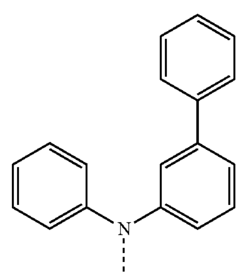

.

According to one embodiment of the present invention, wherein at least one R comprises a substituent selected from the group consisting of phenyl, biphenyl, poly-phenyl, diarylamine, carbazole, azacarbazole, dibenzofuran, azadibenzofuran, dibenzothiophene, azadibenzothiophene, dibenzoselenophene, azadibenzoselenophene, triphenylene, azatriphenylene, tetraphenylene, diarylsilyl, and triarylsilyl.

According to one embodiment of the present invention, a first organic light-emitting device is also disclosed, which comprises:

an anode, a cathode, and an organic layer disposed between the anode and the cathode, wherein comprising a compound having Formula I:

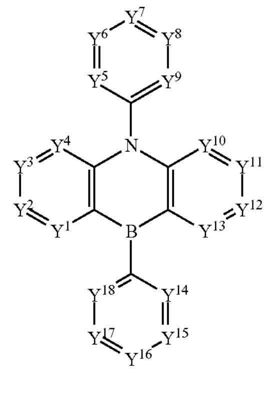

wherein $Y^1$-$Y^{18}$ are each independently selected from C, CR or N;

wherein R is each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, nitrile, isonitrile, sulfanyl, sulfinyl, sulfonyl, phosphino, and combinations thereof;

wherein $Y^4$ and $Y^5$ are carbon and connected by a C—C single bond, wherein at least two of the three groups consisting of $Y^1$ and $Y^{18}$, $Y^{13}$ and $Y^{14}$ and $Y^9$ and $Y^{10}$ are connected via Z, wherein Z is selected from $CR^{z1}R^{z2}$, $PR^z$, O, S or Se;

wherein $R^{z1}$, $R^{z2}$ and $R^z$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

and wherein the compound is not a fullerene type compound.

According to one embodiment of the present invention, wherein the organic layer is an emissive layer and the compound is an emitter.

According to one embodiment of the present invention, wherein the organic layer further comprises a host.

According to one embodiment of the present invention, wherein the organic layer is an emissive layer and the compound is a host.

According to one embodiment of the present invention, wherein the organic layer is a charge carrier blocking layer and the compound is a charge carrier blocking material in the organic layer.

According to one embodiment of the present invention, wherein the organic layer is a charge carrier transporting layer and the compound is a charge carrier transporting material in the organic layer.

According to one embodiment of the present invention, wherein the first organic light-emitting device is incorporated into a device selected from the group consisting of a consumer product, an electronic component module, an organic light-emitting device, and a lighting panel.

According to yet another embodiment of the present invention, a formulation comprising a compound according to formula I is also disclosed. The specific structure of the compound is described in any of the above embodiments Combination with Other Materials The materials described herein as useful for a particular layer in an organic light emitting device may be used in combination with a wide variety of other materials present in the device. The combinations of these materials are described in more detail in U.S. Pat. App. No. 20160359122 at paragraphs 0132-0161, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatography-mass spectrometer produced by SHIMADZU, gas chromatography-mass spectrometer produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

SYNTHESIS EXAMPLES

The method for preparing the compounds of the present invention is not limited. The following compounds are exemplified as a typical but non-limiting example, and the synthesis route and preparation method are as follows:

Synthesis Example 1: Synthesis of Compound 3-1

Step 1: Synthesis of Intermediate 1

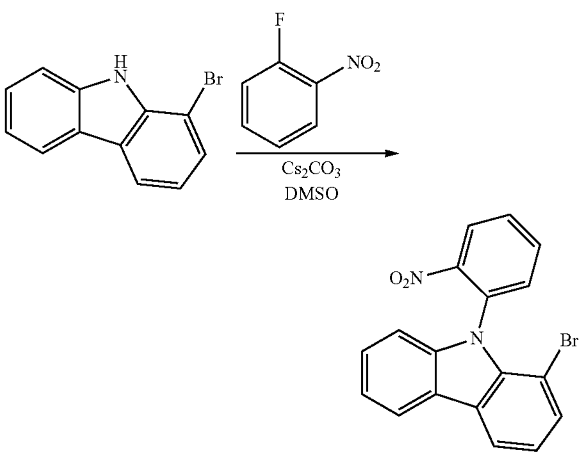

1

To a 500 mL three neck flask were added 1-bromo-9H-carbozole (20 g, 81 mmol), 2-fluoronitrobenzene (22 g, 162 mmol), cesium carbonate (80 g, 243 mmol), DMSO (160 mL), and the mixture was stirred for 48 h at room temperature. To the reaction was added saturated brine (50 mL), and the organic matter was extracted with PE/DCM (3/1, 500 mL), separated, washed with saturated brine until that the water phase is colorless. The organic phase was combined, concentrated, purified via column chromatography, eluting with PE/DCM (3/1), to afford intermediate 1 (15.86 g, 54% yield) as a yellow solid.

Step 2: Synthesis of Intermediate 2

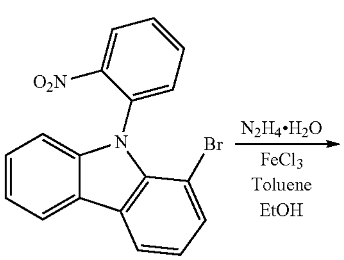

1

-continued

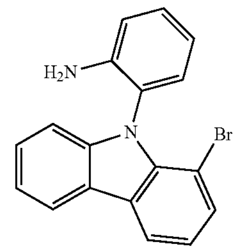

2

To a 2 L three-necked flask were added intermediate 1 (13 g, 35.7 mmol), $N_2H_4.H_2O$ (5 mL, 85.8 mmol), $FeCl_3$ (347 mg, 2.14 mmol), activated carbon (1.3 g) and toluene/ethanol (900 mL, 1/1). The reaction was heated to 90° C. under stirring. To the reaction was added $N_2H_4*H_2O$ for additional 10 times, 5 mL (85.8 mmol) each time, until the finish of the reaction monitored with TLC. The reaction mixture was filtered, and the filtrate was concentrated to afford intermediate 2 (12 g, 99% yield) as a yellow solid.

Step 3: Synthesis of Intermediate 3

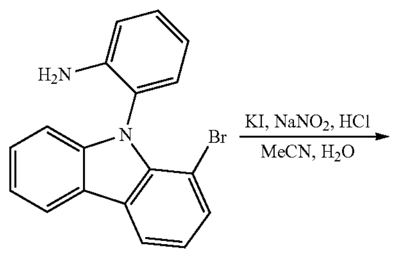

2

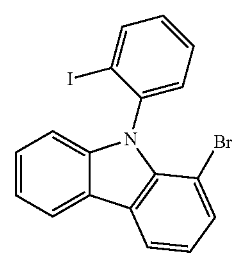

3

To a 250 mL single-necked flask was added intermediate 2 (12 g, 35.7 mmol), which was dissolved with MeCN (80 mL). To the solution was added concentrated HCl (excess) under stirring. After 10 min, the reaction was moved to a ice-water bath. To the reaction was added aqueous $NaNO_2$ (5 g, 71.4 mmol) dropwise. After 30 min, to the reaction was added aqueous KI (18 g, 107.1 mmol) dropwise, stirring while keeping the ice-water bath. The reaction was monitored with TLC. The reaction was filter through celite as cold. The organic matter was extracted with EA, concentrated, and the resulting crude product was purified via column chromatography, eluting with PE/DCM (30/1), to afford intermediate 3 (9 g, 57% yield) as a white solid.

Step 4: Synthesis of Intermediate 4

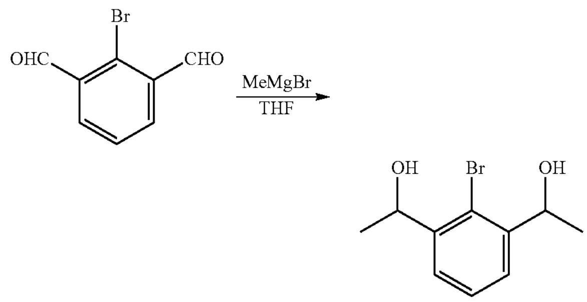

4

To a dry 1 L three-necked flask were added 2-bromoisophthalaldehyde (32 g, 151 mmol) and anhydrous THF (400 mL). At 0° C., to the reaction was added MeMgBr (110 mL, 330 mmol) dropwise, and the reaction was allowed to warm to room temperature after the addition. After the finish of the reaction monitored with TLC (5 h), the reaction was quenched with water. The reaction solution was concentrated, purified via column chromatography, eluting with DCM, to afford intermediate 4 (27.6 g, 75% yield).

Step 5: Synthesis of Intermediate 5

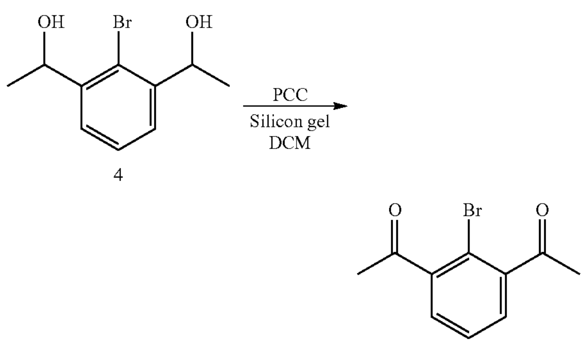

5

To a dry 2 L three-necked flask were added intermediate 4 (27.6 g, 113 mmol) and DCM (600 mL). Under 0° C., to the flask were added silica gel powder (150 g), and pyridinium chlorochromate (121 g, 565 mmol) in portion. The reaction was warmed to room temperature and monitored with TLC. After the finish (18 h), the reaction solution was concentrated, purified via column chromatography, eluting with DCM/PE (1/1), to afford intermediate 5 (20 g, 73% yield).

Step 6: Synthesis of Intermediate 6

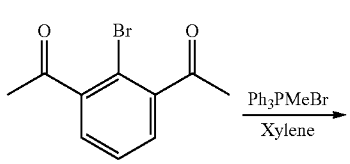

5

-continued

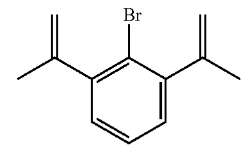

6

To a dry 1 L three-necked flask were added methyltriphenylphosphonium bromide (186 g, 495 mmol) and anhydrous xylene (400 mL). Under 0° C., to the flask was added tBuOK (47.6 g, 495 mmol), and the reaction was warmed to room temperature and stirred for 1 h. The intermediate 5 (20 g, 82.5 mmol) was dissolved in dry xylene (100 mL) and the solution was added to the reaction solution of methyltriphenylphosphonium bromide at 0° C., and the reaction was heated to 90° C. for 12 h. The reaction solution was concentrated, purified via column chromatography, eluting with PE, to afford intermediate 6 (13.7 g, 70% yield).

Step 7: Synthesis of Intermediate 7

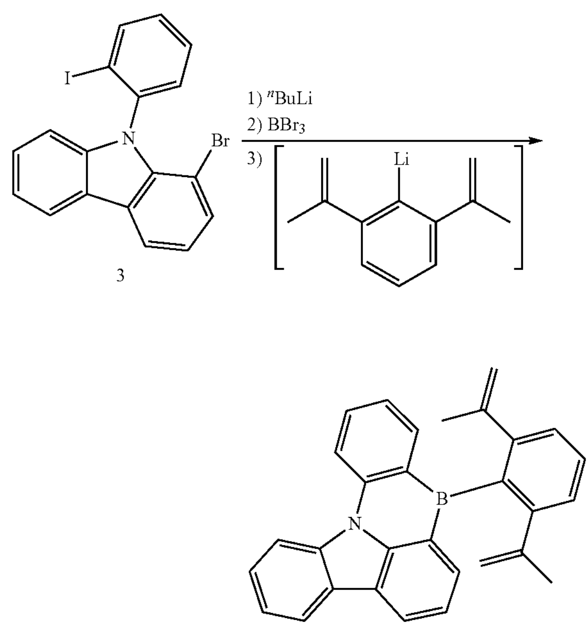

7

To a dry 250 mL three-necked flask was added intermediate 3 (5.2 g, 12 mmol), purged with $N_2$ for three times, then THF (40 mL) was added, and the mixture was cooled with dry ice-ethanol bath under stirring for 0.5 h. To the reaction were added nBuLi (15 mL, 36 mmol), and the mixture was stirred for 0.5 h. Then boron tribromide (3.4 mL, 36 mmol) was added, and the reaction was continued for 1 h. To another flask was added intermediate 6 (11.3 g, 48 mmol) and THF (70 mL). The solution was stirred for 0.5 h in an ice-water bath, nBuLi (20 mL, 50 mmol) was added and the mixture was stirred for 0.5 h. The mixture was added to the reaction above, and the reaction was heated to 70° C. overnight. The reaction solution was concentrated, purified via column chromatography, eluting with PE, to afford intermediate 7 (1.9 g, 40% yield).

Step 8: Synthesis of Compound 3-1

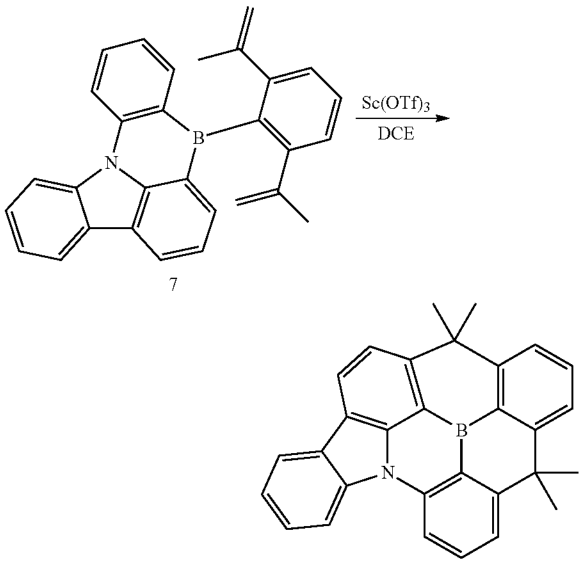

7

3-1

To a dry 100 mL three-necked flask were added intermediate 7 (1.9 g, 4.6 mmol), $Sc(OTf)_3$ (4.9 g, 10 mmol) and anhydrous DCE. The reaction was heated to reflux overnight. The reaction was concentrated, purified vie column chromatography, eluting with PE, to afford Compound 3-1 (1.5 g, 78% yield). The product was confirmed as the target product, with a molecular weight of 409.

The persons skilled in the art should know that the above preparation method is only an illustrative example, and the persons skilled in the art can obtain the structure of other compounds of the present invention by modifying the above preparation method.

In the compounds of the present invention, the nitrogen atom has unbonded electron lone pair, while the boron atom has empty orbitals. Through the design of the molecular structure, the intramolecular electron donor (nitrogen atom) and electron acceptor (boron atom) play a synergistic role in the poly-aromatic system, thus achieving a small energy gap between S1 state and Ti state. For example, the ΔEst of Compound 3-1 is less than 0.27 eV. Thus, this kind of compounds meet the requirements of being a TADF candidate compound. Other than that, the specific design of the compound of the present invention having Formula I-IV improve the rigidity of the molecular skeleton, while maintaining the poly-aromatic ring system, especially in Formula IV, and the effect is obvious. For example, the emission wavelength of the fluorescence spectrum of Compound 3-1 is in the deep blue region, and the full width of the half maximum (FWHM) of the emission spectrum of Compound 3-1 is 27.0 nm. The very narrow FWHM, is a significant advantages of the compound of the present invention to the TADF materials which have electron donor and electron acceptor at the two ends of the molecules (generally half peak width >100 nm). And it is narrower than the 35 nm FWHM value of the Comparative Compound 1 (U.S. Pat. No. 9,073,948B2).

Comparative Compound 1

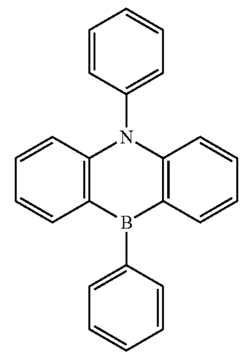

It is understood that the various embodiments described herein are by way of example only, and are not intended to limit the scope of the invention. The present invention as claimed may therefore include variations from the particular examples and preferred embodiments described herein, as will be apparent to one of skill in the art. Many of the materials and structures described herein may be substituted with other materials and structures without deviating from the spirit of the invention. It is understood that various theories as to why the invention works are not intended to be limiting.

What is claimed is:

1. A compound having a structure of Formula IV:

Formula IV

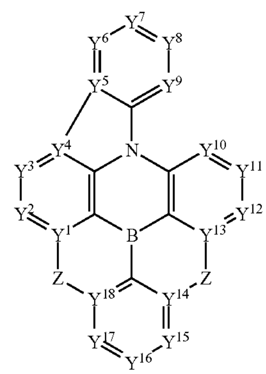

wherein $Y^1$-$Y^{18}$ are each independently selected from C, CR or N;

wherein $Y^4$ and $Y^5$ are carbon;

wherein Z is selected from $CR^{z1}R^{z2}$, $PR^z$, O, S or Se, the Z can be same or different;

wherein R, $R^{z1}$, $R^{z2}$ and $R^z$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof; and wherein the compound is not a fullerene compound where carbon atoms are partially replaced with heteroatoms.

2. The compound of claim 1, wherein the compound is selected from the group consisting of:

Compound 3-1

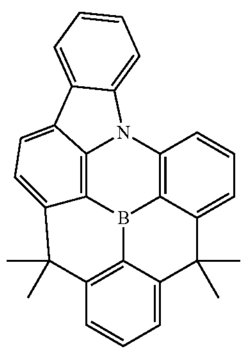

Compound 3-2

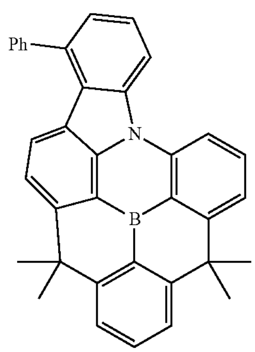

Compound 3-3

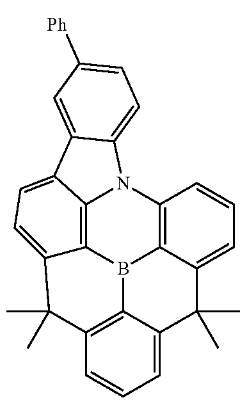

-continued

Compound 3-4

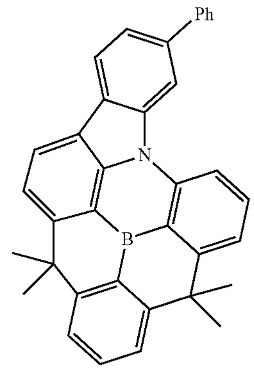

Compound 3-5

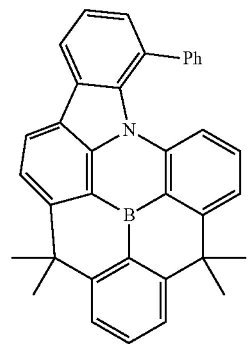

Compound 3-6

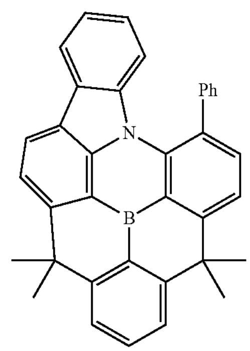

Compound 3-7

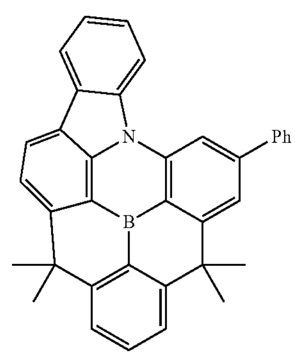

-continued
Compound 3-8
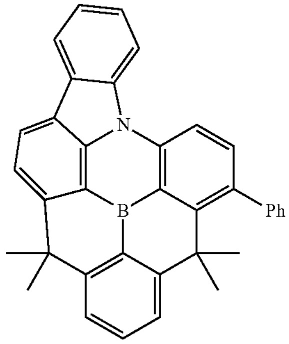
Compound 3-9
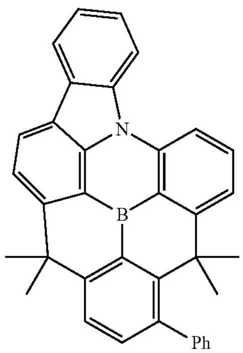
Compound 3-10
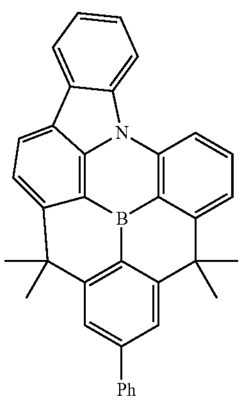
Compound 3-11
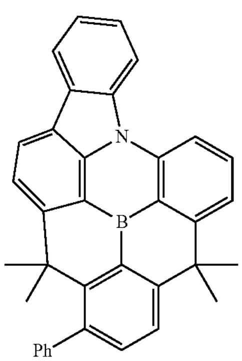
-continued
Compound 3-12
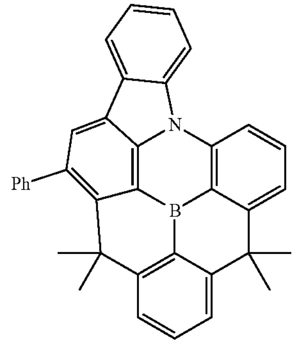
Compound 3-13
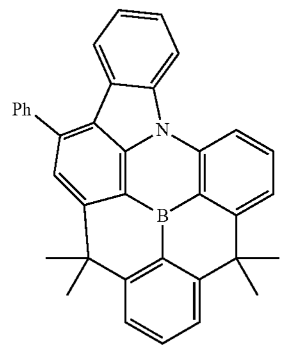
Compound 3-14
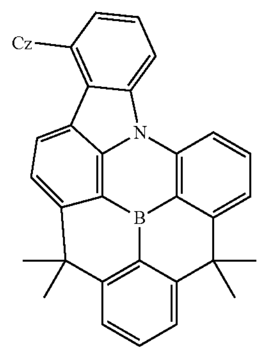
Compound 3-15
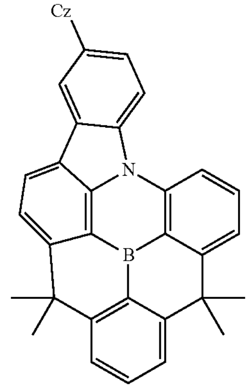

-continued
Compound 3-16
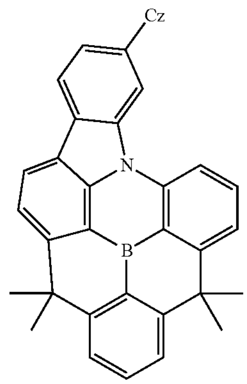
Compound 3-17
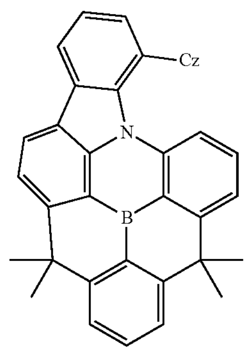
Compound 3-18
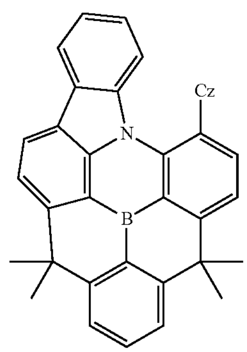
Compound 3-19
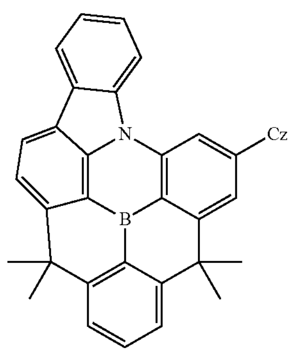
-continued
Compound 3-20
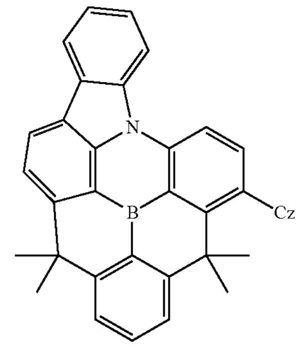
Compound 3-21
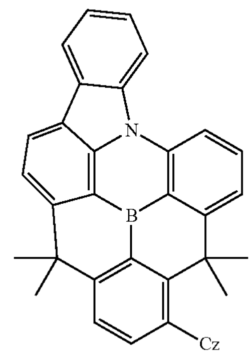
Compound 3-22
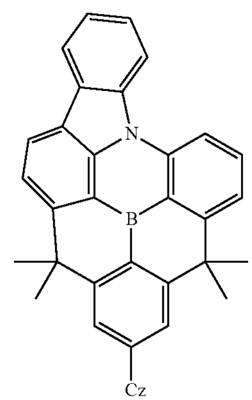
Compound 3-23
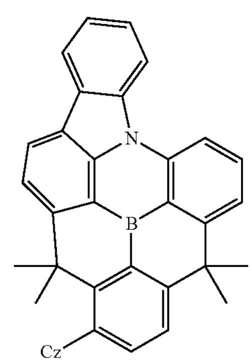

-continued
Compound 3-24
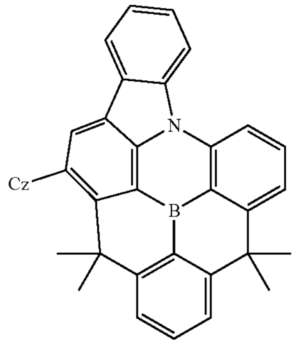
Compound 3-25
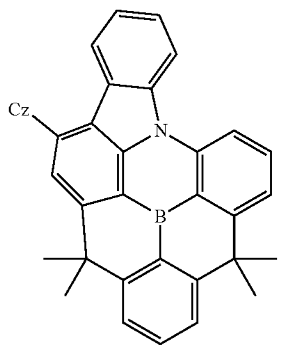
Compound 3-26
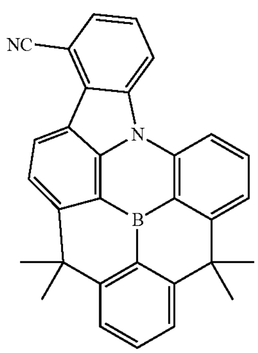
Compound 3-27
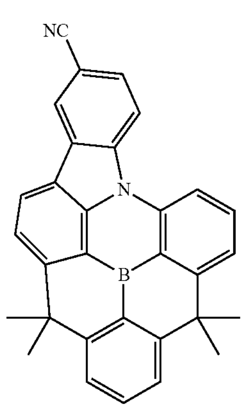
-continued
Compound 3-28
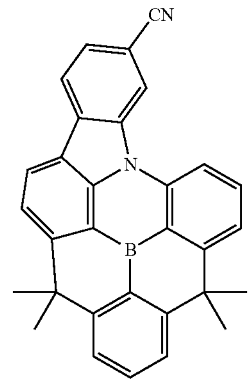
Compound 3-29
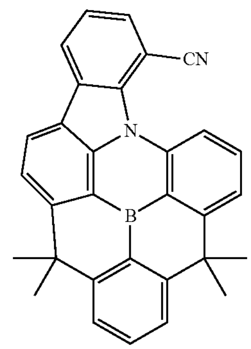
Compound 3-30
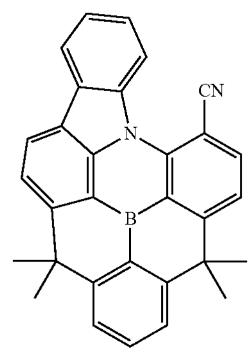
Compound 3-31
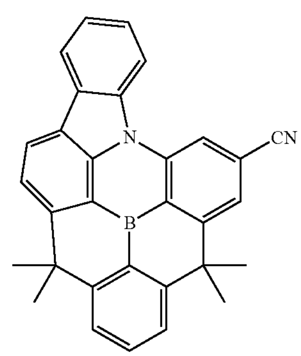

Compound 3-32
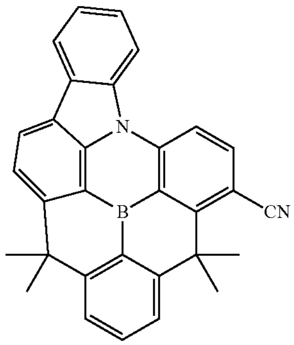
Compound 3-33
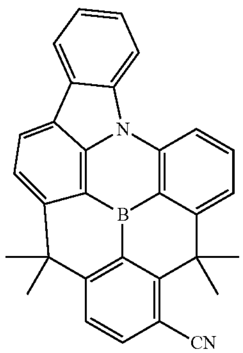
Compound 3-34
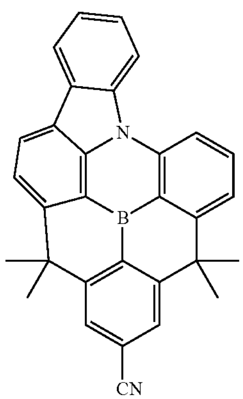
Compound 3-35
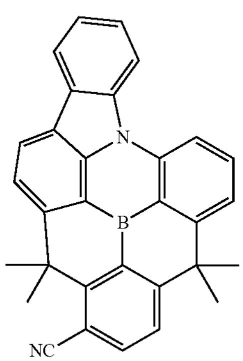
Compound 3-36
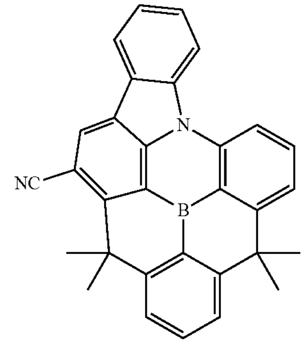
Compound 3-37
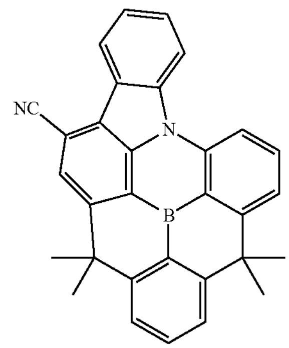
Compound 3-38
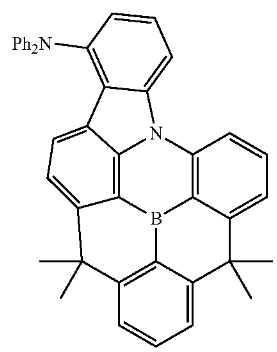
Compound 3-39
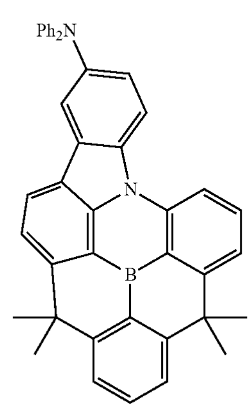

-continued
Compound 3-40
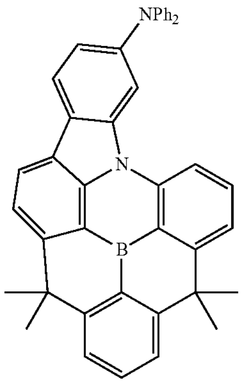
Compound 3-41
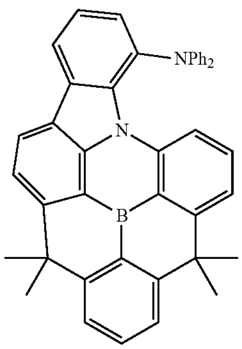
Compound 3-42
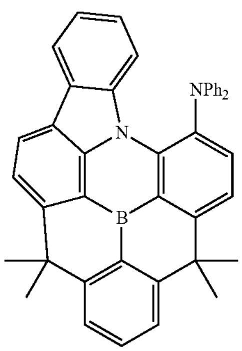
Compound 3-43
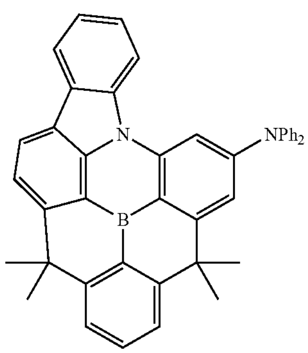
-continued
Compound 3-44
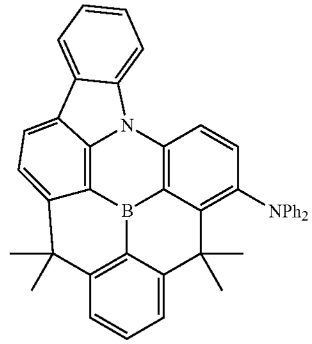
Compound 3-45
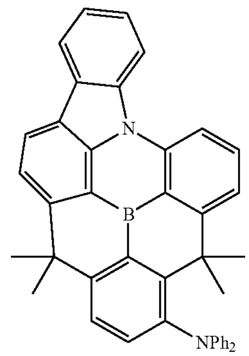
Compound 3-46
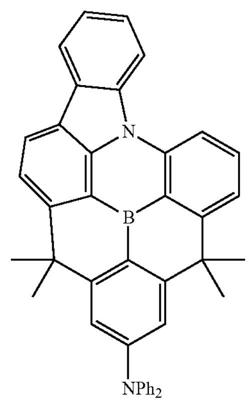
Compound 3-47
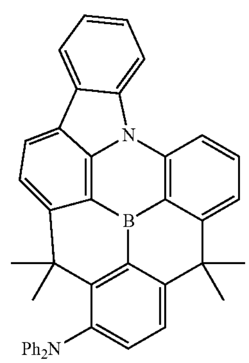

-continued
Compound 3-48
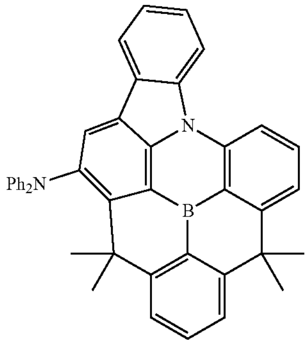
Compound 3-49
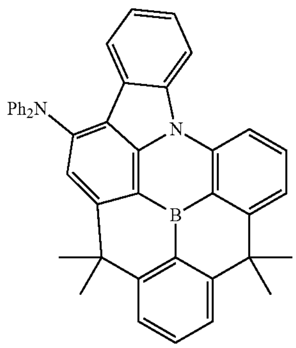
Compound 3-50
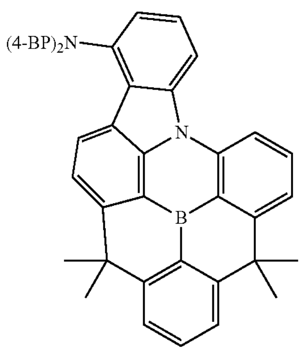
Compound 3-51
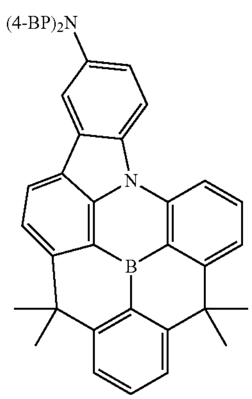
-continued
Compound 3-52
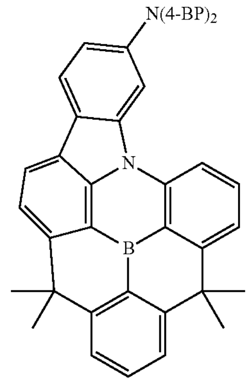
Compound 3-53
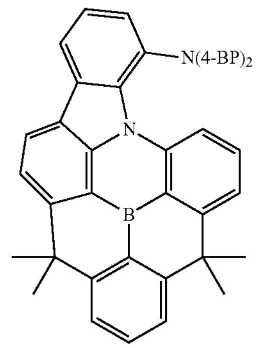
Compound 3-54
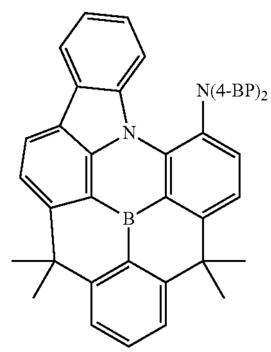
Compound 3-55
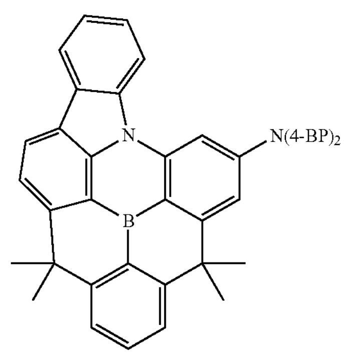

Compound 3-56
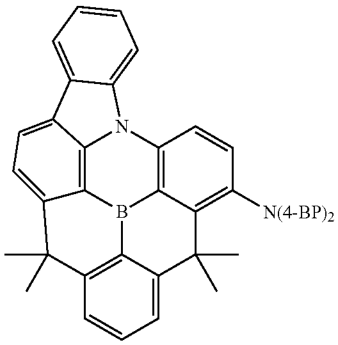
Compound 3-57
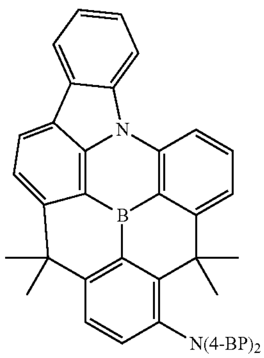
Compound 3-58
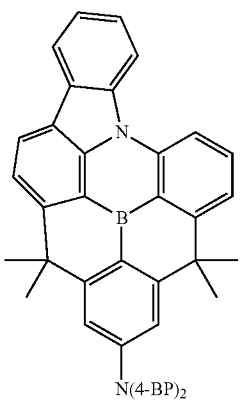
Compound 3-59
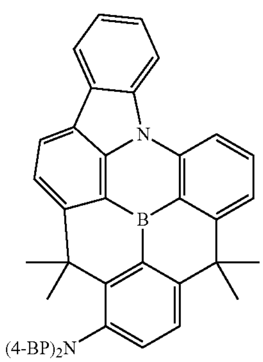
Compound 3-60
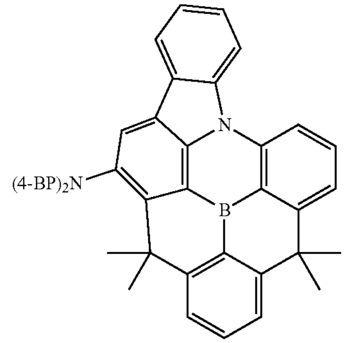
Compound 3-61
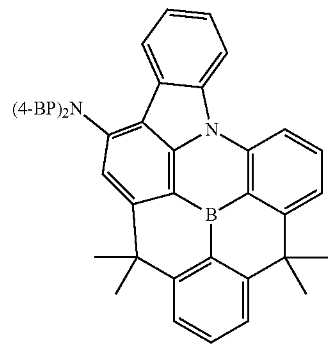
Compound 3-62
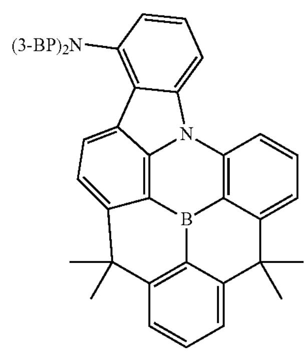
Compound 3-63
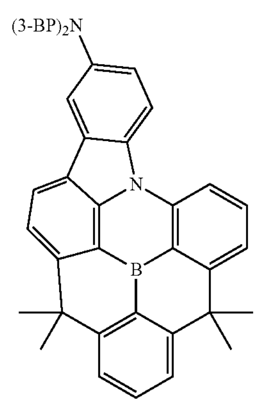

Compound 3-64
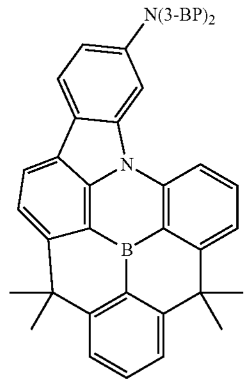
Compound 3-65
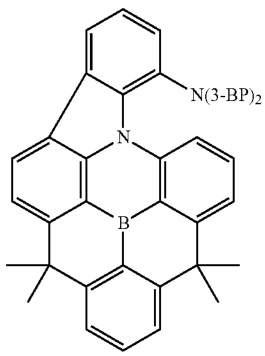
Compound 3-66
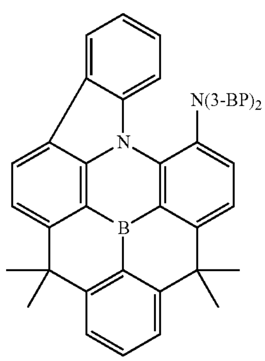
Compound 3-67
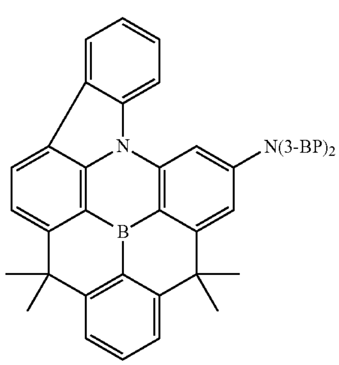
Compound 3-68
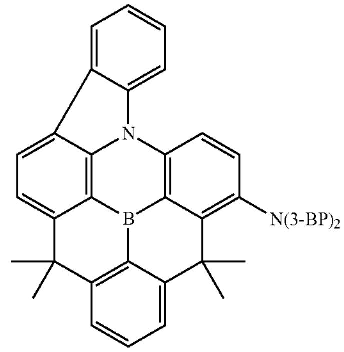
Compound 3-69
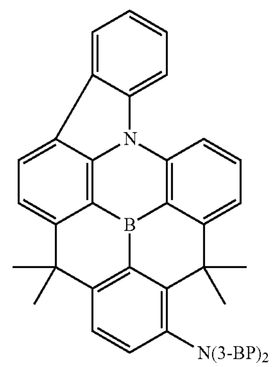
Compound 3-70
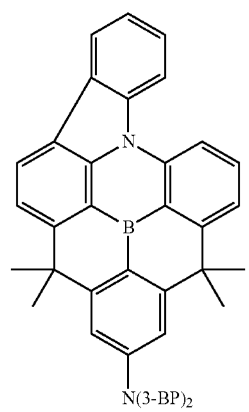
Compound 3-71
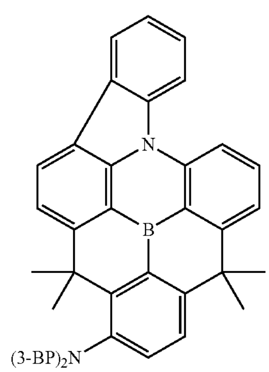

-continued
Compound 3-72
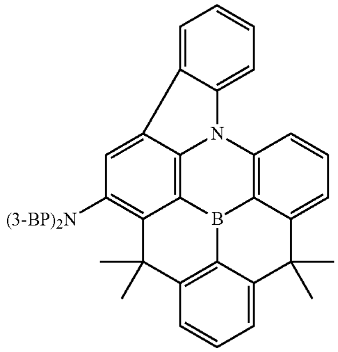
Compound 3-73
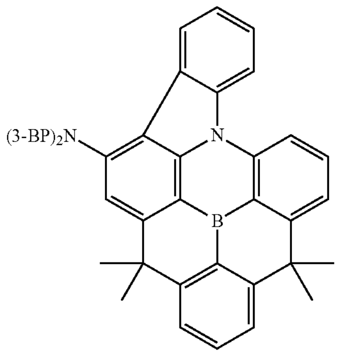
Compound 3-74
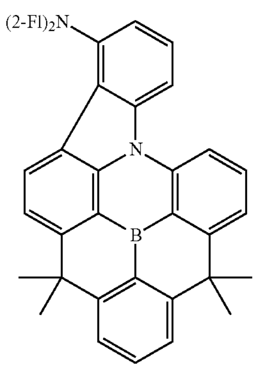
Compound 3-75
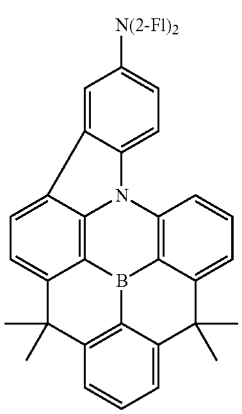
-continued
Compound 3-76
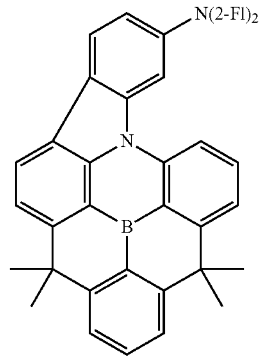
Compound 3-77
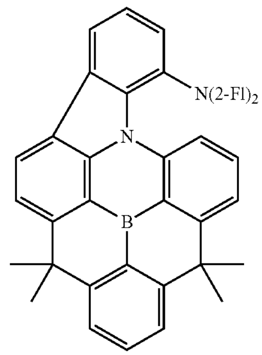
Compound 3-78
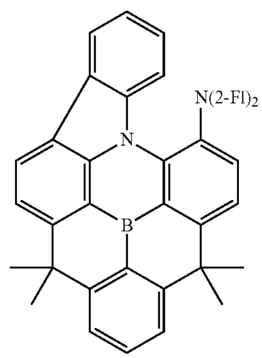
Compound 3-79
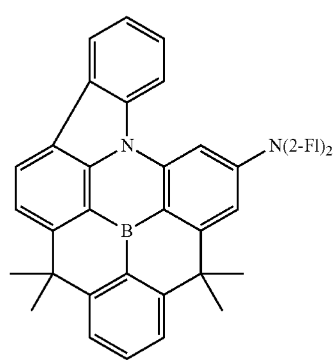

-continued
Compound 3-80
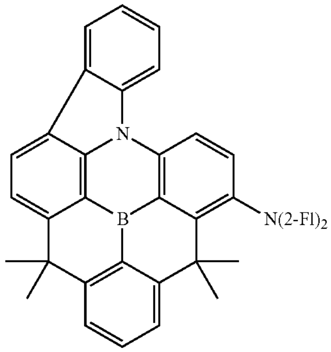
Compound 3-81
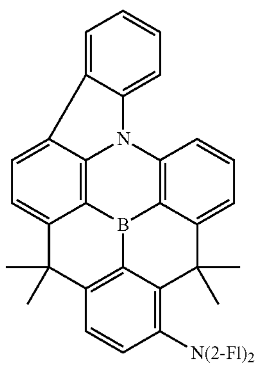
Compound 3-82
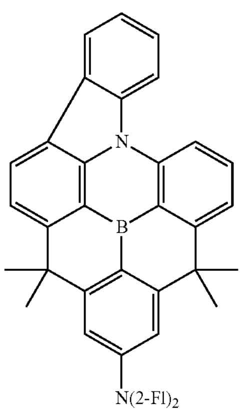
Compound 3-83
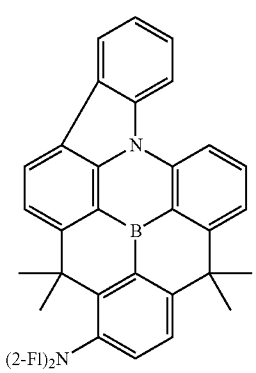
-continued
Compound 3-84
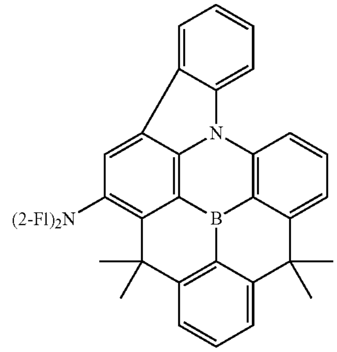
Compound 3-85
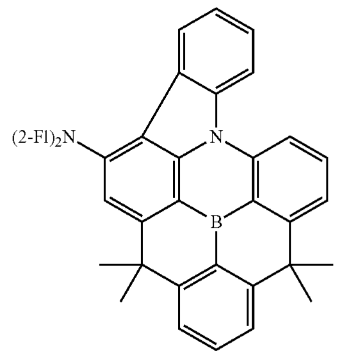
Compound 3-86
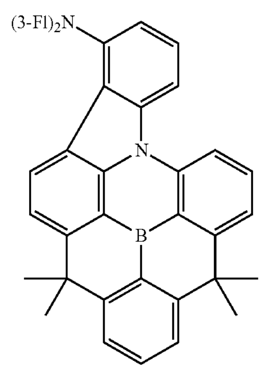
Compound 3-87
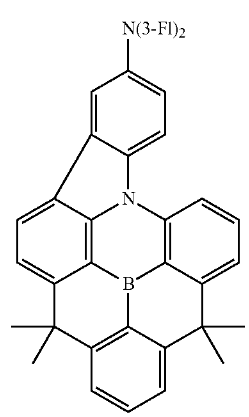

-continued
Compound 3-88
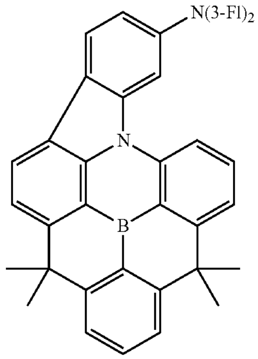
Compound 3-89
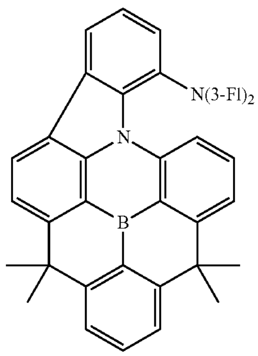
Compound 3-90
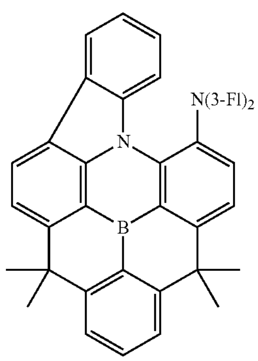
Compound 3-91
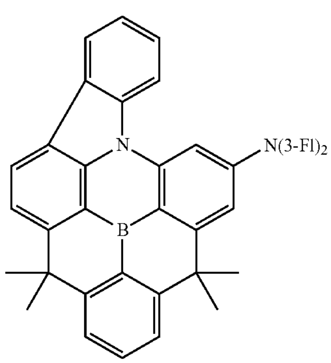
-continued
Compound 3-92
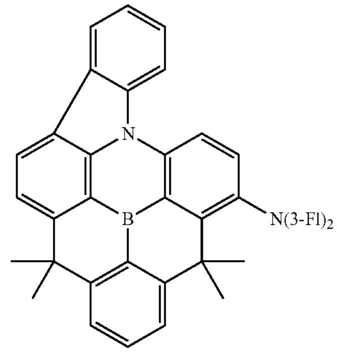
Compound 3-93
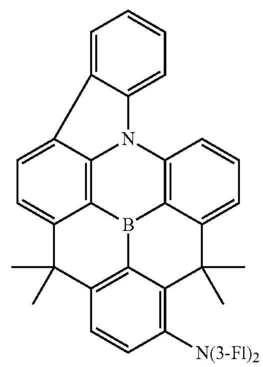
Compound 3-94
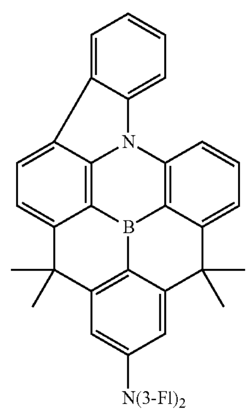
Compound 3-95
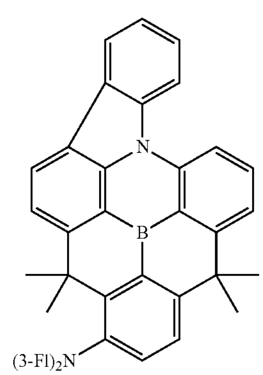

-continued
Compound 3-96
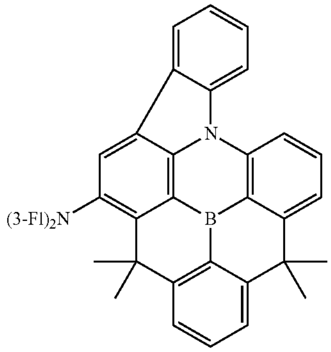
Compound 3-97
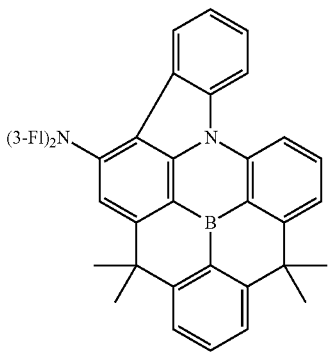
Compound 3-98
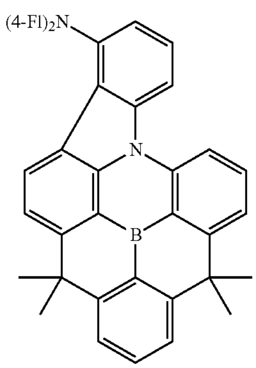
Compound 3-99
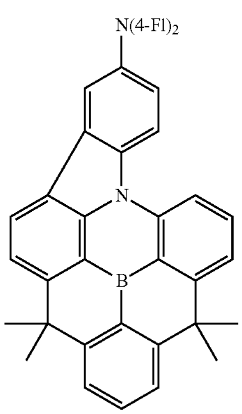
-continued
Compound 3-100
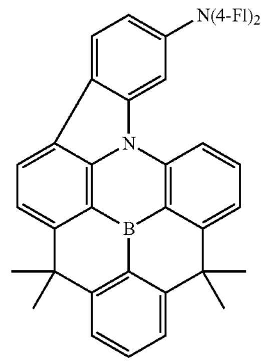
Compound 3-101
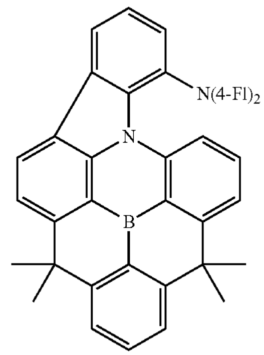
Compound 3-102
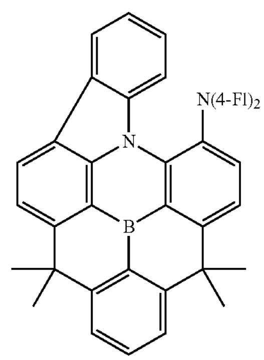
Compound 3-103
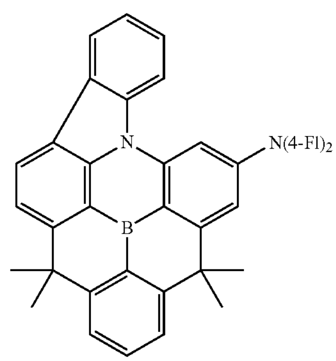

Compound 3-104
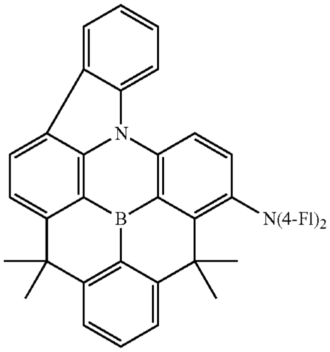
Compound 3-105
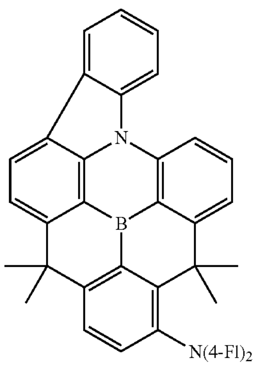
Compound 3-106
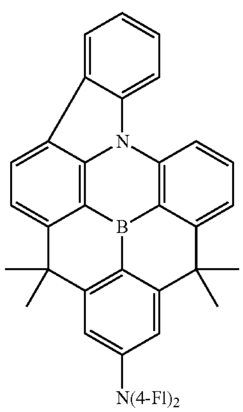
Compound 3-107
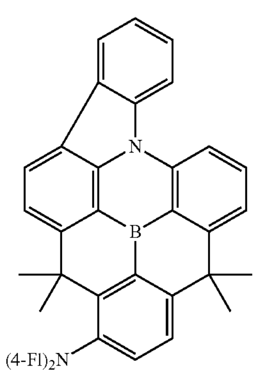
Compound 3-108
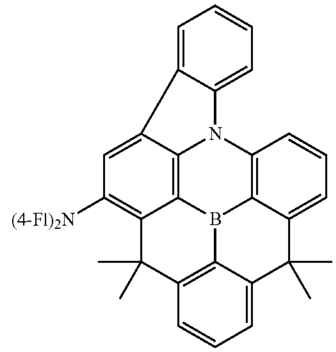
Compound 3-109
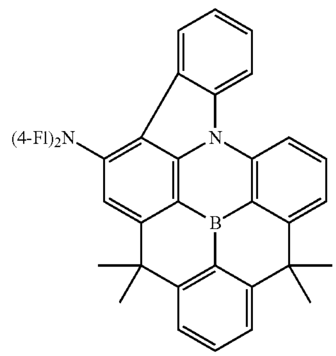
Compound 3-110
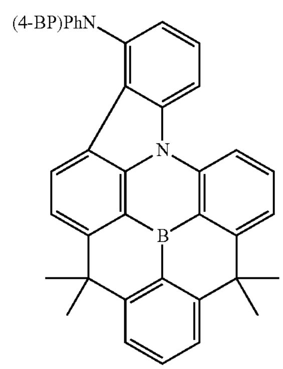
Compound 3-111
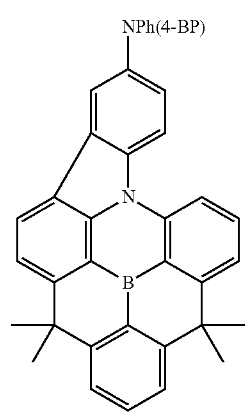

-continued
Compound 3-112
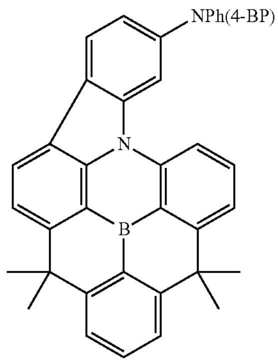
Compound 3-113
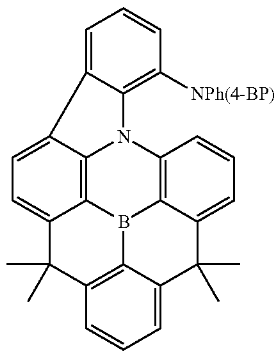
Compound 3-114
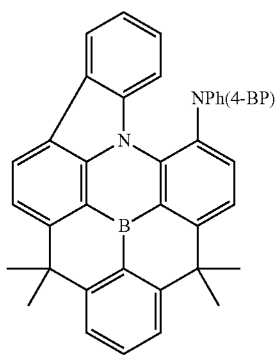
Compound 3-115
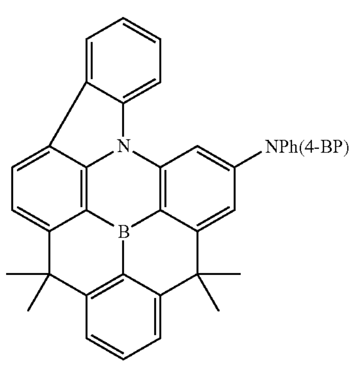
-continued
Compound 3-116
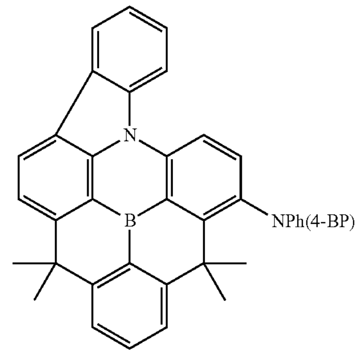
Compound 3-117
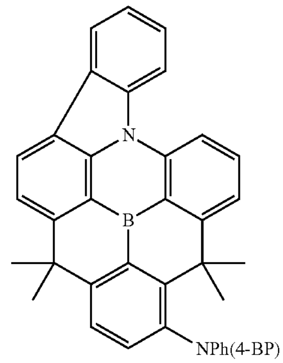
Compound 3-118
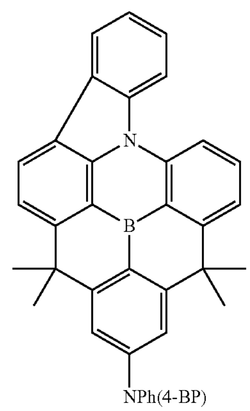
Compound 3-119
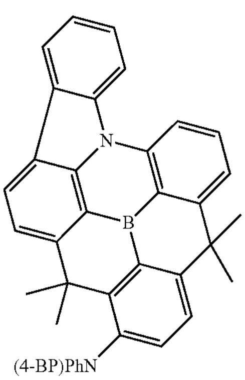

Compound 3-120
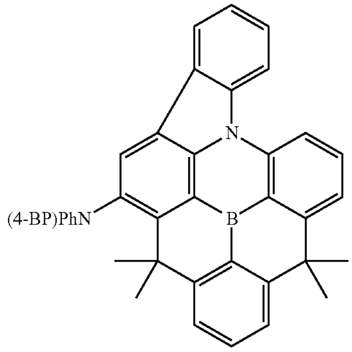
Compound 3-121
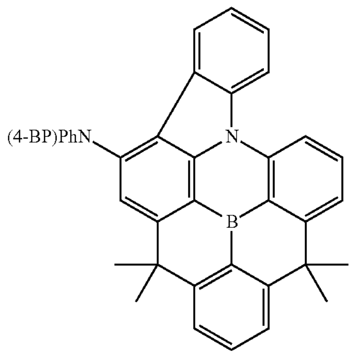
Compound 3-122
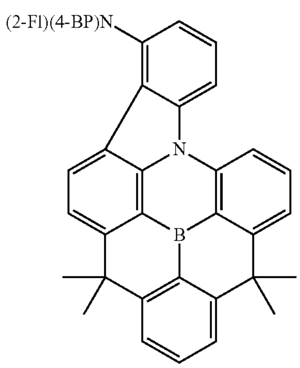
Compound 3-123
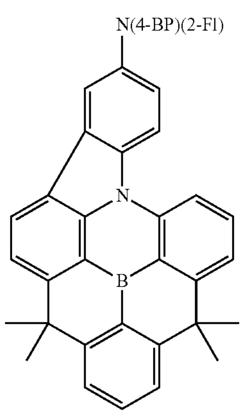
Compound 3-124
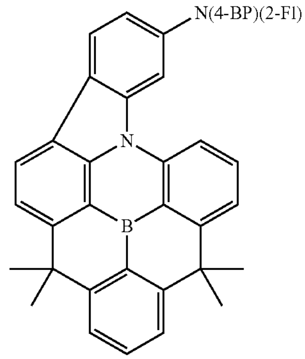
Compound 3-125
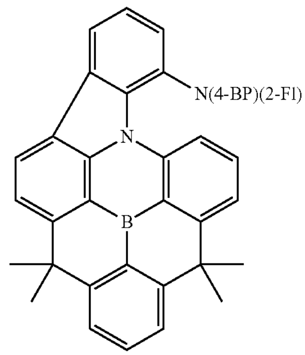
Compound 3-126
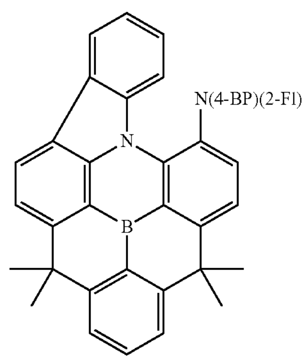
Compound 3-127
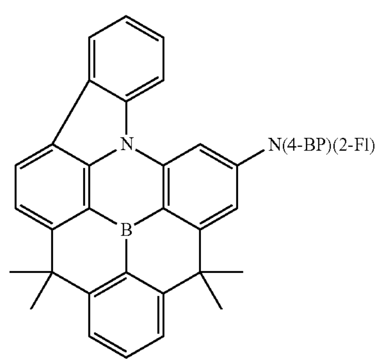

-continued
Compound 3-128
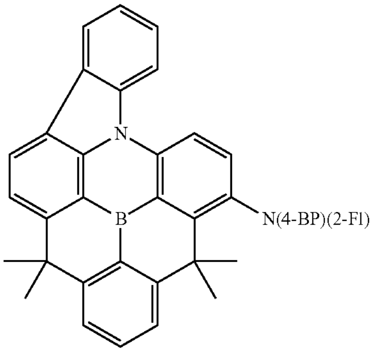
Compound 3-129
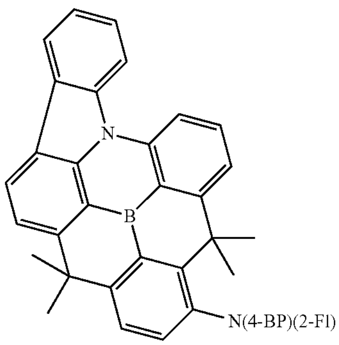
Compound 3-130
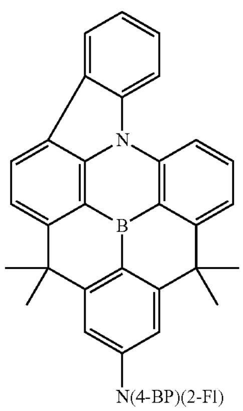
Compound 3-131
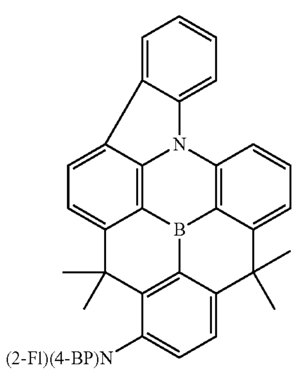
-continued
Compound 3-132
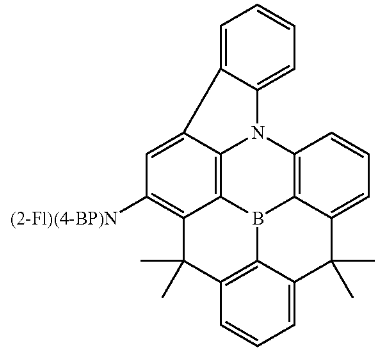
Compound 3-133
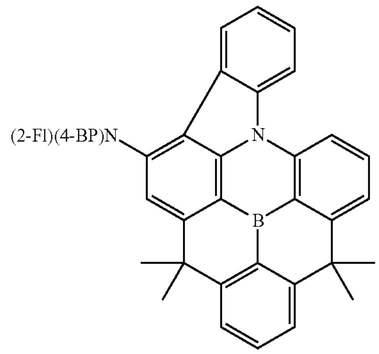
Compound 3-134
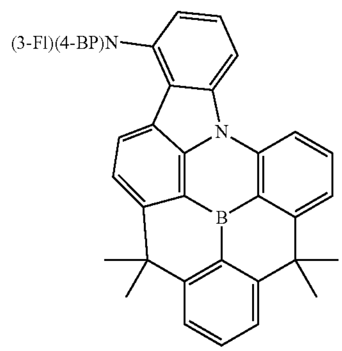
Compound 3-135
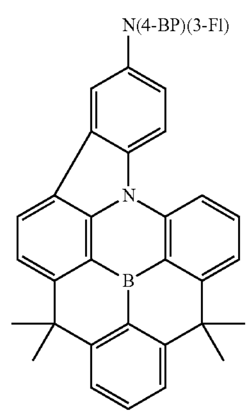

-continued
Compound 3-136
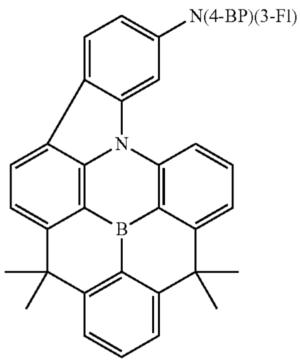
Compound 3-137
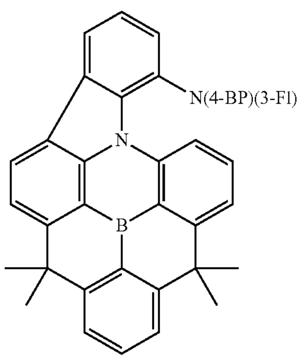
Compound 3-138
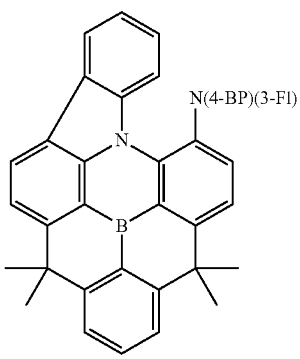
Compound 3-139
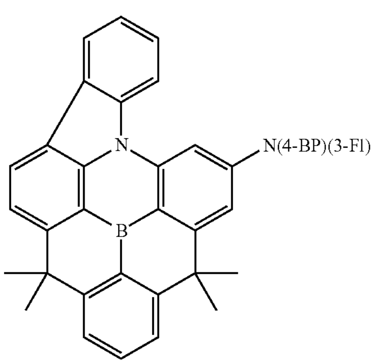
-continued
Compound 3-140
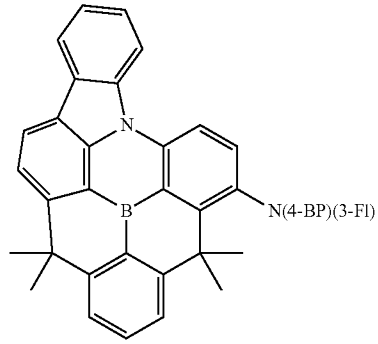
Compound 3-141
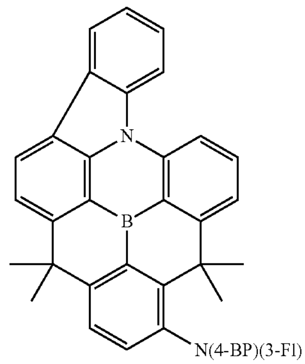
Compound 3-142
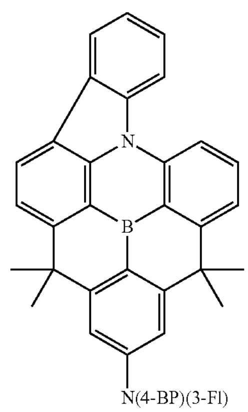
Compound 3-143
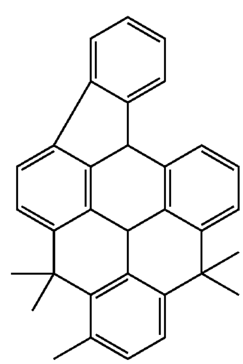

-continued
Compound 3-144
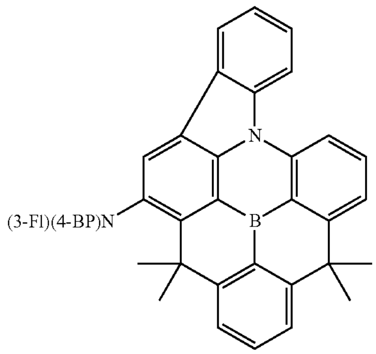
Compound 3-145
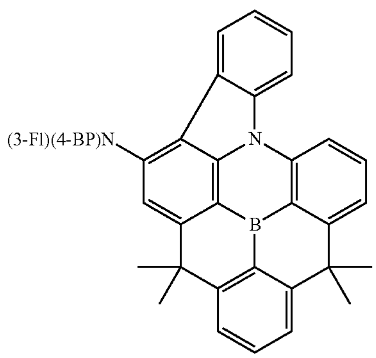
Compound 3-146
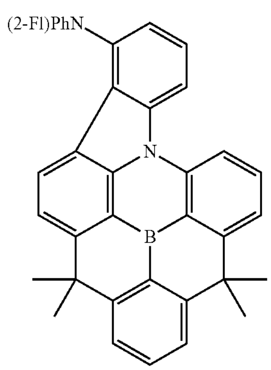
Compound 3-147
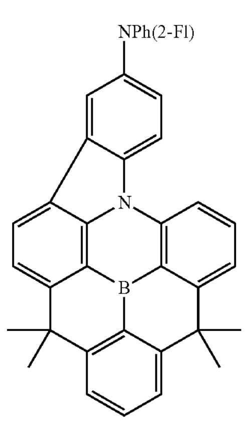
-continued
Compound 3-148
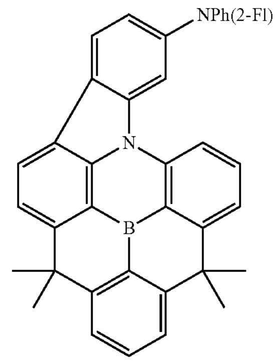
Compound 3-149
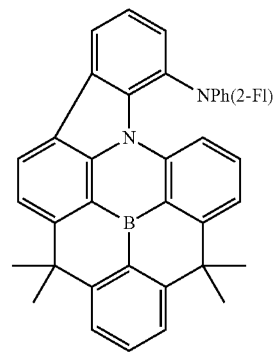
Compound 3-150
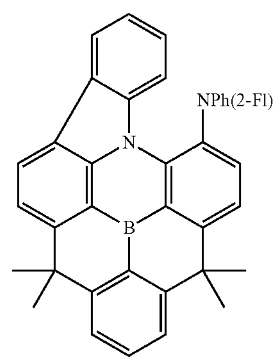
Compound 3-151
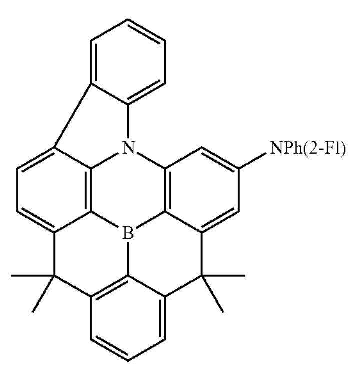

Compound 3-152
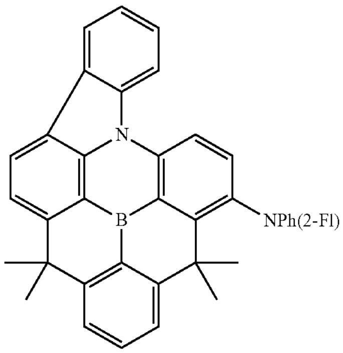
Compound 3-153
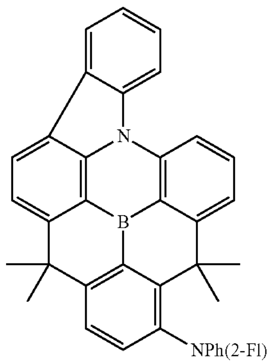
Compound 3-154
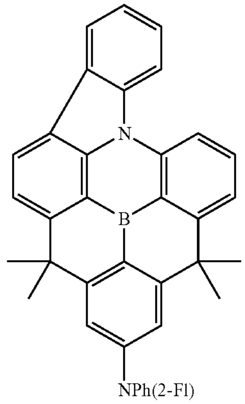
Compound 3-155
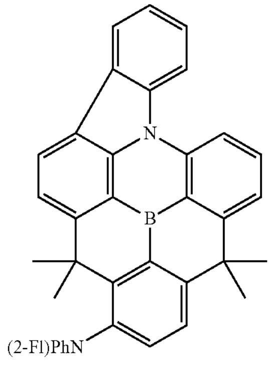
Compound 3-156
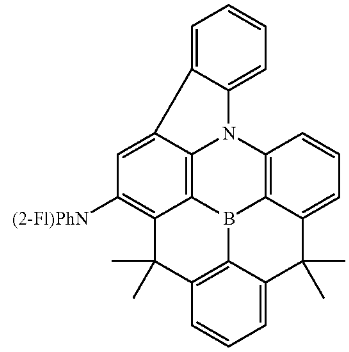
Compound 3-157
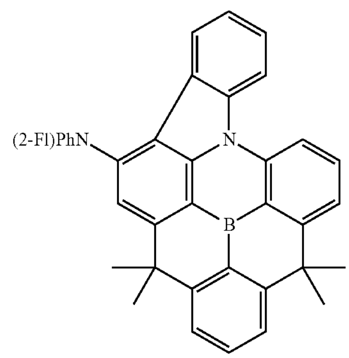
Compound 3-158
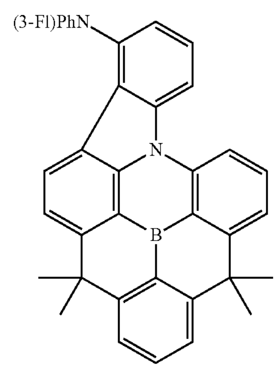
Compound 3-159
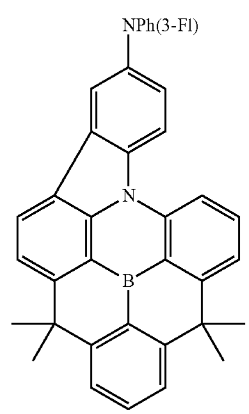

-continued
Compound 3-160
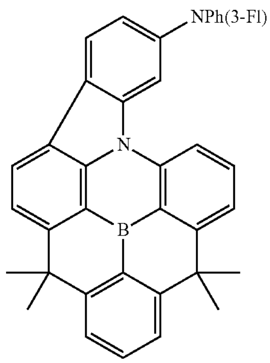
Compound 3-161
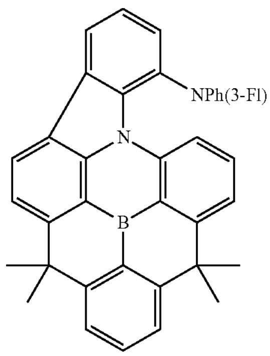
Compound 3-162
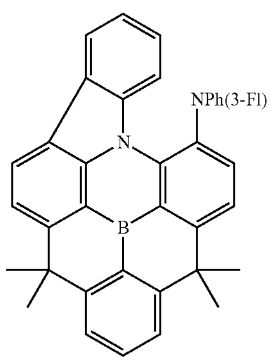
Compound 3-163
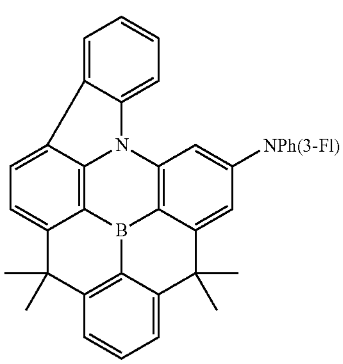
-continued
Compound 3-164
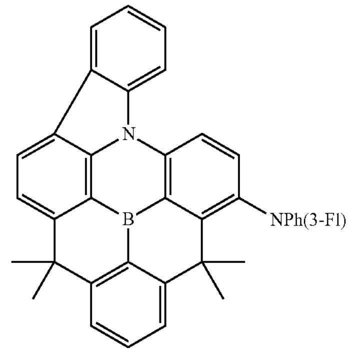
Compound 3-165
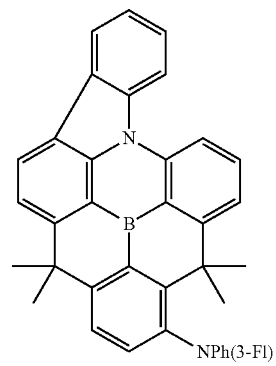
Compound 3-166
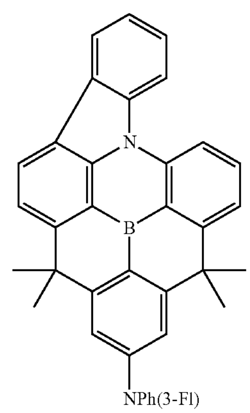
Compound 3-167
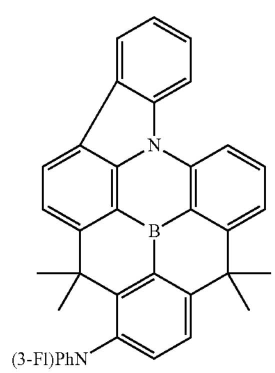

-continued
Compound 3-168
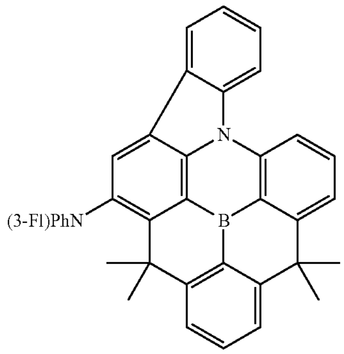
Compound 3-169
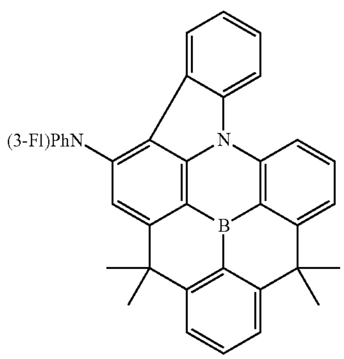
Compound 3-170
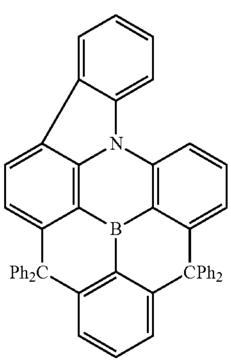
Compound 3-171
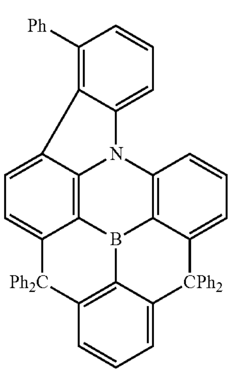
-continued
Compound 3-172
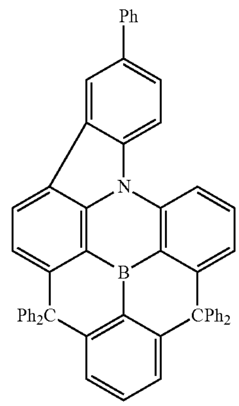
Compound 3-173
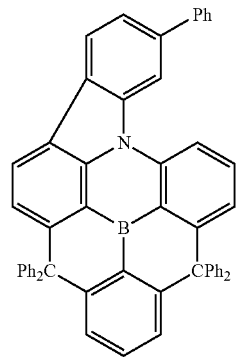
Compound 3-174
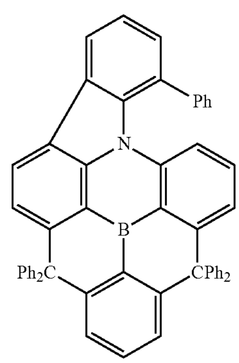
Compound 3-175
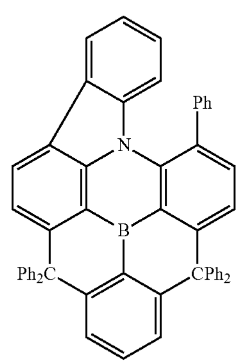

-continued
Compound 3-176
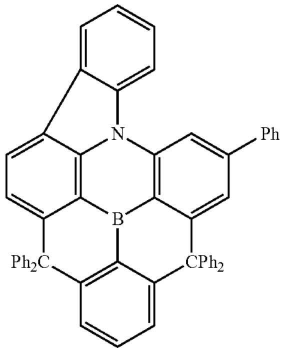
Compound 3-177
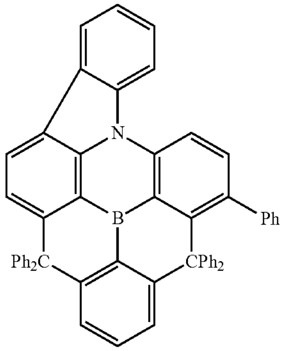
Compound 3-178
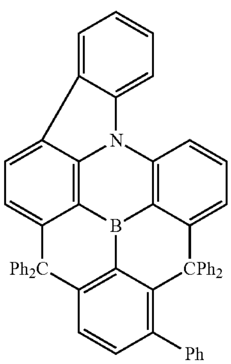
Compound 3-179
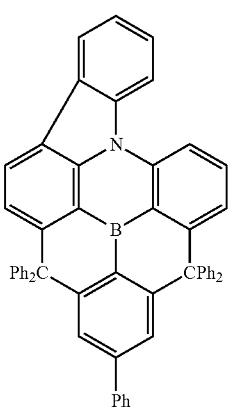
-continued
Compound 3-180
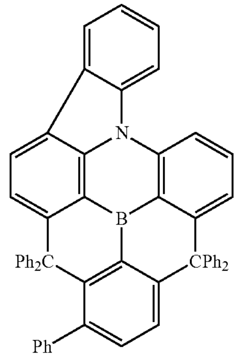
Compound 3-181
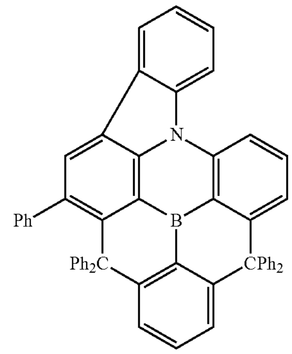
Compound 3-182
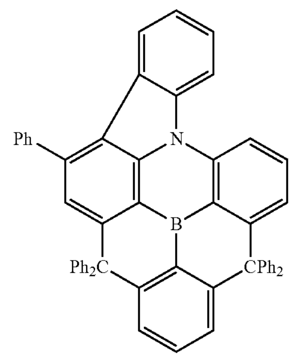
Compound 3-183
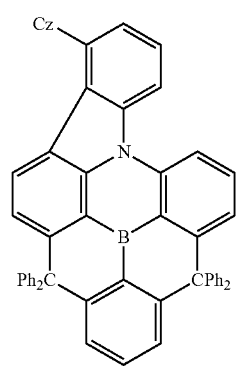

-continued
Compound 3-184
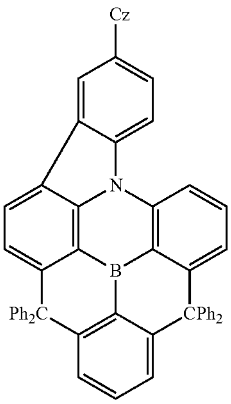
Compound 3-185
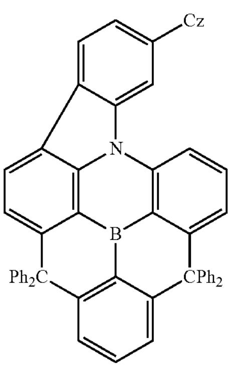
Compound 3-186
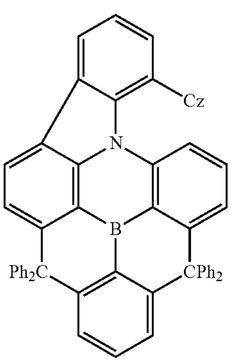
Compound 3-187
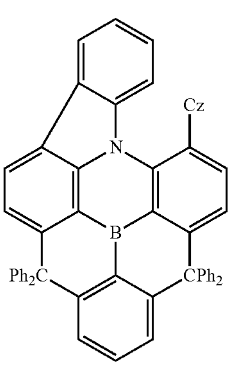
-continued
Compound 3-188
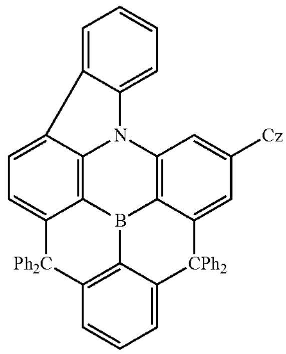
Compound 3-189
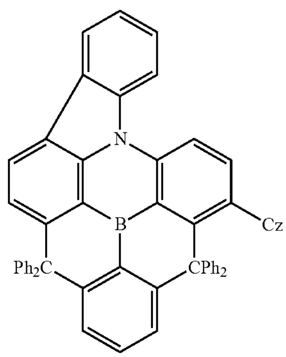
Compound 3-190
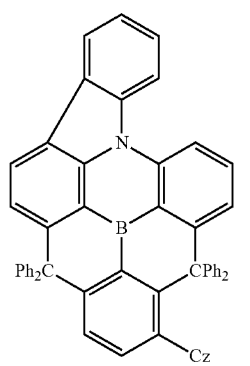
Compound 3-191
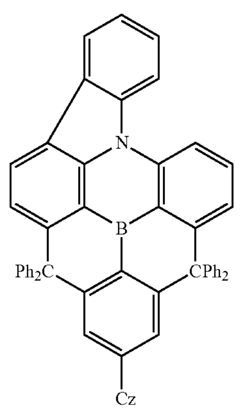

-continued
Compound 3-192
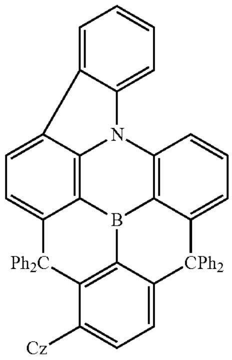
Compound 3-193
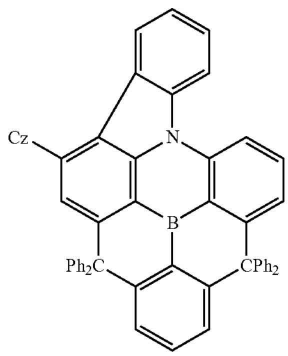
Compound 3-194
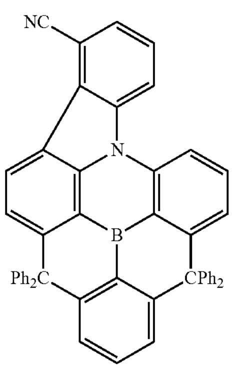
Compound 3-195
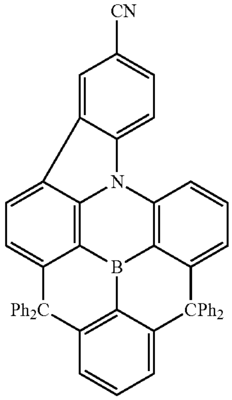
-continued
Compound 3-196
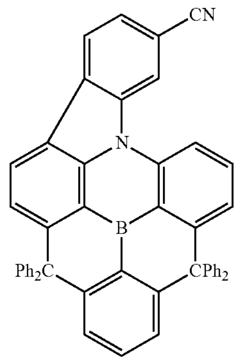
Compound 3-197
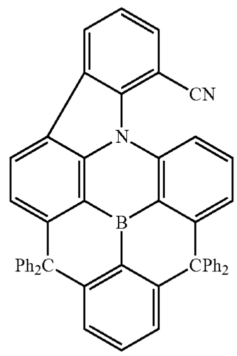
Compound 3-198
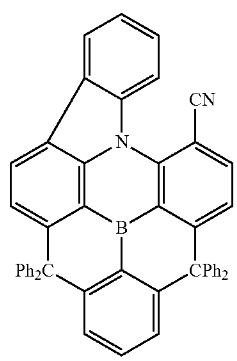
Compound 3-199
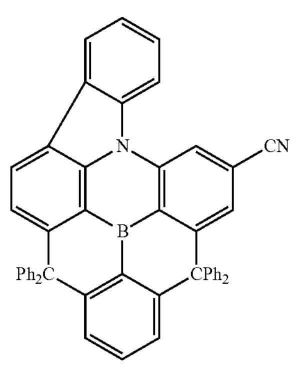

-continued
Compound 3-200
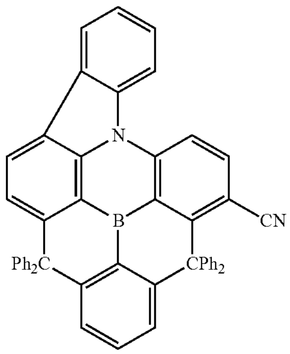
Compound 3-201
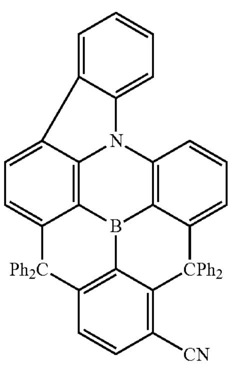
Compound 3-202
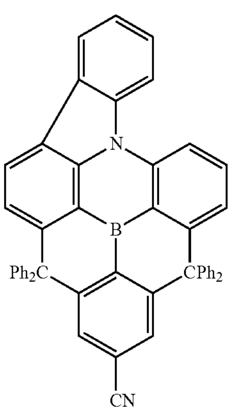
Compound 3-203
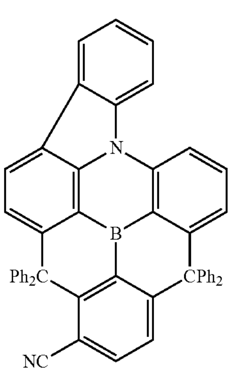
-continued
Compound 3-204
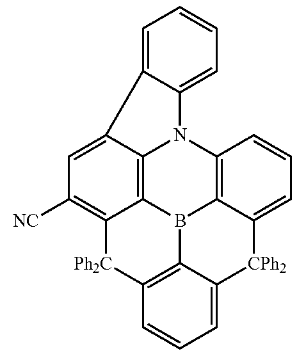
Compound 3-205
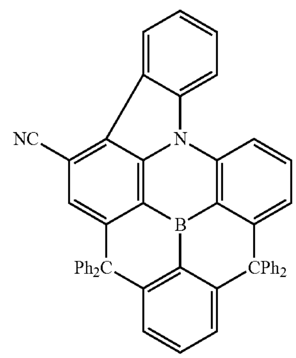
Compound 3-206
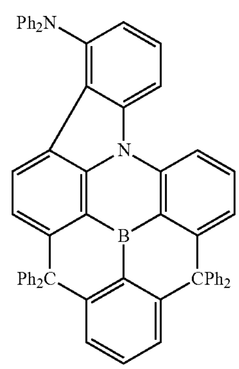
Compound 3-207
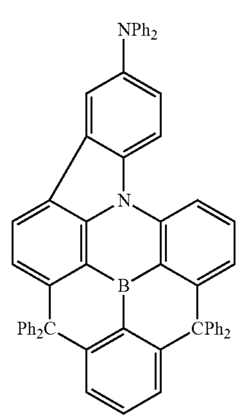

-continued
Compound 3-208
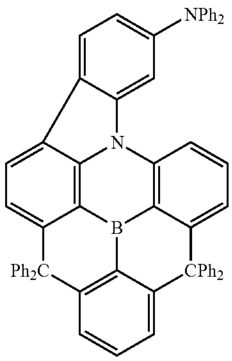
Compound 3-209
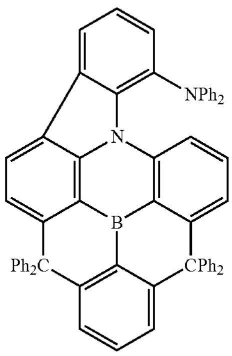
Compound 3-210
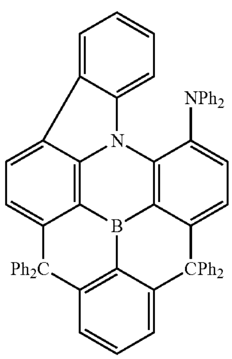
Compound 3-211
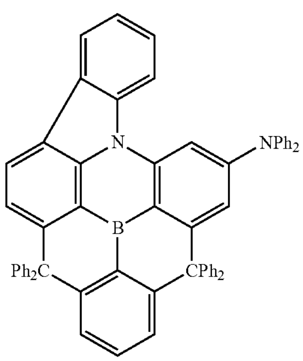
-continued
Compound 3-212
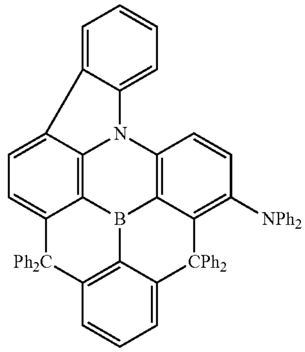
Compound 3-213
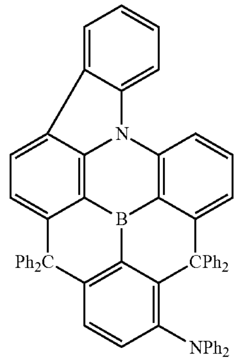
Compound 3-214
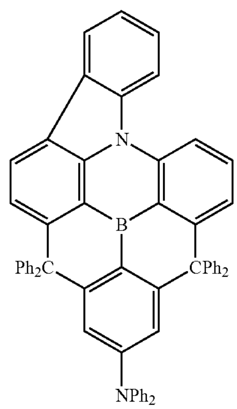
Compound 3-215
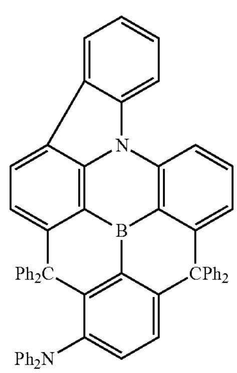

-continued
Compound 3-216
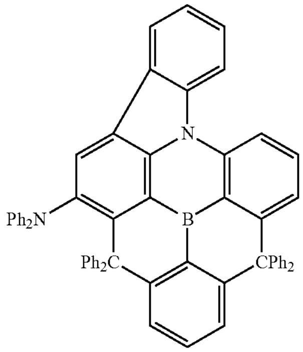
Compound 3-217
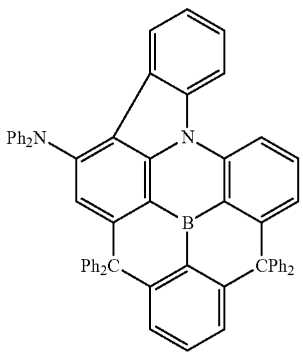
Compound 3-218
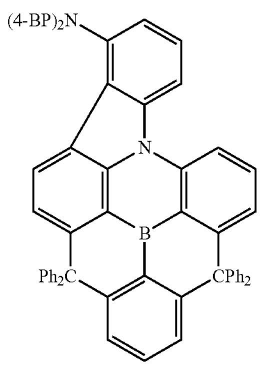
Compound 3-219
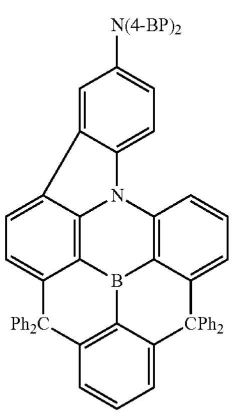
-continued
Compound 3-220
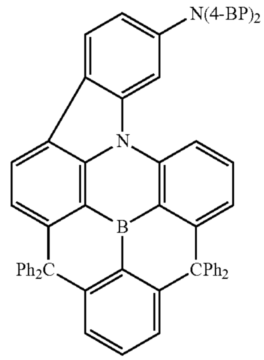
Compound 3-221
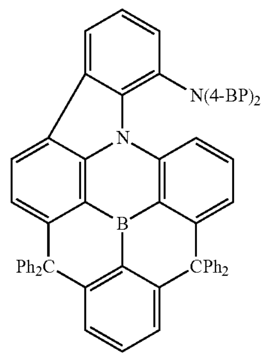
Compound 3-222
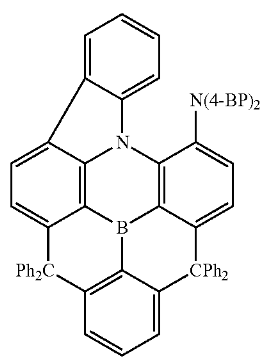
Compound 3-223
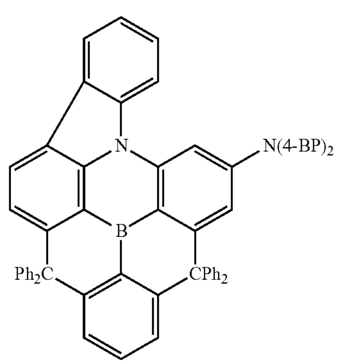

-continued
Compound 3-224
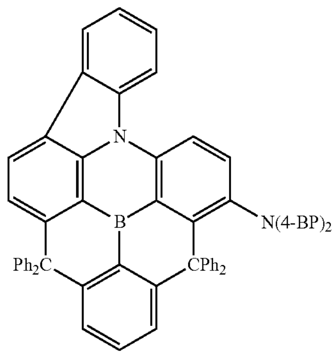
Compound 3-225
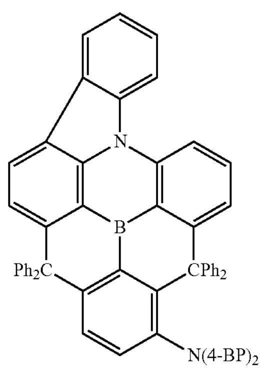
Compound 3-226
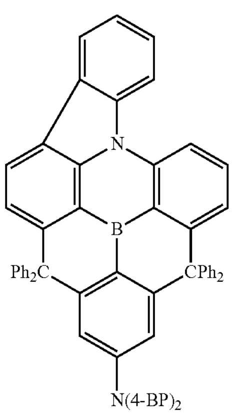
Compound 3-227
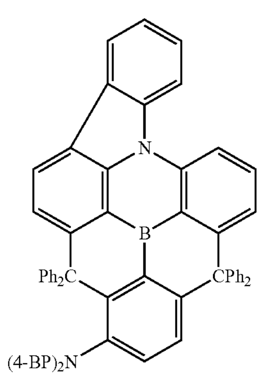
-continued
Compound 3-228
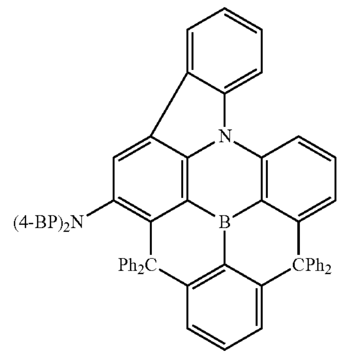
Compound 3-229
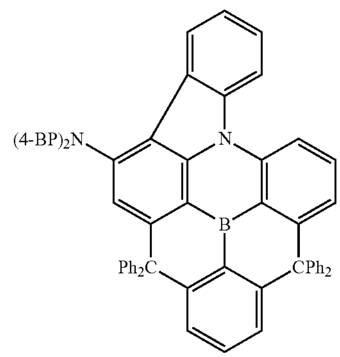
Compound 3-230
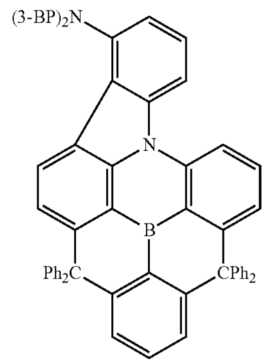
Compound 3-231
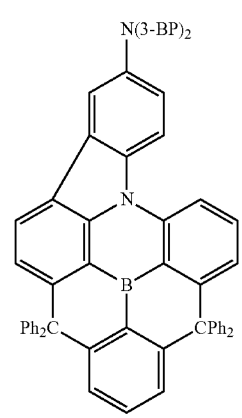

-continued
Compound 3-232
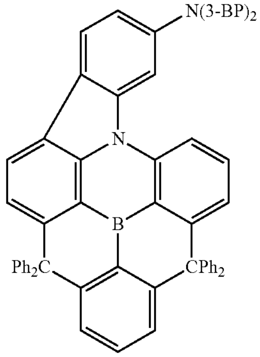
Compound 3-233
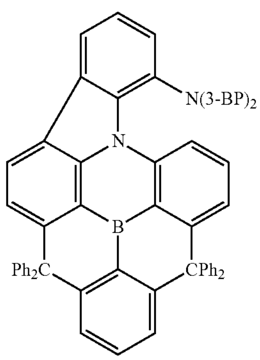
Compound 3-234
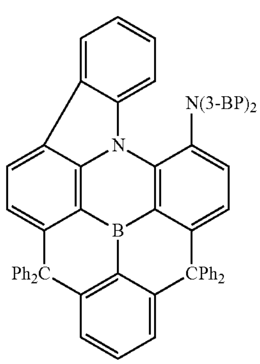
Compound 3-235
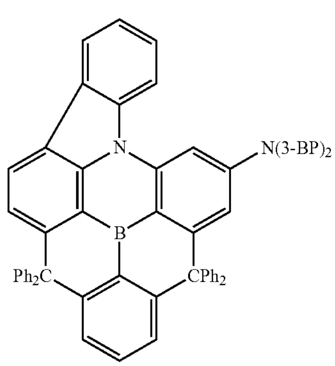
-continued
Compound 3-236
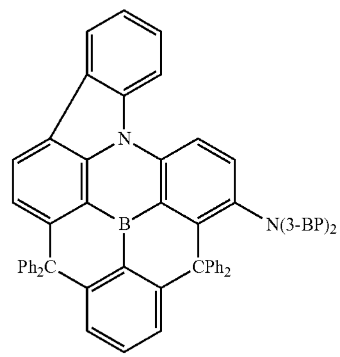
Compound 3-237
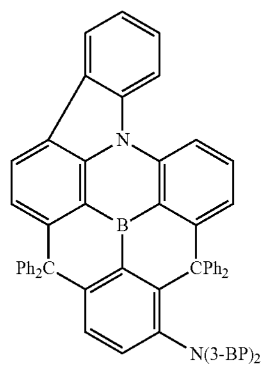
Compound 3-238
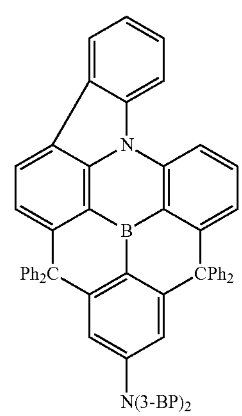
Compound 3-239
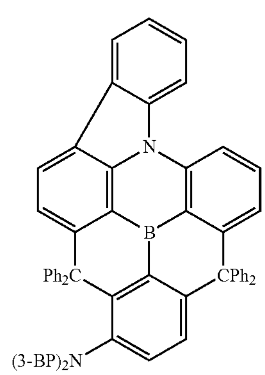

Compound 3-240
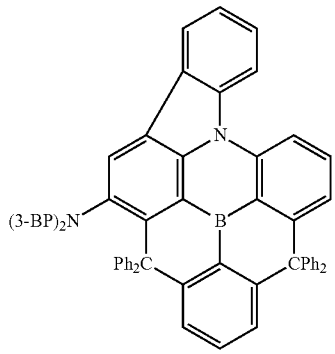
Compound 3-241
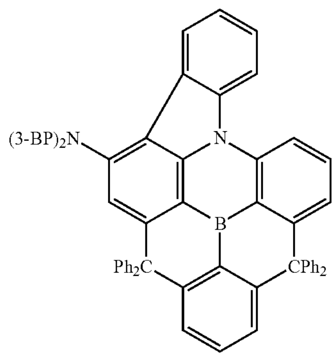
Compound 3-242
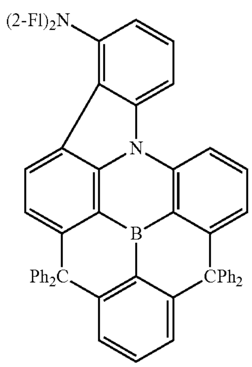
Compound 3-243
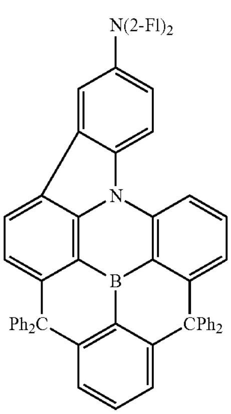
Compound 3-244
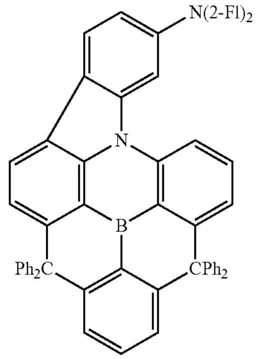
Compound 3-245
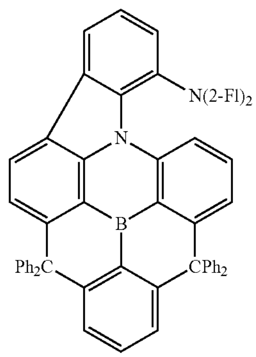
Compound 3-246
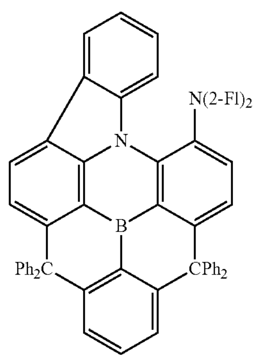
Compound 3-247
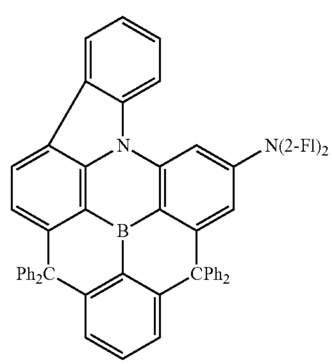

-continued
Compound 3-248
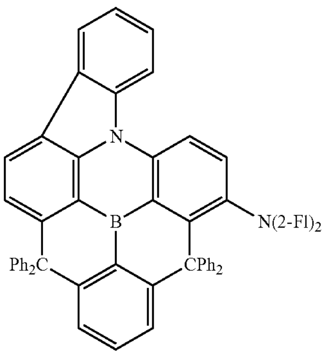
Compound 3-249
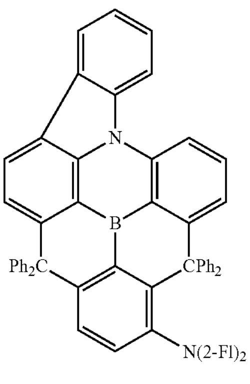
Compound 3-250
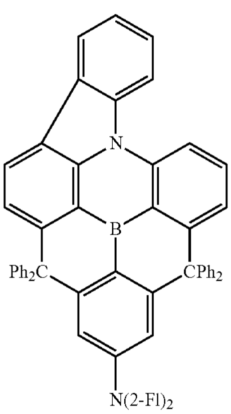
Compound 3-251
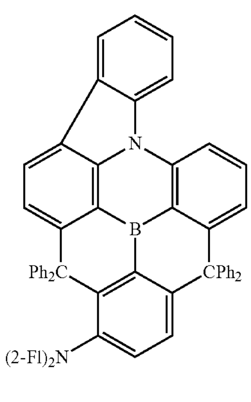
-continued
Compound 3-252
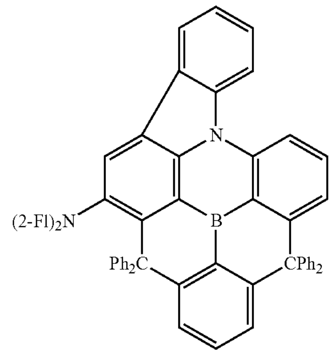
Compound 3-253
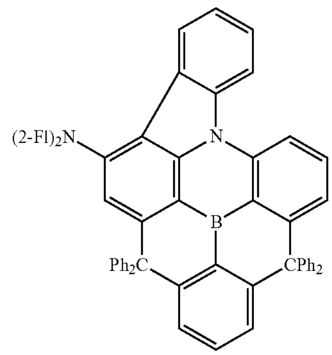
Compound 3-254
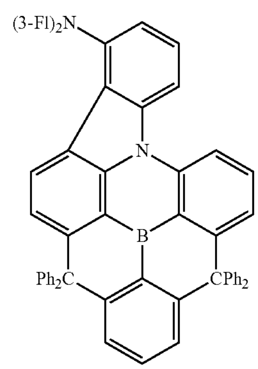
Compound 3-255
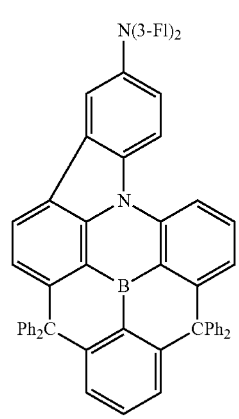

-continued
Compound 3-256
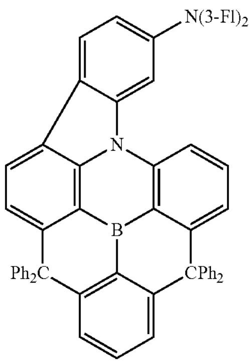
Compound 3-257
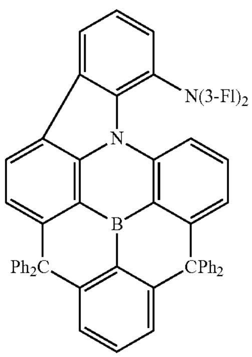
Compound 3-258
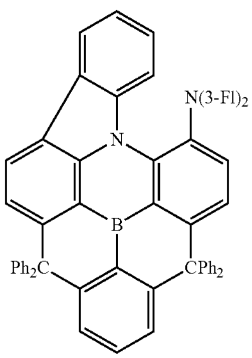
Compound 3-259
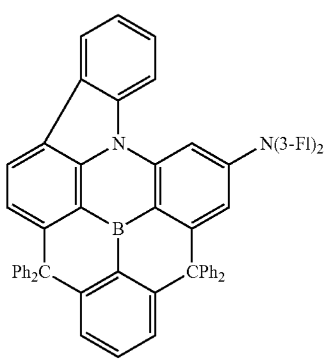
-continued
Compound 3-260
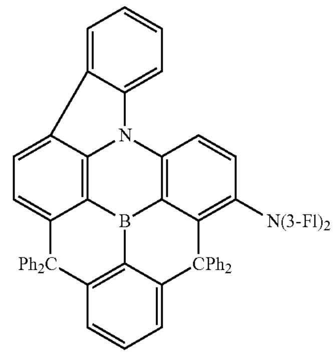
Compound 3-261
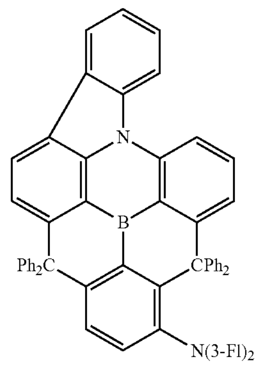
Compound 3-262
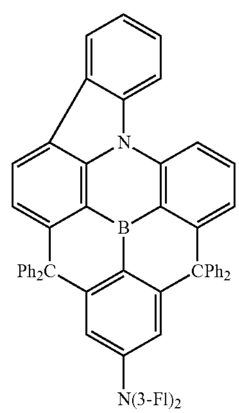
Compound 3-263
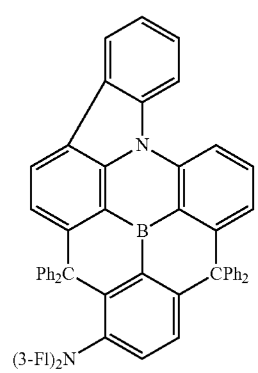

-continued
Compound 3-264
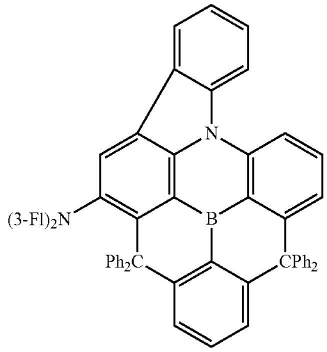
Compound 3-265
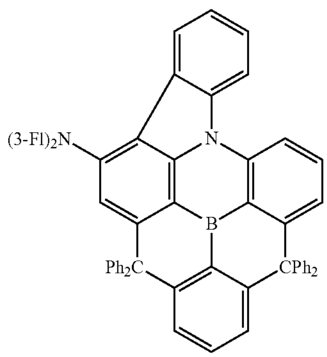
Compound 3-266
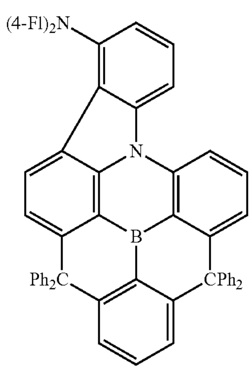
Compound 3-267
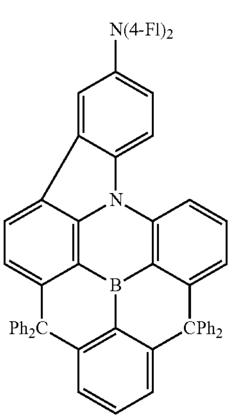
-continued
Compound 3-268
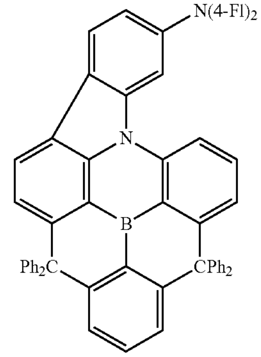
Compound 3-269
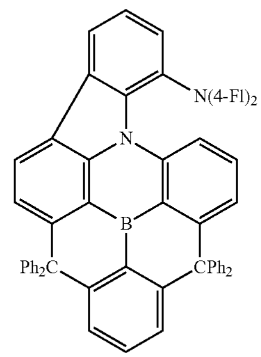
Compound 3-270
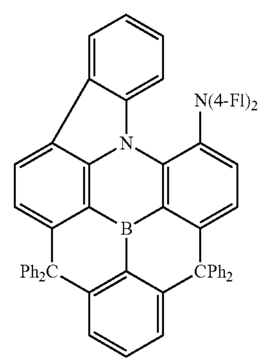
Compound 3-271
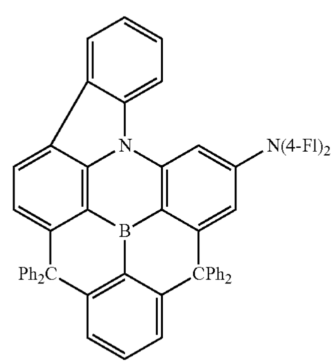

-continued
Compound 3-272
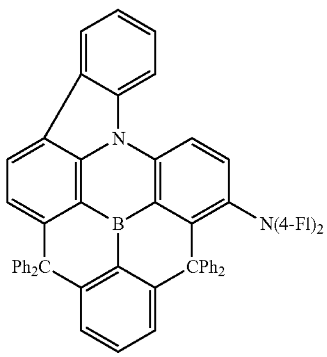
Compound 3-273
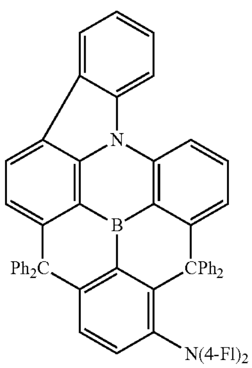
Compound 3-274
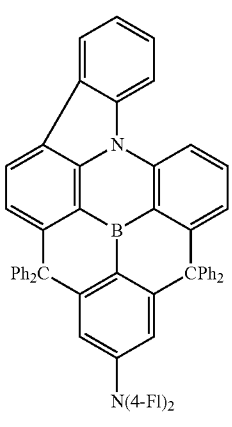
Compound 3-275
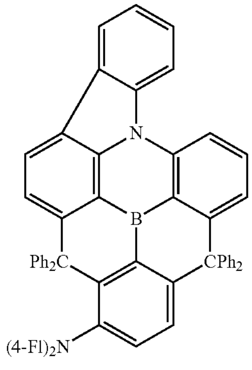
-continued
Compound 3-276
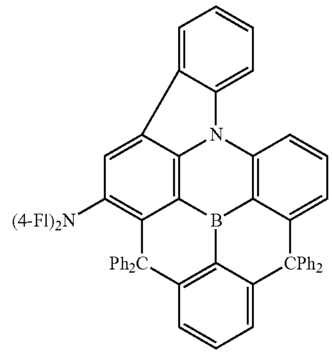
Compound 3-277
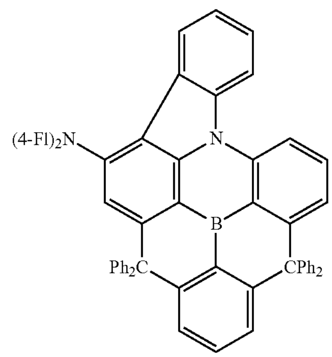
Compound 3-278
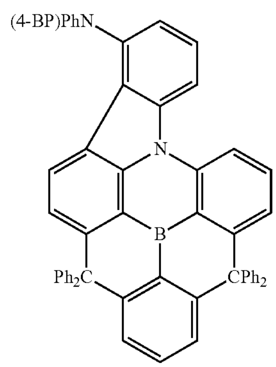
Compound 3-279
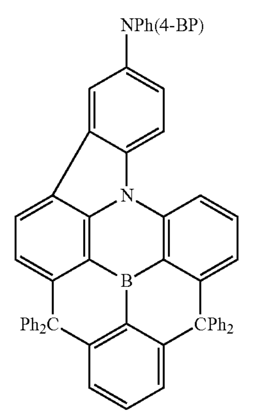

-continued
Compound 3-280
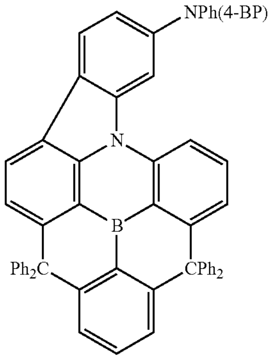
Compound 3-281
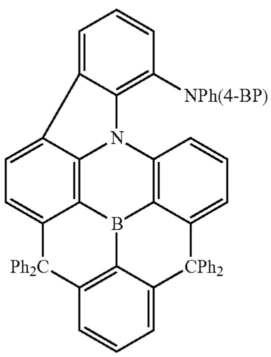
Compound 3-282
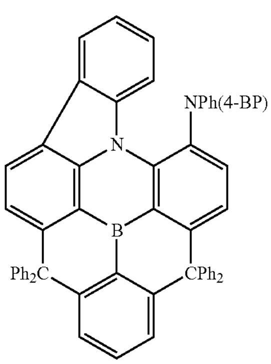
Compound 3-283
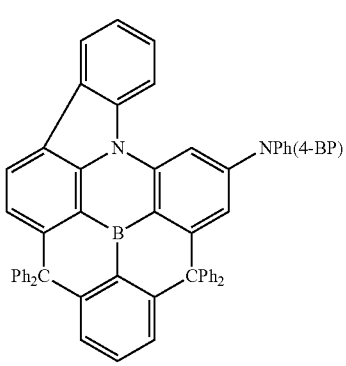
-continued
Compound 3-284
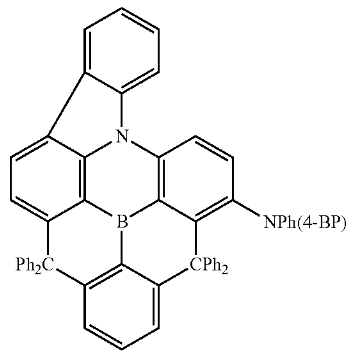
Compound 3-285
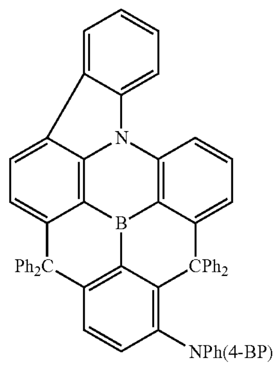
Compound 3-286
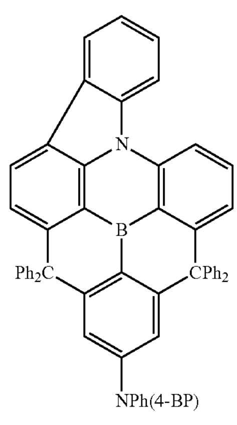
Compound 3-287
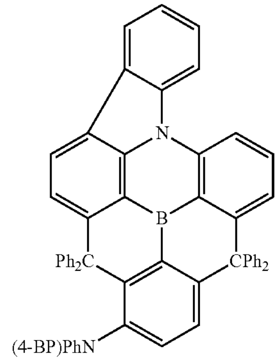

-continued
Compound 3-288
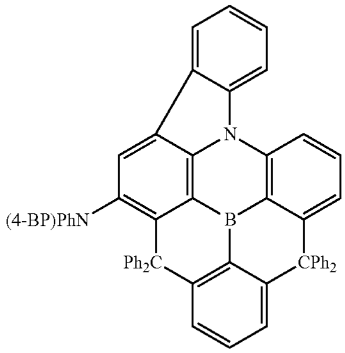
Compound 3-289
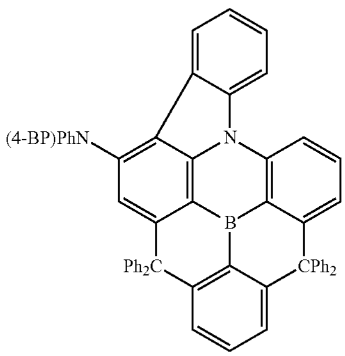
Compound 3-290
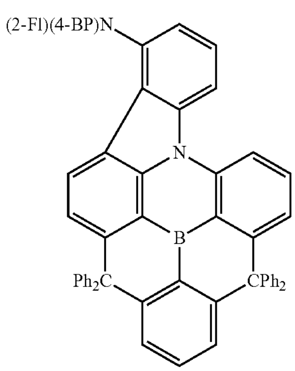
Compound 3-291
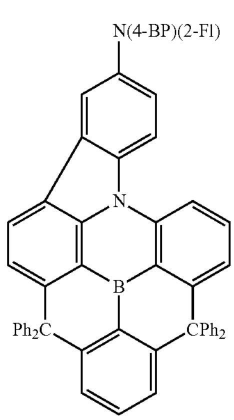
-continued
Compound 3-292
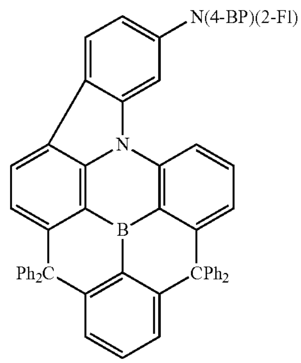
Compound 3-293
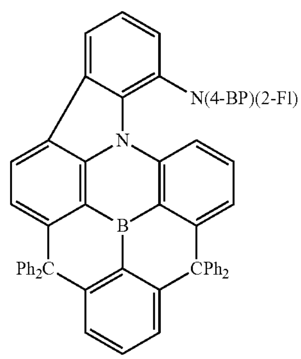
Compound 3-294
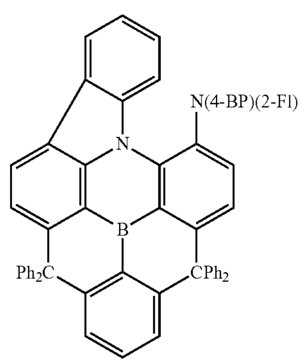
Compound 3-295
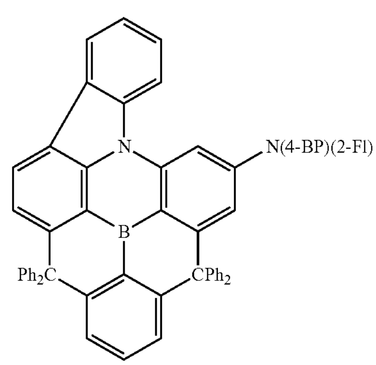

-continued
Compound 3-296
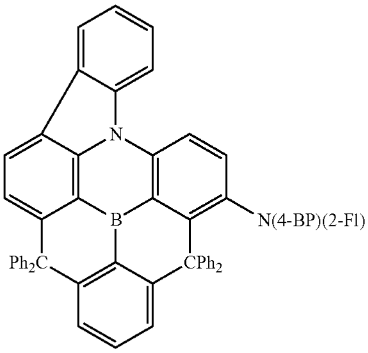
Compound 3-297
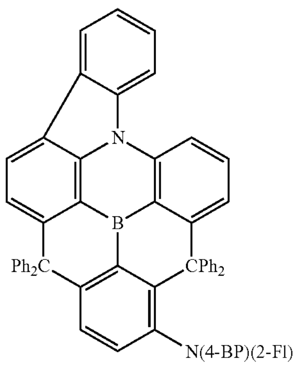
Compound 3-298
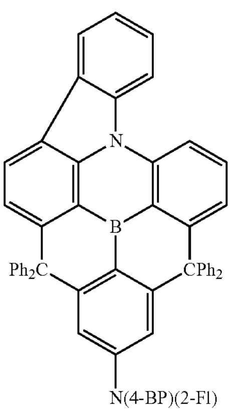
Compound 3-299
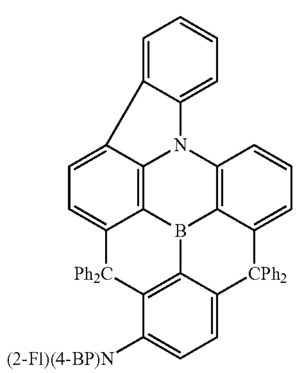
-continued
Compound 3-300
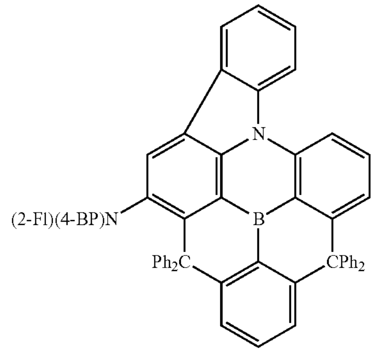
Compound 3-301
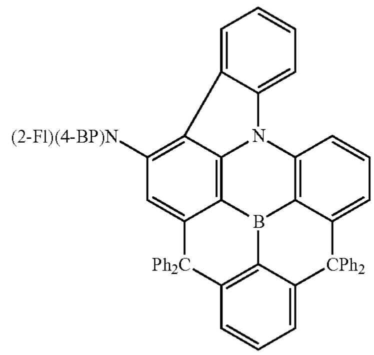
Compound 3-302
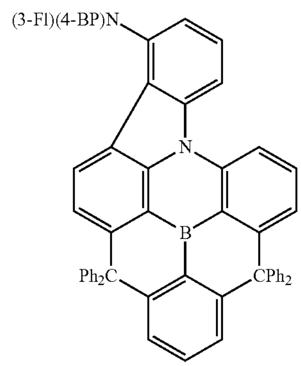
Compound 3-303
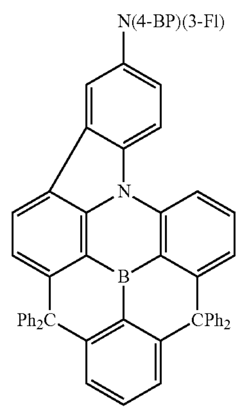

-continued
Compound 3-304
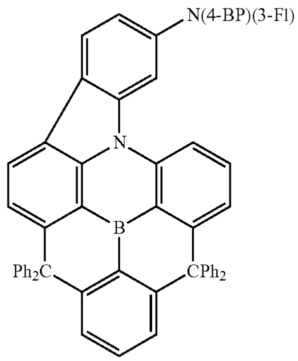
Compound 3-305
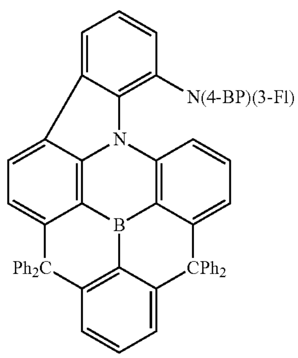
Compound 3-306
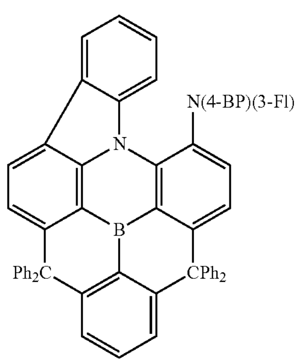
Compound 3-307
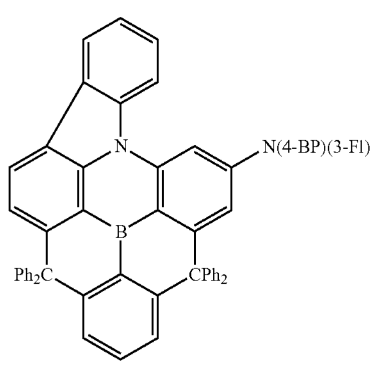
-continued
Compound 3-308
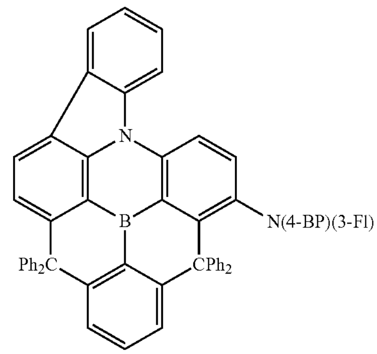
Compound 3-309
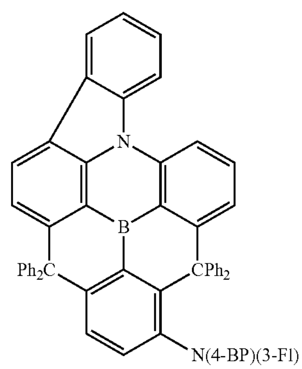
Compound 3-310
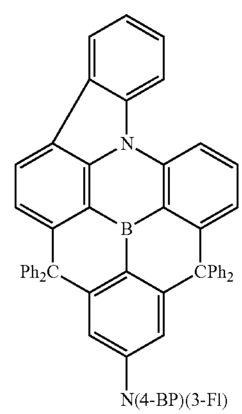
Compound 3-311
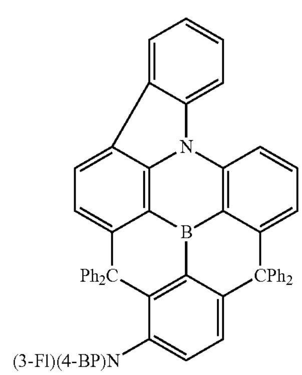

-continued
Compound 3-312
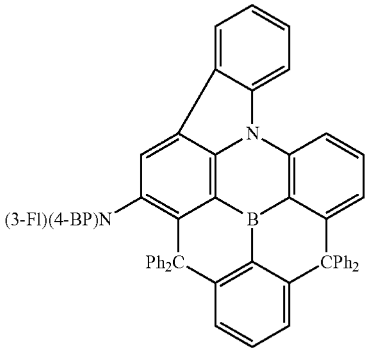
Compound 3-313
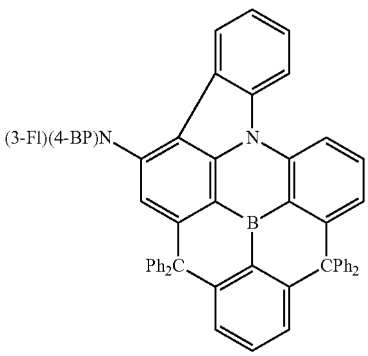
Compound 3-314
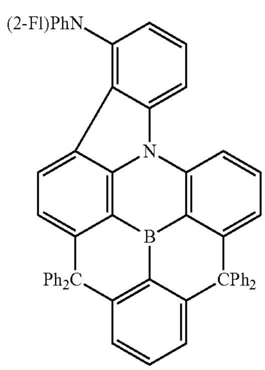
Compound 3-315
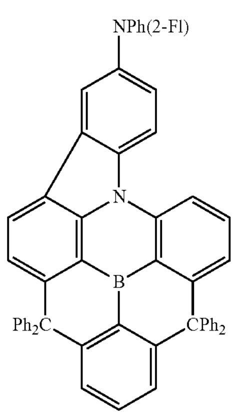
-continued
Compound 3-316
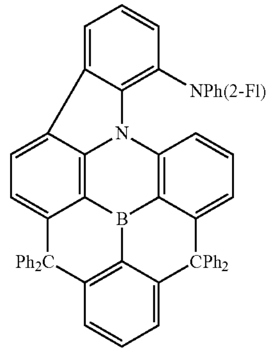
Compound 3-317
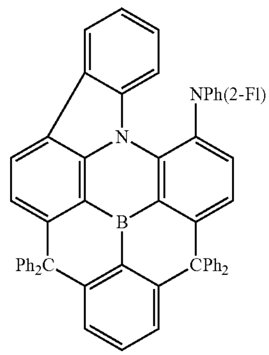
Compound 3-318
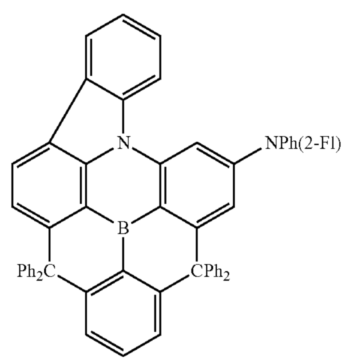
Compound 3-319
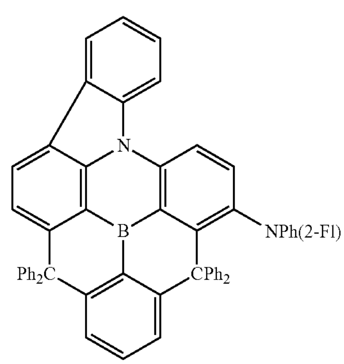

Compound 3-320
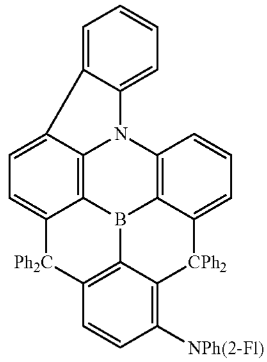
Compound 3-321
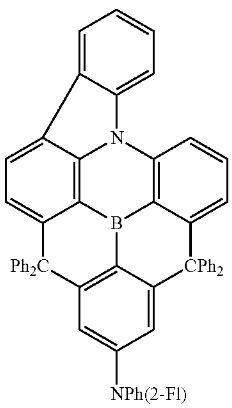
Compound 3-322
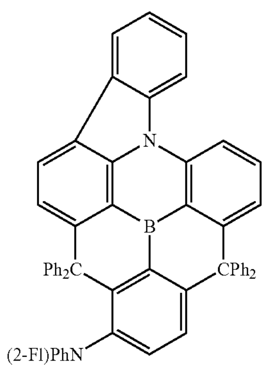
Compound 3-323
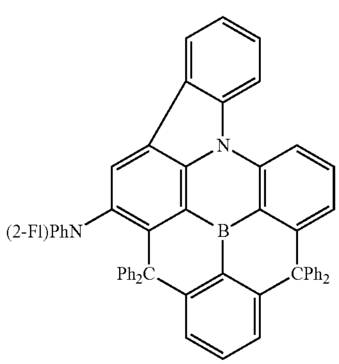
Compound 3-324
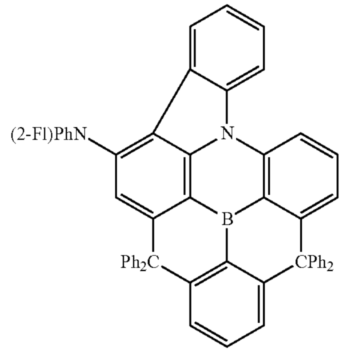
Compound 3-325
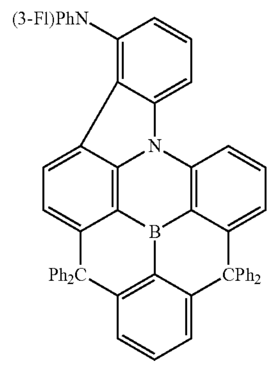
Compound 3-326
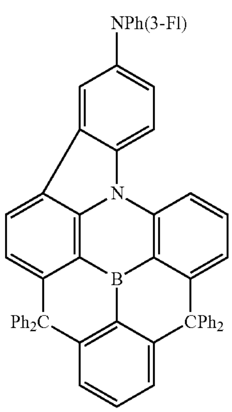
Compound 3-327
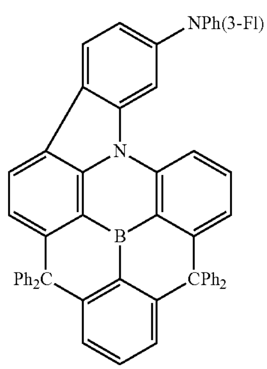

-continued
Compound 3-328
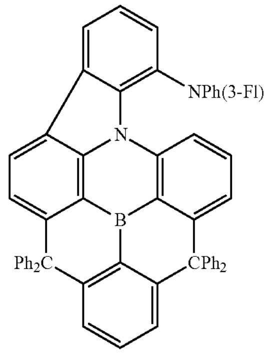
Compound 3-329
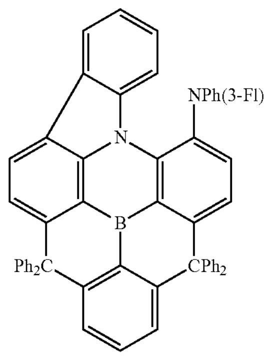
Compound 3-330
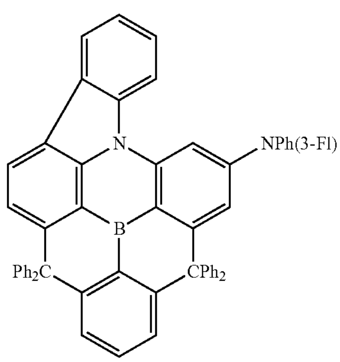
Compound 3-331
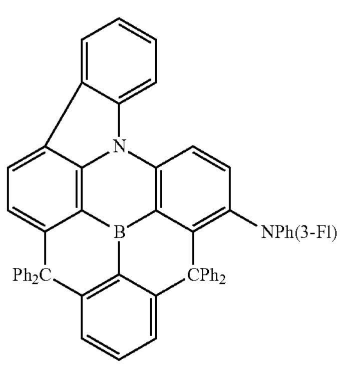
-continued
Compound 3-332
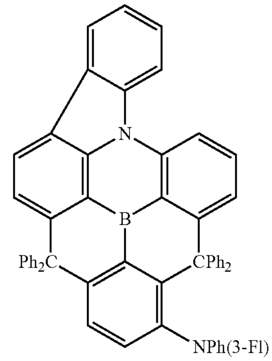
Compound 3-333
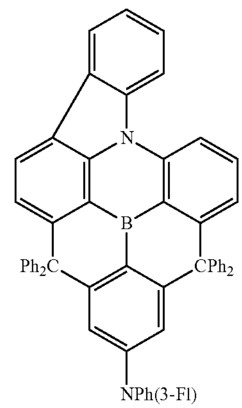
Compound 3-334
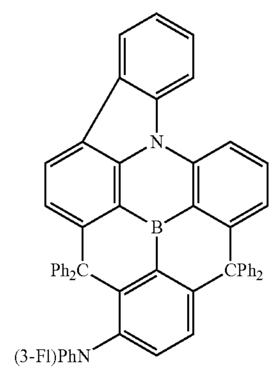
Compound 3-335
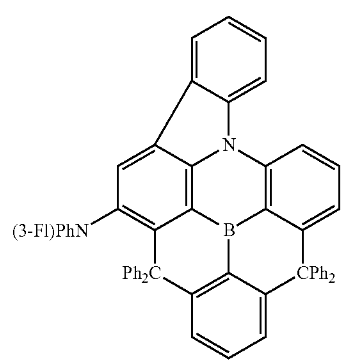

-continued
Compound 3-336
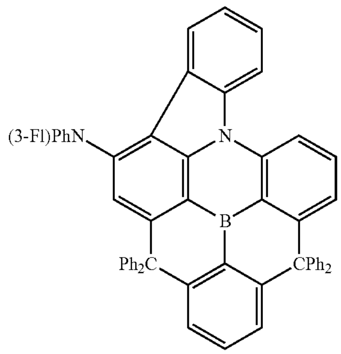
Compound 3-337
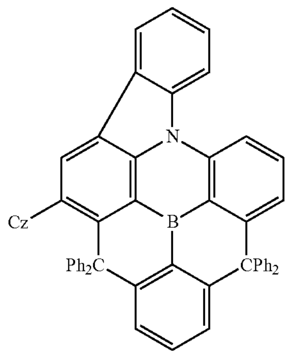
Compound 3-338
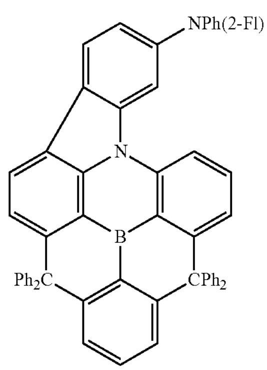
Compound 3-339
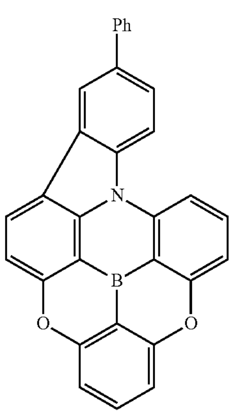
-continued
Compound 3-340
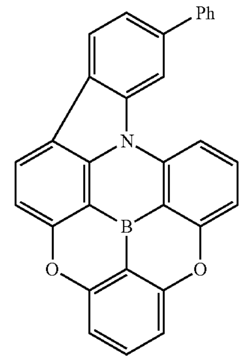
Compound 3-341
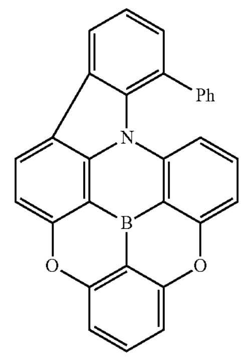
Compound 3-342
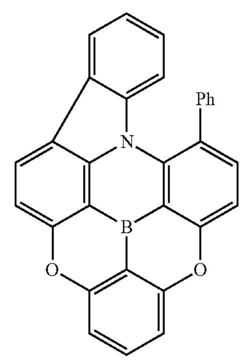
Compound 3-343
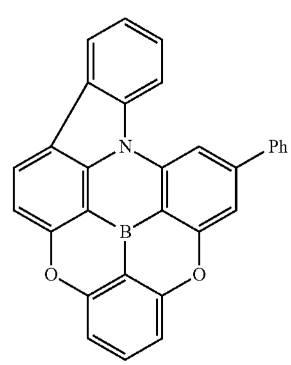

Compound 3-344
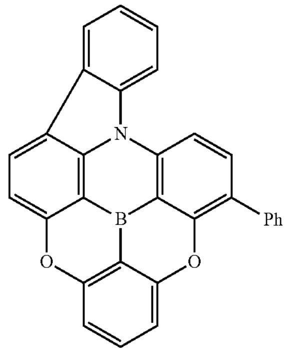
Compound 3-345
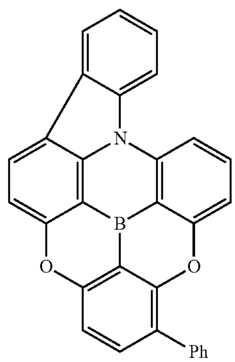
Compound 3-346
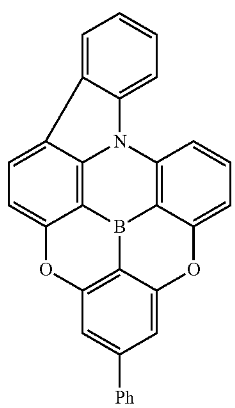
Compound 3-347
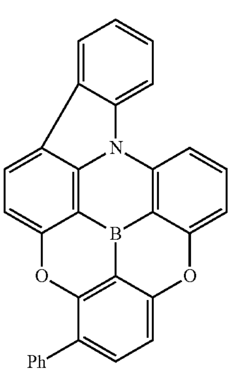
Compound 3-348
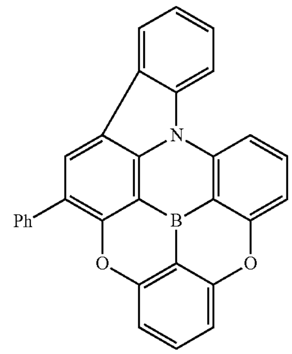
Compound 3-349
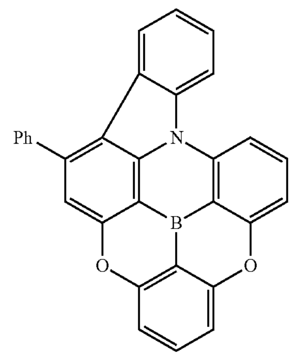
Compound 3-350
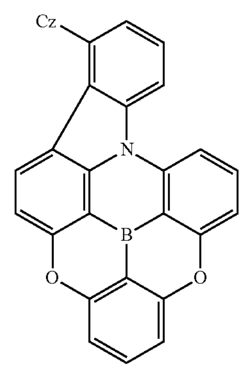
Compound 3-351
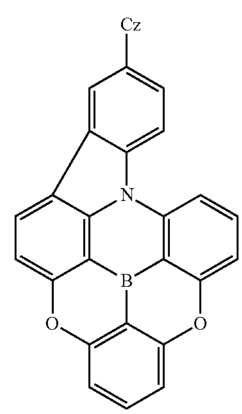

-continued
Compound 3-352
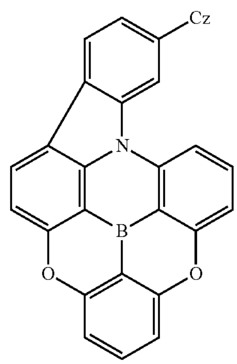
Compound 3-353
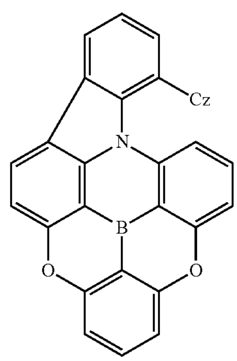
Compound 3-354
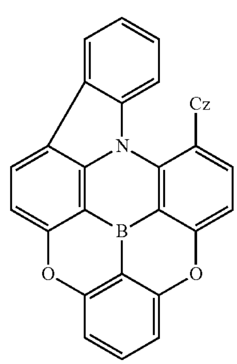
Compound 3-355
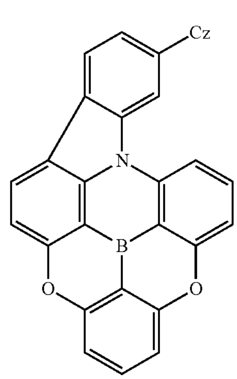
-continued
Compound 3-356
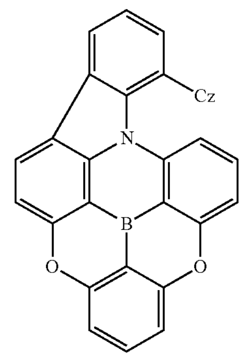
Compound 3-357
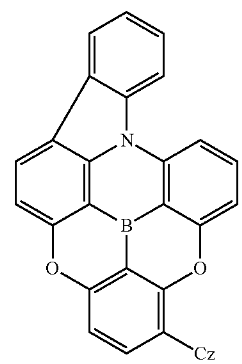
Compound 3-358
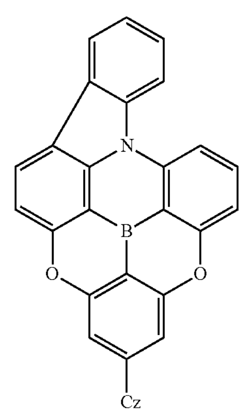
Compound 3-359
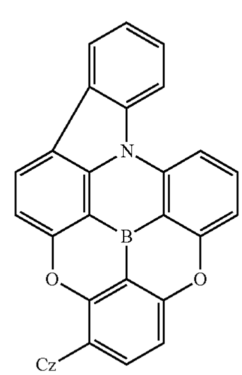

-continued
Compound 3-360
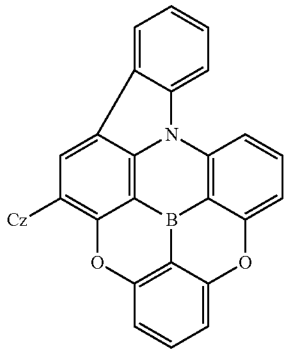
Compound 3-361
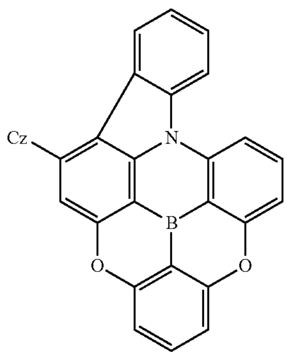
Compound 3-362
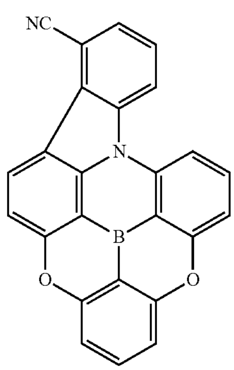
Compound 3-363
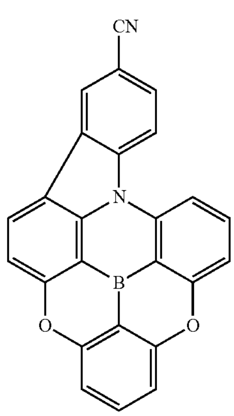
-continued
Compound 3-364
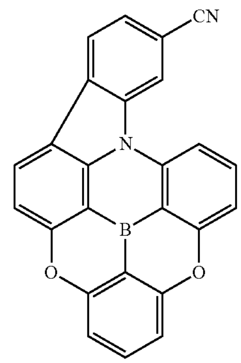
Compound 3-365
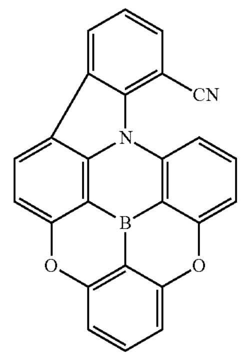
Compound 3-366
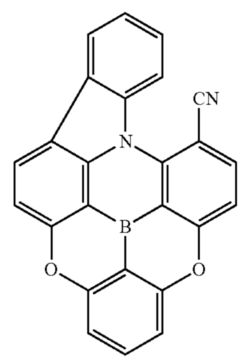
Compound 3-367
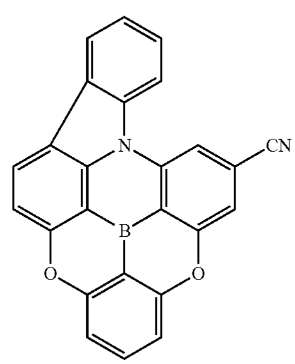

-continued
Compound 3-368
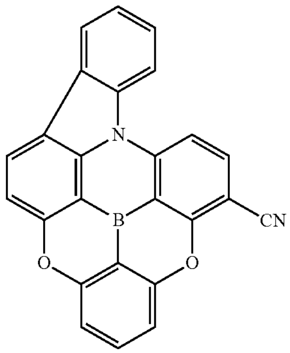
Compound 3-369
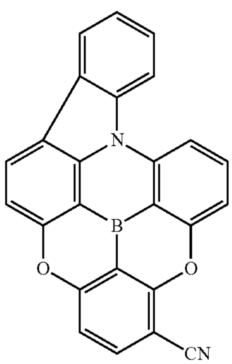
Compound 3-370
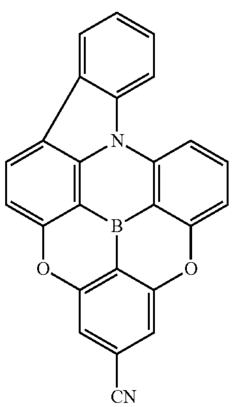
Compound 3-371
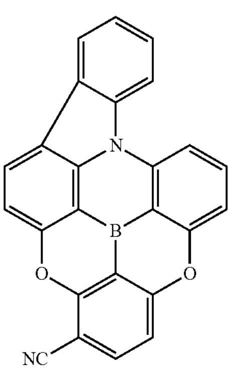
-continued
Compound 3-372
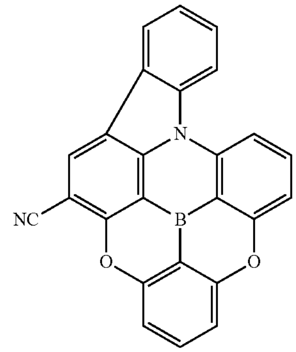
Compound 3-373
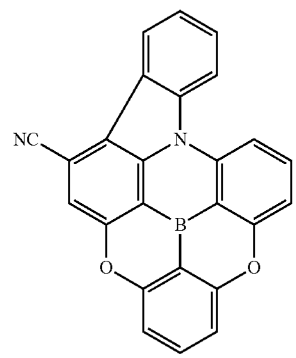
Compound 3-374
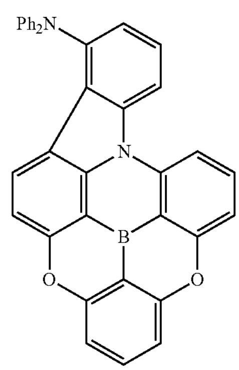
Compound 3-375
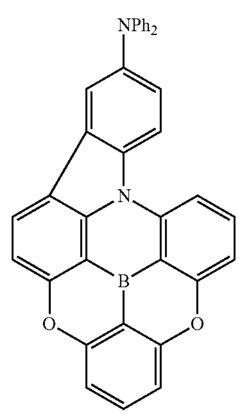

-continued
Compound 3-376
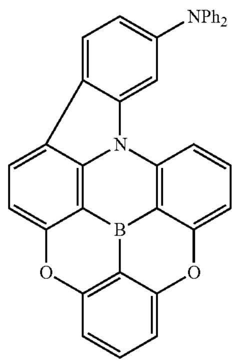
Compound 3-377
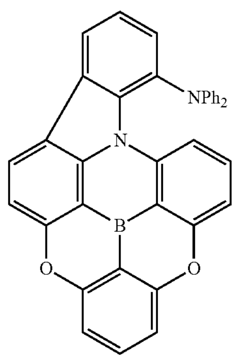
Compound 3-378
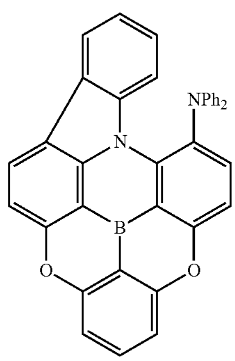
Compound 3-379
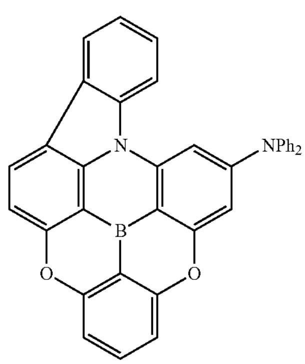
-continued
Compound 3-380
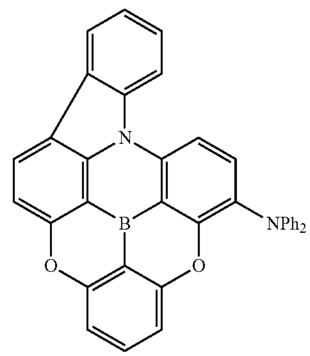
Compound 3-381
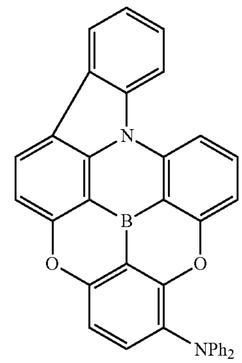
Compound 3-382
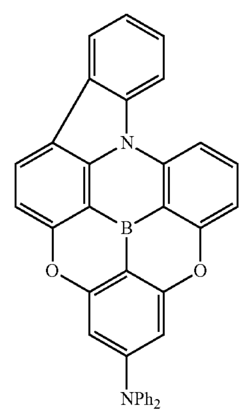
Compound 3-383
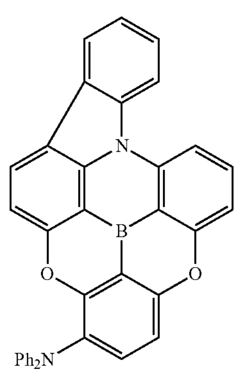

-continued
Compound 3-384
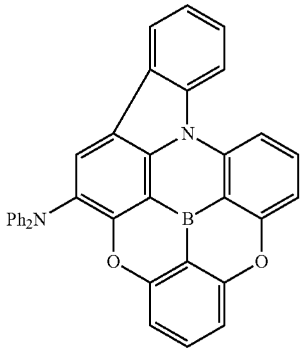
Compound 3-385
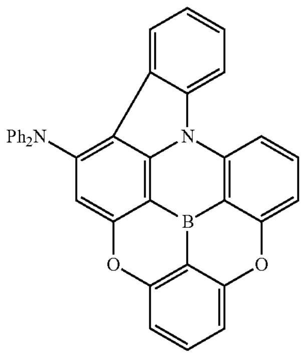
Compound 3-386
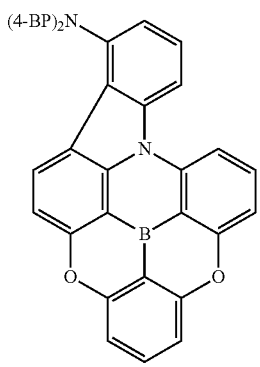
Compound 3-387
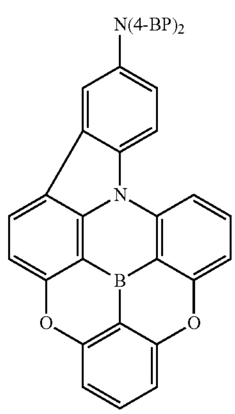
-continued
Compound 3-388
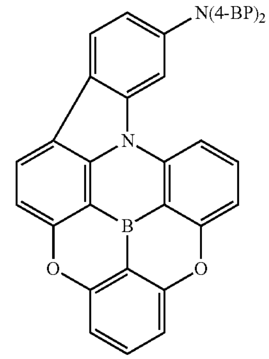
Compound 3-389
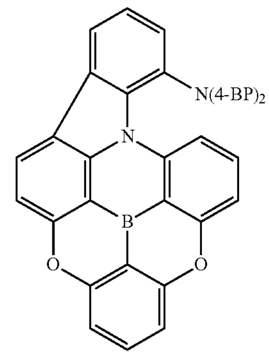
Compound 3-390
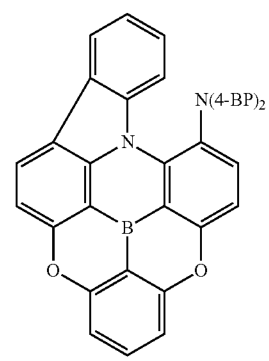
Compound 3-391
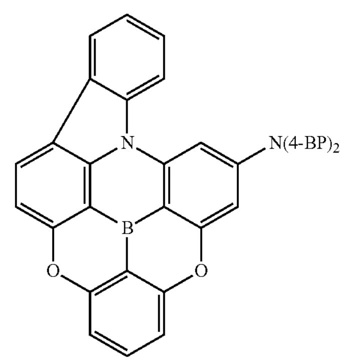

-continued
Compound 3-392
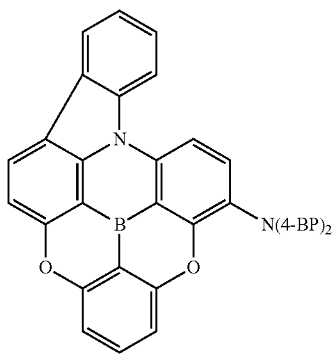
Compound 3-393
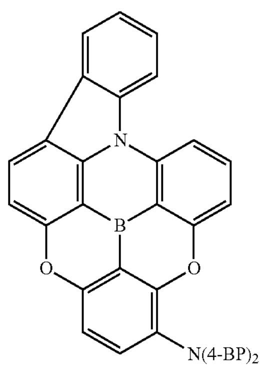
Compound 3-394
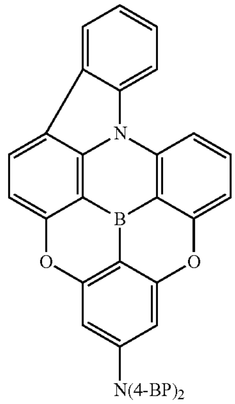
Compound 3-395
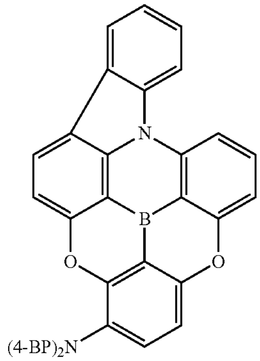
-continued
Compound 3-396
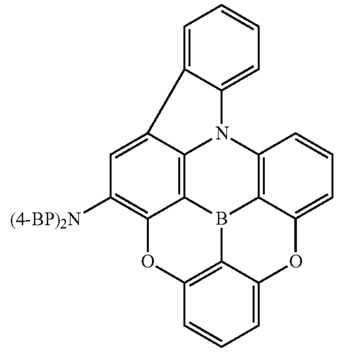
Compound 3-397
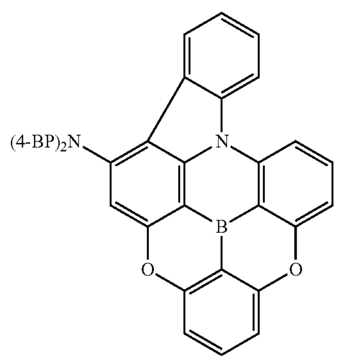
Compound 3-398
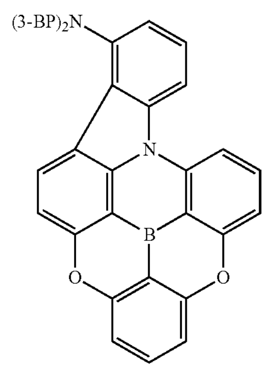
Compound 3-399
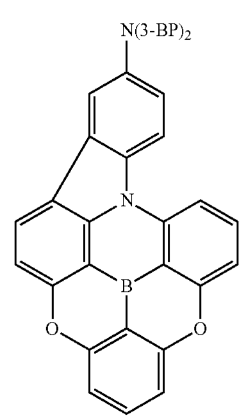

Compound 3-400
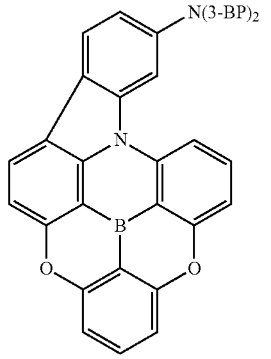
Compound 3-401
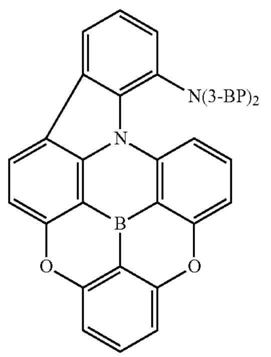
Compound 3-402
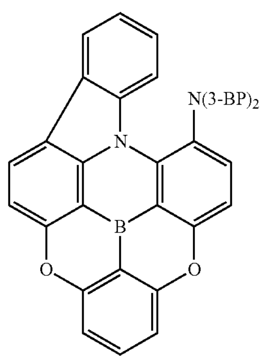
Compound 3-403
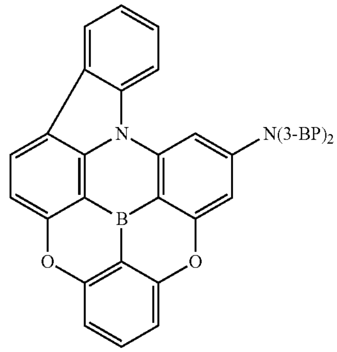
Compound 3-404
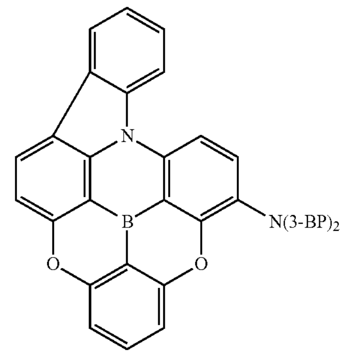
Compound 3-405
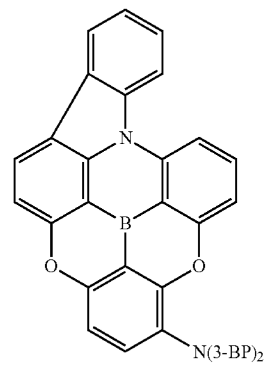
Compound 3-406
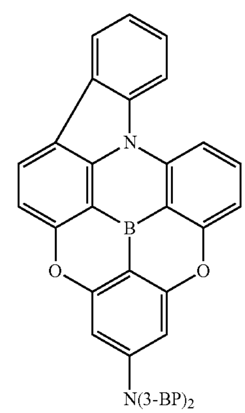
Compound 3-407
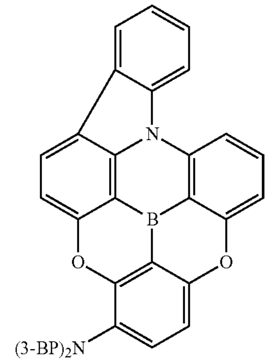

-continued
Compound 3-408
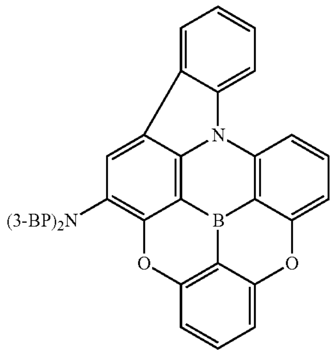
Compound 3-409
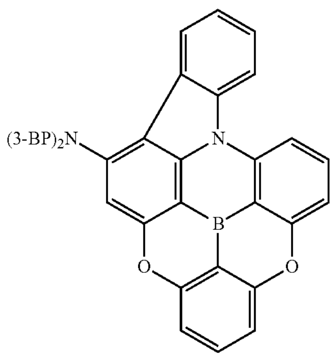
Compound 3-410
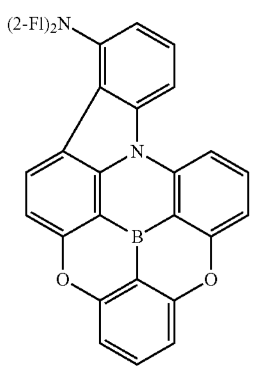
Compound 3-411
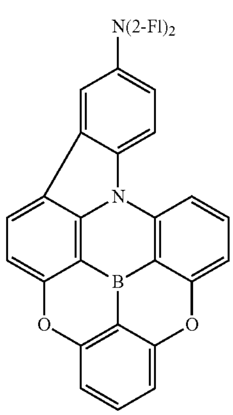
-continued
Compound 3-412
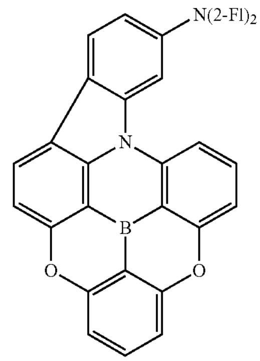
Compound 3-413
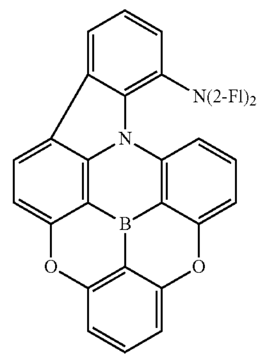
Compound 3-414
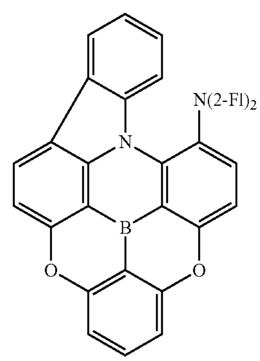
Compound 3-415
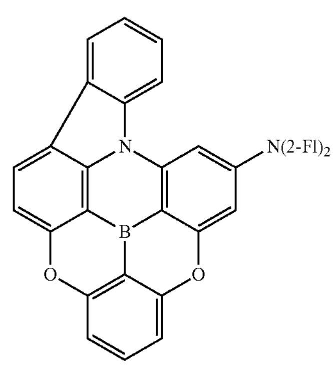

Compound 3-416
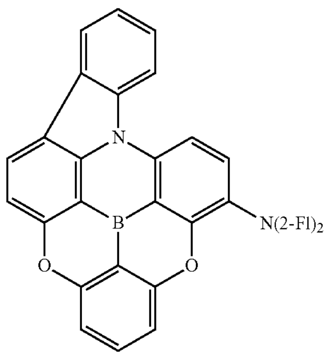
Compound 3-417
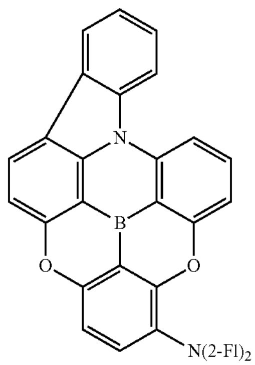
Compound 3-418
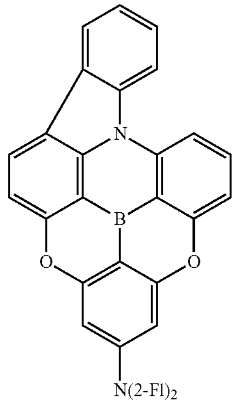
Compound 3-419
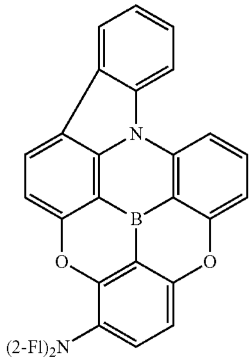
Compound 3-420
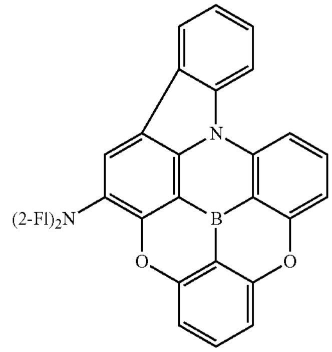
Compound 3-421
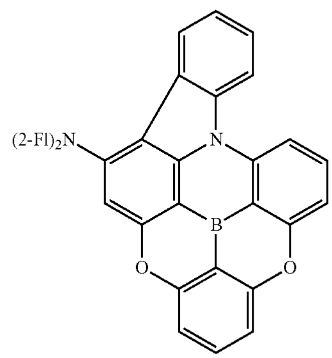
Compound 3-422
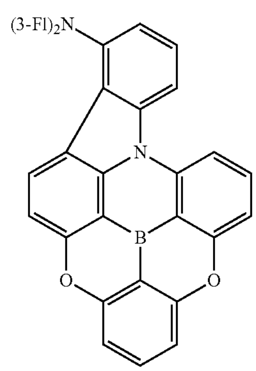
Compound 3-423
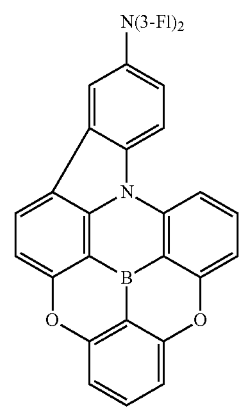

-continued
Compound 3-424
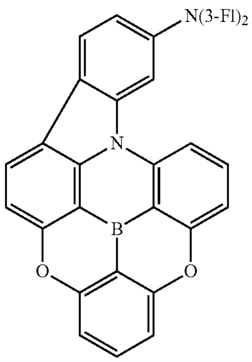
Compound 3-425
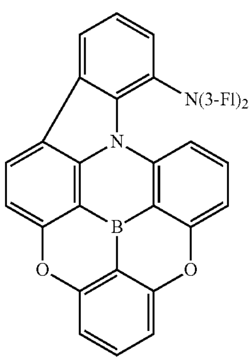
Compound 3-426
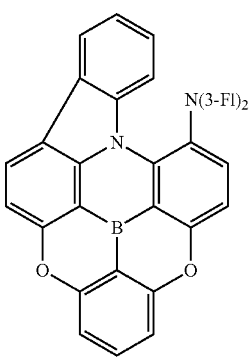
Compound 3-427
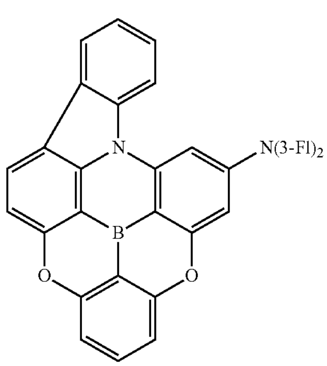
-continued
Compound 3-428
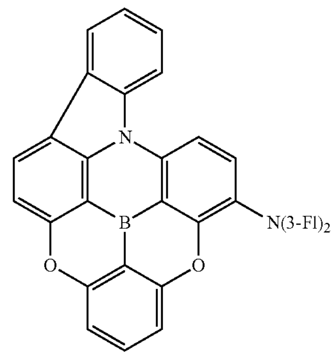
Compound 3-429
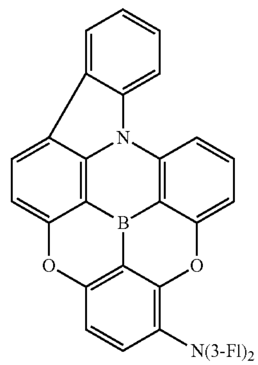
Compound 3-430
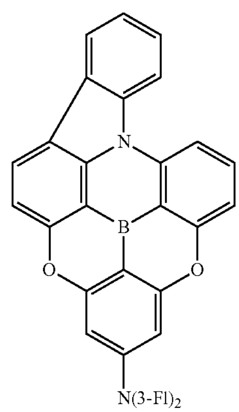
Compound 3-431
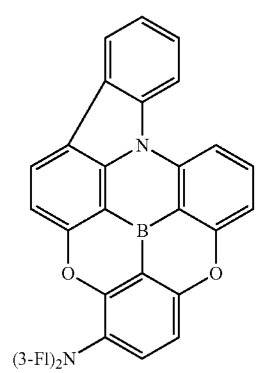

-continued
Compound 3-432
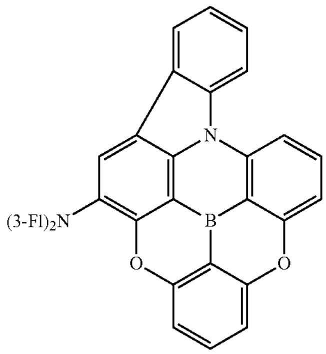
Compound 3-433
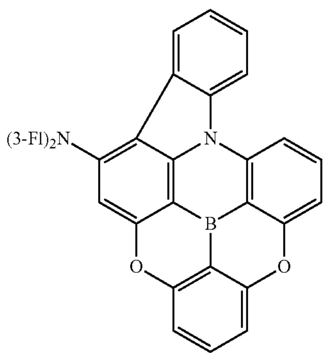
Compound 3-434
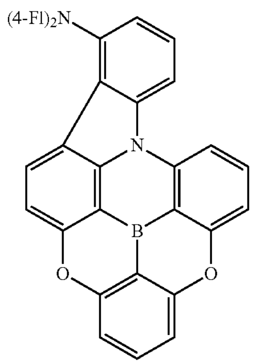
Compound 3-435
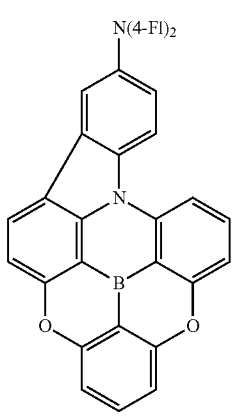
-continued
Compound 3-436
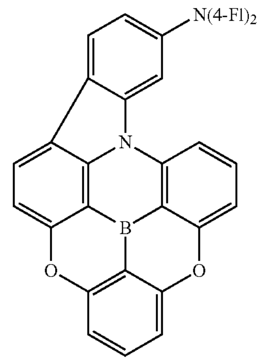
Compound 3-437
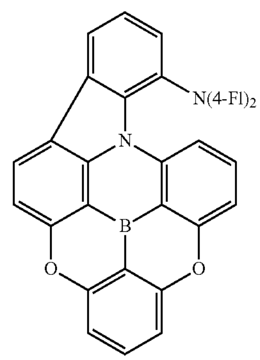
Compound 3-438
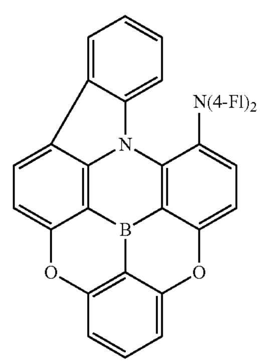
Compound 3-439
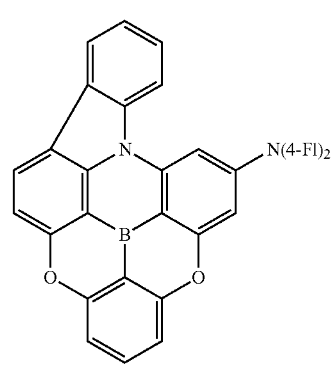

-continued
Compound 3-440
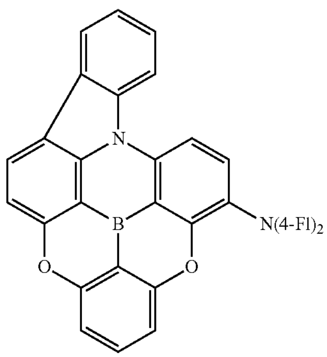
Compound 3-441
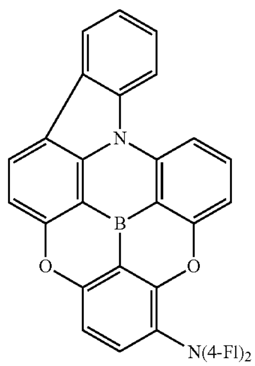
Compound 3-442
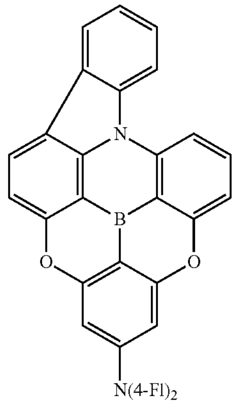
Compound 3-443
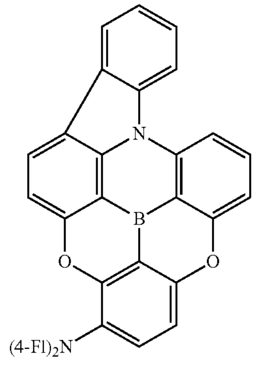
-continued
Compound 3-444
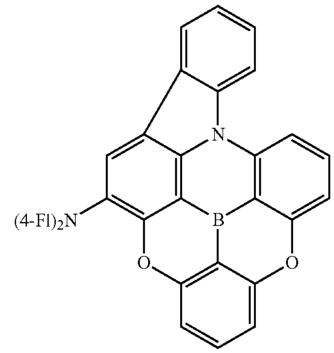
Compound 3-445
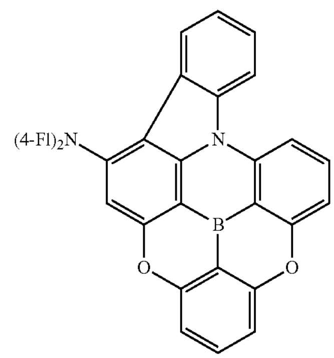
Compound 3-446
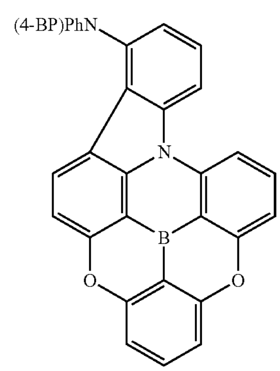
Compound 3-447
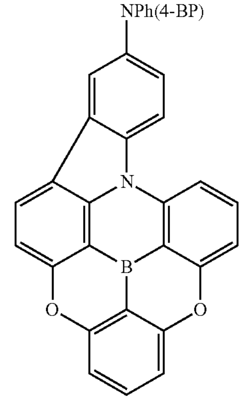

-continued
Compound 3-448
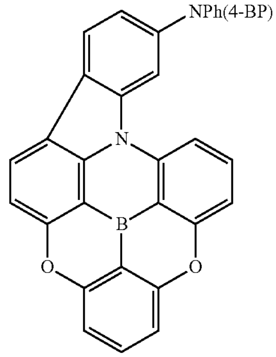
Compound 3-449
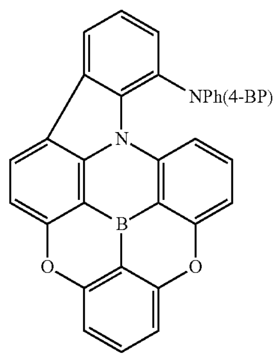
Compound 3-450
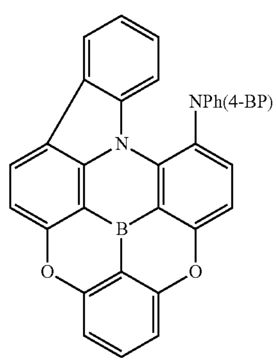
Compound 3-451
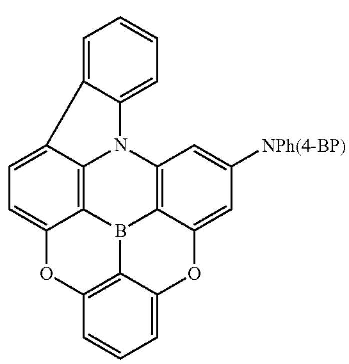
-continued
Compound 3-452
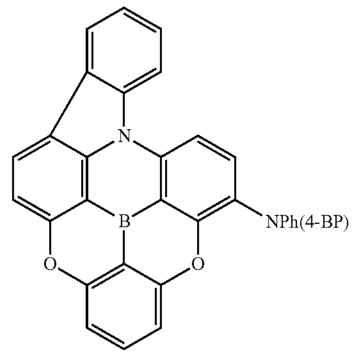
Compound 3-453
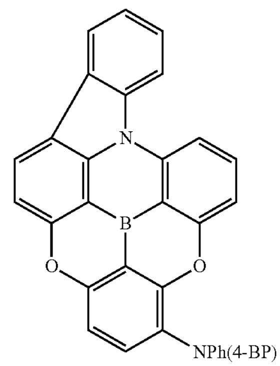
Compound 3-454
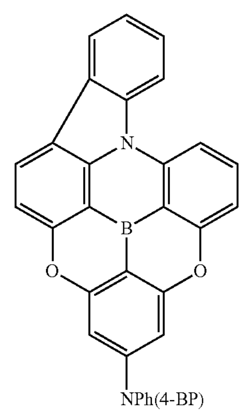
Compound 3-455
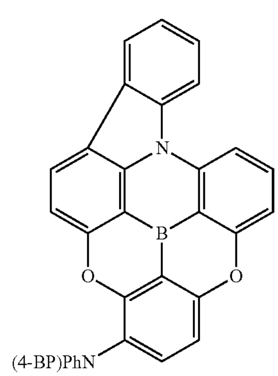

Compound 3-456
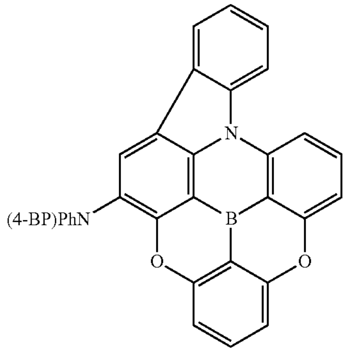
Compound 3-457
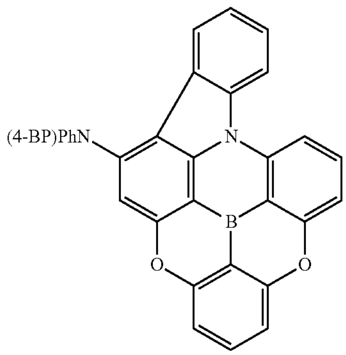
Compound 3-458
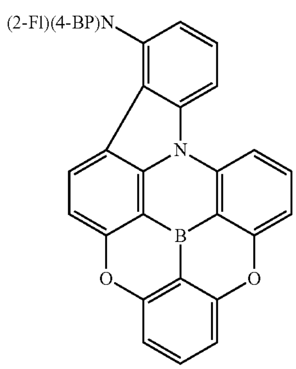
Compound 3-459
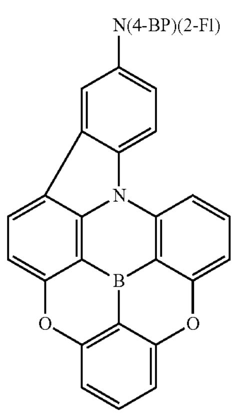
Compound 3-460
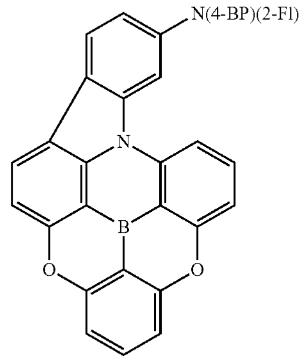
Compound 3-461
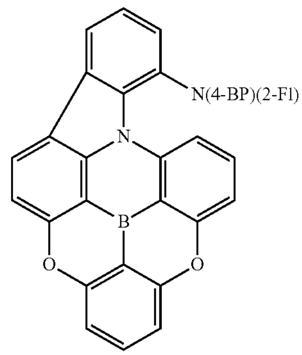
Compound 3-462
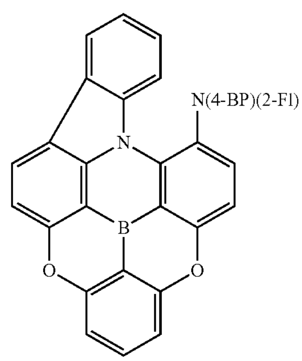
Compound 3-463
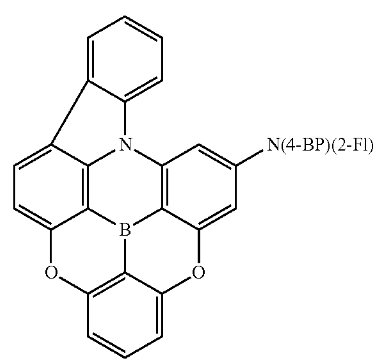

Compound 3-464
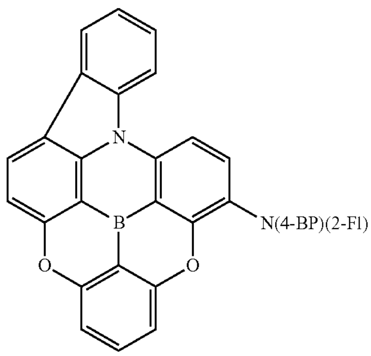
Compound 3-465
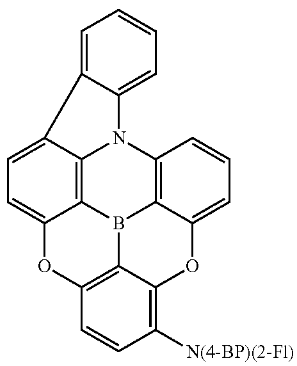
Compound 3-466
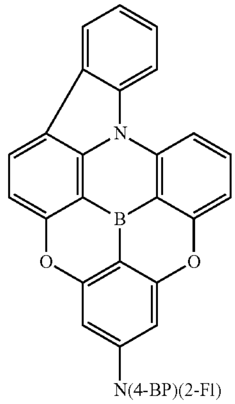
Compound 3-467
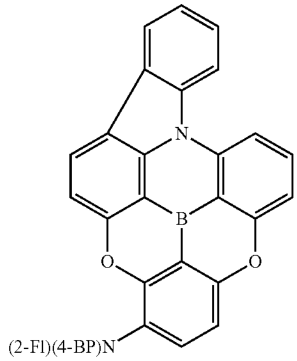
Compound 3-468
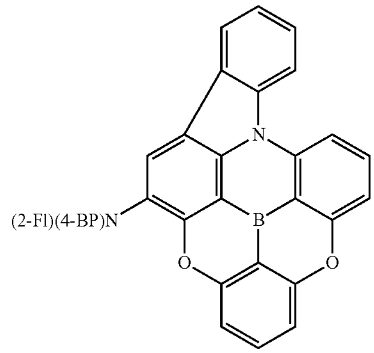
Compound 3-469
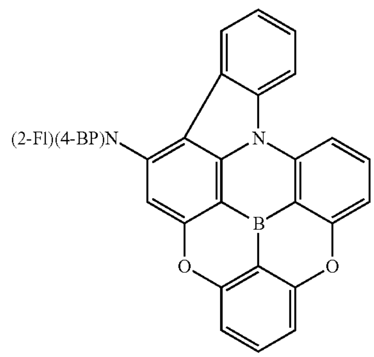
Compound 3-470
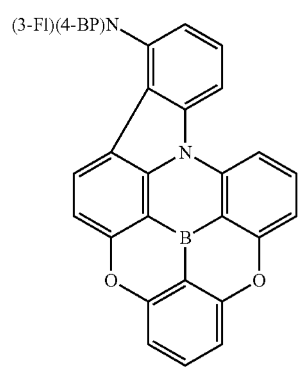
Compound 3-471
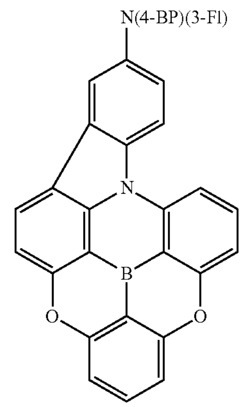

-continued
Compound 3-472
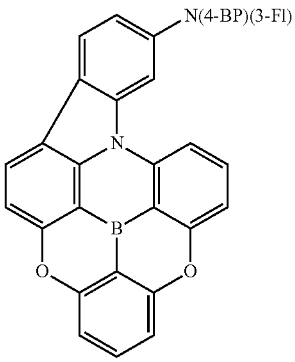
Compound 3-473
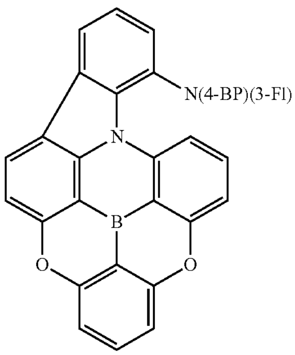
Compound 3-474
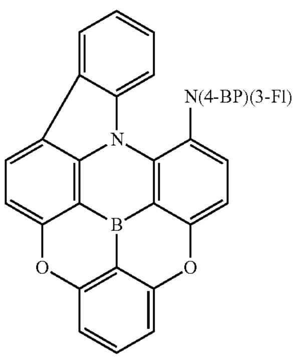
Compound 3-475
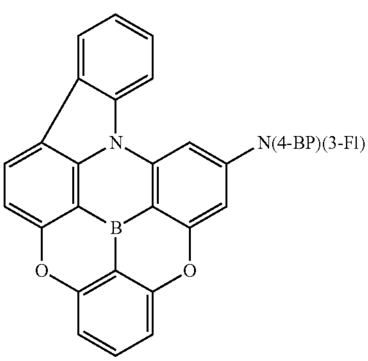
-continued
Compound 3-476
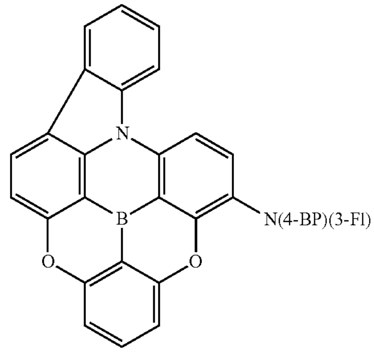
Compound 3-477
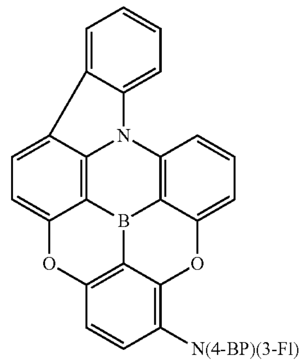
Compound 3-478
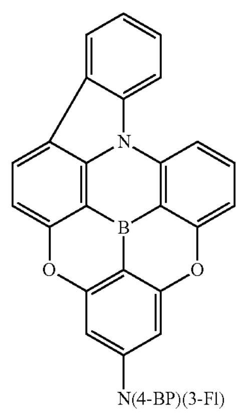
Compound 3-479
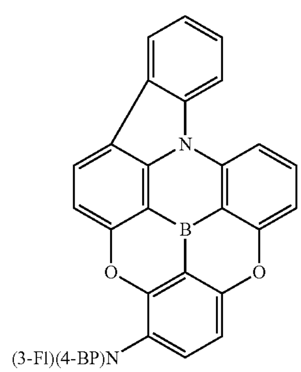

-continued
Compound 3-480
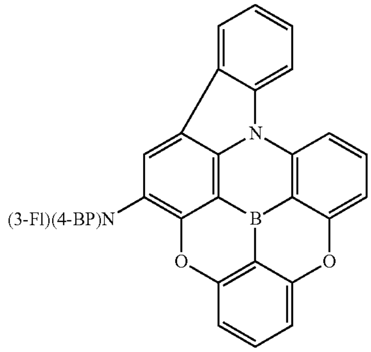
Compound 3-481
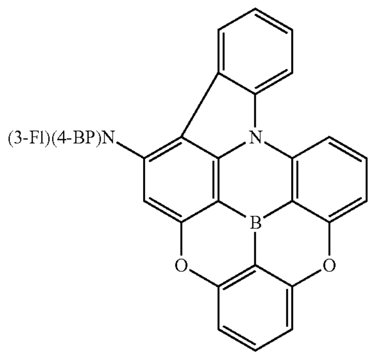
Compound 3-482
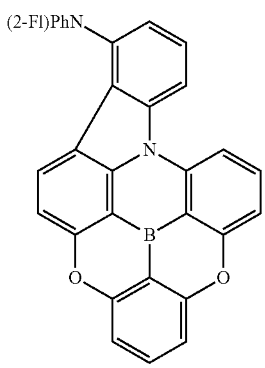
Compound 3-483
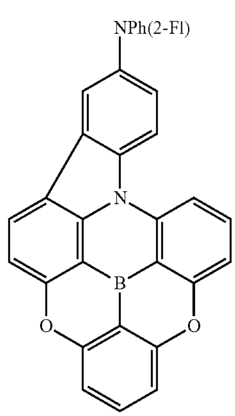
-continued
Compound 3-484
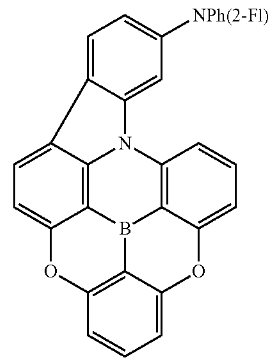
Compound 3-485
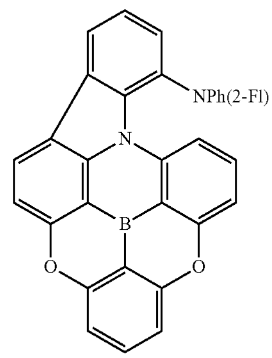
Compound 3-486
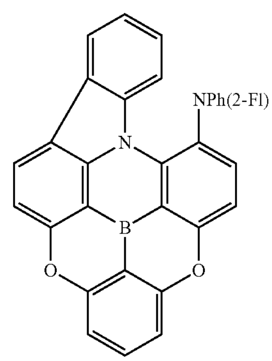
Compound 3-487
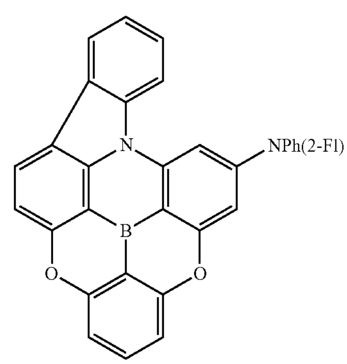

-continued
Compound 3-488
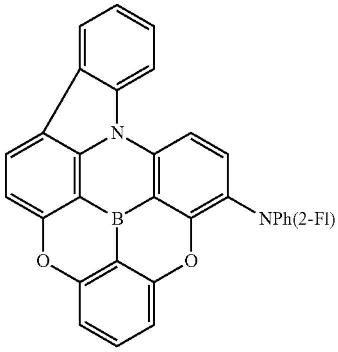
Compound 3-489
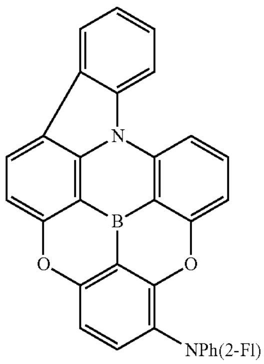
Compound 3-490
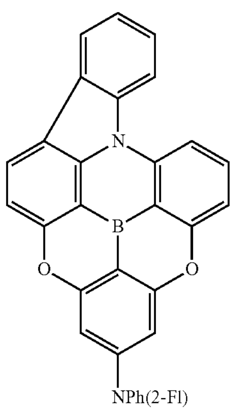
Compound 3-491
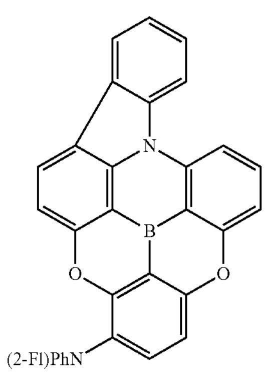
-continued
Compound 3-492
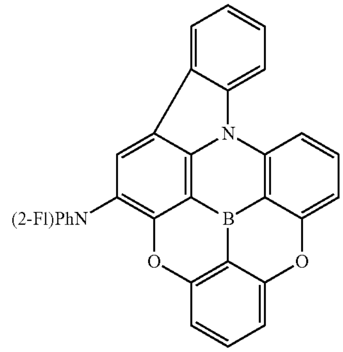
Compound 3-493
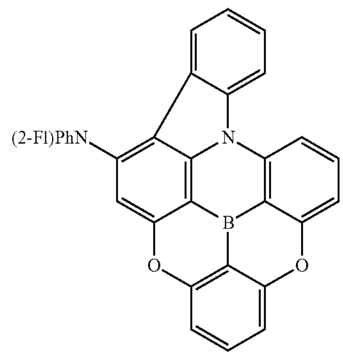
Compound 3-494
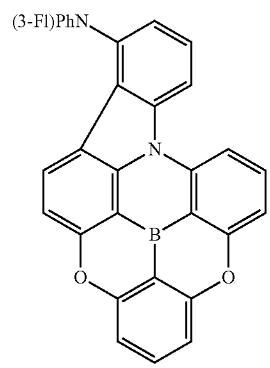
Compound 3-495
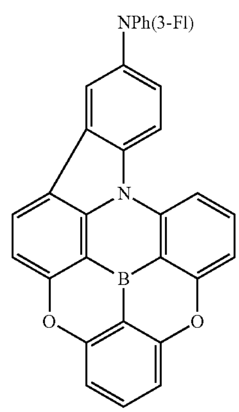

Compound 3-496
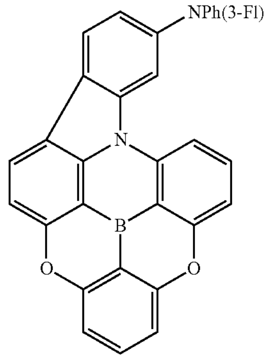
Compound 3-497
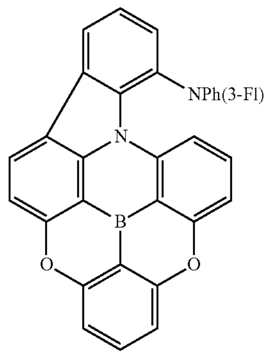
Compound 3-498
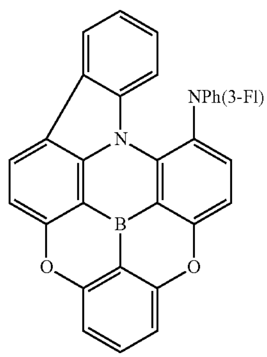
Compound 3-499
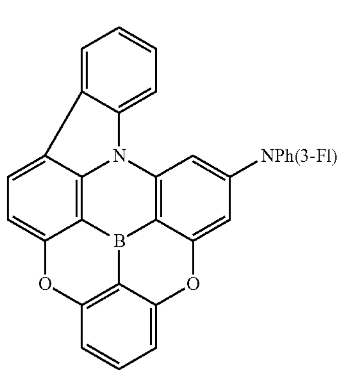
Compound 3-500
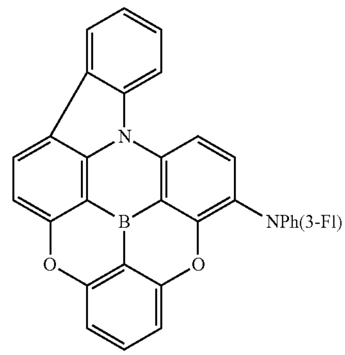
Compound 3-501
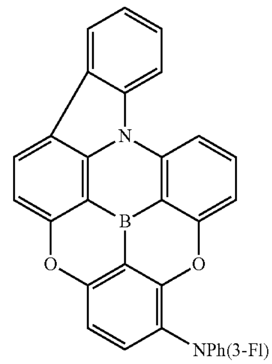
Compound 3-502
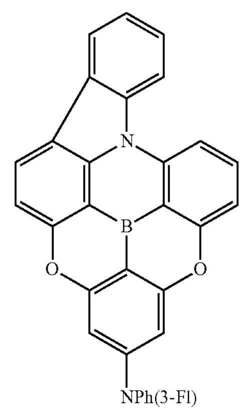
Compound 3-503
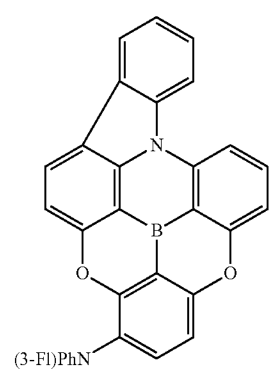

-continued
Compound 3-504
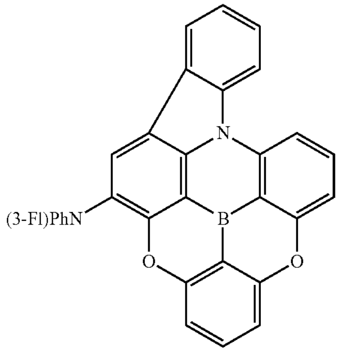
Compound 3-505
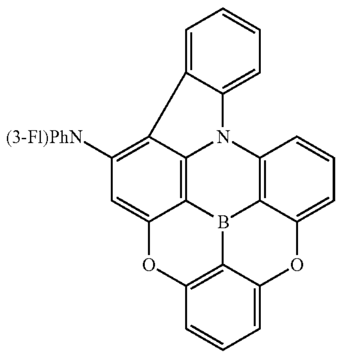
Compound 3-506
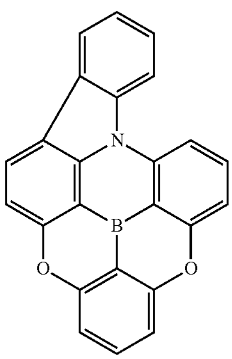
Compound 3-507
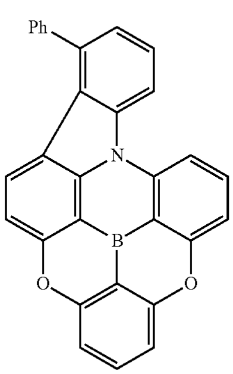
;
in the structure of the compounds above, wherein Ph is
Ph is 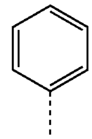, Cz is 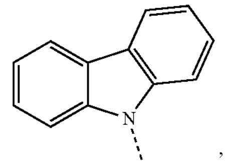,
NPh$_2$ is 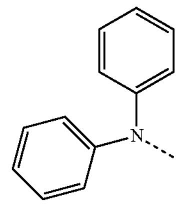,
N(3-BP)$_2$ is 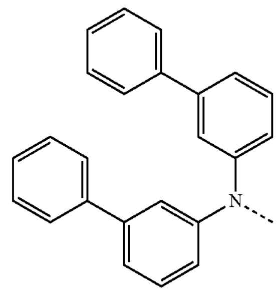,
N(4-BP)$_2$ is 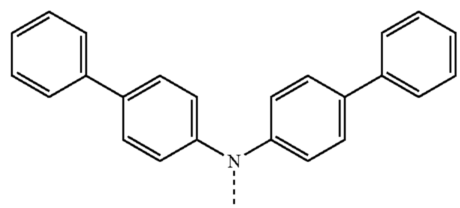,
N(2-Fl)$_2$ is 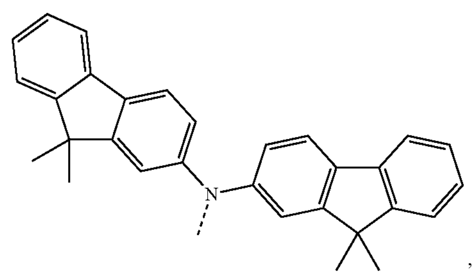,
N(3-Fl)$_2$ is 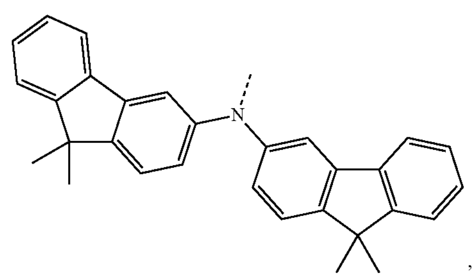,
N(4-Fl)$_2$ is 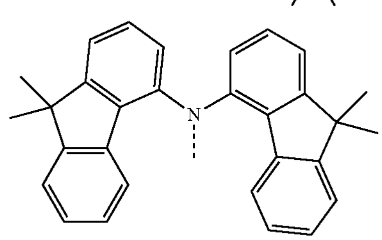, -continued NPh(4-BP) is 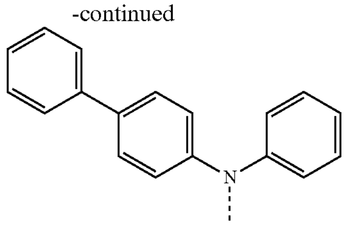 , N(2-Fl)(4-BP) is 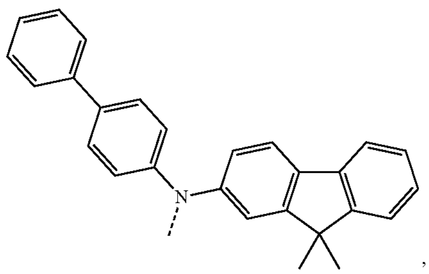 , N(3-Fl)(4-BP) is 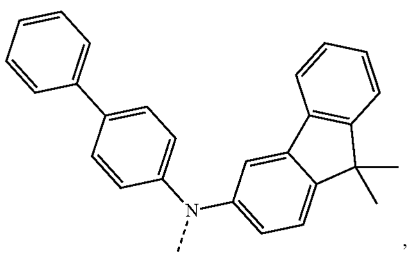 , NPh(2-Fl) is 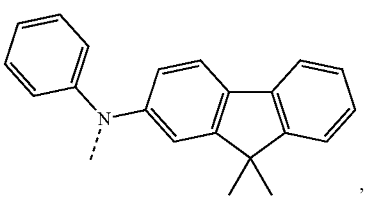 , NPh(3-Fl) is 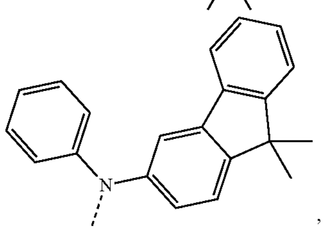 , -continued NPh(3-BP) is 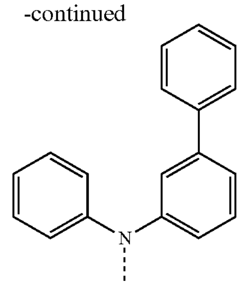 .

3. The compound of claim 1, wherein at least one of R is selected from the group consisting of phenyl, biphenyl, poly-phenyl, diarylamine, carbazole, azacarbazole, dibenzofuran, azadibenzofuran, dibenzothiophene, azadibenzothiophene, dibenzoselenophene, azadibenzoselenophene, triphenylene, azatriphenylene, tetraphenylene, diarylsilyl, and triarylsilyl.

4. A formulation comprising the compound of claim 1.

5. The compound of claim 1, wherein Z is selected from $CRzl^{Rz2}$ or PRz.

6. The compound of claim 1, wherein Z is $CR^{z1}R^{z2}$.

7. A first organic light-emitting device comprising:

an anode;

a cathode; and an organic layer, disposed between the anode and the cathode, comprising the compound of claim 1.

8. The first organic light-emitting device of claim 7, wherein the organic layer is an emissive layer and the compound is an emitter.

9. The first organic light-emitting device of claim 8, wherein the organic layer further comprises a host.

10. The first organic light-emitting device of claim 7, wherein the organic layer is an emissive layer and the compound is a host.

11. The first organic light-emitting device of claim 7, wherein the organic layer is a charge carrier blocking layer and the compound is a charge carrier blocking material in the organic layer.

12. The first organic light-emitting device of claim 7, wherein the organic layer is a charge carrier transporting layer and the compound is a charge carrier transporting material in the organic layer.

13. The first organic light-emitting device of claim 7, wherein the first organic light-emitting device is incorporated into a device selected from the group consisting of a consumer product, an electronic component module, an organic light-emitting device, and a lighting panel.

* * * * *